(12) United States Patent
Sorrells et al.

(10) Patent No.: US 8,295,406 B1
(45) Date of Patent: *Oct. 23, 2012

(54) UNIVERSAL PLATFORM MODULE FOR A PLURALITY OF COMMUNICATION PROTOCOLS

(75) Inventors: David F. Sorrells, Middleburg, FL (US); Michael J. Bultman, Jacksonville, FL (US); Robert W. Cook, Switzerland, FL (US); Richard C. Looke, Jacksonville, FL (US); Charley D. Moses, Jr., Jacksonville, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/569,045

(22) Filed: May 10, 2000

Related U.S. Application Data

(63) Continuation-in-part of application No. 09/550,642, filed on Apr. 14, 2000, now Pat. No. 7,065,162, which is a continuation-in-part of application No. 09/521,878, filed on Mar. 9, 2000, now abandoned.

(60) Provisional application No. 60/147,129, filed on Aug. 4, 1999, provisional application No. 60/195,328, filed on Apr. 10, 2000.

(51) Int. Cl.
*H04L 27/06* (2006.01)
(52) U.S. Cl. .................................................... 375/340
(58) Field of Classification Search .................. 375/316, 375/320, 322, 295, 300, 302, 340, 298; 455/20, 455/112, 131, 190.1, 313, 315, 323, 324, 455/118
See application file for complete search history.

(56) References Cited

U.S. PATENT DOCUMENTS

| | | | |
|---|---|---|---|
| 2,057,613 A | 10/1936 | Gardner | 250/8 |
| 2,241,078 A | 5/1941 | Vreeland | 179/15 |
| 2,270,385 A | 1/1942 | Skillman | 179/15 |
| 2,283,575 A | 5/1942 | Roberts | 250/6 |
| 2,358,152 A | 9/1944 | Earp | 179/171.5 |
| 2,410,350 A | 10/1946 | Labin et al. | 179/15 |
| 2,451,430 A | 10/1948 | Barone | 250/8 |
| 2,462,069 A | 2/1949 | Chatterjea et al. | 250/17 |
| 2,462,181 A | 2/1949 | Grosselfinger | 250/17 |
| 2,472,798 A | 6/1949 | Fredendall | 178/44 |
| 2,497,859 A | 2/1950 | Boughtwood et al. | 250/8 |

(Continued)

FOREIGN PATENT DOCUMENTS

DE 1936252 1/1971

(Continued)

OTHER PUBLICATIONS

English Translation of German Patent Publication No. DE 196 48 915 A1, 10 pages.

(Continued)

*Primary Examiner* — Kevin Kim
(74) *Attorney, Agent, or Firm* — Workman Nydegger

(57) ABSTRACT

A communication system comprising a multi-protocol, multi-bearer sub-system is described herein. The sub-system is a universal platform module that can transmit and receive one or more information signals in one or more protocols using one or more bearer services. In one embodiment, the sub-system may form a portion of a transceiver that is composed of a transmitter and a receiver, and which is a gateway server between a personal area network (PAN) and the global wireless network.

24 Claims, 105 Drawing Sheets

U.S. PATENT DOCUMENTS

| | | | |
|---|---|---|---|
| 2,499,279 A | 2/1950 | Peterson | 332/41 |
| 2,530,824 A | 11/1950 | King | |
| 2,802,208 A | 8/1957 | Hobbs | 343/176 |
| 2,985,875 A | 5/1961 | Grisdale et al. | 343/100 |
| 3,023,309 A | 2/1962 | Foulkes | 250/17 |
| 3,069,679 A | 12/1962 | Sweeney et al. | 343/200 |
| 3,104,393 A | 9/1963 | Vogelman | 343/200 |
| 3,114,106 A | 12/1963 | McManus | 325/56 |
| 3,118,117 A | 1/1964 | King et al. | 332/22 |
| 3,226,643 A | 12/1965 | McNair | 325/40 |
| 3,246,084 A | 4/1966 | Kryter | |
| 3,258,694 A | 6/1966 | Shepherd | 325/145 |
| 3,383,598 A | 5/1968 | Sanders | 325/163 |
| 3,384,822 A | 5/1968 | Miyagi | 325/30 |
| 3,454,718 A | 7/1969 | Perreault | 178/66 |
| 3,523,291 A | 8/1970 | Pierret | 340/347 |
| 3,548,342 A | 12/1970 | Maxey | 332/9 |
| 3,555,428 A | 1/1971 | Perreault | 325/320 |
| 3,614,627 A | 10/1971 | Runyan et al. | |
| 3,614,630 A | 10/1971 | Rorden | |
| 3,617,892 A | 11/1971 | Hawley et al. | 325/145 |
| 3,617,898 A | 11/1971 | Janning, Jr. | |
| 3,621,402 A | 11/1971 | Gardner | 328/37 |
| 3,622,885 A | 11/1971 | Kruszynski et al. | 325/40 |
| 3,623,160 A | 11/1971 | Giles et al. | 340/347 DA |
| 3,626,315 A | 12/1971 | Stirling et al. | |
| 3,626,417 A | 12/1971 | Gilbert | 343/203 |
| 3,629,696 A | 12/1971 | Bartelink | 324/57 R |
| 3,641,442 A | 2/1972 | Boucher | |
| 3,643,168 A | 2/1972 | Manicki | |
| 3,662,268 A | 5/1972 | Gans et al. | 325/56 |
| 3,689,841 A | 9/1972 | Bello et al. | 325/39 |
| 3,694,754 A | 9/1972 | Baltzer | |
| 3,702,440 A | 11/1972 | Moore | |
| 3,714,577 A | 1/1973 | Hayes | 325/145 |
| 3,716,730 A | 2/1973 | Cerny, Jr. | 307/295 |
| 3,717,844 A | 2/1973 | Barret et al. | 340/5 R |
| 3,719,903 A | 3/1973 | Goodson | |
| 3,735,048 A | 5/1973 | Tomsa et al. | 179/15 BM |
| 3,736,513 A | 5/1973 | Wilson | |
| 3,737,778 A | 6/1973 | Van Gerwen et al. | |
| 3,739,282 A | 6/1973 | Bruch et al. | |
| 3,740,636 A | 6/1973 | Hogrefe et al. | |
| 3,764,921 A | 10/1973 | Huard | |
| 3,767,984 A | 10/1973 | Shinoda et al. | |
| 3,806,811 A | 4/1974 | Thompson | 325/145 |
| 3,809,821 A | 5/1974 | Melvin | |
| 3,852,530 A | 12/1974 | Shen | |
| 3,868,601 A | 2/1975 | MacAfee | 332/45 |
| 3,940,697 A | 2/1976 | Morgan | |
| 3,949,300 A | 4/1976 | Sadler | 325/31 |
| 3,967,202 A | 6/1976 | Batz | 325/31 |
| 3,980,945 A | 9/1976 | Bickford | 325/30 |
| 3,987,280 A | 10/1976 | Bauer | 235/150.53 |
| 3,991,277 A | 11/1976 | Hirata | 179/15 FD |
| 4,003,002 A | 1/1977 | Snijders et al. | 332/10 |
| 4,004,237 A | 1/1977 | Kratzer | |
| 4,013,966 A | 3/1977 | Campbell | 325/363 |
| 4,016,366 A | 4/1977 | Kurata | |
| 4,017,798 A | 4/1977 | Gordy et al. | 325/42 |
| 4,019,140 A | 4/1977 | Swerdlow | 322/65 |
| 4,020,487 A | 4/1977 | Winter | |
| 4,032,847 A | 6/1977 | Unkauf | 325/323 |
| 4,035,732 A | 7/1977 | Lohrmann | 325/446 |
| 4,045,740 A | 8/1977 | Baker | |
| 4,047,121 A | 9/1977 | Campbell | 331/76 |
| 4,048,598 A | 9/1977 | Knight | |
| 4,051,475 A | 9/1977 | Campbell | 343/180 |
| 4,066,841 A | 1/1978 | Young | 178/66 R |
| 4,066,919 A | 1/1978 | Huntington | 307/353 |
| 4,080,573 A | 3/1978 | Howell | 325/439 |
| 4,081,748 A | 3/1978 | Batz | 325/56 |
| 4,115,737 A | 9/1978 | Hongu et al. | |
| 4,130,765 A | 12/1978 | Arakelian et al. | 307/220 R |
| 4,130,806 A | 12/1978 | Van Gerwen et al. | 325/487 |
| 4,132,952 A | 1/1979 | Hongu et al. | |
| 4,142,155 A | 2/1979 | Adachi | 325/47 |
| 4,143,322 A | 3/1979 | Shimamura | |
| 4,145,659 A | 3/1979 | Wolfram | |
| 4,158,149 A | 6/1979 | Otofuji | |
| 4,170,764 A | 10/1979 | Salz et al. | 332/17 |
| 4,173,164 A | 11/1979 | Adachi et al. | |
| 4,204,171 A | 5/1980 | Sutphin, Jr. | 328/167 |
| 4,210,872 A | 7/1980 | Gregorian | 330/9 |
| 4,220,977 A | 9/1980 | Yamanaka | |
| 4,241,451 A | 12/1980 | Maixner et al. | |
| 4,245,355 A | 1/1981 | Pascoe et al. | 455/326 |
| 4,250,458 A | 2/1981 | Richmond et al. | |
| 4,253,066 A | 2/1981 | Fisher et al. | 329/50 |
| 4,253,067 A | 2/1981 | Caples et al. | 329/110 |
| 4,253,069 A | 2/1981 | Nossek | 330/107 |
| 4,286,283 A | 8/1981 | Clemens | |
| 4,308,614 A | 12/1981 | Fisher et al. | 370/119 |
| 4,313,222 A | 1/1982 | Katthan | |
| 4,320,361 A | 3/1982 | Kikkert | 332/16 R |
| 4,320,536 A | 3/1982 | Dietrich | 455/325 |
| 4,334,324 A | 6/1982 | Hoover | 455/333 |
| 4,346,477 A | 8/1982 | Gordy | 455/257 |
| 4,355,401 A | 10/1982 | Ikoma et al. | 375/5 |
| 4,356,558 A | 10/1982 | Owen et al. | 364/724 |
| 4,360,867 A | 11/1982 | Gonda | 363/158 |
| 4,363,132 A | 12/1982 | Collin | 455/52 |
| 4,363,976 A | 12/1982 | Minor | |
| 4,365,217 A | 12/1982 | Berger et al. | 333/165 |
| 4,369,522 A | 1/1983 | Cerny, Jr. et al. | 455/333 |
| 4,370,572 A | 1/1983 | Cosand et al. | 307/353 |
| 4,380,828 A | 4/1983 | Moon | |
| 4,384,357 A | 5/1983 | deBuda et al. | |
| 4,389,579 A | 6/1983 | Stein | 307/353 |
| 4,392,255 A | 7/1983 | Del Giudice | 455/328 |
| 4,393,352 A | 7/1983 | Volpe et al. | |
| 4,393,395 A | 7/1983 | Hacke et al. | 358/23 |
| 4,405,835 A | 9/1983 | Jansen et al. | |
| 4,409,877 A | 10/1983 | Budelman | |
| 4,430,629 A | 2/1984 | Betzl et al. | 333/165 |
| 4,439,787 A | 3/1984 | Mogi et al. | |
| 4,441,080 A | 4/1984 | Saari | |
| 4,446,438 A | 5/1984 | Chang et al. | 328/127 |
| 4,456,990 A | 6/1984 | Fisher et al. | 370/119 |
| 4,463,320 A | 7/1984 | Dawson | |
| 4,470,145 A | 9/1984 | Williams | |
| 4,472,785 A | 9/1984 | Kasuga | 364/718 |
| 4,479,226 A | 10/1984 | Prabhu et al. | 375/1 |
| 4,481,490 A | 11/1984 | Huntley | 332/41 |
| 4,481,642 A | 11/1984 | Hanson | 375/9 |
| 4,483,017 A | 11/1984 | Hampel et al. | 382/17 |
| 4,484,143 A | 11/1984 | French et al. | 329/50 |
| 4,485,347 A | 11/1984 | Hirasawa et al. | |
| 4,485,488 A | 11/1984 | Houdart | 455/327 |
| 4,488,119 A | 12/1984 | Marshall | |
| 4,504,803 A | 3/1985 | Lee et al. | 332/31 R |
| 4,510,467 A | 4/1985 | Chang et al. | |
| 4,517,519 A | 5/1985 | Mukaiyama | 329/126 |
| 4,517,520 A | 5/1985 | Ogawa | 329/145 |
| 4,518,935 A | 5/1985 | van Roermund | 333/173 |
| 4,521,892 A | 6/1985 | Vance et al. | 375/88 |
| 4,562,414 A | 12/1985 | Linder et al. | |
| 4,563,773 A | 1/1986 | Dixon, Jr. et al. | 455/327 |
| 4,571,738 A | 2/1986 | Vance | |
| 4,577,157 A | 3/1986 | Reed | 329/50 |
| 4,583,239 A | 4/1986 | Vance | 375/94 |
| 4,591,736 A | 5/1986 | Hirao et al. | 307/267 |
| 4,591,930 A | 5/1986 | Baumeister | |
| 4,596,046 A | 6/1986 | Richardson et al. | |
| 4,601,046 A | 7/1986 | Halpern et al. | |
| 4,602,220 A | 7/1986 | Kurihara | 331/19 |
| 4,603,300 A | 7/1986 | Welles, II et al. | 329/50 |
| 4,612,464 A | 9/1986 | Ishikawa et al. | 307/496 |
| 4,612,518 A | 9/1986 | Gans et al. | 332/21 |
| 4,616,191 A | 10/1986 | Galani et al. | 331/4 |
| 4,621,217 A | 11/1986 | Saxe et al. | 315/1 |
| 4,628,517 A | 12/1986 | Schwarz et al. | 375/40 |
| 4,633,510 A | 12/1986 | Suzuki et al. | |
| 4,634,998 A | 1/1987 | Crawford | 331/1 A |
| 4,648,021 A | 3/1987 | Alberkrack | 363/157 |
| 4,651,034 A | 3/1987 | Sato | 307/556 |
| 4,651,210 A | 3/1987 | Olson | |

| | | | | | | |
|---|---|---|---|---|---|---|
| 4,653,117 A | 3/1987 | Heck .................... 455/209 | | 5,010,585 A | 4/1991 | Garcia .................... 455/118 |
| 4,660,164 A | 4/1987 | Leibowitz | | 5,012,245 A | 4/1991 | Scott et al. |
| 4,663,744 A | 5/1987 | Russell et al. | | 5,014,130 A | 5/1991 | Heister et al. |
| 4,675,882 A | 6/1987 | Lillie et al. .................... 375/80 | | 5,014,304 A | 5/1991 | Nicollini et al. ............ 379/399 |
| 4,688,237 A | 8/1987 | Brault | | 5,015,963 A | 5/1991 | Sutton .................... 329/361 |
| 4,688,253 A | 8/1987 | Gumm ........................ 381/7 | | 5,016,242 A | 5/1991 | Tang |
| 4,716,376 A | 12/1987 | Daudelin .................... 329/107 | | 5,017,924 A | 5/1991 | Guiberteau et al. .......... 342/195 |
| 4,716,388 A | 12/1987 | Jacobs .................... 333/173 | | 5,020,149 A | 5/1991 | Hemmie .................... 455/325 |
| 4,718,113 A | 1/1988 | Rother et al. .................... 455/209 | | 5,020,154 A | 5/1991 | Zierhut .................... 455/608 |
| 4,726,041 A | 2/1988 | Prohaska et al. .................... 375/91 | | 5,020,745 A | 6/1991 | Stetson, Jr. |
| 4,733,403 A | 3/1988 | Simone .................... 375/103 | | 5,023,572 A | 6/1991 | Caldwell et al. |
| 4,734,591 A | 3/1988 | Ichitsubo .................... 307/219.1 | | 5,047,860 A | 9/1991 | Rogalski |
| 4,737,969 A | 4/1988 | Steel et al. .................... 375/67 | | 5,052,050 A | 9/1991 | Collier et al. .................... 455/296 |
| 4,740,675 A | 4/1988 | Brosnan et al. | | 5,058,107 A | 10/1991 | Stone et al. |
| 4,740,792 A | 4/1988 | Sagey et al. | | 5,062,122 A | 10/1991 | Pham et al. |
| 4,743,858 A | 5/1988 | Everard .................... 330/10 | | 5,063,387 A | 11/1991 | Mower |
| 4,745,463 A | 5/1988 | Lu .................... 358/23 | | 5,065,409 A | 11/1991 | Hughes et al. .................... 375/91 |
| 4,751,468 A | 6/1988 | Agoston .................... 328/133 | | 5,083,050 A | 1/1992 | Vasile .................... 307/529 |
| 4,757,538 A | 7/1988 | Zink .................... 381/7 | | 5,091,921 A | 2/1992 | Minami .................... 375/88 |
| 4,761,798 A | 8/1988 | Griswold, Jr. et al. | | 5,095,533 A | 3/1992 | Loper et al. .................... 455/245 |
| 4,768,187 A | 8/1988 | Marshall .................... 370/69.1 | | 5,095,536 A | 3/1992 | Loper .................... 455/324 |
| 4,769,612 A | 9/1988 | Tamakoshi et al. .......... 328/167 | | 5,111,152 A | 5/1992 | Makino .................... 329/300 |
| 4,771,265 A | 9/1988 | Okui et al. | | 5,113,094 A | 5/1992 | Grace et al. .................... 307/529 |
| 4,772,853 A | 9/1988 | Hart | | 5,113,129 A | 5/1992 | Hughes .................... 323/316 |
| 4,785,463 A | 11/1988 | Janc et al. .................... 375/1 | | 5,115,409 A | 5/1992 | Stepp .................... 364/841 |
| 4,789,837 A | 12/1988 | Ridgers | | 5,122,765 A | 6/1992 | Pataut .................... 332/105 |
| 4,791,584 A | 12/1988 | Greivenkamp, Jr. .......... 364/525 | | 5,124,592 A | 6/1992 | Hagino .................... 307/520 |
| 4,801,823 A | 1/1989 | Yokoyama .................... 307/353 | | 5,126,682 A | 6/1992 | Weinberg et al. ............ 329/304 |
| 4,806,790 A | 2/1989 | Sone .................... 307/353 | | 5,131,014 A | 7/1992 | White |
| 4,810,904 A | 3/1989 | Crawford .................... 307/353 | | 5,136,267 A | 8/1992 | Cabot .................... 333/174 |
| 4,810,976 A | 3/1989 | Cowley et al. .......... 331/117 R | | 5,140,699 A | 8/1992 | Kozak |
| 4,811,362 A | 3/1989 | Yester, Jr. et al. .................... 375/75 | | 5,140,705 A | 8/1992 | Kosuga .................... 455/318 |
| 4,811,422 A | 3/1989 | Kahn | | 5,150,124 A | 9/1992 | Moore et al. .................... 342/68 |
| 4,814,649 A | 3/1989 | Young | | 5,151,661 A | 9/1992 | Caldwell et al. .................... 328/14 |
| 4,816,704 A | 3/1989 | Fiori, Jr. .................... 307/519 | | 5,157,687 A | 10/1992 | Tymes .................... 375/1 |
| 4,819,252 A | 4/1989 | Christopher .................... 375/122 | | 5,159,710 A | 10/1992 | Cusdin .................... 455/304 |
| 4,833,445 A | 5/1989 | Buchele .................... 341/118 | | 5,164,985 A | 11/1992 | Nysen et al. |
| 4,841,265 A | 6/1989 | Watanabe et al. ............ 333/194 | | 5,170,414 A | 12/1992 | Silvian .................... 375/59 |
| 4,845,389 A | 7/1989 | Pyndiah et al. | | 5,172,019 A | 12/1992 | Naylor et al. |
| 4,855,894 A | 8/1989 | Asahi et al. .................... 363/157 | | 5,172,070 A | 12/1992 | Hiraiwa et al. .................... 329/304 |
| 4,857,928 A | 8/1989 | Gailus et al. | | 5,179,731 A | 1/1993 | Tränkle et al. |
| 4,862,121 A | 8/1989 | Hochschild et al. .......... 333/173 | | 5,191,459 A | 3/1993 | Thompson et al. .......... 359/133 |
| 4,866,441 A | 9/1989 | Conway et al. | | 5,196,806 A | 3/1993 | Ichihara |
| 4,868,654 A | 9/1989 | Juri et al. .................... 358/133 | | 5,204,642 A | 4/1993 | Asghar et al. .................... 331/135 |
| 4,870,659 A | 9/1989 | Oishi et al. .................... 375/82 | | 5,212,827 A | 5/1993 | Meszko et al. .................... 455/219 |
| 4,871,987 A | 10/1989 | Kawase .................... 332/100 | | 5,214,787 A | 5/1993 | Karkota, Jr. .................... 455/3.2 |
| 4,873,492 A | 10/1989 | Myer | | 5,218,562 A | 6/1993 | Basehore et al. |
| 4,885,587 A | 12/1989 | Wiegand et al. .................... 42/14 | | 5,220,583 A | 6/1993 | Solomon .................... 375/82 |
| 4,885,671 A | 12/1989 | Peil | | 5,220,680 A | 6/1993 | Lee .................... 455/102 |
| 4,885,756 A | 12/1989 | Fontanes et al. .................... 375/82 | | 5,222,079 A | 6/1993 | Rasor |
| 4,888,557 A | 12/1989 | Puckette, IV et al. ........ 329/341 | | 5,222,144 A | 6/1993 | Whikehart .................... 381/15 |
| 4,890,302 A | 12/1989 | Muilwijk .................... 375/80 | | 5,222,250 A | 6/1993 | Cleveland et al. |
| 4,893,316 A | 1/1990 | Janc et al. .................... 375/44 | | 5,230,097 A | 7/1993 | Currie et al. .................... 455/226.1 |
| 4,893,341 A | 1/1990 | Gehring .................... 381/7 | | 5,239,496 A | 8/1993 | Vancraeynest |
| 4,894,766 A | 1/1990 | De Agro .................... 363/159 | | 5,239,686 A | 8/1993 | Downey .................... 455/78 |
| 4,896,152 A | 1/1990 | Tiemann .................... 340/853 | | 5,239,687 A | 8/1993 | Chen |
| 4,902,979 A | 2/1990 | Puckette, IV .................... 329/343 | | 5,241,561 A | 8/1993 | Barnard .................... 375/1 |
| 4,908,579 A | 3/1990 | Tawfik et al. .................... 328/167 | | 5,249,203 A | 9/1993 | Loper .................... 375/97 |
| 4,910,752 A | 3/1990 | Yester, Jr. et al. .................... 375/75 | | 5,251,218 A | 10/1993 | Stone et al. .................... 370/120 |
| 4,914,405 A | 4/1990 | Wells .................... 331/25 | | 5,251,232 A | 10/1993 | Nonami .................... 375/5 |
| 4,920,510 A | 4/1990 | Senderowicz et al. ........ 364/825 | | 5,260,970 A | 11/1993 | Henry et al. .................... 375/10 |
| 4,922,452 A | 5/1990 | Larsen et al. .................... 365/45 | | 5,260,973 A | 11/1993 | Watanabe |
| 4,931,716 A | 6/1990 | Jovanovic et al. | | 5,263,194 A | 11/1993 | Ragan .................... 455/316 |
| 4,931,921 A | 6/1990 | Anderson .................... 363/163 | | 5,263,196 A | 11/1993 | Jasper .................... 455/324 |
| 4,943,974 A | 7/1990 | Motamedi .................... 375/1 | | 5,263,198 A | 11/1993 | Geddes et al. |
| 4,944,025 A | 7/1990 | Gehring et al. .................... 455/207 | | 5,267,023 A | 11/1993 | Kawasaki .................... 358/23 |
| 4,955,079 A | 9/1990 | Connerney et al. .......... 455/325 | | 5,278,826 A | 1/1994 | Murphy et al. .................... 370/76 |
| 4,965,467 A | 10/1990 | Bilterijst .................... 307/352 | | 5,282,023 A | 1/1994 | Scarpa .................... 358/36 |
| 4,967,160 A | 10/1990 | Quievy et al. .................... 328/16 | | 5,282,222 A | 1/1994 | Fattouche et al. |
| 4,968,958 A | 11/1990 | Hoare | | 5,287,516 A | 2/1994 | Schaub .................... 375/88 |
| 4,970,703 A | 11/1990 | Hariharan et al. ............ 367/138 | | 5,293,398 A | 3/1994 | Hamao et al. .................... 375/1 |
| 4,972,436 A | 11/1990 | Halim et al. | | 5,303,417 A | 4/1994 | Laws .................... 455/314 |
| 4,982,353 A | 1/1991 | Jacob et al. .................... 364/724.1 | | 5,307,517 A | 4/1994 | Rich .................... 455/306 |
| 4,984,077 A | 1/1991 | Uchida .................... 358/140 | | 5,315,583 A | 5/1994 | Murphy et al. .................... 370/18 |
| 4,995,055 A | 2/1991 | Weinberger et al. .............. 375/5 | | 5,319,799 A | 6/1994 | Morita .................... 455/78 |
| 5,003,621 A | 3/1991 | Gailus .................... 455/209 | | 5,321,852 A | 6/1994 | Seong .................... 455/182.1 |
| 5,005,169 A | 4/1991 | Bronder et al. .................... 370/76 | | 5,325,204 A | 6/1994 | Scarpa .................... 348/607 |
| 5,006,810 A | 4/1991 | Popescu .................... 328/167 | | 5,337,014 A | 8/1994 | Najle et al. .................... 324/613 |
| 5,006,854 A | 4/1991 | White et al. | | 5,339,054 A | 8/1994 | Taguchi .................... 332/100 |

| Patent | Date | Inventor(s) | Class |
|---|---|---|---|
| 5,339,395 A | 8/1994 | Pickett et al. | |
| 5,339,459 A * | 8/1994 | Schiltz et al. | 455/333 |
| 5,345,239 A | 9/1994 | Madni et al. | |
| 5,353,306 A | 10/1994 | Yamamoto | 375/14 |
| 5,355,114 A | 10/1994 | Sutterlin et al. | 340/310 A |
| 5,361,408 A | 11/1994 | Watanabe et al. | 455/324 |
| 5,369,404 A | 11/1994 | Galton | 341/143 |
| 5,369,789 A | 11/1994 | Kosugi et al. | |
| 5,369,800 A | 11/1994 | Takagi et al. | 455/59 |
| 5,375,146 A | 12/1994 | Chalmers | 375/103 |
| 5,379,040 A | 1/1995 | Mizomoto et al. | 341/143 |
| 5,379,141 A | 1/1995 | Thompson et al. | 359/125 |
| 5,388,063 A | 2/1995 | Takatori et al. | 364/724.17 |
| 5,389,839 A | 2/1995 | Heck | |
| 5,390,215 A | 2/1995 | Antia et al. | |
| 5,390,364 A | 2/1995 | Webster et al. | 455/52.3 |
| 5,400,084 A | 3/1995 | Scarpa | 348/624 |
| 5,400,363 A | 3/1995 | Waugh et al. | |
| 5,404,127 A | 4/1995 | Lee et al. | 340/310.02 |
| 5,410,195 A | 4/1995 | Ichihara | |
| 5,410,270 A | 4/1995 | Rybicki et al. | |
| 5,410,541 A | 4/1995 | Hotto | 370/76 |
| 5,410,743 A | 4/1995 | Seely et al. | 455/326 |
| 5,412,352 A | 5/1995 | Graham | 332/103 |
| 5,416,449 A | 5/1995 | Joshi | |
| 5,416,803 A | 5/1995 | Janer | 375/324 |
| 5,422,909 A | 6/1995 | Love et al. | |
| 5,422,913 A | 6/1995 | Wilkinson | 375/347 |
| 5,423,082 A | 6/1995 | Cygan et al. | 455/126 |
| 5,428,638 A | 6/1995 | Cioffi et al. | 375/224 |
| 5,428,640 A | 6/1995 | Townley | 375/257 |
| 5,434,546 A | 7/1995 | Palmer | 332/151 |
| 5,438,329 A | 8/1995 | Gastouniotis et al. | |
| 5,438,692 A | 8/1995 | Mohindra | 455/324 |
| 5,440,311 A | 8/1995 | Gallagher et al. | |
| 5,444,415 A | 8/1995 | Dent et al. | 329/302 |
| 5,444,416 A | 8/1995 | Ishikawa et al. | 329/341 |
| 5,444,865 A | 8/1995 | Heck et al. | 455/86 |
| 5,446,421 A | 8/1995 | Kechkaylo | 332/100 |
| 5,446,422 A | 8/1995 | Mattila et al. | 332/103 |
| 5,448,602 A | 9/1995 | Ohmori et al. | 375/347 |
| 5,449,939 A | 9/1995 | Horiguchi et al. | |
| 5,451,899 A | 9/1995 | Lawton | 329/302 |
| 5,454,007 A | 9/1995 | Dutta | 375/322 |
| 5,454,009 A | 9/1995 | Fruit et al. | 372/202 |
| 5,461,646 A | 10/1995 | Anvari | |
| 5,463,356 A | 10/1995 | Palmer | 332/117 |
| 5,463,357 A | 10/1995 | Hobden | 332/151 |
| 5,465,071 A | 11/1995 | Kobayashi et al. | 329/315 |
| 5,465,410 A | 11/1995 | Hiben et al. | 455/266 |
| 5,465,415 A | 11/1995 | Bien | 455/326 |
| 5,465,418 A | 11/1995 | Zhou et al. | 455/332 |
| 5,471,162 A | 11/1995 | McEwan | 327/92 |
| 5,471,665 A | 11/1995 | Pace et al. | |
| 5,479,120 A | 12/1995 | McEwan | 327/91 |
| 5,479,447 A | 12/1995 | Chow et al. | 375/260 |
| 5,481,570 A | 1/1996 | Winters | |
| 5,483,193 A | 1/1996 | Kennedy et al. | 329/300 |
| 5,483,245 A | 1/1996 | Ruinet | |
| 5,483,549 A | 1/1996 | Weinberg et al. | 375/200 |
| 5,483,600 A | 1/1996 | Werrbach | |
| 5,483,691 A | 1/1996 | Heck et al. | 455/234.2 |
| 5,483,695 A | 1/1996 | Pardoen | |
| 5,490,173 A | 2/1996 | Whikehart et al. | 375/316 |
| 5,490,176 A | 2/1996 | Peltier | |
| 5,493,581 A | 2/1996 | Young et al. | 375/350 |
| 5,493,721 A | 2/1996 | Reis | 455/339 |
| 5,495,200 A | 2/1996 | Kwan et al. | 327/554 |
| 5,495,202 A | 2/1996 | Hsu | 327/113 |
| 5,495,500 A | 2/1996 | Jovanovich et al. | 375/206 |
| 5,499,267 A | 3/1996 | Ohe et al. | 375/206 |
| 5,500,758 A | 3/1996 | Thompson et al. | 359/189 |
| 5,512,946 A | 4/1996 | Murata et al. | |
| 5,513,389 A | 4/1996 | Reeser et al. | 455/311 |
| 5,515,014 A | 5/1996 | Troutman | 332/178 |
| 5,517,688 A | 5/1996 | Fajen et al. | 455/333 |
| 5,519,890 A | 5/1996 | Pinckley | 455/307 |
| 5,523,719 A | 6/1996 | Longo et al. | 327/557 |
| 5,523,726 A | 6/1996 | Kroeger et al. | 332/103 |
| 5,523,760 A | 6/1996 | McEwan | 342/89 |
| 5,528,068 A | 6/1996 | Ohmi | |
| 5,535,402 A | 7/1996 | Leibowitz et al. | |
| 5,539,770 A | 7/1996 | Ishigaki | 375/206 |
| 5,551,076 A | 8/1996 | Bonn | |
| 5,552,789 A | 9/1996 | Schuermann | |
| 5,555,453 A | 9/1996 | Kajimoto et al. | 455/266 |
| 5,557,641 A * | 9/1996 | Weinberg | 375/295 |
| 5,557,642 A * | 9/1996 | Williams | 375/316 |
| 5,559,468 A | 9/1996 | Gailus et al. | |
| 5,559,809 A | 9/1996 | Jeon et al. | |
| 5,563,550 A | 10/1996 | Toth | 329/347 |
| 5,564,097 A | 10/1996 | Swanke | |
| 5,574,755 A | 11/1996 | Persico | 375/295 |
| 5,579,341 A | 11/1996 | Smith et al. | 375/267 |
| 5,579,347 A | 11/1996 | Lindquist et al. | 375/346 |
| 5,584,068 A | 12/1996 | Mohindra | 455/324 |
| 5,589,793 A | 12/1996 | Kassapian | |
| 5,592,131 A | 1/1997 | Labreche et al. | 332/103 |
| 5,600,680 A | 2/1997 | Mishima et al. | |
| 5,602,847 A | 2/1997 | Pagano et al. | 370/484 |
| 5,602,868 A | 2/1997 | Wilson | 375/219 |
| 5,604,592 A | 2/1997 | Kotidis et al. | 356/357 |
| 5,604,732 A | 2/1997 | Kim et al. | 370/342 |
| 5,606,731 A | 2/1997 | Pace et al. | |
| 5,608,531 A | 3/1997 | Honda et al. | 386/1 |
| 5,610,946 A | 3/1997 | Tanaka et al. | 375/269 |
| RE35,494 E | 4/1997 | Nicollini | 327/554 |
| 5,617,451 A | 4/1997 | Mimura et al. | 375/340 |
| 5,619,538 A | 4/1997 | Sempel et al. | 375/328 |
| 5,621,455 A | 4/1997 | Rogers et al. | 348/8 |
| 5,628,055 A | 5/1997 | Stein | 455/89 |
| 5,630,227 A | 5/1997 | Bella et al. | 455/324 |
| 5,633,610 A | 5/1997 | Maekawa et al. | |
| 5,633,815 A | 5/1997 | Young | |
| 5,634,207 A | 5/1997 | Yamaji et al. | |
| 5,636,140 A | 6/1997 | Lee et al. | |
| 5,638,396 A | 6/1997 | Klimek | 372/92 |
| 5,640,415 A | 6/1997 | Pandula | 375/202 |
| 5,640,424 A | 6/1997 | Banavong et al. | 375/316 |
| 5,640,428 A | 6/1997 | Abe et al. | 375/334 |
| 5,640,698 A | 6/1997 | Shen et al. | 455/323 |
| 5,642,071 A | 6/1997 | Sevenhans et al. | |
| 5,648,985 A | 7/1997 | Bjerede et al. | 375/219 |
| 5,650,785 A | 7/1997 | Rodal | 342/357 |
| 5,659,372 A | 8/1997 | Patel et al. | |
| 5,661,424 A | 8/1997 | Tang | 327/105 |
| 5,663,878 A | 9/1997 | Walker | 363/159 |
| 5,663,986 A | 9/1997 | Striffler | 375/260 |
| 5,668,836 A | 9/1997 | Smith et al. | 375/316 |
| 5,675,392 A | 10/1997 | Nayebi et al. | 348/584 |
| 5,678,220 A | 10/1997 | Fournier | 455/302 |
| 5,678,226 A | 10/1997 | Li et al. | |
| 5,680,078 A | 10/1997 | Ariie | 332/178 |
| 5,680,418 A | 10/1997 | Croft et al. | 375/346 |
| 5,682,099 A | 10/1997 | Thompson et al. | |
| 5,689,413 A | 11/1997 | Jaramillo et al. | 363/146 |
| 5,691,629 A | 11/1997 | Belnap | |
| 5,694,096 A | 12/1997 | Ushiroku et al. | 333/195 |
| 5,697,074 A | 12/1997 | Makikallio et al. | |
| 5,699,006 A | 12/1997 | Zele et al. | 327/341 |
| 5,703,584 A | 12/1997 | Hill | |
| 5,705,949 A | 1/1998 | Alelyunas et al. | 329/304 |
| 5,705,955 A | 1/1998 | Freeburg et al. | 331/14 |
| 5,710,992 A | 1/1998 | Sawada et al. | |
| 5,710,998 A | 1/1998 | Opas | 455/324 |
| 5,714,910 A | 2/1998 | Skoczen et al. | 331/3 |
| 5,715,281 A | 2/1998 | Bly et al. | 375/344 |
| 5,721,514 A | 2/1998 | Crockett et al. | 331/3 |
| 5,724,002 A | 3/1998 | Hulick | 329/361 |
| 5,724,041 A | 3/1998 | Inoue et al. | |
| 5,724,653 A | 3/1998 | Baker et al. | 455/296 |
| 5,729,577 A | 3/1998 | Chen | 375/334 |
| 5,729,829 A | 3/1998 | Talwar et al. | 455/63 |
| 5,732,333 A | 3/1998 | Cox et al. | 455/126 |
| 5,734,683 A | 3/1998 | Hulkko et al. | |
| 5,736,895 A | 4/1998 | Yu et al. | 327/554 |
| 5,737,035 A | 4/1998 | Rotzoll | 348/725 |
| 5,742,189 A | 4/1998 | Yoshida et al. | 327/113 |

| Patent No. | Kind | Date | Inventor | Class |
|---|---|---|---|---|
| 5,745,846 | A | 4/1998 | Myer et al. | |
| 5,748,683 | A | 5/1998 | Smith et al. | 375/347 |
| 5,751,154 | A | 5/1998 | Tsugai | |
| 5,757,858 | A | 5/1998 | Black et al. | |
| 5,757,864 | A * | 5/1998 | Petranovich et al. | 375/344 |
| 5,757,870 | A | 5/1998 | Miya et al. | 375/367 |
| RE35,829 | E | 6/1998 | Sanderford, Jr. | 375/200 |
| 5,760,629 | A | 6/1998 | Urabe et al. | |
| 5,760,632 | A | 6/1998 | Kawakami et al. | |
| 5,760,645 | A | 6/1998 | Comte et al. | 329/304 |
| 5,764,087 | A | 6/1998 | Clark | 327/105 |
| 5,767,726 | A | 6/1998 | Wang | 327/356 |
| 5,768,118 | A | 6/1998 | Faulk et al. | 363/72 |
| 5,768,323 | A | 6/1998 | Kroeger et al. | 375/355 |
| 5,770,985 | A | 6/1998 | Ushiroku et al. | 333/193 |
| 5,771,442 | A | 6/1998 | Wang et al. | 455/93 |
| 5,777,692 | A | 7/1998 | Ghosh | 348/725 |
| 5,777,771 | A | 7/1998 | Smith | 359/180 |
| 5,778,022 | A | 7/1998 | Walley | 375/206 |
| 5,781,600 | A | 7/1998 | Reeve et al. | |
| 5,784,689 | A | 7/1998 | Kobayashi | |
| 5,786,844 | A | 7/1998 | Rogers et al. | 348/6 |
| 5,787,125 | A | 7/1998 | Mittel | |
| 5,790,587 | A | 8/1998 | Smith et al. | |
| 5,793,801 | A | 8/1998 | Fertner | 375/219 |
| 5,793,817 | A | 8/1998 | Wilson | |
| 5,793,818 | A | 8/1998 | Claydon et al. | 375/326 |
| 5,801,654 | A | 9/1998 | Traylor | 341/144 |
| 5,802,463 | A | 9/1998 | Zuckerman | 455/208 |
| 5,805,460 | A | 9/1998 | Greene et al. | |
| 5,809,060 | A | 9/1998 | Cafarella et al. | 375/206 |
| 5,812,546 | A | 9/1998 | Zhou et al. | 370/342 |
| 5,818,582 | A | 10/1998 | Fernandez et al. | 356/318 |
| 5,818,869 | A | 10/1998 | Miya et al. | 375/206 |
| 5,825,254 | A | 10/1998 | Lee | 331/25 |
| 5,825,257 | A | 10/1998 | Klymyshyn et al. | |
| 5,834,979 | A | 11/1998 | Yatsuka | |
| 5,834,985 | A | 11/1998 | Sundegård | 332/100 |
| 5,834,987 | A | 11/1998 | Dent | |
| 5,841,324 | A | 11/1998 | Williams | 331/17 |
| 5,841,811 | A | 11/1998 | Song | 375/235 |
| 5,844,449 | A | 12/1998 | Abeno et al. | 332/105 |
| 5,844,868 | A * | 12/1998 | Takahashi et al. | 369/6 |
| 5,847,594 | A | 12/1998 | Mizuno | |
| 5,859,878 | A | 1/1999 | Phillips et al. | 375/316 |
| 5,864,754 | A | 1/1999 | Hotto | 455/280 |
| 5,870,670 | A | 2/1999 | Ripley et al. | |
| 5,872,446 | A | 2/1999 | Cranford, Jr. et al. | 323/315 |
| 5,878,088 | A | 3/1999 | Knutson et al. | |
| 5,881,375 | A | 3/1999 | Bonds | 455/118 |
| 5,883,548 | A | 3/1999 | Assard et al. | 329/306 |
| 5,884,154 | A | 3/1999 | Sano et al. | |
| 5,886,547 | A | 3/1999 | Durec et al. | |
| 5,887,001 | A | 3/1999 | Russell | |
| 5,892,380 | A | 4/1999 | Quist | 327/172 |
| 5,894,239 | A | 4/1999 | Bonaccio et al. | 327/176 |
| 5,894,496 | A | 4/1999 | Jones | 455/126 |
| 5,896,304 | A | 4/1999 | Tiemann et al. | |
| 5,896,347 | A | 4/1999 | Tomita et al. | |
| 5,896,562 | A | 4/1999 | Heinonen | 455/76 |
| 5,898,912 | A | 4/1999 | Heck et al. | |
| 5,900,746 | A | 5/1999 | Sheahan | |
| 5,900,747 | A | 5/1999 | Brauns | 327/9 |
| 5,901,054 | A | 5/1999 | Leu et al. | 363/41 |
| 5,901,187 | A | 5/1999 | Iinuma | 375/347 |
| 5,901,344 | A | 5/1999 | Opas | 455/76 |
| 5,901,347 | A | 5/1999 | Chambers et al. | 455/234.1 |
| 5,901,348 | A | 5/1999 | Bang et al. | 455/254 |
| 5,901,349 | A | 5/1999 | Guegnaud et al. | 455/302 |
| 5,903,178 | A | 5/1999 | Miyatsuji et al. | 327/308 |
| 5,903,187 | A | 5/1999 | Claverie et al. | 329/342 |
| 5,903,196 | A | 5/1999 | Salvi et al. | 331/16 |
| 5,903,421 | A | 5/1999 | Furutani et al. | 361/58 |
| 5,903,553 | A | 5/1999 | Sakamoto et al. | 370/338 |
| 5,903,595 | A | 5/1999 | Suzuki | 375/207 |
| 5,903,609 | A | 5/1999 | Kool et al. | 375/261 |
| 5,903,827 | A | 5/1999 | Kennan et al. | 455/326 |
| 5,903,854 | A | 5/1999 | Abe et al. | 455/575 |
| 5,905,433 | A | 5/1999 | Wortham | |
| 5,905,449 | A | 5/1999 | Tsubouchi et al. | 340/925.69 |
| 5,907,149 | A | 5/1999 | Marckini | 235/487 |
| 5,907,197 | A | 5/1999 | Faulk | 307/119 |
| 5,909,447 | A | 6/1999 | Cox et al. | 370/508 |
| 5,909,460 | A | 6/1999 | Dent | |
| 5,911,116 | A | 6/1999 | Nosswitz | 455/83 |
| 5,911,123 | A | 6/1999 | Shaffer et al. | 455/554 |
| 5,914,622 | A | 6/1999 | Inoue | 327/172 |
| 5,915,278 | A | 6/1999 | Mallick | 73/658 |
| 5,918,167 | A | 6/1999 | Tiller et al. | |
| 5,920,199 | A | 7/1999 | Sauer | 324/678 |
| 5,926,065 | A | 7/1999 | Wakai et al. | 329/304 |
| 5,926,513 | A | 7/1999 | Suominen et al. | |
| 5,933,467 | A | 8/1999 | Sehier et al. | 375/350 |
| 5,937,013 | A | 8/1999 | Lam et al. | |
| 5,943,370 | A | 8/1999 | Smith | 375/334 |
| 5,945,660 | A | 8/1999 | Nakasuji et al. | 235/462.46 |
| 5,949,827 | A | 9/1999 | DeLuca et al. | |
| 5,952,895 | A | 9/1999 | McCune, Jr. et al. | 332/128 |
| 5,953,642 | A | 9/1999 | Feldtkeller et al. | 455/195.1 |
| 5,955,992 | A | 9/1999 | Shattil | |
| 5,959,850 | A | 9/1999 | Lim | 363/17 |
| 5,960,033 | A | 9/1999 | Shibano et al. | 375/207 |
| 5,970,053 | A | 10/1999 | Schick et al. | |
| 5,973,568 | A | 10/1999 | Shapiro et al. | |
| 5,973,570 | A | 10/1999 | Salvi et al. | |
| 5,982,315 | A * | 11/1999 | Bazarjani et al. | 341/143 |
| 5,982,329 | A | 11/1999 | Pittman et al. | |
| 5,982,810 | A | 11/1999 | Nishimori | |
| 5,986,600 | A | 11/1999 | McEwan | |
| 5,994,689 | A | 11/1999 | Charrier | |
| 5,995,030 | A | 11/1999 | Cabler | |
| 5,999,561 | A | 12/1999 | Naden et al. | |
| 6,005,506 | A * | 12/1999 | Bazarjani et al. | 341/143 |
| 6,005,903 | A | 12/1999 | Mendelovicz | |
| 6,009,317 | A * | 12/1999 | Wynn | 455/296 |
| 6,011,435 | A | 1/2000 | Takeyabu et al. | |
| 6,014,176 | A | 1/2000 | Nayebi et al. | |
| 6,014,551 | A | 1/2000 | Pesola et al. | |
| 6,018,262 | A | 1/2000 | Noro et al. | |
| 6,018,553 | A | 1/2000 | Sanielevici et al. | |
| 6,026,286 | A | 2/2000 | Long | |
| 6,028,887 | A | 2/2000 | Harrison et al. | 375/206 |
| 6,031,217 | A | 2/2000 | Aswell et al. | |
| 6,034,566 | A | 3/2000 | Ohe | |
| 6,038,265 | A | 3/2000 | Pan et al. | |
| 6,041,073 | A | 3/2000 | Davidovici et al. | 375/148 |
| 6,044,332 | A | 3/2000 | Korsah et al. | |
| 6,047,026 | A | 4/2000 | Chao et al. | |
| 6,049,573 | A | 4/2000 | Song | |
| 6,049,706 | A | 4/2000 | Cook et al. | 455/313 |
| 6,054,889 | A | 4/2000 | Kobayashi | 327/357 |
| 6,057,714 | A | 5/2000 | Andrys et al. | |
| 6,061,551 | A | 5/2000 | Sorrells et al. | 455/118 |
| 6,061,555 | A | 5/2000 | Bultman et al. | 455/313 |
| 6,064,054 | A | 5/2000 | Waczynski et al. | |
| 6,067,329 | A | 5/2000 | Kato et al. | |
| 6,072,996 | A | 6/2000 | Smith | |
| 6,073,001 | A | 6/2000 | Sokoler | |
| 6,076,015 | A | 6/2000 | Hartley et al. | |
| 6,078,630 | A | 6/2000 | Prasanna | |
| 6,081,691 | A | 6/2000 | Renard et al. | 455/12.1 |
| 6,084,465 | A | 7/2000 | Dasgupta | |
| 6,084,922 | A | 7/2000 | Zhou et al. | 375/316 |
| 6,085,073 | A | 7/2000 | Palermo et al. | |
| 6,088,348 | A | 7/2000 | Bell, III et al. | |
| 6,091,289 | A | 7/2000 | Song et al. | |
| 6,091,939 | A | 7/2000 | Banh | 455/102 |
| 6,091,940 | A | 7/2000 | Sorrells et al. | 455/118 |
| 6,091,941 | A | 7/2000 | Moriyama et al. | 455/126 |
| 6,094,084 | A | 7/2000 | Abou-Allam et al. | |
| 6,097,762 | A | 8/2000 | Suzuki et al. | |
| 6,098,046 | A | 8/2000 | Cooper et al. | |
| 6,098,886 | A | 8/2000 | Swift et al. | 235/472.01 |
| 6,112,061 | A | 8/2000 | Rapeli | |
| 6,121,819 | A | 9/2000 | Traylor | 327/359 |
| 6,125,271 | A | 9/2000 | Rowland et al. | 455/313 |
| 6,128,746 | A | 10/2000 | Clark et al. | |
| 6,137,321 | A | 10/2000 | Bazarjani | |

| | | | |
|---|---|---|---|
| 6,144,236 A | 11/2000 | Vice et al. ............... 327/113 |
| 6,144,331 A | 11/2000 | Jiang |
| 6,144,846 A | 11/2000 | Durec ........................ 455/323 |
| 6,147,340 A | 11/2000 | Levy ......................... 250/214 R |
| 6,147,763 A | 11/2000 | Steinlechner ................ 356/484 |
| 6,150,890 A | 11/2000 | Damgaard et al. ............ 331/14 |
| 6,151,354 A * | 11/2000 | Abbey ........................ 375/211 |
| 6,160,280 A | 12/2000 | Bonn et al. |
| 6,167,247 A | 12/2000 | Kannell et al. |
| 6,169,733 B1 * | 1/2001 | Lee ............................ 370/342 |
| 6,175,728 B1 | 1/2001 | Mitama ....................... 455/323 |
| 6,178,319 B1 | 1/2001 | Kashima |
| 6,182,011 B1 | 1/2001 | Ward |
| 6,188,221 B1 | 2/2001 | Van de Kop et al. |
| 6,192,225 B1 | 2/2001 | Arpaia et al. |
| 6,195,539 B1 | 2/2001 | Galal et al. |
| 6,198,941 B1 | 3/2001 | Aho et al. |
| 6,204,789 B1 | 3/2001 | Nagata |
| 6,208,636 B1 | 3/2001 | Tawil et al. |
| 6,208,875 B1 | 3/2001 | Damgaard et al. |
| RE37,138 E | 4/2001 | Dent |
| 6,211,718 B1 | 4/2001 | Souetinov |
| 6,212,369 B1 | 4/2001 | Avasarala |
| 6,215,475 B1 | 4/2001 | Meyerson et al. ............ 345/173 |
| 6,215,828 B1 | 4/2001 | Signell et al. |
| 6,215,830 B1 | 4/2001 | Temerinac et al. |
| 6,223,061 B1 | 4/2001 | Dacus et al. |
| 6,225,848 B1 | 5/2001 | Tilley et al. |
| 6,230,000 B1 | 5/2001 | Tayloe |
| 6,246,695 B1 | 6/2001 | Seazholtz et al. |
| 6,259,293 B1 | 7/2001 | Hayase et al. |
| 6,266,518 B1 | 7/2001 | Sorrells et al. ................ 455/118 |
| 6,275,542 B1 | 8/2001 | Katayama et al. |
| 6,298,065 B1 | 10/2001 | Dombkowski et al. |
| 6,307,894 B2 | 10/2001 | Eidson et al. |
| 6,308,058 B1 | 10/2001 | Souetinov et al. |
| 6,313,685 B1 | 11/2001 | Rabii |
| 6,313,700 B1 | 11/2001 | Nishijima et al. |
| 6,314,279 B1 | 11/2001 | Mohindra |
| 6,317,589 B1 | 11/2001 | Nash |
| 6,321,073 B1 | 11/2001 | Luz et al. |
| 6,324,379 B1 | 11/2001 | Hadden et al. |
| 6,327,313 B1 | 12/2001 | Traylor et al. |
| 6,330,244 B1 | 12/2001 | Swartz et al. |
| 6,332,007 B1 * | 12/2001 | Sasaki ......................... 375/344 |
| 6,335,656 B1 | 1/2002 | Goldfarb et al. |
| 6,353,735 B1 | 3/2002 | Sorrells et al. ................ 455/118 |
| 6,363,126 B1 | 3/2002 | Furukawa et al. |
| 6,363,262 B1 * | 3/2002 | McNicol ...................... 455/561 |
| 6,366,622 B1 | 4/2002 | Brown et al. |
| 6,366,765 B1 | 4/2002 | Hongo et al. |
| 6,370,371 B1 | 4/2002 | Sorrells et al. ................ 455/323 |
| 6,385,439 B1 | 5/2002 | Hellberg |
| 6,393,070 B1 | 5/2002 | Reber |
| 6,400,963 B1 | 6/2002 | Glöckler et al. |
| 6,404,758 B1 | 6/2002 | Wang |
| 6,404,823 B1 | 6/2002 | Grange et al. |
| 6,408,018 B1 | 6/2002 | Dent |
| 6,421,534 B1 | 7/2002 | Cook et al. .................... 455/313 |
| 6,437,639 B1 | 8/2002 | Nguyen et al. |
| 6,438,366 B1 * | 8/2002 | Lindfors et al. ............... 455/334 |
| 6,441,659 B1 | 8/2002 | Demone |
| 6,441,694 B1 | 8/2002 | Turcotte et al. |
| 6,445,726 B1 | 9/2002 | Gharpurey |
| 6,459,721 B1 | 10/2002 | Mochizuki et al. |
| 6,509,777 B2 | 1/2003 | Razavi et al. |
| 6,512,544 B1 | 1/2003 | Merrill et al. |
| 6,512,785 B1 | 1/2003 | Zhou et al. |
| 6,512,798 B1 | 1/2003 | Akiyama et al. |
| 6,516,185 B1 | 2/2003 | MacNally |
| 6,531,979 B1 | 3/2003 | Hynes |
| 6,542,722 B1 | 4/2003 | Sorrells et al. |
| 6,546,061 B2 | 4/2003 | Signell et al. |
| 6,560,301 B1 | 5/2003 | Cook et al. |
| 6,560,451 B1 | 5/2003 | Somayajula |
| 6,567,483 B1 | 5/2003 | Dent et al. |
| 6,580,902 B1 | 6/2003 | Sorrells et al. |
| 6,591,310 B1 | 7/2003 | Johnson |
| 6,597,240 B1 | 7/2003 | Walburger et al. |
| 6,600,795 B1 | 7/2003 | Ohta et al. |
| 6,600,911 B1 | 7/2003 | Morishige et al. |
| 6,608,647 B1 | 8/2003 | King |
| 6,611,569 B1 | 8/2003 | Schier et al. |
| 6,618,579 B1 | 9/2003 | Smith et al. |
| 6,625,470 B1 | 9/2003 | Fourtet et al. |
| 6,628,328 B1 | 9/2003 | Yokouchi et al. |
| 6,633,194 B2 | 10/2003 | Arnborg et al. |
| 6,634,555 B1 | 10/2003 | Sorrells et al. |
| 6,639,939 B1 | 10/2003 | Naden et al. |
| 6,647,250 B1 | 11/2003 | Bultman et al. |
| 6,647,270 B1 | 11/2003 | Himmelstein |
| 6,686,879 B2 | 2/2004 | Shattil |
| 6,687,493 B1 | 2/2004 | Sorrells et al. |
| 6,690,232 B2 | 2/2004 | Ueno et al. |
| 6,690,741 B1 | 2/2004 | Larrick, Jr. et al. |
| 6,694,128 B1 | 2/2004 | Sorrells et al. |
| 6,697,603 B1 * | 2/2004 | Lovinggood et al. ........ 455/13.1 |
| 6,704,549 B1 | 3/2004 | Sorrells et al. |
| 6,704,558 B1 | 3/2004 | Sorrells et al. |
| 6,731,146 B1 | 5/2004 | Gallardo |
| 6,738,609 B1 | 5/2004 | Clifford |
| 6,738,611 B1 | 5/2004 | Politi |
| 6,741,139 B2 | 5/2004 | Pleasant et al. |
| 6,741,650 B1 * | 5/2004 | Painchaud et al. ......... 375/240.21 |
| 6,775,684 B1 | 8/2004 | Toyoyama et al. |
| 6,798,351 B1 | 9/2004 | Sorrells et al. |
| 6,801,253 B1 | 10/2004 | Yonemoto et al. |
| 6,813,320 B1 | 11/2004 | Claxton et al. |
| 6,813,485 B1 | 11/2004 | Sorrells et al. |
| 6,823,178 B2 | 11/2004 | Pleasant et al. |
| 6,829,311 B1 | 12/2004 | Riley |
| 6,836,650 B2 | 12/2004 | Sorrells et al. |
| 6,850,742 B2 | 2/2005 | Fayyaz |
| 6,853,690 B1 | 2/2005 | Sorrells et al. |
| 6,865,399 B2 | 3/2005 | Fujioka et al. |
| 6,873,836 B1 | 3/2005 | Sorrells et al. |
| 6,876,846 B2 | 4/2005 | Tamaki et al. |
| 6,879,817 B1 | 4/2005 | Sorrells et al. |
| 6,882,194 B2 | 4/2005 | Belot et al. |
| 6,892,057 B2 | 5/2005 | Nilsson |
| 6,892,062 B2 | 5/2005 | Lee et al. |
| 6,894,988 B1 | 5/2005 | Zehavi |
| 6,909,739 B1 | 6/2005 | Eerola et al. |
| 6,910,015 B2 | 6/2005 | Kawai |
| 6,917,796 B2 | 7/2005 | Setty et al. |
| 6,920,311 B2 | 7/2005 | Rofougaran et al. |
| 6,959,178 B2 | 10/2005 | Macedo et al. |
| 6,963,626 B1 | 11/2005 | Shaeffer et al. |
| 6,963,734 B2 | 11/2005 | Sorrells et al. |
| 6,973,476 B1 | 12/2005 | Naden et al. |
| 6,975,848 B2 | 12/2005 | Rawlins et al. |
| 6,999,747 B2 | 2/2006 | Su |
| 7,006,805 B1 | 2/2006 | Sorrells et al. |
| 7,010,286 B2 | 3/2006 | Sorrells et al. |
| 7,010,559 B2 | 3/2006 | Rawlins et al. |
| 7,016,663 B2 | 3/2006 | Sorrells et al. |
| 7,027,786 B1 | 4/2006 | Smith et al. |
| 7,039,372 B1 | 5/2006 | Sorrells et al. |
| 7,050,058 B2 | 5/2006 | Sorrells et al. |
| 7,054,296 B1 | 5/2006 | Sorrells et al. |
| 7,065,162 B1 | 6/2006 | Sorrells et al. |
| 7,072,390 B1 | 7/2006 | Sorrells et al. |
| 7,072,427 B2 | 7/2006 | Rawlins et al. |
| 7,072,433 B2 | 7/2006 | Bell |
| 7,076,011 B2 | 7/2006 | Cook et al. |
| 7,082,171 B1 | 7/2006 | Johnson et al. |
| 7,085,335 B2 | 8/2006 | Rawlins et al. |
| 7,107,028 B2 | 9/2006 | Sorrells et al. |
| 7,110,435 B1 | 9/2006 | Sorrells et al. |
| 7,110,444 B1 | 9/2006 | Sorrells et al. |
| 7,149,487 B2 | 12/2006 | Yoshizawa |
| 7,190,941 B2 | 3/2007 | Sorrells et al. |
| 7,193,965 B1 | 3/2007 | Nevo et al. |
| 7,194,044 B2 | 3/2007 | Birkett et al. |
| 7,194,246 B2 | 3/2007 | Sorrells et al. |
| 7,197,081 B2 | 3/2007 | Saito |
| 7,209,725 B1 | 4/2007 | Sorrells et al. |
| 7,212,581 B2 | 5/2007 | Birkett et |

| | | | | | | |
|---|---|---|---|---|---|---|
| 7,218,899 B2 | 5/2007 | Sorrells et al. | EP | 0 254 844 A2 | 2/1988 | |
| 7,218,907 B2 | 5/2007 | Sorrells et al. | EP | 0 276 130 A2 | 7/1988 | |
| 7,224,749 B2 | 5/2007 | Sorrells et al. | EP | 0 276 130 A3 | 7/1988 | |
| 7,233,969 B2 | 6/2007 | Rawlins et al. | EP | 0 193 899 B1 | 6/1990 | |
| 7,236,754 B2 | 6/2007 | Sorrells et al. | EP | 0 380 351 A2 | 8/1990 | |
| 7,245,886 B2 | 7/2007 | Sorrells et al. | EP | 0 380 351 A3 | 2/1991 | |
| 7,272,164 B2 | 9/2007 | Sorrells et al. | EP | 0 411 840 A2 | 2/1991 | |
| 7,292,835 B2 | 11/2007 | Sorrells et al. | EP | 0 423 718 A2 | 4/1991 | |
| 7,295,826 B1 | 11/2007 | Cook et al. | EP | 0 411 840 A3 | 7/1991 | |
| 7,308,242 B2 | 12/2007 | Sorrells et al. | EP | 0 486 095 A1 | 5/1992 | |
| 7,321,640 B2 | 1/2008 | Milne et al. | EP | 0 423 718 A3 | 8/1992 | |
| 7,321,735 B1 | 1/2008 | Smith et al. | EP | 0 512 748 A2 | 11/1992 | |
| 7,321,751 B2 | 1/2008 | Sorrells et al. | EP | 0 529 836 A1 | 3/1993 | |
| 7,358,801 B2 | 4/2008 | Perdoor et al. | EP | 0 548 542 A1 | 6/1993 | |
| 7,376,410 B2 | 5/2008 | Sorrells et al. | EP | 0 512 748 A3 | 7/1993 | |
| 7,379,515 B2 | 5/2008 | Johnson et al. | EP | 0 560 228 A1 | 9/1993 | |
| 7,379,883 B2 | 5/2008 | Sorrells | EP | 0 632 288 A2 | 1/1995 | |
| 7,386,292 B2 | 6/2008 | Sorrells et al. | EP | 0 632 577 A1 | 1/1995 | |
| 7,389,100 B2 | 6/2008 | Sorrells et al. | EP | 0 643 477 A2 | 3/1995 | |
| 7,433,910 B2 | 10/2008 | Rawlins et al. | EP | 0 643 477 A3 | 3/1995 | |
| 7,454,453 B2 | 11/2008 | Rawlins et al. | EP | 0 411 840 B1 | 10/1995 | |
| 7,460,584 B2 | 12/2008 | Parker et al. | EP | 0 696 854 A1 | 2/1996 | |
| 7,483,686 B2 | 1/2009 | Sorrells et al. | EP | 0 632 288 A3 | 7/1996 | |
| 7,496,342 B2 | 2/2009 | Sorrells et al. | EP | 0 732 803 A1 | 9/1996 | |
| 7,515,896 B1 | 4/2009 | Sorrells et al. | EP | 0 486 095 B1 | 2/1997 | |
| 7,529,522 B2 | 5/2009 | Sorrells et al. | EP | 0 782 275 A2 | 7/1997 | |
| 7,539,474 B2 | 5/2009 | Sorrels et al. | EP | 0 785 635 A1 | 7/1997 | |
| 7,546,096 B2 | 6/2009 | Sorrells et al. | EP | 0 789 449 A2 | 8/1997 | |
| 7,554,508 B2 | 6/2009 | Johnson et al. | EP | 0 795 955 | 9/1997 | |
| 7,599,421 B2 | 10/2009 | Sorrells et al. | EP | 0 795 978 A2 | 9/1997 | |
| 7,620,378 B2 | 11/2009 | Sorrells et al. | EP | 0 817 36 A3 | 1/1998 | |
| 7,653,145 B2 | 1/2010 | Sorrells et al. | EP | 0 817 369 A2 | 1/1998 | |
| 7,653,158 B2 | 1/2010 | Rawlins et al. | EP | 0 837 565 A1 | 4/1998 | |
| 7,693,230 B2 | 4/2010 | Sorrells et al. | EP | 0 862 274 A1 | 9/1998 | |
| 7,693,502 B2 | 4/2010 | Sorrells et al. | EP | 0 874 499 A2 | 10/1998 | |
| 7,697,916 B2 | 4/2010 | Sorrells et al. | EP | 0 512 748 B1 | 11/1998 | |
| 7,724,845 B2 | 5/2010 | Sorrells et al. | EP | 0 877 476 A1 | 11/1998 | |
| 7,773,688 B2 | 8/2010 | Sorrells et al. | EP | 0 977 351 A1 | 2/2000 | |
| 7,783,250 B2 | 8/2010 | Lynch | FR | 2 245 130 | 4/1975 | |
| 7,822,401 B2 | 10/2010 | Sorrells et al. | FR | 2 669 787 A1 | 5/1992 | |
| 7,826,817 B2 | 11/2010 | Sorrells et al. | FR | 2 743 231 A1 | 7/1997 | |
| 7,865,177 B2 | 1/2011 | Sorrells et al. | GB | 2 161 344 A | 1/1986 | |
| 7,894,789 B2 | 2/2011 | Sorrells et al. | GB | 2 215 945 A | 9/1989 | |
| 7,929,638 B2 | 4/2011 | Sorrells et al. | GB | 2 324 919 A | 11/1998 | |
| 7,936,022 B2 | 5/2011 | Sorrells et al. | JP | 47-2314 | 2/1972 | |
| 7,937,059 B2 | 5/2011 | Sorrells et al. | JP | 55-66057 | 5/1980 | |
| 7,991,815 B2 | 8/2011 | Rawlins et al. | JP | 56-114451 | 9/1981 | |
| 8,019,291 B2 | 9/2011 | Sorrells et al. | JP | 58-7903 | 1/1983 | |
| 8,036,304 B2 | 10/2011 | Sorrells et al. | JP | 58-031622 | 2/1983 | |
| 8,077,797 B2 | 12/2011 | Sorrells et al. | JP | 58-133004 | 8/1983 | |
| 2001/0015673 A1 | 8/2001 | Yamashita et al. | JP | 59-022438 | 2/1984 | |
| 2001/0036818 A1 | 11/2001 | Dobrovolny | JP | 59-123318 | 7/1984 | |
| 2002/0021685 A1 | 2/2002 | Sakusabe | JP | 59-144249 | 8/1984 | |
| 2002/0037706 A1 | 3/2002 | Ichihara | JP | 60-58705 | 4/1985 | |
| 2002/0080728 A1 | 6/2002 | Sugar et al. | JP | 60-130203 | 7/1985 | |
| 2002/0098823 A1* | 7/2002 | Lindfors et al. ............ 455/334 | JP | 61-30821 | 2/1986 | |
| 2002/0132642 A1 | 9/2002 | Hines et al. | JP | 61-193521 | 8/1986 | |
| 2002/0163921 A1 | 11/2002 | Ethridge et al. | JP | 61-232706 | 10/1986 | |
| 2003/0045263 A1 | 3/2003 | Wakayama et al. | JP | 61-245749 | 11/1986 | |
| 2003/0078011 A1 | 4/2003 | Cheng et al. | JP | 62-12381 | 1/1987 | |
| 2003/0081781 A1 | 5/2003 | Jensen et al. | JP | 62-047214 | 2/1987 | |
| 2003/0149579 A1 | 8/2003 | Begemann et al. | JP | 63-54002 | 3/1988 | |
| 2003/0193364 A1 | 10/2003 | Liu et al. | JP | 63-65587 | 3/1988 | |
| 2004/0125879 A1 | 7/2004 | Jaussi et al. | JP | 63-153691 | 6/1988 | |
| 2005/0164670 A1 | 7/2005 | Sorrells et al. | JP | 63-274214 | 11/1988 | |
| 2006/0002491 A1 | 1/2006 | Darabi et al. | JP | 64-048557 | 2/1989 | |
| 2006/0039449 A1 | 2/2006 | Fontana et al. | JP | 2-39632 | 2/1990 | |
| 2006/0209599 A1 | 9/2006 | Kato et al. | JP | 2-131629 | 5/1990 | |
| | | | JP | 2-276351 | 11/1990 | |
| FOREIGN PATENT DOCUMENTS | | | JP | 4-123614 | 4/1992 | |
| DE | 35 41 031 A1 | 5/1986 | JP | 4-127601 | 4/1992 | |
| DE | 42 37 692 C1 | 3/1994 | JP | 4-154227 | 5/1992 | |
| DE | 196 27 640 A1 | 1/1997 | JP | 5-175730 | 7/1993 | |
| DE | 196 48 915 A1 | 6/1998 | JP | 5-175734 | 7/1993 | |
| DE | 197 35 798 C1 | 7/1998 | JP | 5-327356 | 12/1993 | |
| EP | 0 035 166 A1 | 9/1981 | JP | 6-237276 | 8/1994 | |
| EP | 0 087 336 A1 | 8/1983 | JP | 6-284038 | 10/1994 | |
| EP | 0 099 265 A1 | 1/1984 | JP | 7-154344 | 6/1995 | |
| EP | 0 087 336 B1 | 7/1986 | JP | 7-169292 A | 7/1995 | |

| | | |
|---|---|---|
| JP | 7-307620 | 11/1995 |
| JP | 8-23359 | 1/1996 |
| JP | 8-32556 | 2/1996 |
| JP | 8-139524 | 5/1996 |
| JP | 8-288882 A | 11/1996 |
| JP | 9-36664 | 2/1997 |
| JP | 9-171399 | 6/1997 |
| JP | 10-22804 A | 1/1998 |
| JP | 10-41860 | 2/1998 |
| JP | 10-96778 | 4/1998 |
| JP | 10-173563 | 6/1998 |
| JP | 11-98205 | 4/1999 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 95/19073 A2 | 7/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A2 | 3/1997 |
| WO | WO 9708839 A3 | 3/1997 |
| WO | WO 97/38490 A1 | 10/1997 |
| WO | WO 98/00953 A1 | 1/1998 |
| WO | WO 98/24201 A1 | 6/1998 |
| WO | WO 98/40968 | 9/1998 |
| WO | WO 98/53556 A2 | 11/1998 |
| WO | WO 99/23755 A1 | 5/1999 |
| WO | WO 00/31659 A1 | 6/2000 |

OTHER PUBLICATIONS

Deboo, Gordon J., *Integrated Circuits and Semiconductor Devices*, 2nd Edition, McGraw-Hill, Inc., pp. 41-45 (1977).

Hellwarth, G.A. and Jones, G.D, "Automatic Conditioning of Speech Signals," *IEEE Transactions on Audio and Electroacoustics*. vol. AU-16, No. 2, pp. 169-179 (Jun. 1968).

English Abstract for German Patent No. DE 692 21 098 T2, 1 page, data supplied from the espacenet.

Gaudiosi, J., "Retailers will bundle Microsoft's Xbox with games and peripherals," *Video Store Magazine*, vol. 23, Issue 36, p. 8, 2 pages (Sep. 2-8, 2001).

English translation of German Patent DE 1936252, 12 pages.

Aghvami, H. et al., "Land Mobile Satellites Using the Highly Elliptic Orbits—The UK T-SAT Mobile Payload," *Fourth International Conference on Satellite Systems for Mobile Communications and Navigation*, IEE, pp. 147-153 (Oct. 17-19, 1988).

Akers, N.P. et al., "RF Sampling Gates: a Brief Review," *IEE Proceedings*, IEE, vol. 133, Part A, No. 1, pp. 45-49 (Jan. 1986).

Al-Ahmad, H.A.M. et al., "Doppler Frequency Correction for a Non-Geostationary Communications Satellite. Techniques for CERS and T-SAT," *Electronics Division Colloquium on Low Noise Oscillators and Synthesizers*, IEE, pp. 4/1-4/5 (Jan. 23, 1986).

Ali, I. et al., "Doppler Characterization for LEO Satellites," *IEEE Transactions on Communications*, IEEE, vol. 46, No. 3, pp. 309-313 (Mar. 1998).

Allan, D.W., "Statistics of Atomic Frequency Standards," *Proceedings of the IEEE Special Issue on Frequency Stability*, IEEE, pp. 221-230 (Feb. 1966).

Allstot, D.J. et al., "MOS Switched Capacitor Ladder Filters," *IEEE Journal of Solid-State Circuits*, IEEE, vol. SC-13, No. 6, pp. 806-814 (Dec. 1978).

Allstot, D.J. and Black Jr. W.C., "Technological Design Considerations for Monolithic MOS Switched-Capacitor Filtering Systems," *Proceedings of the IEEE*, IEEE, vol. 71, No. 8, pp. 967-986 (Aug. 1983).

Alouini, M. et al., "Channel Characterization and Modeling for Ka-Bind Very Small Aperture Terminals," *Proceedings of the IEEE*, IEEE, vol. 85, No. 6, pp. 981-997 (Jun. 1997).

Andreyev, G.A. and Ogarev, S.A., "Phase Distortions of Keyed Millimeter-Wave Signals in the Case of Propagation in a Turbulent Atmosphere," *Telecommunications and Radio Engineering*, Scripta Technica, vol. 43, No. 12, pp. 87-90 (Dec. 1988).

Antonetti, A. et al., "Optoelectronic Sampling in the Picosecond Range," *Optics Communications*, North-Holland Publishing Company, vol. 21, No. 2, pp. 211-214 (May 1977).

Austin, J. et al., "Doppler Correction of the Telecommunication Payload Oscillators in the UK T-SAT," *18th European Microwave Conference*, Microwave Exhibitions and Publishers Ltd., pp. 851-857 (Sep. 12-15, 1988).

Auston, D.H., "Picosecond optoelectronic switching and gating in silicon," *Applied Physics Letters*, American Institute of Physics, vol. 26, No. 3, pp. 101-103 (Feb. 1, 1975).

Baher, H., "Transfer Functions for Switched-Capacitor and Wave Digital Filters," *IEEE Transactions on Circuits and Systems*, IEEE Circuits and Systems Society, vol. CAS-33, No. 11, pp. 1138-1142 (Nov. 1986).

Baines, R., "The DSP Bottleneck," *IEEE Communications Magazine*, IEEE Communications Society, pp. 46-54 (May 1995).

Banjo, O.P. and Vilar, E., "Binary Error Probabilities on Earth-Space Links Subject to Scintillation Fading," *Electronics Letters*, IEE, vol. 21, No. 7, pp. 296-297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277-280 (Mar. 30-Apr. 2, 1987).

Banjo, O.P. and Vilar, E. "Measurement and Modeling of Amplitude Scintillations on Low-Elevation Earth-Space Paths and Impact on Communication Systems," *IEEE Transactions on Communications*, IEEE Communications Society, vol. COM-34, No. 8, pp. 774-780 (Aug. 1986).

Banjo, O.P. et al., "Tropospheric Amplitude Spectra Due to Absorption and Scattering in Earth-Space Paths," *Fourth International Conference on Antennas and Propagation (ICAP 85)*, IEE, pp. 77-82 (Apr. 16-19, 1985).

Basili,P. et al., "Case Study of Intense Scintillation Events on the OTS Path," *IEEE Transactions on Antennas and Propagation*, IEEE, vol. 38, No. 1, pp. 107-113 (Jan. 1990).

Basili, P. et al., "Observation of High $C^2$ and Turbulent Path Length on OTS Space-Earth Link," *Electronics Letters*, IEE, vol. 24, No. 17, pp. 1114-1116 (Aug. 18, 1988).

Blakey, J.R. et al., "Measurement of Atmospheric Millimetre-Wave Phase Scintillations in an Absorption Region," *Electronics Letters*, IEE, vol. 21, No. 11, pp. 486-487 (May 23, 1985).

Burgueño, A. et al., "Influence of rain gauge integration time on the rain rate statistics used in microwave communications," *annales des télécommunications*, International Union of Radio Science, pp. 522-527 (Sep./Oct. 1988).

Burgueño, A. et al, "Long-Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198-201 (Mar. 30-Apr. 2, 1987).

Burgueño, A. et at., "Long Term Statistics of Precipitation Rate Return Periods in the Context of Microwave Communications," *Sixth International Conference on Antennas and Propagation (ICAP 89) Part 2: Propagation*, IEE, pp. 297-301 (Apr. 4-7, 1989).

Burgueño, A et al., "Spectral Analysis of 49 Years of Rainfall Rate and Relation to Fade Dynamics," *IEEE Transactions on Communications*, IEEE Communications Society, vol. 38, No. 9, pp. 1359-1366 (Sep. 1990).

Catalan. C. and Vilar, E., "Approach for satellite slant path remote sensing," *Electronics Letters*, IEE, vol. 34, No. 12, pp. 1238-1240 (Jun. 11, 1998).

Chan, P. et al., "A Highly Linear 1-GHz CMOS Downconversion Mixer," *European Solid State Circuits Conference*, IEEE Communication Society, pp. 210-213 (Sep. 22-24, 1993).

Declaration of Michael J. Buitman filed in U.S. Appl. No. 09/176,022, which is directed to related subject matter, 2 pages.

Declaration of Robert W. Cook filed in U.S. Appl. No. 09/176,022, which is directed to related subject matter, 2 pages.

Declaration of Alex Holtz filed in U.S. Appl. No. 09/176,022, which is directed to related subject matter, 3 pages.

Declaration'of Richard C. Looke filed in U.S. Appl. No. 09/176,022, which is directed to related subject matter, 2 pages.

Declaration of Charley D. Moses, Jr. filed in U.S. Appl. No. 09/176,022, which is directed to related subject matter, 2 pages.

Declaration of Jeffrey L. Parker and David F. Sorrells, with attachment Exhibit 1, filed in U.S. Appl. No. 09/176,022, which is directed to related subject matter, 130 pages.

Dewey, R.J. and Collier, C.J., "Multi-Mode Radio Receiver," *Electronics Division Colloquium on Digitally Implemented Radios*, IEE, pp. 3/1-3/5 (Oct. 18, 1985).

Dialog File 347 (JAPIO) English Language Patent Abstract for JP 2-276351, 1 page (Nov. 13, 1990—Date of publication of application).

Dialog File 347 (JAPIO) English Language Patent Abstract for JP 2-131629, 1 page (May 21, 1990—Date of publication of application).

Dialog File 347 (JAPIO) English Language Patent Abstract for JP 2-39632, 1 page (Feb. 8, 1990—Date of publication of application).

Dialog File 348 (European Patents) English Language Patent Abstract for EP 0 785 635 A1, 3 pages (Dec. 26, 1996—Date of publication of application).

Dialog File 348 (European Patents) English Language Patent Abstract for EP 35166 A1, 2 pages (Feb. 18, 1981—Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET-Less Sample-and-Hold with High Charge-to-Droop Current Ratio," *IEEE Journal of Solid-State Circuits*, IEEE, vol. SC-13, No. 6, pp. 864-873 (Dec. 1978).

Faulkner, N.D. and Vilar, E., "Subhamionic Sampling for the Measurement of Short Term Stability of Microwave Oscillators," *IEEE Transactions on Instrumentation and Measurement*, IEEE, vol. IM-32, No. 1, pp. 208-213 (Mar. 1983).

Faulkner, N. D. et al., "Sub-Harmonic Sampling for the Accurate Measurement of Frequency Stability of Microwave Oscillators," *CPEM 82 Digest: Conference on Precision Electromagnetic Measurements*, IEEE, pp. M-10 and M-11 (1982).

Faulkner, N.D. and Vilar, E., "Time Domain Analysis of Frequency Stability Using Non-Zero Dead-Time Counter Techniques," *CPEM 84 Digest Conference on Precision Electromagnetic Measurements*, IEEE, pp. 81-82 (1984).

Flip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958-1965 (Nov. 1990).

Fukahori, K, "A CMOS Narrow-Band Signaling Filter with Q Reduction," *IEEE Journal of Solid-State Circuits*, IEEE, vol. SC-19, No. 6, pp. 926-932 (Dec. 1984).

Fukuchi, H. and Otsu, Y., "Available time statistics of rain attenuation on earth-space path," *IEE Proceedings-H: Microwaves, Antennas and Propagation*, IEE, vol. 135, Pt. H, No. 6, pp. 387-390 (Dec. 1988).

Gibbins, C.J. And Chadha, R., "Millimetre-wave propagation through hydrocarbon flame," *IEE Proceedings*, IEE, vol. 134, Pt. H, No. 2 , pp. 169-173 (Apr. 1987).

Gilchrist, B. et at, "Sampling hikes performance of frequency synthesizers," *Microwaves & RF*, Hayden Publishing, vol. 23, No. 1, pp. 93-94 and 110 (Jan. 1984).

Gossard, E.E."Clear weather meterorological effects on propagation at frequencies above 1 Ghz," *Radio Science*, American Geophysical Union, vol. 16, No. 5, pp. 589-608 (Sep.-Oct. 1981).

Gregorian, R. et al., "Switched-Capacitor Circuit Design," *Proceedings of the IEEE*, IEEE, vol. 71, No. 8, pp. 941-966 (Aug. 1983).

Groshong et al., "Undersampling Techniques Simplify Digital Radio," *Electronic Design*, Penton Publishing, pp. 67-68, 70, 73-75 and 78 (May 23, 1991).

Grove, W.M., "Sampling for Oscilloscopes and Other RF Systems: Dc through X-Band," *IEEE Transactions on Microwave Theory and Techniques*, IEEE, pp. 629-635 (Dec. 1966).

Haddon, J. et al., "Measurement of Microwave Scintillations on a Satellite Down-Link at X-Band," *Antennas and Propagation*, IEE, pp. 113-117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP-34, No. 5, pp. 646-657 (May 1986).

Hafdallah, H. et al., "2-4 Ghz MESFET Sampler," *Electronics Letters*, IEE, vol. 24, No. 3, pp. 151-153 (Feb. 4, 1988).

Herben, M.H.A.J., "Amplitude and Phase Scintillation Measurements on 8-2 km Line-Of-Sight Path at 30 Ghz," *Electronics Letters*, IEE, vol. 18, No. 7, pp. 287-289 (Apr. 1, 1982).

Hewitt, A. et al., "An 18 Ghz Wideband LOS Multipath Experiment," *International Conference on Measurements for Telecommunication Transmission Systems—MTTS 85*, IEE, pp. 112-116 (Nov. 27-28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136-1143 (Nov. 1989).

Hewitt, A. and Viler, E., "Selective fading on LOS Microwave Links: Classical and Spread-Spectrum Measurement Techniques," *IEEE Transactions on Communications*, IEEE Communications Society, vol. 36, No. 7, pp. 789-796 (Jul. 1988).

Hospitalier, E., "Instruments for Recording and Observing Rapidly Varying Phenomena," *Science Abstracts*, IEE, vol. VII, pp. 22-23 (1904).

Howard, I.M. and Swansson, N. S., "Demodulating High Frequency Resonance Signals for Bearing Fault Detection," *The Institution of Engineers Australia Vibration and Noise Conference*, Institution of Engineers, Australia, pp. 115-121 (Sep. 18-20, 1990).

Hu, X., *A Switched-Current Sample-and-Hold Amplifier for FM Demodulation*, Thesis for Master of Applied Science, Dept. of Electrical and Computer Engineering, University of Toronto, UMI Dissertation Services, pp. 1-64 (1995).

Hung, H-L. A. et al., "Characterization of Microwave Integrated Circuits Using an Optical Phase-Locking and Sampling System," *IEEE MTT-S Digest*, IEEE, pp. 507-510 (1991).

Hurst, P.J., "Shifting the Frequency Response of Switched-Capacitor Filters by Nonuniform Sampling," *IEEE Transactions on Circuits and Systems*, IEEE Circuits and Systems Society, vol. 38, No. 1, pp. 12-19 (Jan. 1991).

Itakura, T., "Effects of the sampling pulse width on the frequency characteristics of a sample-and-hold circuit,". *IEE Proceedings Circuits, Devices and Systems*, IEE, vol. 141, No. 4, pp. 328-336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52-59 (Aug. 1950).

Janssen, J.M.L. and Michels, A.J., "An Experimental 'Stroboscopic' Oscilloscope for Frequencies up to about 50 Mc/s: II. Electrical Build-Up," *Philips Technical Review*, Philips Research Laboratories, vol. 12, No. 3, pp. 73-82 (Sep. 1950).

Jondral, V.F. et al., "Doppler Profiles for Communication Satellites," *Frequenz*, Herausberger, pp. 111-116 (May-Jun. 1996).

Kaleh, G.K., "A Frequency Diversity Spread Spectrum System for Communication in the Presence of In-band Interference," *1995 IEEE Globecom*, IEEE Communications Society, pp. 66-70 (1995).

Karasawa, Y. et al., "A New Prediction Method for Tropospheric Scintillation on Earth-Space Paths," *IEEE Transactions on Antennas and Propagation*, IEEE Antennas and Propagation Society, vol. 36, No. 11, pp. 1608-1614 (Nov. 1988).

Kirsten, J. and Fleming, J., "Undersampling reduces data-acquisition costs for select applications," *EDN*, Cahners Publishing, vol. 35, No. 13, pp. 217-222, 224, 226-228 (Jun. 21, 1990).

Lam, W.K. et al., "Measurement of the Phase Noise Characteristics of an Unlocked Communications Channel Identifier," *Proceedings of the 1993 IEEE International Frequency Control Symposium*, IEEE, pp. 283-288 (Jun. 2-4, 1993).

Lam, W.K et al., "Wideband sounding of 11.6 Ghz transhorizon channel," *Electronics Letters*, IEE, vol. 30, No. 9, pp. 738-739 (Apr. 28, 1994).

Larkin, K.G., "Efficient demodulator for bandpass sampled AM signals," *Electronics Letters*, IEE, vol. 32, No. 2, pp. 101-102 (Jan. 18, 1996).

Lau, W.H. et al, "Analysis of the Time Variant Structure of Microwave Line-of-sight Multipath Phenomena," *IEEE Global Telecommunications Conference & Exhibition*, IEEE, pp. 1707-1711 (Nov. 28-Dec. 1, 1988).

Lau, W.H. et al., "Improved Prony Algorithm to Identify Multipath Components," *Electronics Letters*, IEE, vol. 23, No. 20, pp. 1059-1060 (Sep. 24. 1987).

Lesage, P. and Audoin, C., "Effect of Dead-Time on the Estimation of the Two-Sample Variance," *IEEE Transactions on Instrumentation and Measurement*, IEEE Instrumentation and Measurement Society, vol. IM-28, No. 1, pp. 6-10 (Mar. 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, vol. MTT-23, No. 6, pp. 461-469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS-26, No. 4, pp. 44.43/4449 (Aug. 1979).

Liou, M.L., "A Tutorial on Computer-Aided Analysis of Switched-Capacitor Circuits," *Proceedings of the IEEE*, IEEE, vol. 71, No. 8, pp. 987-1005 (Aug. 1983).

Lo, P. et al., "Coherent Automatic Gain Control," *IEE Colloquium on Phase Locked Techniques*, IEE, pp. 2/1-2/6 (Mar. 26, 1980).

Lo, P. et al., "Computation of Rain Induced Scintillations on Satellite Down-Links at Microwave Frequencies," *Third International Conference on Antennas and Propagation (ICAP 83)*, pp. 127-131 (Apr. 12-15, 1983).

Lo, P.S.L.O. et al., "Observations of Amplitude Scintillations on a Low-Elevation Earth-Space Path," *Electronics Letters*, IEE, vol. 20, No. 7, pp. 307-308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960-1963 (Oct. 1992).

Marsland, R.A. et al., "130 Ghz GaAs monolithic integrated circuit sampling head," *Appl. Phys. Lett*, American Institute of Physics, vol. 55, No. 6, pp. 592-594 (Aug. 7, 1989).

Martin, K. and Sedra, A.S., "Switched-Capacitor Building Blocks for Adaptive Systems," *IEEE Transactions on Circuits and Systems*, IEEE Circuits and Systems Society, vol. CAS-28, No. 6, pp. 576-584 (Jun. 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, vol. 46, No. 10, pp. 1506-1518 (Oct. 1998).

Matricciani, E., "Prediction of fade durations due to rain in satellite communication systems," *Radio Science*, American Geophysical Union, vol. 32, No. 3, pp. 935-941 (May-Jun. 1997).

McQueen, J.G., "The Monitoring of High-Speed Waveforms," *Electronic Engineering*, Morgan Brothers Limited, vol. XXIV, No. 296, pp. 436-441 (Oct. 1952).

Merkelo, J. and Hall, R.D., "Broad-Band Thin-Film Signal Sampler," *IEEE Journal of Solid-State Circuits*, IEEE, vol. SC-7, No. 1, pp. 50-54 (Feb. 1972).

Merlo, U. et al., "Amplitude Scintillation Cycles in a Sirlo Satellite-Earth Link," *Electronics Letters*, IEE, vol. 21, No. 23, pp. 1094-1096 (Nov. 7, 1985).

Morris, D., "Radio-holographic reflector measurement of the 30-m millimeter radio telescope at 22 Ghz with a cosmic signal source," *Astronomy and Astrophysics*, Springer-Verlag, vol. 203, No. 2, pp. 399-406 (Sep. 2, 1988).

Moulsley, T.J. et al., "The efficient acquisition and processing of propagation statistics," *Journal of the Institution of Electronic and Radio Engineers*, IERE, vol. 55, No. 3, pp. 97-103 (Mar. 1985).

Ndzi, D. et al., "Wide-Band Statistical Characterization of an Over-the-Sea Experimental Transhorizon Link," *IEE Colloquium on Radio Communications at Microwave and Millimetre Wave Frequencies*, IEE, pp. 1/1-1/6 (Dec. 16, 1996).

Ndzi, D. et al., "Wideband Statistics of Signal Levels and Doppler Spread on an Over-The-Sea Transhorizon Link," *IEE Colloquium on Propagation Characteristics and Related System Techniques for Beyond Line-of-Sight Radio*, IEE, pp. 9/1-9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130-135 (Apr. 12, 1979).

Oppenheim, A.V. et al., *Signals and Systems*, Prentice-Hall, pp. 527-531 and 561-562 (1983).

Ortgies, G., "Experimental Parameters Affecting Amplitude Scintillation Measurement on Satellite Links," *Electronic Letters*, IEE, vol. 21, No. 17, pp. 771-772 (Aug. 15, 1985).

Parssinen et al., "A 2-GHz Subharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clear-Air Scintillation Prediction Using Olympus Satellite Measurements," *International Journal of Satellite Communications*, John Wiley and Sons, vol. 15, No. 2, pp. 73-88 (Mar.-Apr. 1997).

Perrey, A.G. and Schoenwetter, H.K., *NBS Technical Note 1121: A Schottky Diode Bridge Sampling Gate*, U.S. Dept. of Commerce. pp. 1-14 (May 1980).

Poulton, K. et al., "A 1-Ghz 6-bit Adc System," *IEEE Journal of Solid-State Circuits*, IEEE, vol. SC-22, No. 6, pp. 962-969 (Dec. 1987).

Press Release, "Parkervislon, Inc. Announces Fiscal 1993 Results," Lippert/Heilshom and Associates, 2 Pages (Apr. 8, 1994).

Press Release, "Parkervision, Inc. Announces the Appointment of Michael Baker to the New Position of National Sales Manager," Lippert/Heilshom and Associates, 1 Page (Apr. 7, 1994).

Press Release, "Parkervision's Cameraman Well-Received by Distance Learning Market," LipperVHeilshom and Associates, 2 Pages (Apr. 8, 1994).

Press Release, "Parkervision, Inc. Announces First Quarter Financial Results," Lippert/Heilshom and Associates, 2 Pages (Apr. 26, 1994).

Press Release, "Parkervision, Inc. Announces the Retirement of William H. Fletcher, Chief Financial Officer," Lippert/Heilshom and Associates, 1 Page (May 11, 1994).

Press Release, "Parkervision, Inc. Announces New Cameraman System II™ At Infocomm Trade Show," Lippert/Heilshorn and Associates, 3 Pages (Jun. 9, 1994).

Press Release, "Parkervision, Inc. Announces Appointments to its National Sales Force," Lippert/Heilshom and Associates, 2 Pages (Jun. 17, 1994).

Press Release, "Parkervision, Inc. Announces Second Quarter and Six Months Financial Results," Lippert/Heilshom and Associates, 3 Pages (Aug. 9, 1994).

Press Release, "Parkervision, Inc. Announces Third Quarter and Nine Months Financial Results," Lippert/Heilshom and Associates, 3 Pages (Oct. 28, 1994).

Press Release, "Parkervision, Inc. Announces First Significant Dealer Sale of Its *Cameraman®* System II," Lippert/Heilshom and Associates, 2 Pages (Nov. 7, 1994).

Press Release, "Parkervision, Inc. Announces Fourth Quarter and Year End Results," Lippert/Heilshom and Associates, 2 Pages (Mar. 1, 1995).

Press Release, "Parkervision, Inc. Announces Joint Product Developments With VTEL," Lippert/Heilshom and Associates, 2 Pages (Mar. 21, 1995).

Press Release, "Parkervision, Inc. Announces First Quarter Financial Results," Lippert/Heilshom and Associates, 3 Pages (Apr. 28, 1995).

Press Release, "Parkervision Wins Top 100 Product Districts' Choice Award," Parkervision Marketing and Manufacturing Headquarters, 1 Page (Jun. 29, 1995).

Press Release, "Parkervislon National Sales Manager Next President of USDLA," Parkervision Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Financial Results," Parkervision Marketing and Manufacturing Headquarters, 2 Pages (Jul. 31, 1995).

Press Release, "Parkervision, Inc. Expands Its Cameraman System II Product Line," Parkervision Marketing and Manufacturing Headquarters, 2 Pages (Sep. 22, 1995).
Press Release, "Parkervision Announces New Camera Control Technology," Parkervision Marketing and Manufacturing Headquarters, 2 Pages (Oct. 25, 1995).
Press Release, "Parkervision, Inc. Announces Completion of VTEL/Parkervision Joint Product Line," Parkervision Marketing and Manufacturing Headquarters, 2 Pages (Oct. 30, 1995).
Press Release, "Parkervision, Inc. Announces Third Quarter and Nine Months Financial Results," Parkervision Marketing and Manufacturing Headquarters, 2 Pages (Oct. 30, 1995).
Press Release, "Parkervision's Cameraman Personal Locator Camera System Wins Telecon XV Award," Parkervision Marketing and Manufacturing Headquarters, 2 Pages (Nov. 1, 1995).
Press Release, "Parkervision, Inc. Announces Purchase Commitment From VTEL Corporation," Parkervision Marketing and Manufacturing Headquarters, 1 Page (Feb. 26, 1996).
Press Release, "ParkerVision, Inc. Announces Fourth Quarter and Year End Results," Parkervision Marketing and Manufacturing Headquarters, 2 Pages (Feb. 27, 1996).
Press Release, "ParkerVision, Inc. Expands its Product Line," Parkervision Marketing and Manufacturing Headquarters, 2 Pages (Mar. 7, 1996).
Press Release, "ParkerVision Files Patents for its Research of Wireless Technology," Parkervision Marketing and Manufacturing Headquarters, 1 Page (Mar. 28, 1996).
Press Release, "Parkervision, Inc. Announces First Significant Sale of Its Cameraman® Three-Chip System," Parkervision Marketing and Manufacturing Headquarters, 2 pages (Apr. 12, 1996).
Press Release, "Parkervision, Inc. Introduces New Product Line for Studio Production Market," Parkervision Marketing and Manufacturing Headquarters, 2 Pages (Apr. 15, 1996).
Press Release, "Parkervision, Inc. Announces Private Placement of 800,000 Shares," Parkervision Marketing and Manufacturing Headquarters, 1 Page (Apr. 15, 1996).
Press Release, "Parkervision, Inc. Announces First Quarter Financial Results," Parkervision Marketing and Manufacturing Headquarters, 3 Pages (Apr. 30, 1996).
Press Release, "ParkerVision's New Studio Product Wins Award," Parkervision Marketing and Manufacturing Headquarters, 2 Pages (Jun. 5, 1996).
Press Release, "Parkervision, Inc. Announces Second Quarter and Six Months Financial Results," Parkervision Marketing and Manufacturing Headquarters, 3 Pages (Aug. 1, 1996).
Press Release, "Parkervision, Inc. Announces Third Quarter and Nine Months Financial Results," Parkervision Marketing and Manufacturing Headquarters, 2 Pages (Oct. 29, 1996).
Press Release, "PictureTel and ParkerVision Sign Reseller Agreement," Parkervision Marketing and Manufacturing Headquarters, 2 Pages (Oct. 30, 1996).
Press Release, "CLI and ParkerVision Bring Enhanced Ease-of-Use to Videoconferencing," CLI/Parkervision, 2 Pages (Jan. 20, 1997).
Press Release, "Parkervision, Inc. Announces Fourth Quarter and Year End Results," Parkervision Marketing and Manufacturing Headquarters, 3 Pages (Feb. 27, 1997).
Press Release, "Parkervision, Inc. Announces First Quarter Financial Results," Parkervision Marketing and Manufacturing Headquarters, 3 Pages (Apr. 29, 1997).
Press Release, "NEC and Parkervision Make Distance Learning Closer," NEC America, 2 Pages (Jun. 18, 1997).
Press Release, "Parkervision Supplies JPL with Robotic Cameras, Cameraman Shot Director for Mars Mission," Parkervision Marketing and Manufacturing Headquarters, 2 Pages (Jul. 8, 1997).
Press Release, "ParkerVision and IBM Join Forces to Create Wireless Computer Peripherals," Parkervision Marketing and Manufacturing Headquarters, 2 Pages (Jul. 23, 1997).
Press Release, "ParkerVision, Inc. Announces Second Quarter and Six Months Financial Results," Parkervision Marketing and Manufacturing Headquarters, 3 Pages (Jul. 31, 1997).
Press Release, "Parkervision, Inc. Announces Private Placement of 990,000 Shares," Parkervision Marketing and Manufacturing Headquarters, 2 Pages (Sep. 8, 1997).

Press Release, "Wal-Mart Chooses Parkervision for Broadcast Production," Parkervision Marketing and Manufacturing Headquarters, 2 Pages (Oct. 24, 1997).
Press Release, "Parkervision, Inc. Announces Third Quarter Financial Results," Parkervision Marketing and Manufacturing Headquarters, 3 Pages (Oct. 30, 1997).
Press Release, "ParkerVision Announces Breakthrough in Wireless Radio Frequency Technology," Parkervision Marketing and Manufacturing Headquarters, 3 Pages (Dec. 10, 1997).
Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).
Press Release, "Parkervision Announces Existing Agreement with IBM Terminates—Company Continues with Strategic Focus Announced in December," Parkervision Marketing and Manufacturing Headquarters, 2 Pages (Jan. 27, 1998).
Press Release, "Laboratory Tests Verify Parkervision Wireless Technology," Parkervision Marketing and Manufacturing Headquarters, 2 Pages (Mar. 3, 1998).
Press Release, "Parkervision, Inc. Announces Fourth Quarter and Year End Financial Results," Parkervision Marketing and Manufacturing Headquarters, 3 Pages (Mar. 5, 1998).
Press Release, "Parkervision Awarded Editors' Pick of Show for NAB 98," Parkervision Marketing and Manufacturing Headquarters, 2 Pages (Apr. 15, 1998).
Press Release, "Parkervision Announces First Quarter Financial Results," Parkervision Marketing and Manufacturing Headquarters, 3 Pages (May 4, 1998).
Press Release, "Parkervision 'DIRECT2DATA' Introduced in Response to Market Demand," Parkervision Marketing and Manufacturing Headquarters, 3 Pages (Jul. 9, 1998).
Press Release, "Parkervision Expands Senior Management Team," Parkervision Marketing and Manufacturing Headquarters, 2 Pages (Jul. 29, 1998).
Press Release, "Parkervision Announces Second Quarter and Six Month Financial Results," Parkervision Marketing and Manufacturing Headquarters, 4 Pages (Jul. 30, 1998).
Press Release, "Parkervision Announces Third Quarter and Nine Month Financial Results," Parkervision Marketing and Manufacturing Headquarters, 3 Pages (Oct. 30, 1998).
Press Release, "Questar Infocomm, Inc. Invests $5 Million in Parkervision Common Stock," Paricervision Marketing and Manufacturing Headquarters, 3 Pages (Dec. 2, 1998).
Press Release, "Parkervision Adds Two New Directors," Parkervision Marketing and Manufacturing Headquarters, 2 Pages (Mar. 5, 1999).
Press Release, "Parkervision Announces Fourth Quarter and Year End Financial Results," Parkervision Marketing and Manufacturing Headquarters, 3 Pages (Mar. 5, 1999).
Press Release, "Joint Marketing Agreement Offers New Automated Production Solution," Parkervision Marketing and Manufacturing Headquarters, 2 Pages (Apr. 13, 1999).
"Project COST 205: Scintillations in Earth-satellite links," *Alta Fiequenza: Scientific Review in Electronics*, AEI, vol. LIV, No. 3, pp. 209-211 (May-Jun. 1985).
Razavi, B., *RF Microelectronics*, Prentice-Hall, pp. 147-149 (1998).
Reeves, R.J.D., "The Recording and Collocation of Waveforms (Part 1)," *Electronic Engineering*, Morgan Brothers Limited, vol. 31, No. 373, pp. 130-137 (Mar. 1959).
Reeves, R.J.D., "The Recording and Collocation of Waveforms (Part 2)," *Electronic Engineering*, Morgan Brothers Limited, vol. 31, No. 374, pp. 204-212 (Apr. 1959).
Rein, H.M. and Zahn, M., "Subnanosecond-Pulse Generator with Variable Pulsewidth Using Avalanche Transistors," *Electronics Letters*, IEE, vol. 11, No. 1, pp. 21-23 (Jan. 9, 1975).
Riad, S.M. and Nahman, N. S., "Modeling of the Feed-through Wideband (DC to 12.4 Ghz) Sampling-Head," *IEEE MTT-S International Microwave Symposium Digest*, IEEE, pp. 267-269 (Jun. 27-29, 1978).
Rizzoli, V. et al., "Computer-Aided Noise Analysis of MESFET and HEMT Mixers," *IEEE Transactions on Microwave Theory and Techniques*, IEEE, vol. 37, No. 9, pp. 1401-1410 (Sep. 1989).

Rowe, H.E., *Signals and Noise in Communication Systems*, D. Van Nostrand Company, Inc., Princeton, New Jersey, including, for example, Chapter V, Pulse Modulation Systems (1965).

Rücker, F. and Dintelmann, F., "Effect of Antenna Size on OTS Signal Scintillations and Their Seasonal Dependence," *Electronics Letters*, IEE, vol. 19, No. 24, pp. 1032-1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238-242 (Oct. 25-27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218-223 (Oct. 16-18, 1990).

Salous, S., "IF digital generation of FMCW waveforms for wideband channel characterization," *IEE Proceedings-I*, IEE, vol. 139, No. 3, pp. 281-288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched-Capacitor Biquad," *Proceedings of the IEEE*, IEEE, vol. 71, No. 8, pp. 1008-1009 (Aug. 1983).

Saul, P.H., "A GaAs MESFET Sample and Hold Switch," *Fifth European Solid State Circuits Conference-ESSCIRC 79*, IEE, pp. 5-7 (1979).

Shen, D.H. et al., "A 900-MHZ RF Front-End with Integrated Discrete-Time Filtering," *IEEE Journal of Solid-State Circuits*, IEEE Solid-State Circuits Council, vol. 31, No. 12, pp. 1945-1954 (Dec. 1996).

Shen, X.D. and Viler, E., "Anomalous transhorizon propagation and meteorological processes of a multilink path," *Radio Science*, American Geophysical Union, vol. 30, No. 5, pp. 1467-1479 (Sep.-Oct. 1995).

Shen, X. and Tawfik, A.N., "Dynamic Behaviour of Radio Channels Due to Trans-Horizon Propagation Mechanisms," *Electronics Letters*, IEE, vol. 29, No. 17, pp. 1582-1583 (Aug. 19, 1993).

Shen, X. et el., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1-4/7 (Mar. 8, 1996).

Shen, X. and Vilar, E., "Path loss statistics and mechanisms of transhorizon propagation over a sea path," *Electronics Letters*, IEE, vol. 32, No. 3, pp. 259-261 (Feb. 1, 1996).

Shen, D. et al., "A 900 MHZ Integrated Discrete-Time Filtering RF Front-End," *IEEE International Solid State Circuits Conference*, IEEE, vol. 39, pp. 54-55 and 417 (Feb. 1996).

Spillard, C. et al., "X-Band Tropospheric Transhorizon Propagation Under Differing Meteorological Conditions," *Sixth International Conference on Antennas and Propagation (ICAP 89) Part 2: Propagation*, IEE, pp. 451-455 (Apr. 4-7, 1989).

Stafford, K.R. et al., "A Complete Monolithic Sample/Hold Amplifier," *IEEE Journal of Solid-State Circuits*, IEEE, vol. SC-9, No. 6, pp. 381-387 (Dec. 1974).

Staruk, W. Jr. et al., "Pushing HF Data Rates," *Defense Electronics*, EW Communications, vol. 17, No. 5, pp. 211, 213, 215, 217, 220 and 222 (May 1985).

Stephenson, A.G., "Digitizing multiple RF signals requires an optimum sampling rate," *Electronics*, McGraw-Hill, pp. 106-110 (Mar. 27, 1972).

Sugarman, R., "Sampling Oscilloscope for Statistically Varying Pulses," *The Review of Scientific Instruments*, American Institute of Physics, vol. 28, No. 11, pp. 933-938 (Nov. 1957).

Sylvain, M., "Experimental probing of multipath microwave channels," *Radio Science*, American Geophysical Union, vol. 24, No. 2, pp. 160-178 (Mar.-Apr. 1989).

Takano, T., "NOVEL GaAs Pet Phase Detector Operable to Ka Band," *IEEE MT-S Digest*, IEEE, pp. 381-383 (1984).

Tan, M.A., "Biquadratic Transconductance Switched-Capacitor Filters," *IEEE Transactions on Circuits and Systems—I: Fundamental Theory and Applications*, IEEE Circuits and Systems Society, vol. 40, No. 4, pp. 272-275 (Apr. 1993).

Tanaka, K et al., "Single Chip Multisystem AM Stereo Decoder IC," *IEEE Transactions on Consumer Electronics*, IEEE Consumer Electronics Society, vol. CE-32, No. 3, pp. 482-496 (Aug. 1986).

Tawfik, A.N., "Amplitude, Duration and Predictability of Long Hop Trans-Horizon X-band Signals Over the Sea," *Electronics Letters*, IEE, vol. 28, No. 6, pp. 571-572 (Mar. 12, 1992).

Tawfik, A.N. and Viler, E., "Correlation of Transhorizon Signal Level Strength with Localized Surface Meterorological Parameters," *Eighth International Conferenceon Antennas and Propagation*, Electronics Division of the IEE, pp. 335-339 (Mar. 30-Apr. 2, 1993).

Tawfik, A.N. and Vilar, E., "Dynamic Structure of a Transhorizon Signal at X-band Over a Sea Path," *Sixth International Conference on Antennas and Propagation (ICAP 89) Part 2: Propagation*, IEE, pp. 446-450 (Apr. 4-7, 1989).

Tawfik, A.N. and Vilar, E., "Statistics of Duration and Intensity of Path Loss in a Microwave Transhorizon Sea-Path," *Electronics Letters*, IEE, vol. 26, No. 7, pp. 474-476 (Mar. 29, 1990).

Tawfik, A.N. and Vilar, E., "X-Band Transhorizon Measurements of CW Transmissions Over the Sea—Part 1: Path Loss, Duration of Events, and Their Modeling," *IEEE Transactions on Antennas and Propagation*, IEEE Antennas and Propagation Society, vol. 41, No. 11, pp. 1491-1500 (Nov. 1993).

Temes, G.C. and Tsividis, T., "The Special Section on Switched-Capacitor Circuits," *Proceedings of the IEEE*, IEEE, vol. 71, No. 8, pp. 915-916 (Aug. 1983).

Thomas, G.B., *Calculus and Analytic Geometry*, Third Edition, Addison-Wesley Publishing, pp. 119-133 (1960).

Tomassetti, Q., "An Unusual Microwave Mixer," *16th European Microwave Conference*, Microwave Exhibitions and Publishers, pp. 754-759 (Sep. 8-12, 1986).

Tortoli, P. et al., "Bidirectional Doppler Signal Analysis Based on a Single RF Sampling Channel," *IEEE Transactions on Ultrasonics, Fenvelectrics, and Frequency Control*, IEEE Ultrasonics, Ferroelectrics, and Frequency Control Society, vol. 41, No. 1, pp. 1-3 (Jan. 1984).

Tsividis, Y. and Antognetti, P. (Ed.), *Design of MOS VLSI Circuits for Telecommunications*, Prentice-Hall, p. 304 (1985).

Tsividis, Y., "Principles of Operation and Analysis of Switched-Capacitor Circuits," *Proceedings of the IEEE*, IEEE, vol. 71, No. 8, pp. 926-940 (Aug. 1983).

Tsurumi, H. and Maeda, T., "Design Study on a Direct Conversion Receiver Front-End for 280 MHZ, 900 MHZ, and 2.6 Ghz Band Radio Communication Systems," *41st IEEE Vehicular Technology Conference*, IEEE Vehicular Technology Society, pp. 457-462 (May 19-22, 1991).

Valdmanis, J.A. et al., "Picosecond and Subpicosend Optoelectronics for Measurements of Future High Speed Electronic Devices," *IEDM Technical Digest*, IEEE, pp. 597-600 (Dec. 5-7, 1983).

van de Kamp, M.M.J.L., "Asymmetric signal level distribution due to tropospheric scintillation," *Electronics Letters*, IEE, vol. 34, No. 11, pp. 1145-1146 (May 28, 1998).

Vasseur, H. and Vanhoenacker, D., "Characterization of tropospheric turbulent layers from radiosonde data," *Electronics Letters*, IEE, vol. 34, No. 4, pp. 318-319 (Feb. 19, 1998).

Verdone, R., "Outage Probability Analysis for Short-Range Communication Systems at 60 Ghz in ATT Urban Environments," *IEEE Transactions on Vehicular Technology*, IEEE Vehicular Technology Society, vol. 46, No. 4, pp. 1027-1039 (Nov. 1997).

Vierira-Ribeiro, S.A., *Single-IF DECT Receiver Architecture using a Quadrature Sub-Sampling Band-Pass Sigma-Delta Modulator*, Thesis for Degree of Master's of Engineering, Carleton University, UMI Dissertation Services, pp. 1-180 (Apr. 1995).

Viler, E. et al., "A Comprehensive/Selective MM-Wave Satellite Downlink Experiment on Fade Dynamics," *Tenth International Conference on Antennas and Propagation*, Electronics Division of the IEE, pp. 2.98-2.101 (Apr. 14-17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8-1-8-16 (Oct. 4-7, 1983).

Viler, E. and Smith, H., "A Theoretical and Experimental Study of Angular Scintillations in Earth Space Paths," *IEEE Transactions on Antennas and Propagation*, IEEE, vol. AP-34, No. 1, pp. 2-10 (Jan. 1986).

Viler, E. et al., "A Wide Band Transhorizon Experiment at 11.6 Ghz," *Eighth International Conference on Antennas and Propagation*, Electronics Division of the IEE, pp. 441-445 (Mar. 30-Apr. 2, 1993).

Viler, E. and Matthews, P.A., "Amplitude Dependence of Frequency in Oscillators," *Electronics Letters*, IEE, vol. 8, No. 20, pp. 509-511 (Oct. 5, 1972).

Viler, E. at al., "An experimental mm-wave receiver system for measuring phase noise due to atmospheric turbulence," *Proceedings of the 25th European Microwave Conference*, Nexus House, pp. 114-119 (1995).

Viler, E. and Burgueno, A., "Analysis and Modeling of Time Intervals Between Rain Rate Exceedances in the Context of Fade Dynamics," *IEEE Transactions on Communications*, IEEE Communications Society, vol. 39, No. 9, pp. 1306-1312 (Sep. 1991).

Viler, E. at at, "Angle of Arrival Fluctuations in High and Low Elevation Earth Space Paths," *Fourth International Conference on Antennas and Propagation (ICAP 85)*, Electronics Division of the IEE, pp. 83-88 (Apr. 16-19, 1985).

Viler, E., "Antennas and Propagation: A Telecommunications Systems Subject," *Electronics Division Colloquium on Teaching Antennas and Propagation to Undergraduates*, IEE, pp. 7/1-7/6 (Mar. 8, 1988).

Viler, E. et rd., "CERS*. Millimetre-Wave Beacon Package and Related Payload Doppler Correction Strategies," *Electronics Division Colloquium on CERS-Communications Engineering Research Satellite*, IEE, pp. 10/1-10/10 (Apr. 10, 1984).

Viler, E. and Moulsley, T.J., "Comment and Reply: Probability Density Function of Amplitude Scintillations," *Electronics Letters*, IEE, vol. 21, No. 14, pp. 620-622 (Jul. 4, 1985).

Viler, E. et al., "Comparison of Rainfall Rate Duration Distributions for ILE-IFE and Barcelona," *Electronics Letters*, IEE, vol. 28, No. 20, pp. 1922-1924 (Sep. 24, 1992).

Vilar, E., "Depolarization and Field Transmittances in Indoor Communications," *Electronics Letters*, IEE, vol. 27, No. 9, pp. 732-733 (Apr. 25, 1991).

Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150-154 (Apr. 4-7, 1989).

Viler, E. et al., "Experimental System and Measurements of Transhorizon Signal Levels at 11 Ghz," *18th European Microwave Conference*, Microwave Exhibitions and Publishers Ltd., pp. 429-435 (Sep. 12-15, 1988).

Viler, E. and Matthews, P.A., "Importance of Amplitude Scintillations in Millimetric Radio Links," *Proceedings of the 4th European Microwave Conference*, Microwave Exhibitions and Publishers, pp. 202-206 (Sep. 10-13, 1974).

Viler, E. and Haddon, J., "Measurement and Modeling of Scintillation Intensity to Estimate Turbulence Parameters in an Earth-Space Path," *IEEE Transactions on Antennas and Propagation*, IEEE Antennas and Propagation Society, vol. AP-32, No. 4, pp. 340-346 (Apr. 1984).

Viler, E. and Matthews, P.A., "Measurement of Phase Fluctuations on Millimetric Radiowave Propagation,". *Electronics Letters*, IEE, vol. 7, No. 18, pp. 566-568 (Sep. 9, 1971).

Viler, E. and Wan, K.W., "Narrow and Wide Band Estimates of Field Strength for Indoor Communications in the Millimetre Band," *Electronics Division Colloquium on Radiocommunications in the Range 30-60 Ghz*, IEE, pp. 5/1-5/8 (Jan. 17, 1991).

Viler, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Viler, E. and Senin, S., "Propagation phase noise identified using 40 Ghz satellite downlink," *Electronics Letters*, IEE, vol. 33, No. 22, pp. 1901-1902 (Oct. 23, 1997).

Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230-2.233 (Apr. 14-17, 1997).

Viler, E. and Haddon, J., "Scintillation Modeling and Measurement—A Tool for Remote-Sensing Slant Paths," *AGARD Conference Proceedings No. 332: Propagation Aspects of Frequency Sharing, Interference and System Diversity*, AGARD, pp. 27-1-27-13 (Oct. 18-22, 1982).

Vilar, E., "Some Umitations on Digital Transmission Through Turbulent Atmosphere," *International Conference on Satellite Communication Systems Technology*, Electronics Division of the IEE, pp. 169-187 (Apr. 7-10, 1975).

Viler, E. and Matthews, P.A., "Summary of Scintillation Observations in a 36 Ghz Link Across London," *International Conference on Antennas and Propagation Part 2: Propagation*, IEE, pp. 36-40 (Nov. 28-30, 1978).

Viler, E. et al., "Wideband Characterization of Scattering Channels," *Tenth International Conference on Antennas and Propagation*, Electronics Division of the IEE, pp. 2.353-2.358 (Apr. 14-17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1-11 (Nov. 1986).

Wan, K.W. et al, "A Novel Approach to the Simultaneous Measurement of Phase and Amplitude Noises in Oscillator," *Proceedings of the 19th European Microwave Conference*, Microwave Exhibitions and Publishers Ltd., pp. 809-813 (Sep. 4-7, 1989).

Wan, K.W. et al., "Extended Variances and Autoregressive/Moving Average Algorithm for the Measurement and Synthesis of Oscillator Phase Noise," *Proceedings of the 43rd Annual Symposium on Frequency Control*, IEEE, pp. 331-335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1-3/5 (Dec. 3, 1993).

Wang, H. "A 1-V Multigigahertz RF Mixer Core in 0.5—µm CMOS," *IEEE Journal of Solid-State Circuits*, IEEE Solid-State Circuits Society, vol. 33, No. 12, pp. 2265-2267 (Dec. 1998).

Watson, A.W.D. et at, "Digital Conversion and Signal Processing for High Performance Communications Receivers," *Digital Processing of Signals in Communications*, Institution of Electronic and Radio Engineers, pp. 367-373 (Apr. 22-26, 1985).

Weast, R.C. et al. (Ed.), *Handbook of Mathematical Tables*, Second Edition, The Chemical Rubber Co., pp. 480-485 (1964).

Wiley, R.G., "Approximate FM Demodulation Using Zero Crossings," *IEEE Transactions on Communications*, IEEE, vol. COM-29, No. 7, pp. 1061-1065 (Jul. 1981).

U.S. Appl. No. 09/569,044, filed May 10, 2000, Sorrells et al.

Worthman, W., "Convergence . . . Again," *RF Design*, Primedia, p. 102 (Mar. 1999).

Young, I.A. and Hodges, D.A., "MOS Switched-Capacitor Analog Sampled-Data Direct-Form Recursive Filters," *IEEE Journal of Solid-State Circuits*, IEEE, vol. SC-14, No. 6, pp. 1020-1033 (Dec. 1979).

Translation of Specification and Claims of FR Patent No. 2245130, 3 pages.

Fest, Jean-Pierre, "Le Convertisseur A/N Revolutionne Le Recepteur Radio," *Electronique*, JMJ (Publisher), No. 54, pp. 40-42 (Dec. 1995).

Translation of DE Patent No. 35 41 031 A1, 22 pages.

Translation of EP Patent No. 0 732 803 A1, 9 pages.

Fest, Jean-Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages.

Miki, S. and Nagahama, R., *Modulation System II*, Common Edition 7, Kyoritsu Publishing Co., Ltd., pp. 146-154 (Apr. 30, 1956).

Mike, S. and Nagahama, R., *Modulation System II*, Common Edition 7, Kyoritsu Publishing Co., Ltd., pp. 146-149 (Apr. 30, 1956). (Partial Translation of Doc. AQ51).

Rabiner, L.R. and Gold, B., *Theory and Application of Digital Signal Processing*, Prentice-Hall, Inc., pp. xiii-xii and 40-46 (1975).

English-language Abstract of Japanese Patent Publication No. 08-032556, from http://www1.ipdl.jpo.go.jp, 2 Pages (Feb. 2, 1996—Date of publication of application).
English-language Abstract of Japanese Patent Publication No. 08-139524, from http://www1.ipdl.jpo.go.jp, 2 Pages (May 31, 1996—Date of publication of application).
English-language Abstract of Japanese Patent Publication No. 59-144249, from http://www1.ipdl.jpo.go.jp, 2 Pages (Aug. 18, 1984—Date of publication of application).
English-language Abstract of Japanese Patent Publication No. 63-054002, from http://www1.ipdl.jpo.go.jp, 2 Pages (Mar. 8, 1988—Date of publication of application).
English-language Abstract of Japanese Patent Publication No. 06-237276, from http://www1.ipdl.jpo.go.jp, 2 Pages (Aug. 23, 1994—Date of publication of application).
English-language Abstract of Japanese Patent Publication No. 08-023359, from http://www1.ipdl.jpo.go.jp, 2 Pages (Jan. 23, 1996—Date of publication of application).
Translation of Japanese Patent Publication No. 47/2314, 7 pages.
Partial Translation of Japanese Patent Publication No. 58/7903, 3 pages.
English-language Abstract of Japanese Patent Publication No. 58-133004, from http://www1.ipdl.jpo.go.jp, 2 Pages (Aug. 8, 1993—Date of publication of application).
English-language Abstract of Japanese Patent Publication No. 60-058705, from http://www1.ipdl.jpo.go.jp, 2 Pages (Apr. 4, 1985—Date of publication of application).
English-language Abstract of Japanese Patent Publication No. 04-123614, from http://www1.ipcfl.jpo.go.jp, 2 Pages (Apr. 23, 1992—Date of publication of application).
English-language Abstract of Japanese Patent Publication No. 04-127601, from http://www1.ipdl.jpo.go.jp, 2 Pages (Apr. 28, 1992—Date of publication of application).
English-language Abstract of Japanese Patent Publication No. 05-175730, from http://www1.ipdl.jpo.go.jp, 2 Pages (Jul. 13, 1993—Date of publication of application).
English-language Abstract of Japanese Patent Publication No. 05-175734, from http://www1.ipdl.jpo.go.jp, 2 Pages (Jul. 13, 1993—Date of publication of application).
English-language Abstract of Japanese Patent Publication No. 07-154344, from http://www1.ipdl.jpo.go.jp, 2 Pages (Jun. 16, 1995—Date of publication of application).
English-language Abstract of Japanese Patent Publication No. 07-307620, from http://www1.ipdl.jpo.go.jp, 2 Pages (Nov. 21, 1995—Date of publication of application).
Oppenheim, A.V. and Schafer, R.W., *Digital Signal Processing*, Prentice-Hall, pp. vii-x, 6-35, 45-78, 87-121 and 136-165 (1975).
English-language Abstract of Japanese Patent Publication No. 55-066057, from http://www1.ipdl.jpo.go.jp, 1 Page (May 19, 1980—Date of publication of application).
English-language Abstract of Japanese Patent Publication No. 63-065587, from http://www1.ipdl.jpo.go.jp, 1 Page (Mar. 24, 1988—Date of publication of application).
English-language Abstract of Japanese Patent Publication No. 63-153691, from http://www1.jpdl.jpo.go.jp, 1 Page (Jun. 27, 1988—Date of publication of application).
Translation of Japanese Patent Publication No. 60-130203, 3 pages (Jul. 11, 1985—Date of publication of application).
Razavi, B., "A 900-MHz/1.8-Ghz CMOS Transmitter for Dual-Band Applications," *Symposium on VLSI Circuits Digest of Technical Papers*, IEEE, pp. 128-131 (1998).
Ritter, G.M., "SDA, A New Solution for Transceivers," *16th European Microwave Conference*, Microwave Exhibitions and Publishers, pp. 729-733 (Sep. 8, 1986).
Dialog File 351 (Derwent WPI) English Language Patent Abstract for FR 2 669 787, 1 page (May 29, 1992—Date of publication of application).
Akos, D.M. et al., "Direct Bandpass Sampling of Multiple Distinct RF Signals," *IEEE Transactions on Communications*, IEEE, vol. 47, No. 7, pp. 983-988 (Jul. 1999).
Patel, M. et al., "Bandpass Sampling for Software Radio Receivers, and the Effect of Oversampling on Aperture Jitter," *VTC 2002*, IEEE, pp. 1901-1905 (2002).

English-language Abstract of Japanese Patent Publication No. 61-030821, 1 Page (Feb. 13, 1986—Date of publication of application).
English-language Abstract of Japanese Patent Publication No. 05-327356, 1 Page (Dec. 10, 1993—Date of publication of application).
Tayloe; D., "A Low-noise, High-performance Zero IF Quadrature Detector/Preamplifler," *RF Design*, Primedia Business Magazines & Media, Inc., pp. 58, 60, 62 and 69 (Mar. 2003).
Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117-120 (Apr. 1996).
Simoni, A. et al., "A Digital Camera for Machine Vision," *20th International Conference on Industrial Electronics, Control and Instrumentation*, IEEE. pp. 879-883 (Sep. 1994).
Stewart, R.W. and Pfann, E., "Oversampling and sigma-delta strategies for data conversion," *Electronics & Communication Engineering Journal*, IEEE, pp. 37-47 (Feb. 1998).
Rudell, J.C. et el., "A 1.9-Ghz Wide-Band IF Double Conversion CMOS Receiver for Cordless Telephone Applications," *IEEE Journal of Solid-State Circuits*, IEEE, vol. 32, No. 12, pp. 2071-2088 (Dec. 1997).
English-language Abstract of Japanese Patent Publication No. 09-036664, from http://www1.jpdl.jpo.go.jp, 2 Pages (Feb. 7, 1997—Date of publication of application).
Simoni, A. et al., "A Single-Chip Optical Sensor with Analog Memory for Motion Detection," *IEEE Journal of Solid-State Circtuits*, IEEE, vol. 30, No. 7, pp. 800-806 (Jul. 1995).
English-language Abstract of Japanese Patent Publication No. JP 62-12381, data supplied by the espacenet, 1 page (Jan. 21, 1987—Date of publication of application).
English-language Abstract of Japanese Patent Publication No. JP 4-154227, data supplied by the espacenet, 1 page (May 27, 1992—Date of publication of application).
English-language Abstract of Japanese Patent Publication No. JP 6-284038, data supplied by the espacenet, 1 page (Oct. 7, 1994—Date of publication of application).
English-language Abstract of Japanese Patent Publication No. JP 10-96778, data supplied by the espacenet, 1 page (Apr. 14, 1998—Date of publication of application).
English-language Abstract of Japanese Patent Publication No. JP 11-98205, data supplied by the espacenet, 1 page (Apr. 9, 1999—Date of publication of application).
English-language Abstract of Japanese Patent Publication No. JP 61-232706, data supplied by the espacenet, 1 page (Oct. 17, 1986—Date of publication of application).
English-language Abstract of Japanese Patent Publication No. JP 9-171399, data supplied by the espacenet, 1 page (Jun. 30, 1997—Date of publication of application).
English-language Abstract of Japanese Patent Publication No. JP 10-41860, data supplied by the espacenet, 1 page (Feb. 13, 1998—Date of publication of application).
English-language Computer Translation of Japanese Patent Publication No. JP 10-173563, provided by the JPO, 10 pages (Jun. 26, 1998—Date of publication of application) and cited in U.S. Appl. No. 10/305,299, directed to related subject matter.
*What Is I/Q Data?*, printed Sep. 16, 2006, from http://zone.ni.com, 8 pages (Copyright 2003).
Thread (computer science) from Wikipedia, the free encyclopedia [online], 6 pages, retrieved from http://en.wikipedia.org/wiki/Thread_%28computer_science%29 [Retrieved on Feb. 11, 2008].
English-language Abstract of Japanese Patent Publication No. JP 58-031622, data supplied by ep.espacenet.com, 1 page (Feb. 24, 1983—Date of publication of application).
English-language Abstract of Japanese Patent Publication No. JP 61-245749, data supplied by ep.espacenet.com, 1 page (Nov. 1, 1986—Date of publication of application).
English-language Abstract of Japanese Patent Publication No. JP 64-048557, data supplied by ep.espacenet.com, 1 page (Feb. 23, 1989—Date of publication of application).

English-language Abstract of Japanese Patent Publication No. JP 59-022438, data supplied by ep.espacenet.com, 1 page (Feb. 4, 1984—Date of publication of application).

English-language Abstract of Japanese Patent Publication No. JP 59-123318, data supplied by ep.espacenet.com, 1 page (Jul. 17, 1984—Date of publication of application).

English-language Abstract of Japanese Patent Publication No. JP 61-193521, data supplied by ep.espacenet.com, 1 page (Aug. 28, 1986—Date of publication of application).

English-language Abstract of Japanese Patent Publication No. JP 62-047214, data supplied by ep.espacenet.com, 1 page (Feb. 28, 1987—Date of publication of application).

English-language Abstract of Japanese Patent Publication No. JP 63-274214, data supplied by ep.espacenet.com, 1 page (Nov. 11, 1988—Date of publication of application).

English-language Abstract of Japanese Patent Publication No. JP 7-169292, data supplied by ep.espacenet.com, 1 page (Jul. 4, 1995—Date of publication of application).

English-language Abstract of Japanese Patent Publication No. JP 10-22804, data supplied by ep.espacenet.com, 1 page (Jan. 23, 1998—Date of publication of application).

English-language Abstract of Japanese Patent Publication No. JP 8-288882, data supplied by ep.espacenet.com, 1 page (Nov. 1, 1996—Date of publication of application).

Office Action dated Mar. 29, 2012 cited in U.S. Appl. No. 13/090,031, filed Apr. 19, 2011.

Notice of Allowanced dated Apr. 10, 2012 cited in U.S. Appl. No. 12/776,173, filed May 7, 2010.

Office action dated Jan. 13, 2011 cited in U.S. Appl. No. 12/615,326, filed Nov. 10, 2009.

Office Action dated Dec. 14, 2011 cited in U.S. Appl. No. 12/634,233, filed Dec. 9, 2009.

Notice of Allowance dated Dec. 20, 2012 cited in U.S. Appl. No. 11/589,921, filed Oct. 31, 2006.

Office Action dated May 26, 2011 cited in U.S. Appl. No. 11/589,921, filed Oct. 31, 2006.

Office Action dated Oct. 6, 2011 cited in U.S. Appl. No. 12/118,111, filed May 9, 2008.

Notice of Allowance dated Jan. 20, 2012 cited in U.S. Appl. No. 12/881,912, filed Sep. 4, 2010.

Notice of Allowance dated Feb. 13, 2012 cited in U.S. Appl. No. 12/881,912, filed Sep. 14, 2010.

Notice of Allowance dated Feb. 29, 2012 cited in U.S. Appl. No. 11/589,921, filed Oct. 31, 2006.

Notice of Allowanced dated Mar. 6, 2012 cited in U.S. Appl. No. 13/040,570, filed Mar. 4, 2011.

Notice of Allowanced dated Mar. 21, 2012 cited in U.S. Appl. No. 13/093,887, filed Apr. 26, 2011.

\* cited by examiner

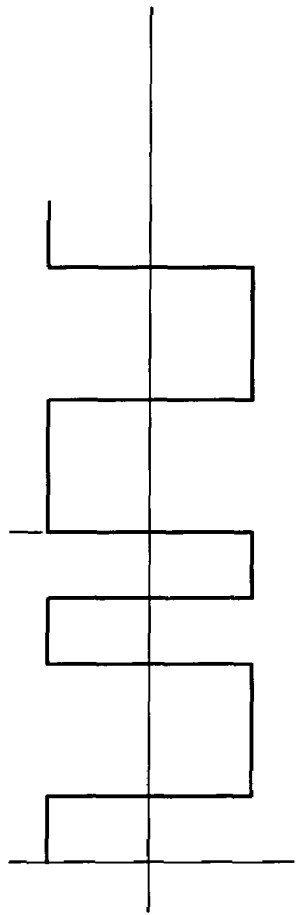
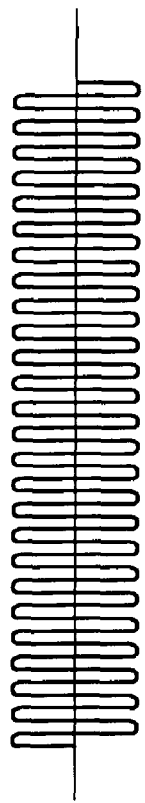
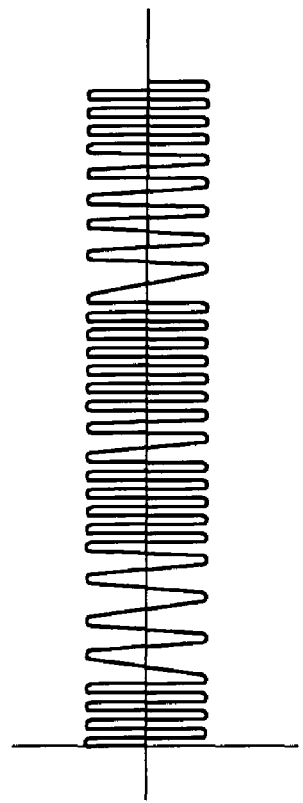
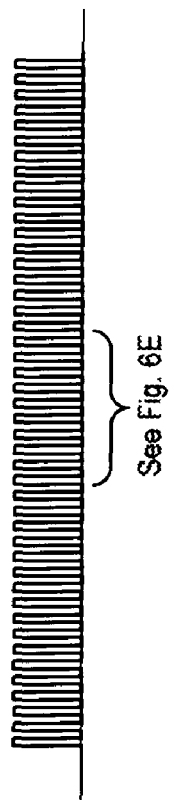
FIG. 6A — Information Signal 602
FIG. 6B — Oscillating Signal 604
FIG. 6C — Frequency Modulated Input Signal 606
FIG. 6D — Harmonically Rich Signal (Shown As Square Wave) 608
See Fig. 6E
FIG. 6

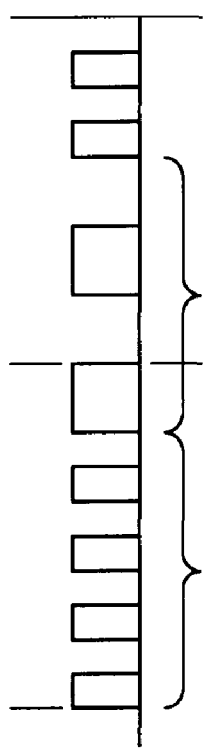
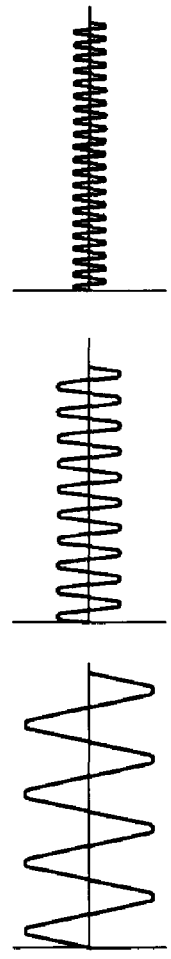
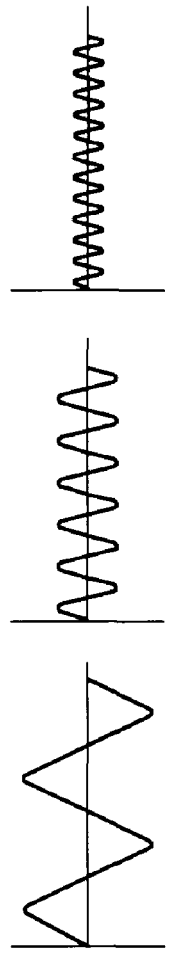
FIG. 6 (Continued)

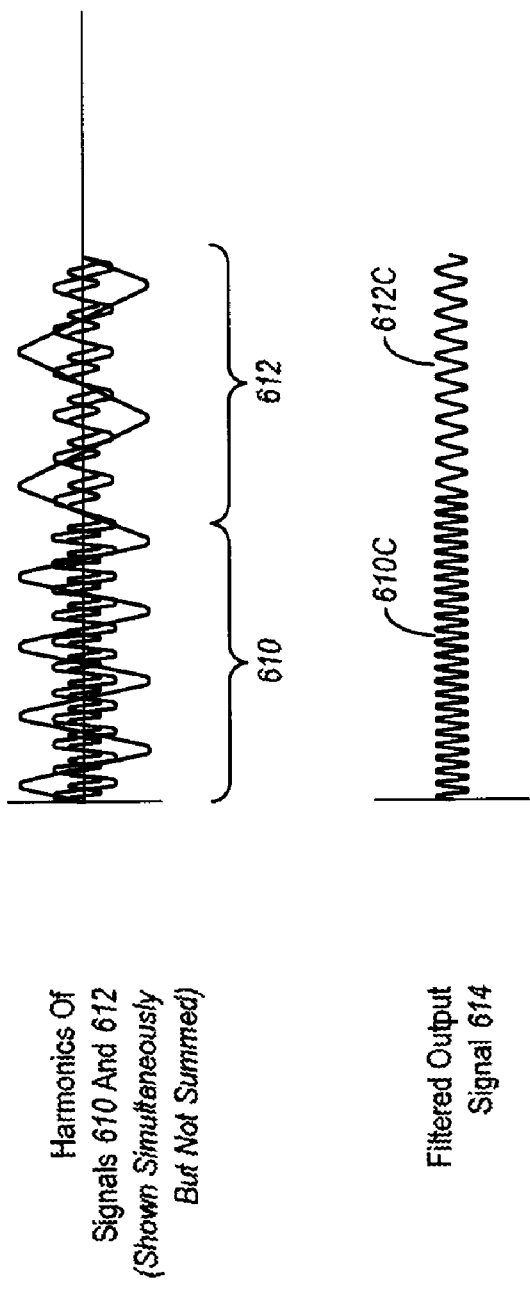

| Time<br>Node | t-1<br>(Rising Edge<br>Of φ₁) | t-1<br>(Rising Edge<br>Of φ₂) | t<br>(Rising Edge<br>Of φ₁) | t<br>(Rising Edge<br>Of φ₂) | t+1<br>(Rising Edge<br>Of φ₁) |
|---|---|---|---|---|---|
| 1902 | V1$_{t-1}$ _1804_ | V1$_{t-1}$ _1808_ | V1$_t$ _1816_ | V1$_t$ _1826_ | V1$_{t+1}$ _1838_ |
| 1904 | — | V1$_{t-1}$ _1810_ | V1$_{t-1}$ _1818_ | V1$_t$ _1828_ | V1$_t$ _1840_ |
| 1906 | VO$_{t-1}$ _1806_ | VO$_{t-1}$ _1812_ | VO$_t$ _1820_ | VO$_t$ _1830_ | VO$_{t+1}$ _1842_ |
| 1908 | — | VO$_{t-1}$ _1814_ | VO$_{t-1}$ _1822_ | VO$_t$ _1832_ | VO$_t$ _1844_ |
| 1910 | — | _1815_ | VO$_{t-1}$ _1824_ | VO$_{t-1}$ _1834_ | VO$_t$ _1846_ |
| 1912 | — | — | — | VO$_{t-1}$ _1836_ | V1$_{t-1}$ _1848_ |
| 1918 | — | — | — | — | V1$_t$ ~ _1850_<br>0.1 = VO$_t$ -<br>0.8 = VO$_{t-1}$ |

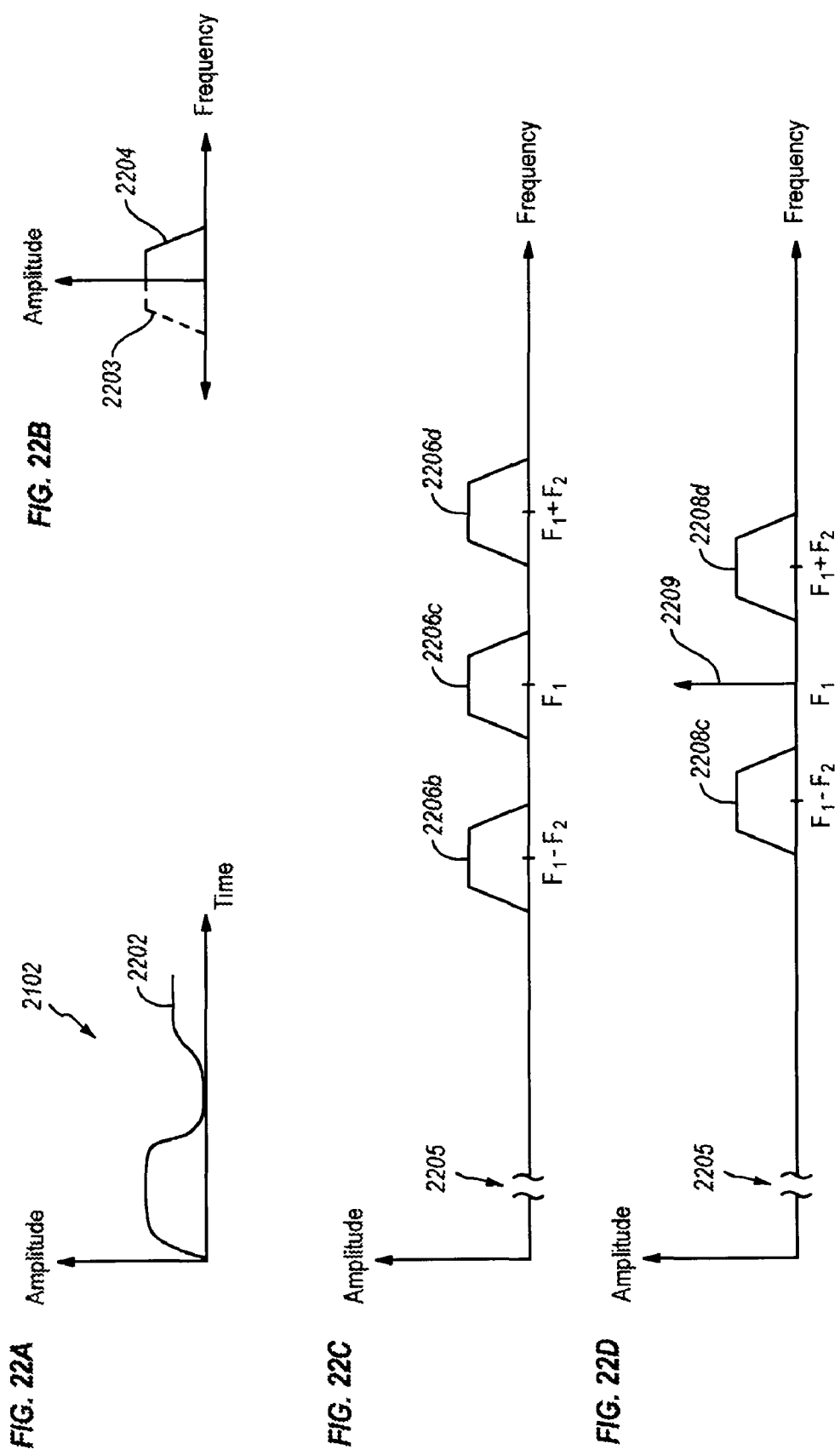

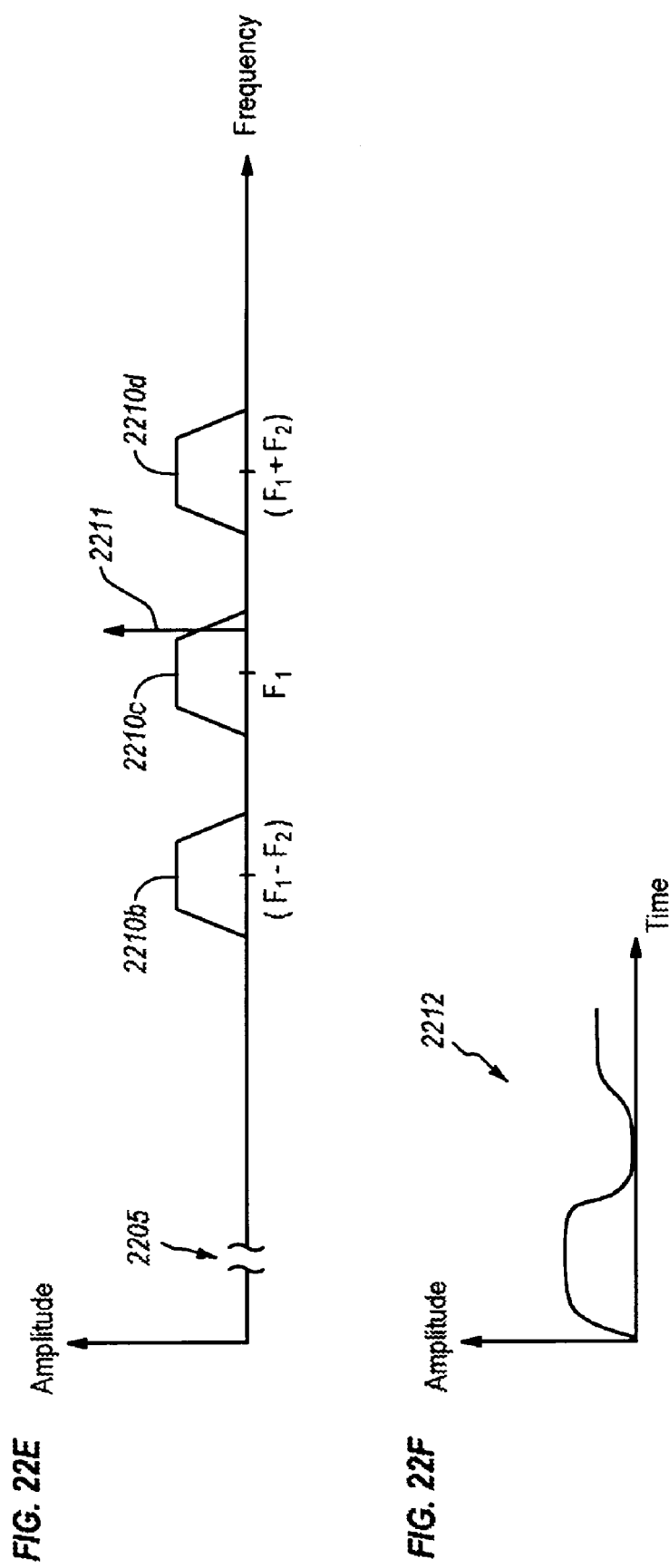

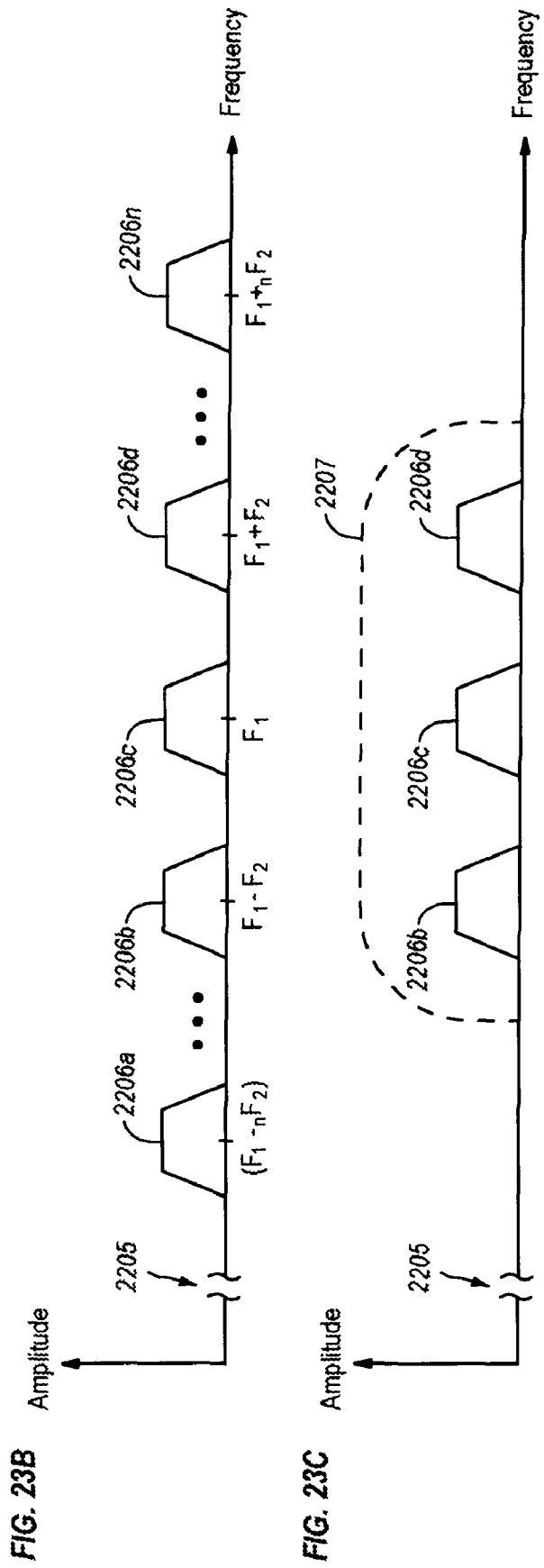

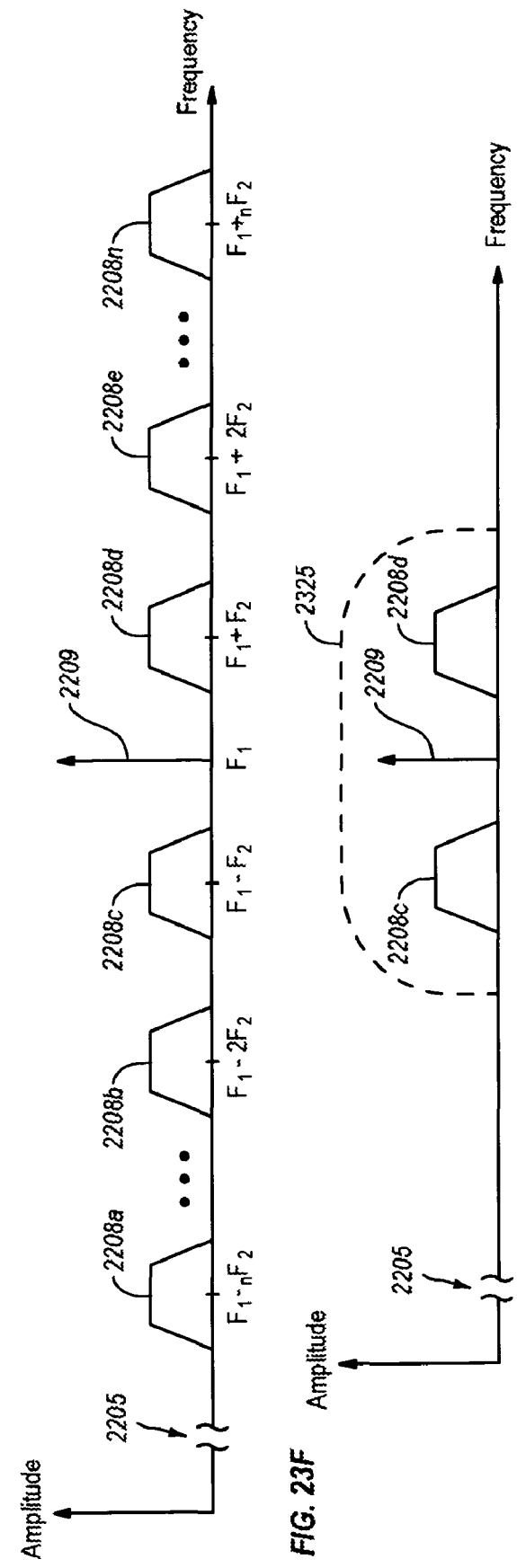

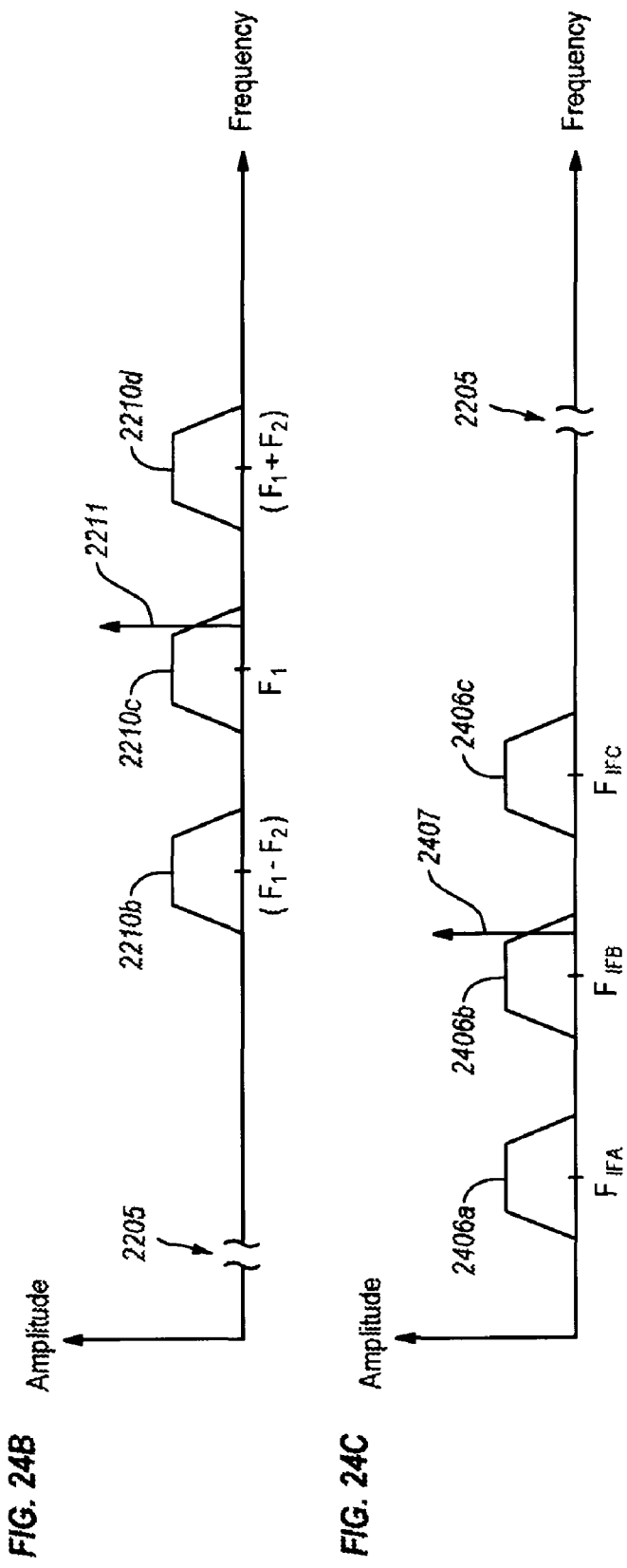

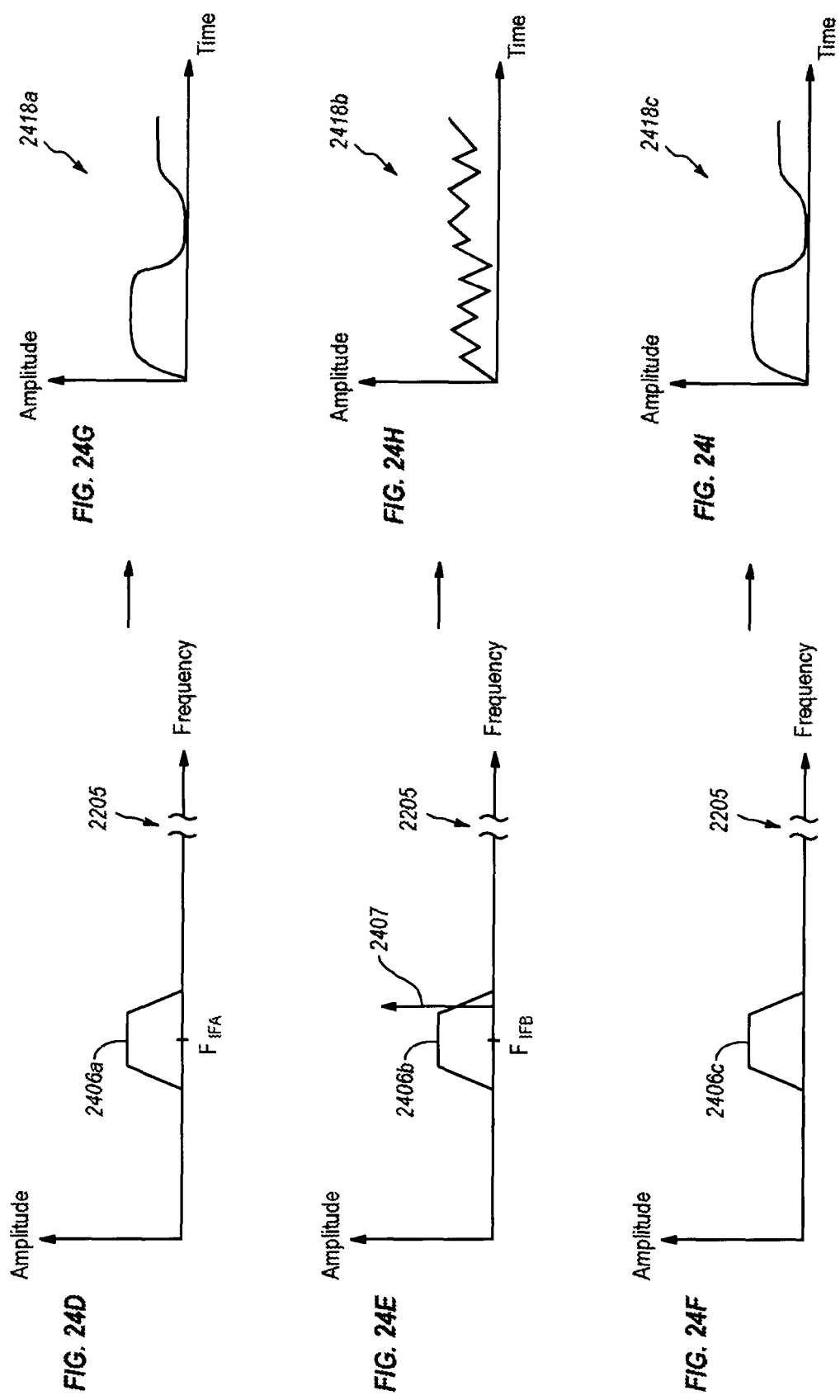

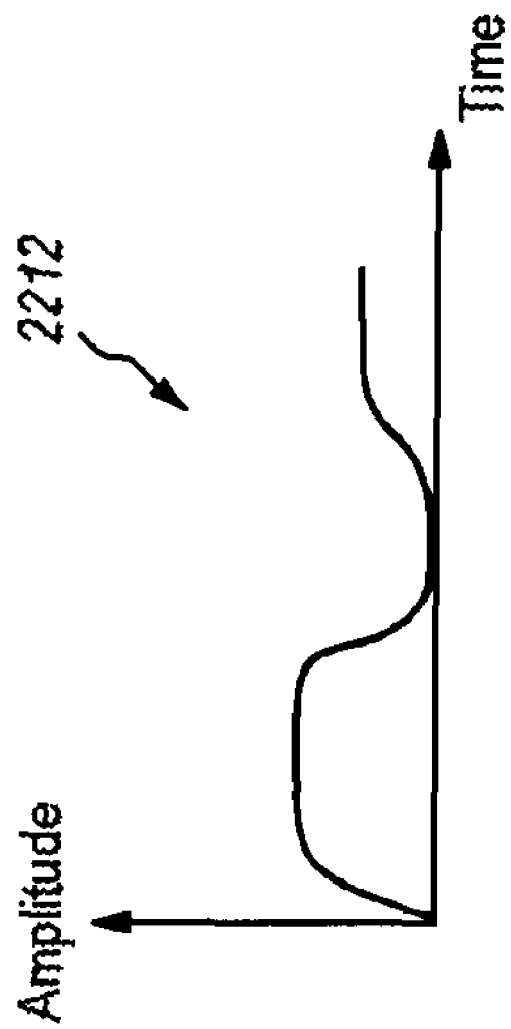

| Protocol / Bearer | Bluetooth | WAP | 802.11 | AT Command | ... | ... | ... |
|---|---|---|---|---|---|---|---|
| Bluetooth | X | | | | | | |
| GSM | | X | | | | | |
| CDMA | | X | | | | | |
| TDMA | | X | | | | | |
| 802.11 | | | X | | | | |
| PHS | | X | | | | | |
| CDPD | | X | | | | | |
| PDC-P | | X | | | | | |
| iDEN | | X | | | | | |
| FLEX | | | | X | | | |
| AMPS | | X | | | | | |
| ... | | | | | | | |

Short-Range

Wireless LAN (WLAN)
- Bluetooth
- Infrared
- Home RF
- 802.11
• • •

Longer-Range

Wireless Local Loop (WLL)
- Project Angel
- LMDS
- MMDS
- ARDIS
• • •

Cellular
- GSM
- SMS
- CDMA
• • •

Fixed

Mobile

*FIG. 40*

A. Rising Edge Pulse Generator

B. Falling-Edge Pulse Generator

Impedance Matched Aliasing Module

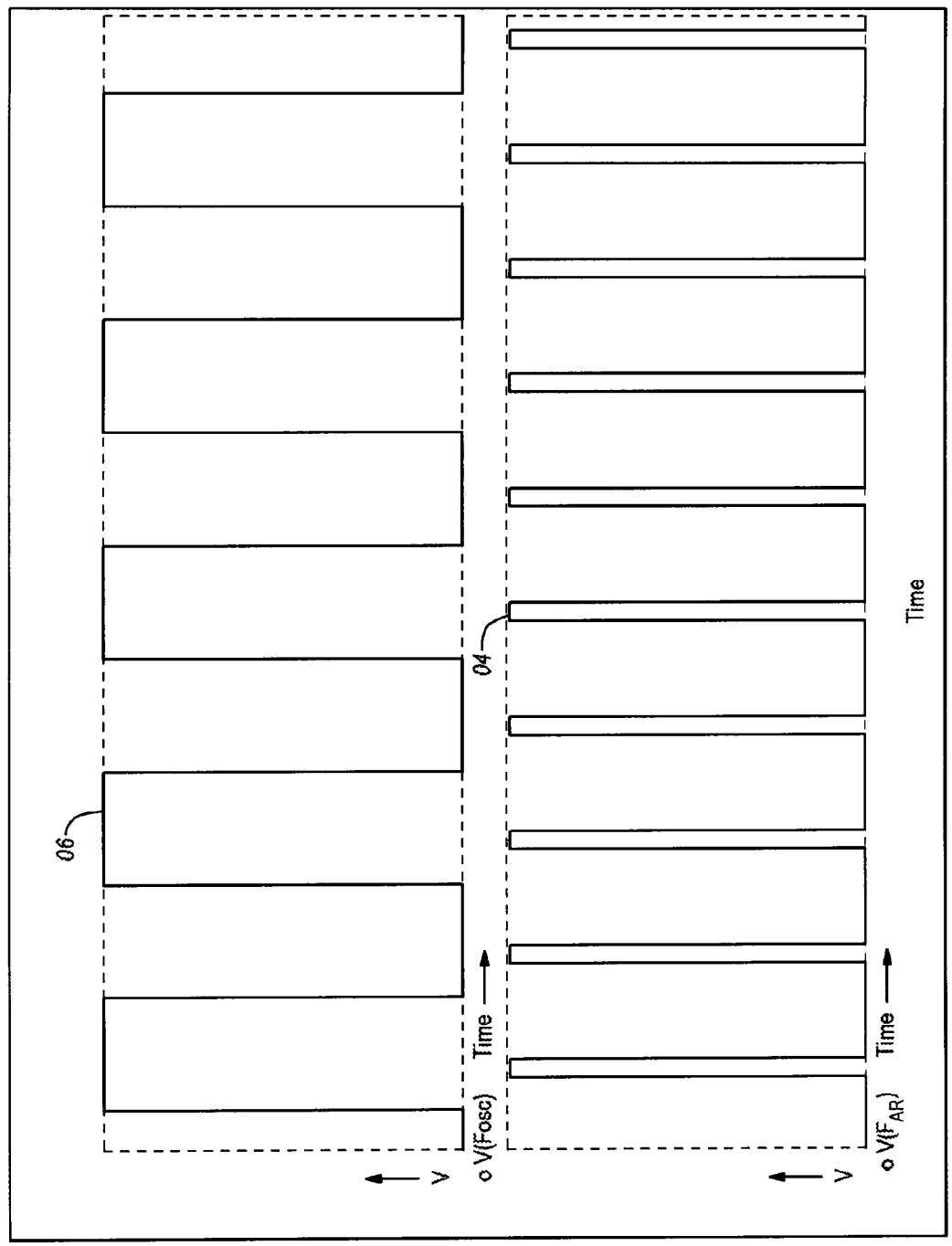

Aliasing Module

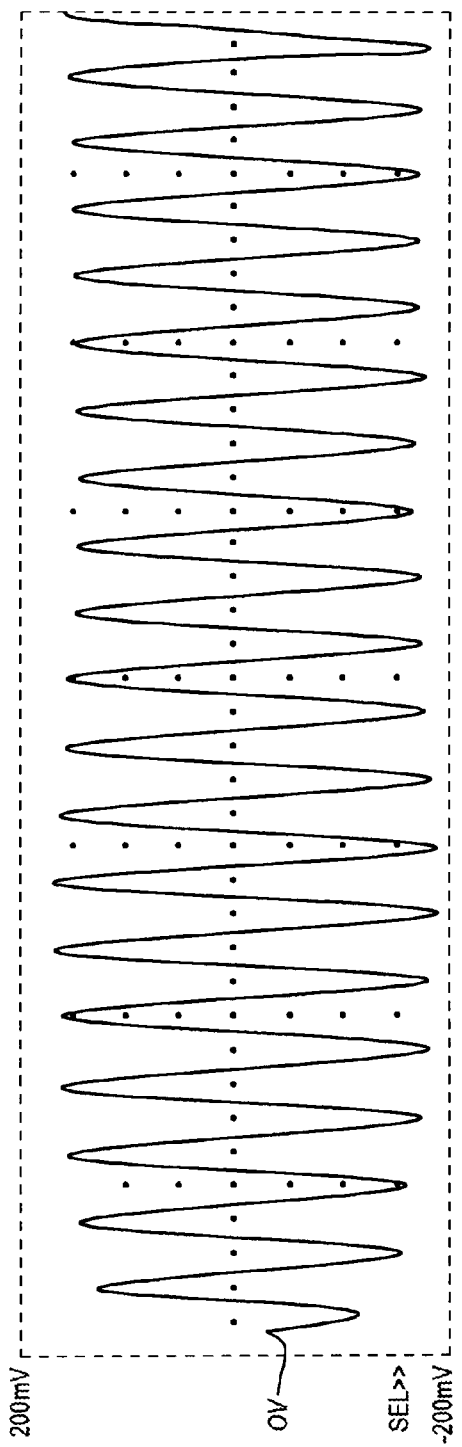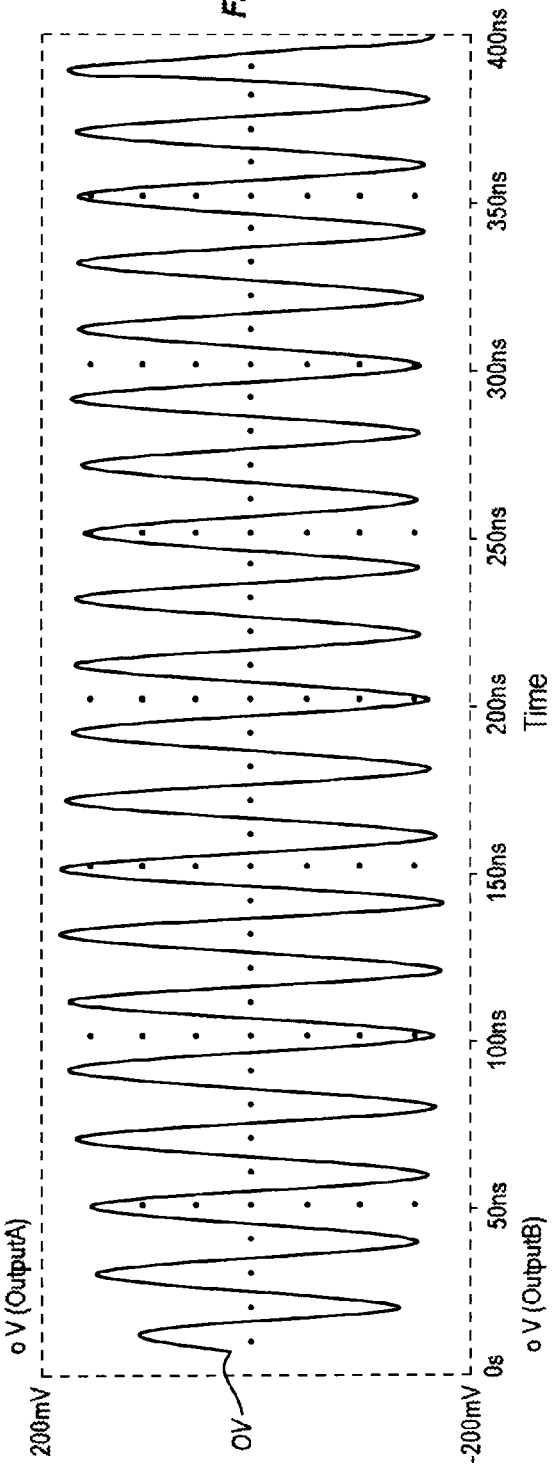

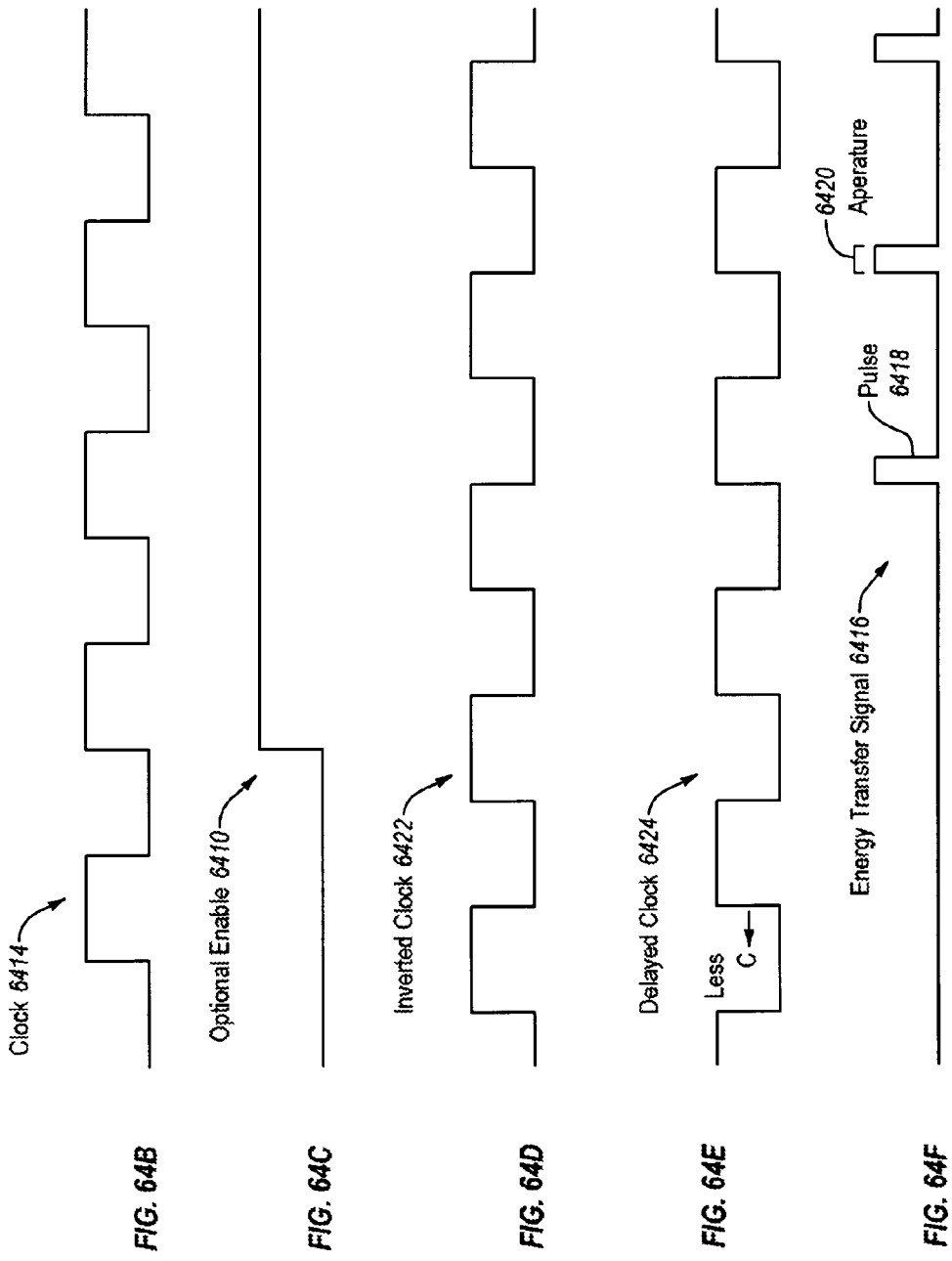

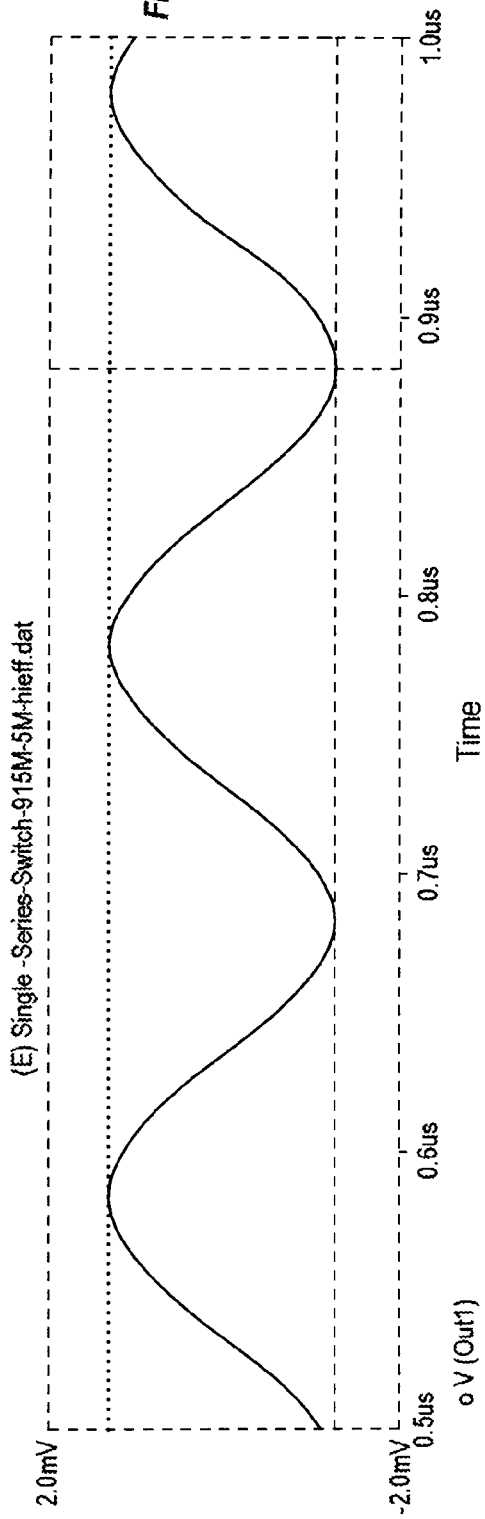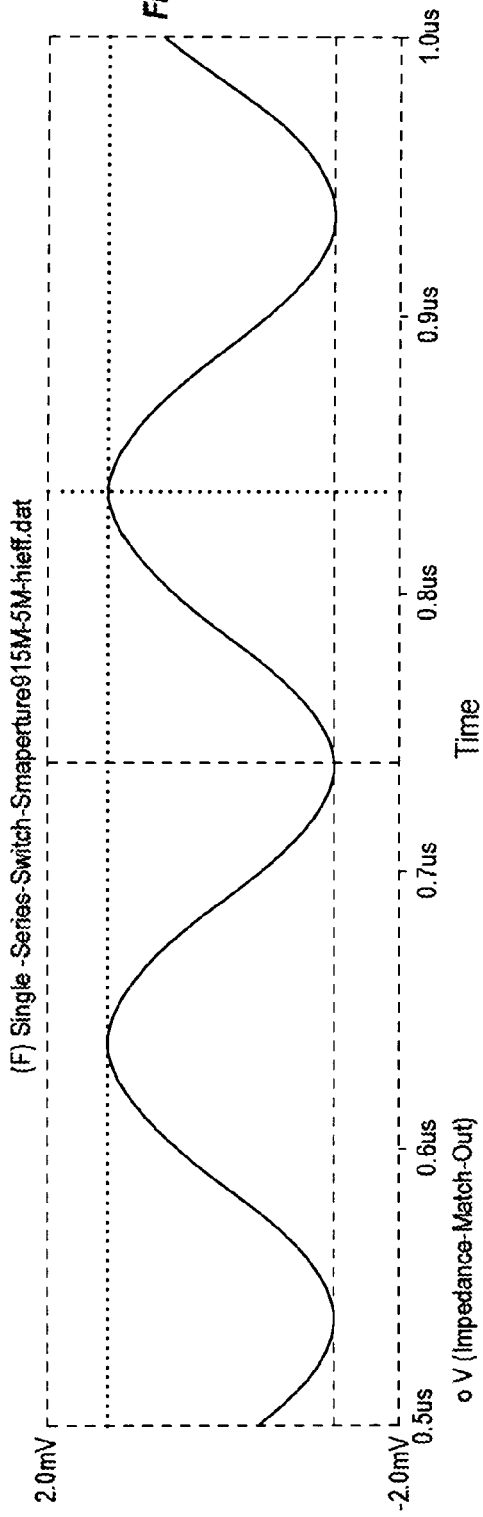

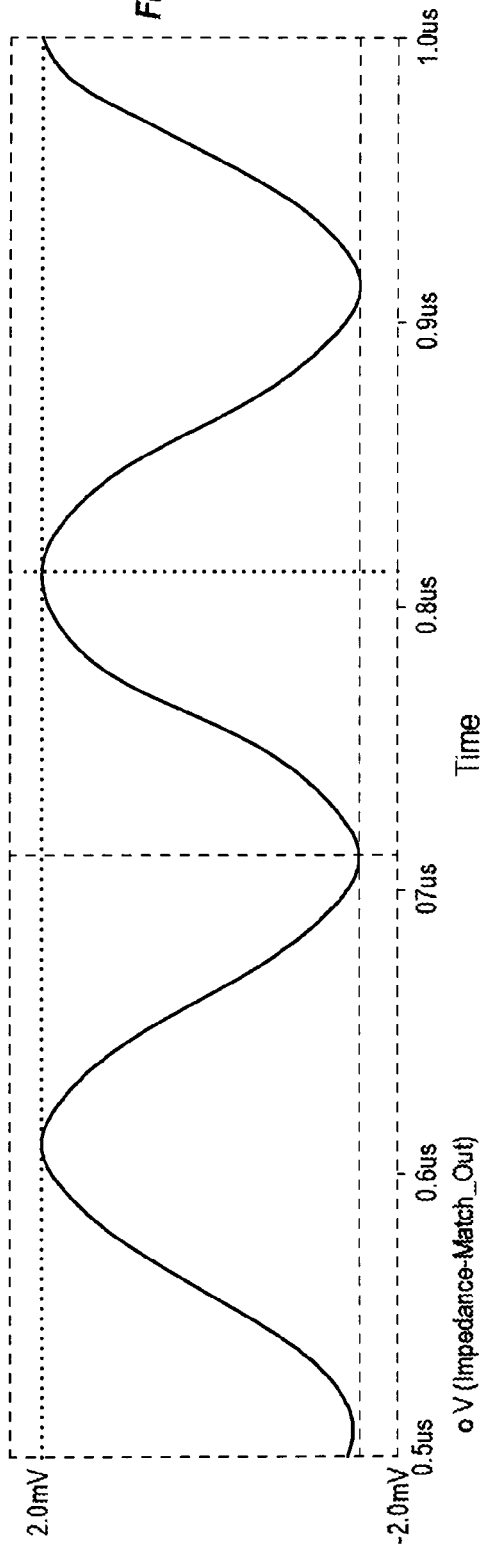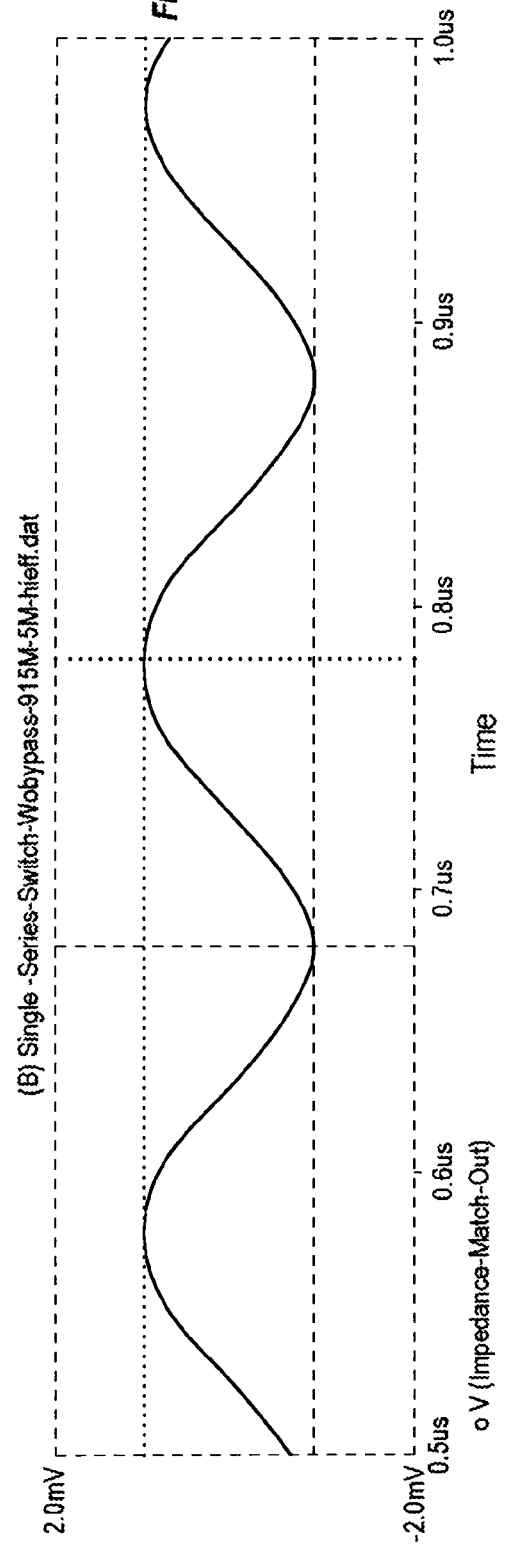

$$q = C \cdot V \qquad \text{EQ. 10}$$

$$V = A \cdot \sin(t) \qquad \text{EQ. 11}$$

$$q(t) = C \cdot A \cdot \sin(t) \qquad \text{EQ. 12}$$

$$\Delta q(t) = C \cdot A \cdot \sin(t) - C \cdot A \cdot (t - T) \qquad \text{EQ. 13}$$

$$\Delta q(t) = C \cdot A \cdot (\sin(t) - \sin(t-T)) \qquad \text{EQ. 14}$$

$$\sin(\alpha) - \sin(\beta) = 2 \cdot \sin\left(\frac{\alpha - \beta}{2}\right) \cdot \cos\left(\frac{\alpha + \beta}{2}\right) \qquad \text{EQ. 15}$$

$$\Delta q(t) = 2 \cdot C \cdot A \cdot \sin\left[\frac{t - (t - T)}{2}\right] \cdot \cos\left[\frac{t + (t - T)}{2}\right] \qquad \text{EQ. 16}$$

$$\Delta q(t) = 2 \cdot C \cdot A \cdot \sin\left(\frac{1}{2} \cdot T\right) \cdot \cos\left(t - \frac{1}{2} \cdot T\right) \qquad \text{EQ. 17}$$

$$q(t) = \int C \cdot A \cdot (\sin(t) - \sin(t - T)) dt \qquad \text{EQ. 18}$$

$$q(t) = (\cos(t) \cdot C \cdot A + \cos(t - T) \cdot C \cdot A \qquad \text{EQ. 19}$$

$$q(t) = C \cdot A \ (\cos(t - T) - \cos(t)) \qquad \text{EQ. 20}$$

FIG. 71B

Power - Charge Relationship $$q = c \cdot v \qquad \text{EQ. 21}$$

$$v = \frac{q}{2} \qquad \text{EQ. 22}$$

$$v = \frac{J}{q} \qquad \text{EQ. 23}$$

$$J = \frac{q^2}{C} \qquad \text{EQ. 24}$$

$$P = \frac{J}{S} \qquad \text{EQ. 25}$$

$$P = \frac{q^2}{C \cdot S} \qquad \text{EQ. 26}$$

FIG. 71E

Insertion Loss

Insertion Loss In dB Is Expressed By:

$$IL_{dB} = 10 \cdot \log \frac{P_{in}}{P_{out}} \qquad \text{EQ. 27}$$

Or $$IL_{dB} = 10 \cdot \log \left[ \frac{\left(\frac{V_{in}^2}{R_{in}}\right)}{\left(\frac{V_{out}^2}{R_{out}}\right)} \right] \qquad \text{EQ. 28}$$

*FIG. 71F*

UNIVERSAL PLATFORM MODULE FOR A PLURALITY OF COMMUNICATION PROTOCOLS

CROSS-REFERENCE TO OTHER APPLICATIONS

This is a continuation-in-part application of U.S. Non-Provisional Application "Method and System for Down-Converting an Electromagnetic Signal, and Transforms for Same," Ser. No. 09/550,642, filed Apr. 14, 2000, now U.S. Pat. No. 7,065,162, which is a continuation-in-part application of U.S. Non-Provisional Application "Matched Filter Characterization and Implementation of Universal Frequency Translation Method and Apparatus," Ser. No. 09/521,878, filed Mar. 9, 2000, now abandoned, both of which are herein incorporated by reference in their entireties.

The following applications of common assignee are related to the present application, and are all herein incorporated by reference in their entireties:

"Wireless Local Area Network (LAN) Using Universal Frequency Translation Technology," Ser. No. 60/147,129, filed Aug. 4, 1999.

"Method, System, and Apparatus for Balanced Frequency Up-Conversion of a Baseband Signal," Ser. No. 09/525,615, filed Mar. 14, 2000.

"Wireless Telephone Using Universal Frequency Translation," Ser. No. 60/195,328, filed Apr. 10, 2000.

BACKGROUND OF THE INVENTION

1. Field of the Invention

The present invention is generally related to multi-mode communications devices, and more particularly, to multi-mode communications devices implemented using universal frequency translation technology.

2. Related Art

Recent developments in computing and communications systems seek to enhance the performance and interoperability of devices. These devices, which include personal digital assistants (PDAs), mobile phones, set-top boxes, handheld personal computers, pagers, laptop personal computers, as well as home and office appliances, are being constructed to handle the tasks of traditional systems. These systems are currently constructed for receiving information signals for only a few platforms. Typically, the platforms available for a given device are predetermined. These systems can suffer from the disadvantage of being obsolete within a year or so of production, as well as being relatively expensive in terms of cost and power consumption. Conventional wireless communications circuitry is complex and has a large number of circuit parts. This complexity and high parts count increases overall cost. Additionally, higher part counts result in higher power consumption, which is undesirable, particularly in battery powered units.

Consequently, it is desirable to provide a method and apparatus for a universal platform module (UPM) for devices.

SUMMARY OF THE INVENTION

The present invention is directed to a universal platform module (UPM). The UPM includes at least one universal frequency translation (UFT) module implemented for signal reception, transmission and/or processing. In one embodiment, the UMP also includes a control module for operating the UFT module for any selected platform or combination of platforms.

Further features and advantages of the invention, as well as the structure and operation of various embodiments of the invention, are described in detail below with reference to the accompanying drawings.

BRIEF DESCRIPTION OF THE FIGURES

The invention shall be described with reference to the accompanying figures, wherein:

FIGS. 6A-6I illustrate example waveforms used to describe the operation of the UFU module;

FIGS. 22A-22F are example waveforms used to describe the system of FIG. 21;

FIGS. 23B and 23C are example waveforms used to further describe the enhanced signal reception system according to an embodiment of the invention;

FIGS. 23E and 23F are example waveforms used to further describe the enhanced signal reception system according to an embodiment of the invention;

FIGS. 24B-24J are example waveforms used to further describe the enhanced signal reception system according to an embodiment of the invention;

FIG. 39 shows some possible protocol/bearer service combinations;

FIG. 40 shows possible representative groupings of network links;

FIGS. 49B and C illustrate example waveforms related to the pulse generator of FIG. 49A;

FIGS. 60B-C illustrate example timing diagrams for the example system of FIG. 60A;

FIG. 64B illustrates a timing diagram of an example clock signal for real time aperture control, according to an embodiment of the invention;

FIG. 64C illustrates a timing diagram of an example optional enable signal for real time aperture control, according to an embodiment of the invention;

FIG. 64D illustrates a timing diagram of an inverted clock signal for real time aperture control, according to an embodiment of the invention;

FIG. 64E illustrates a timing diagram of an example delayed clock signal for real time aperture control, according to an embodiment of the invention;

FIG. 64F illustrates a timing diagram of an example energy transfer including pulses having apertures that are controlled in real time, according to an embodiment of the invention;

FIG. 69A is a timing diagram for the example embodiment of FIG. 65;

FIG. 69B is a timing diagram for the example embodiment of FIG. 66;

FIG. 70A is a timing diagram for the example embodiment of FIG. 67;

FIG. 70B is a timing diagram for the example embodiment of FIG. 68;

FIG. 71B illustrates example equations for determining charge transfer, in accordance with the present invention;

FIG. 71E illustrates power-charge relationship equations, in accordance with an embodiment of the present invention;

FIG. 71F illustrates insertion loss equations, in accordance with an embodiment of the present invention.

Figure 1A:
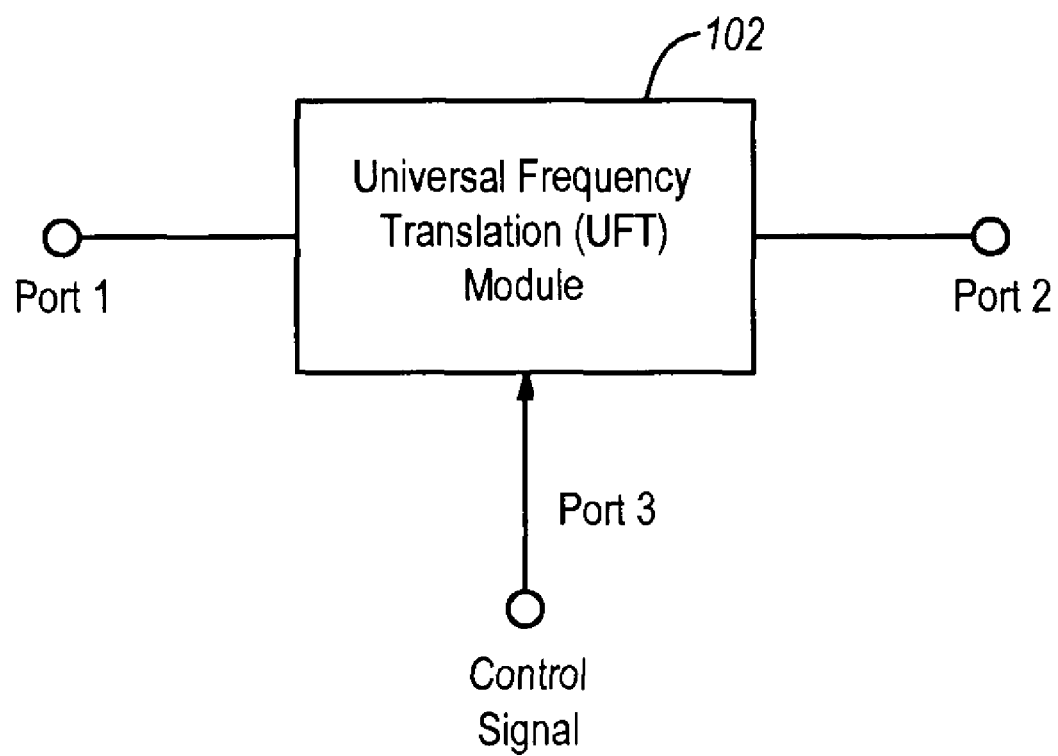
FIG. 1A is a block diagram of a universal frequency translation (UFT) module according to an embodiment of the invention.

The invention will now be described with reference to the accompanying drawings. In the drawings, like reference numbers generally indicate identical, functionally similar, and/or structurally similar elements. The drawing in which an element first appears is generally indicated by the left-most digit(s) in the corresponding reference number.

DETAILED DESCRIPTION OF THE PREFERRED EMBODIMENTS

Table of Contents

1. Overview of the Invention
2. Universal Frequency Translation
3. Frequency Down-conversion
   3.1 Optional Energy Transfer Signal Module
   3.2 Smoothing the Down-Converted Signal
   3.3 Impedance Matching
   3.4 Tanks and Resonant Structures
   3.5 Charge and Power Transfer Concepts
   3.6 Optimizing and Adjusting the Non-Negligible Aperture Width/Duration
      3.6.1 Varying Input and Output Impedances
      3.6.2 Real Time Aperture Control
   3.7 Adding a Bypass Network
   3.8 Modifying the Energy Transfer Signal Utilizing Feedback
   3.9 Other Implementations
   3.10 Example Energy Transfer Down-Converters
4. Frequency Up-conversion
5. Enhanced Signal Reception
6. Unified Down-conversion and Filtering
7. Example Application Embodiments of the Invention
8. Universal Platform Module (UPM)
   8.1 Conventional Multi-Mode Usage Models
   8.2 Universal Platform Module of the Present Invention
      8.2.1 Universal Platform Module Embodiments
      8.2.2 Universal Platform Module Receiver
         8.2.2.1 Universal Platform Module Receiver Embodiments
            8.2.2.1.1 Detailed UFD Module Block Diagram
         8.2.2.2 In-phase/Quadrature-phase (I/Q) Modulation Mode Receiver Embodiments
         8.2.2.3 Unified Down-convert and Filter Receiver Embodiments
         8.2.2.4 Other Receiver Embodiments
      8.2.3 Universal Platform Module Transmitter Embodiments
         8.2.3.1 Various Modulation Mode Transmitter Embodiments, Including Phase Modulation (PM)
            8.2.3.1.1 Detailed UFU Module Embodiments
         8.2.3.2 In-phase/Quadrature-phase (I/Q) Modulation Mode Transmitter Embodiments
         8.2.3.3 Other Transmitter Embodiments
      8.2.4 Enhanced Signal Reception Universal Platform Module Embodiments
      8.2.5 Universal Platform Module Transceiver Embodiments
      8.2.6 Other Universal Platform Module Embodiments
   8.3 Multi-Mode Infrastructure
   8.4 Additional Multi-mode Teachings
9. Conclusion 1. Overview of the Invention The present invention is directed to a universal platform module (UPM) that operates for and/or within a device. Devices include, without limitation, phones, personal digital/ data assistants (PDAs), smart appliances, personal computers (PCs), set-top boxes, networked outlets (printers, projectors, facsimiles), servers, gateways, other computing and/or data processing devices, etc. The UPM may include one or more receivers, transmitters, and/or transceivers, as well as other components such as local oscillators, switches, amplifiers, etc. According to embodiments of the invention, at least some of these components are implemented using universal frequency translation (UFT) modules. The UFT module performs frequency translation operations. Embodiments of the present invention incorporating various applications of the UFT module are described below. The UPM provides new functionality, and/or optionally works alternatively to existing components. The UPM utilizes protocols and/or bearer services and/or combinations thereof to exchange and/or process information with other components on any given network or networks (or any communication medium, for that matter). Generally, protocols, such as but not limited to Wireless Application Protocol (WAP), Jini, Java Virtual Machine (JVM), Bluetooth, IEEE 802.11, TCP/IP, UDP, HAVi, Salutation, Infrared (IR, IRDA), Service Location Protocol (SLP), Universal Plug-n-Play (UPnP, Simple Service Discovery Protocol (SSDP)), etc., provide the format for the transfer of data. Other procedures, methods, protocols, and/or standards may be combined with these protocols to enable and/or support this, similar, and additional functionalities. For example, in the case of Bluetooth, the transport standard is also supplied.

Figure 42:
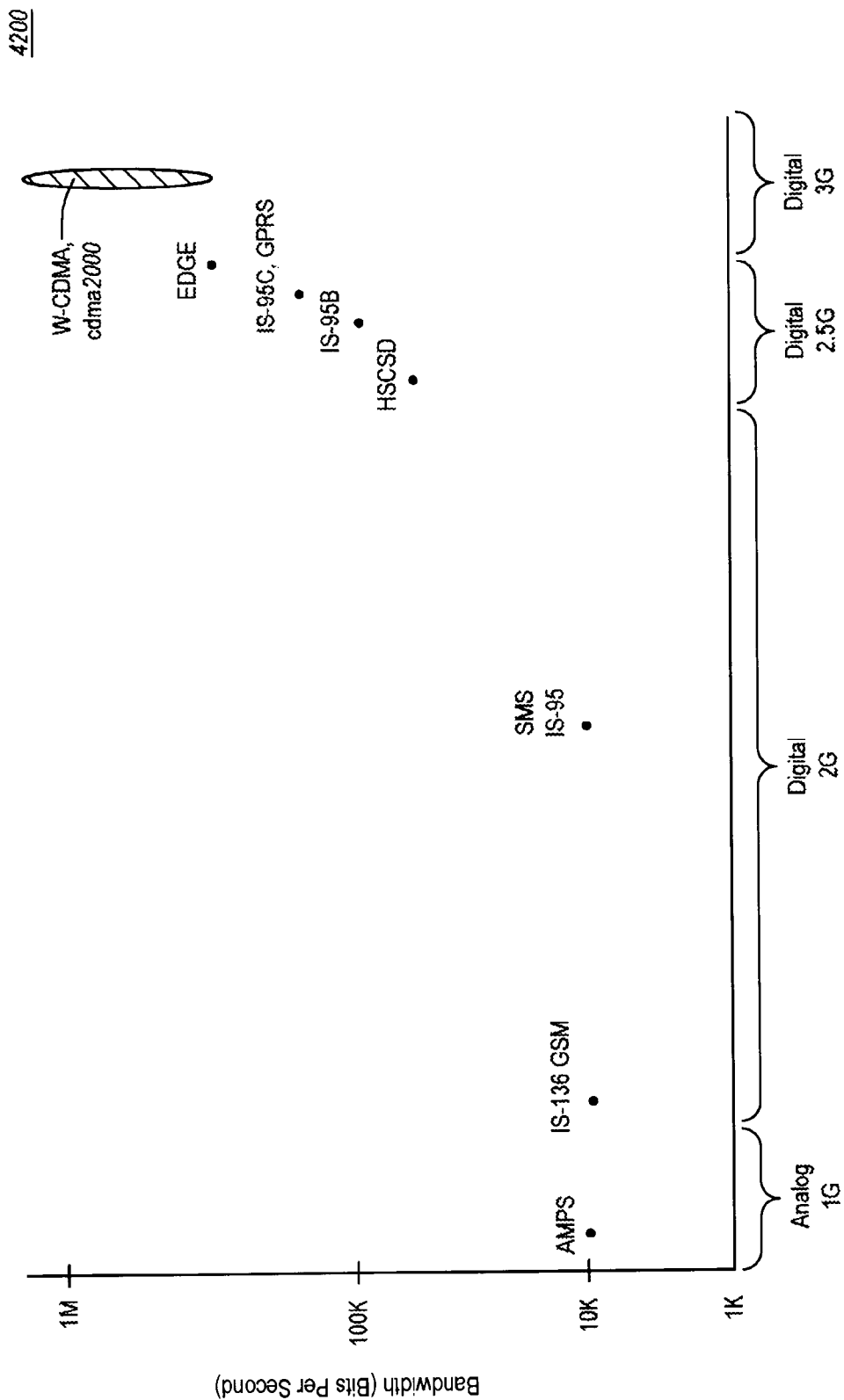
FIG. 42 shows a chart of some standards, protocols, and bearer services.

Generally, protocols call upon bearer services (also known as standards), such as CDMA (IS-95, IS-707), US-TDMA (IS-136), W-CDMA, EDGE, IS-95C, SMS, GSM (900, 1800, 1900 MHz), DataTAC, iDEN (ESMR), CDPD, dDECT, Project Angel, LMDS, MMDS, ARDIS, Mobitex, AMPS, etc. These bearer services can be classified into generations (Gs), several of which are shown in FIG. 42. The bearer services are called upon to provide the communication pipeline (such as a wired or wireless pipeline) for the device to interact with the network. It is noted that, while the invention is sometimes described herein for example purposes as involving wireless communication, the invention is applicable to any communication medium, including without limitation any wireless or wired communication medium.

Generally, platforms are layers on which protocols and bearer services are implemented and/or enabled. Platforms may be implemented using hardware, software, or combinations thereof. Conventional platforms require specialized circuitry for each type of protocol and/or bearer service. According to the invention, a UPM is enabled by one or more UFT modules on a layer with logic and/or circuitry and/or software (or combinations thereof) for any number/combination of protocols and bearer services.

In one embodiment, the UPM includes a UFT module for connecting to/interacting with any network using any protocol/bearer service combination. This embodiment provides the benefit of reduced circuitry over conventional implementations. Furthermore, the UPM can perform multi-platform operations nearly simultaneously. Such operation by the invention is sometimes referred to herein as "apparent simultaneous operation" or "virtual simultaneous operation." For example, the UFT module can switch between a wireless local area network (WLAN) and a wide area network (WAN) and thus, communicate with components on both networks.

In another embodiment, through the use of more than one UFT module, multiple protocols and multiple bearer services can be employed simultaneously. Thus, actual simultaneous multi-operation is possible. Further, components for specific protocols and/or bearer services are included in the UPM's control module which may be upgraded and/or reprogrammed to provide support for additional platforms.

Universal platform modules exhibit multiple advantages by using UFT modules. These advantages include, but are not limited to, lower power consumption, longer power source life, fewer parts, lower cost, less tuning, and more effective signal transmission and reception. The UPM of the present invention can receive and transmit signals across a broad frequency range. The structure and operation of embodiments of the UFT module, and various applications of the same are described in detail in the following sections.

2. Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
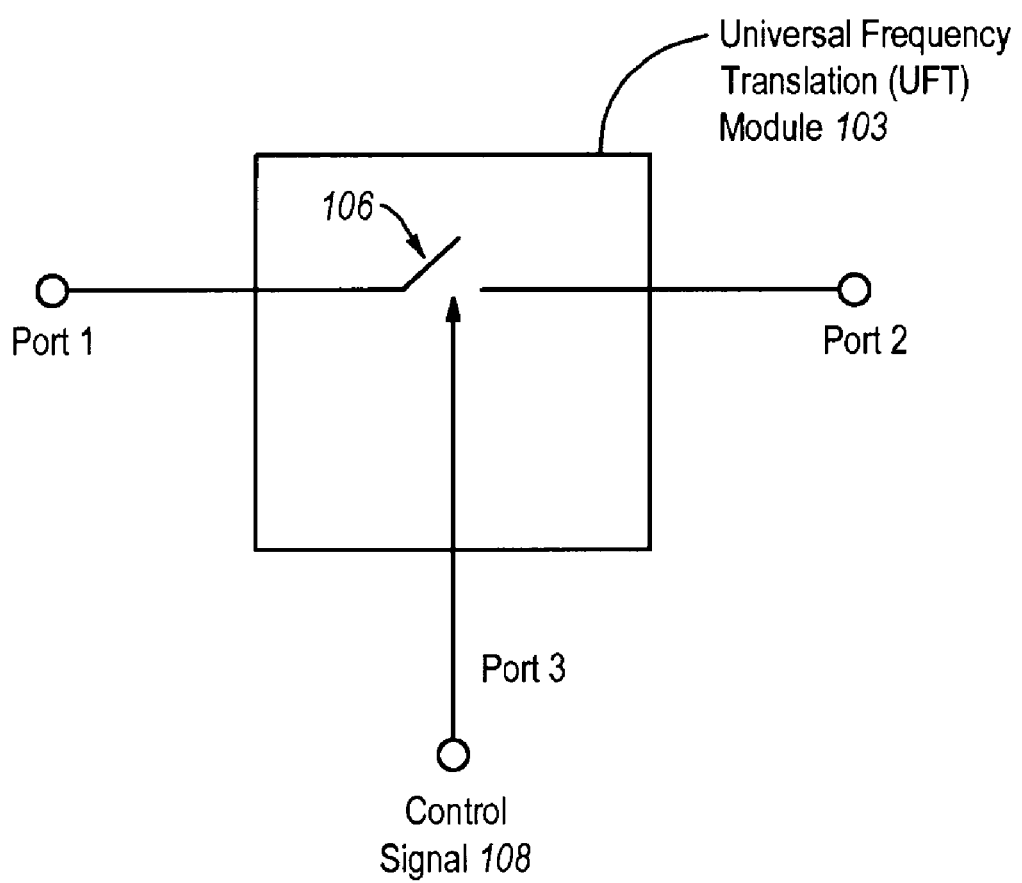
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2:
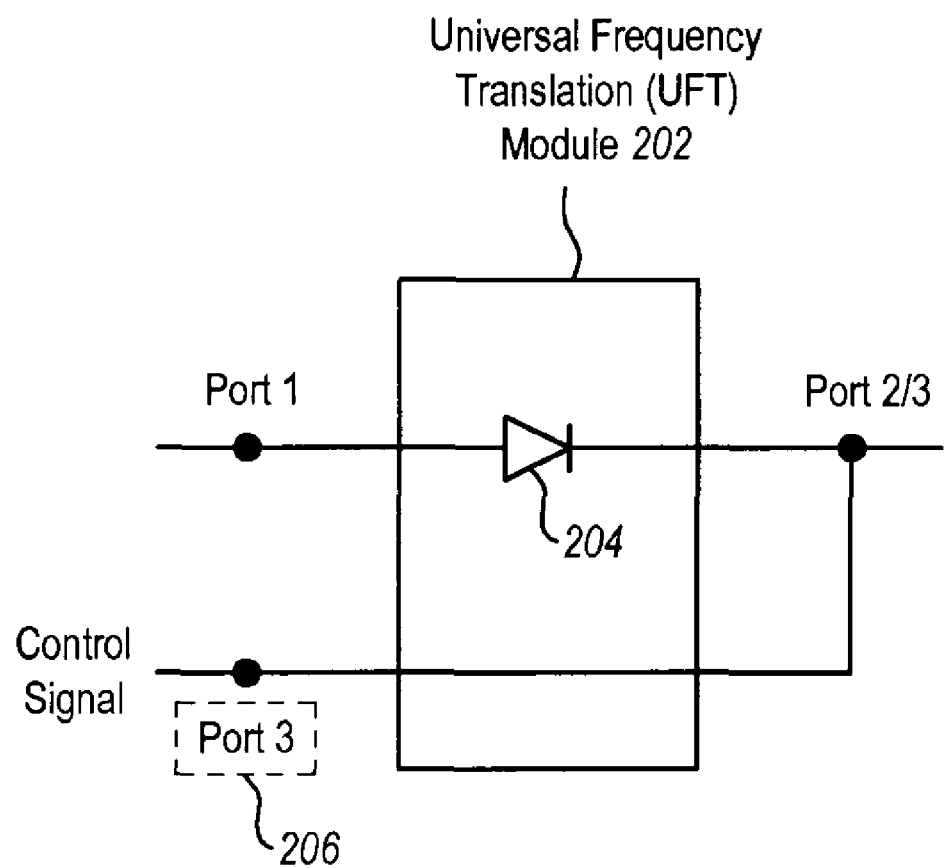
FIG. 2 is a block diagram of a universal frequency translation (UFT) module according to an alternative embodiment of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
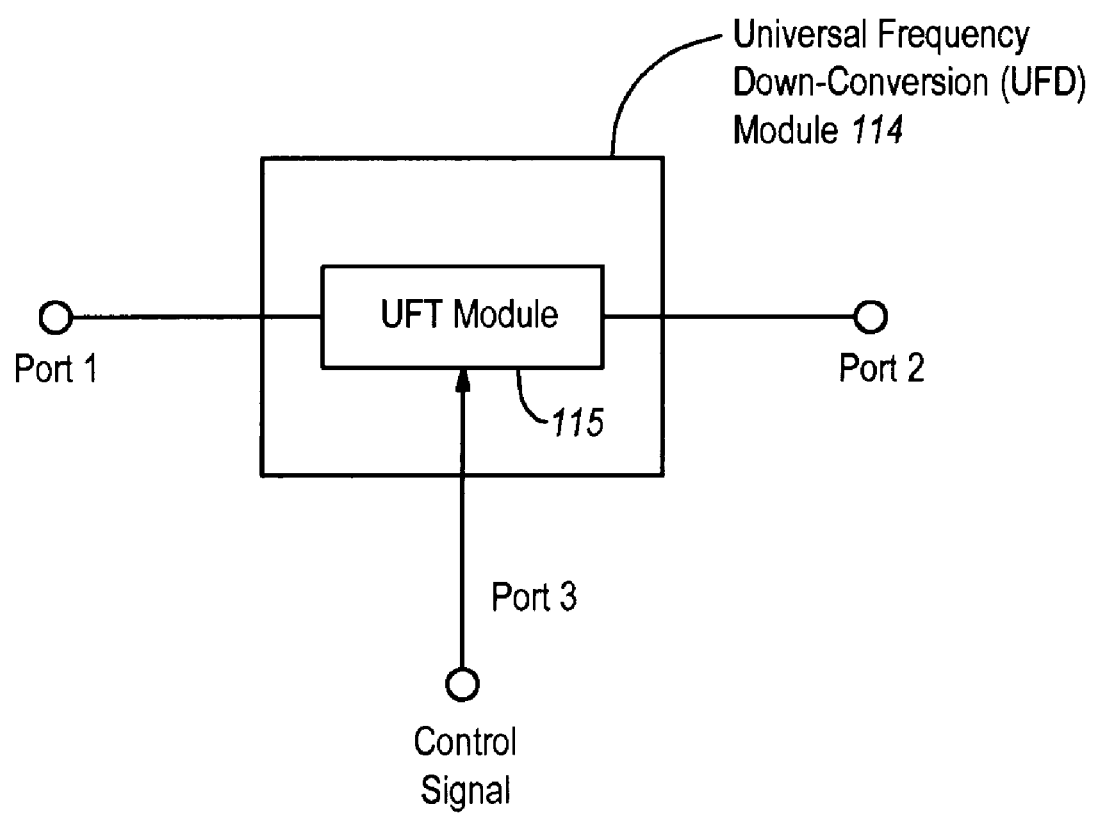
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
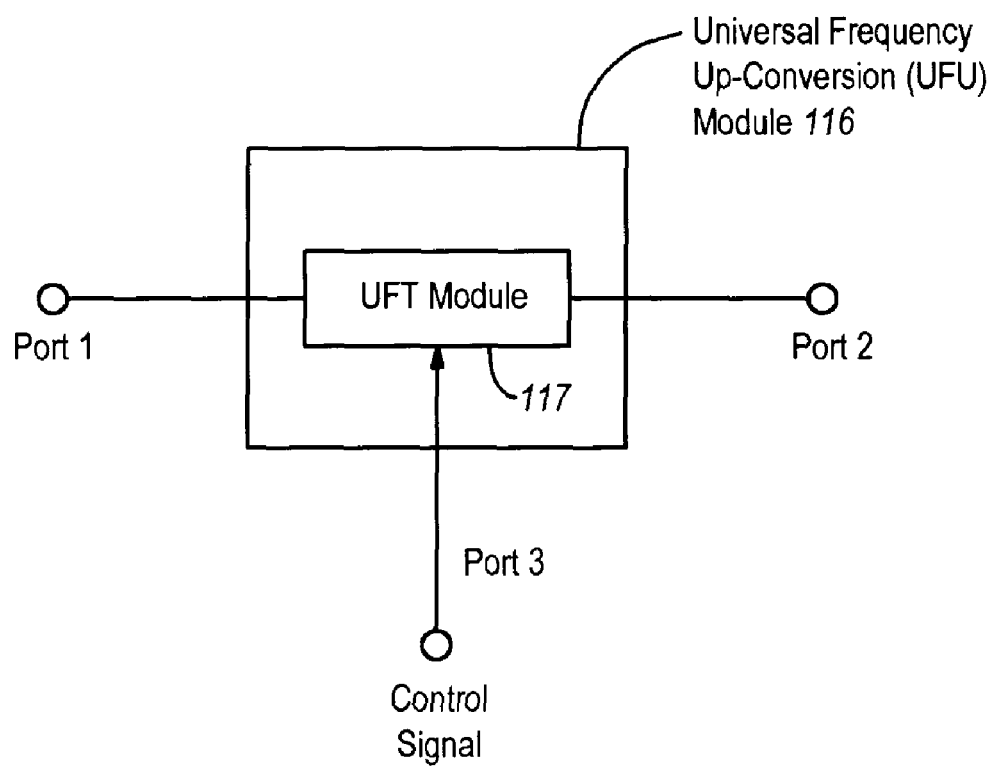
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

3. Frequency Down-Conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in co-pending U.S. patent application entitled "Method and System for Down-Converting Electromagnetic Signals," Ser. No. 09/176,022, filed Oct. 21, 1998, issued as U.S. Pat. No. 6,061,551, the full disclosure of which is incorporated herein by reference, as well as other cases cited above. A relevant portion of the above mentioned patent application is summarized below to describe down-converting an input signal to produce a down-converted signal that exists at a lower frequency or a baseband signal.

Figure 20A:
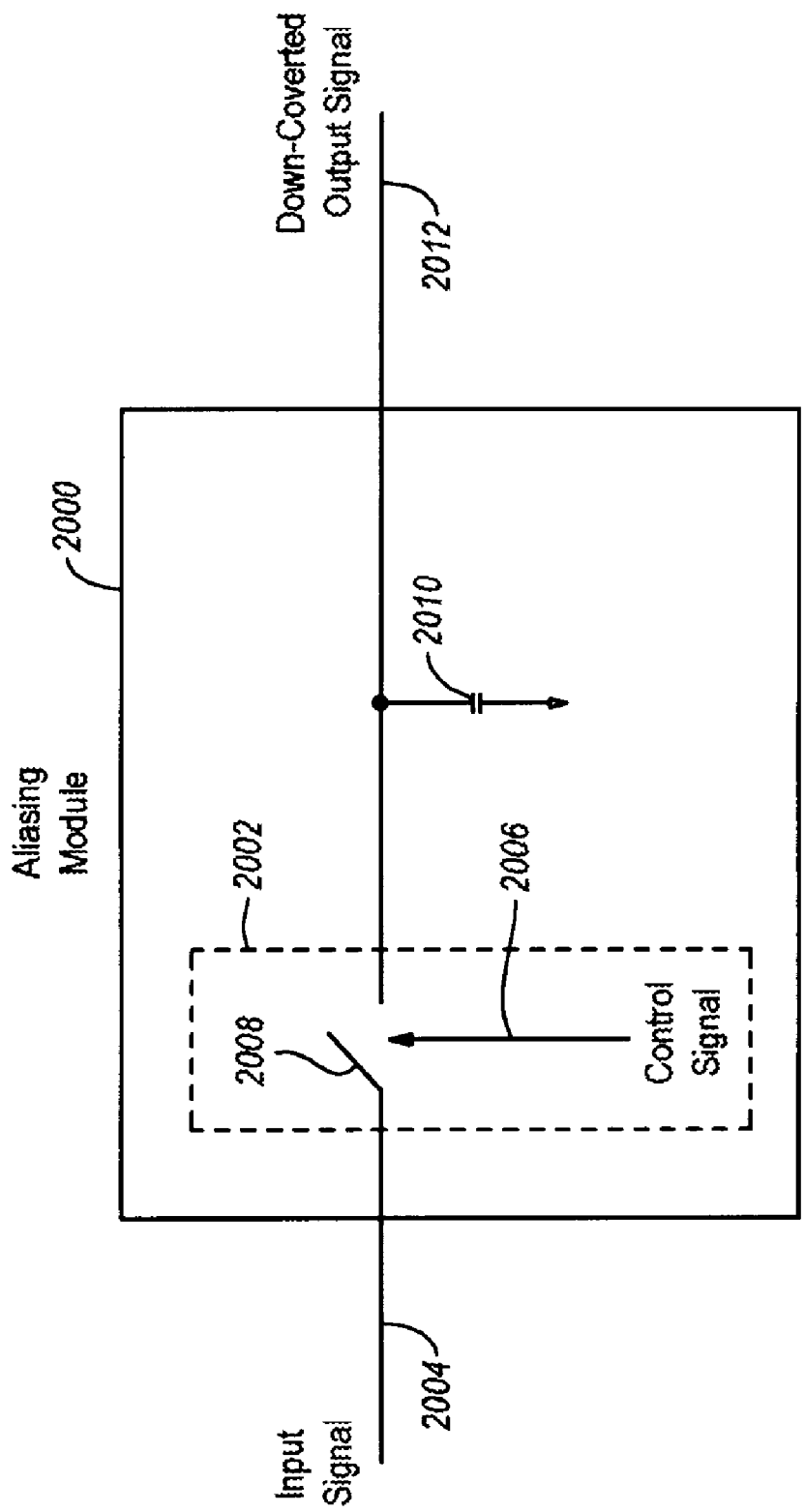
FIGS. 20A and 20A-1 are example aliasing modules according to embodiments of the invention.
Figures 1, 20A:
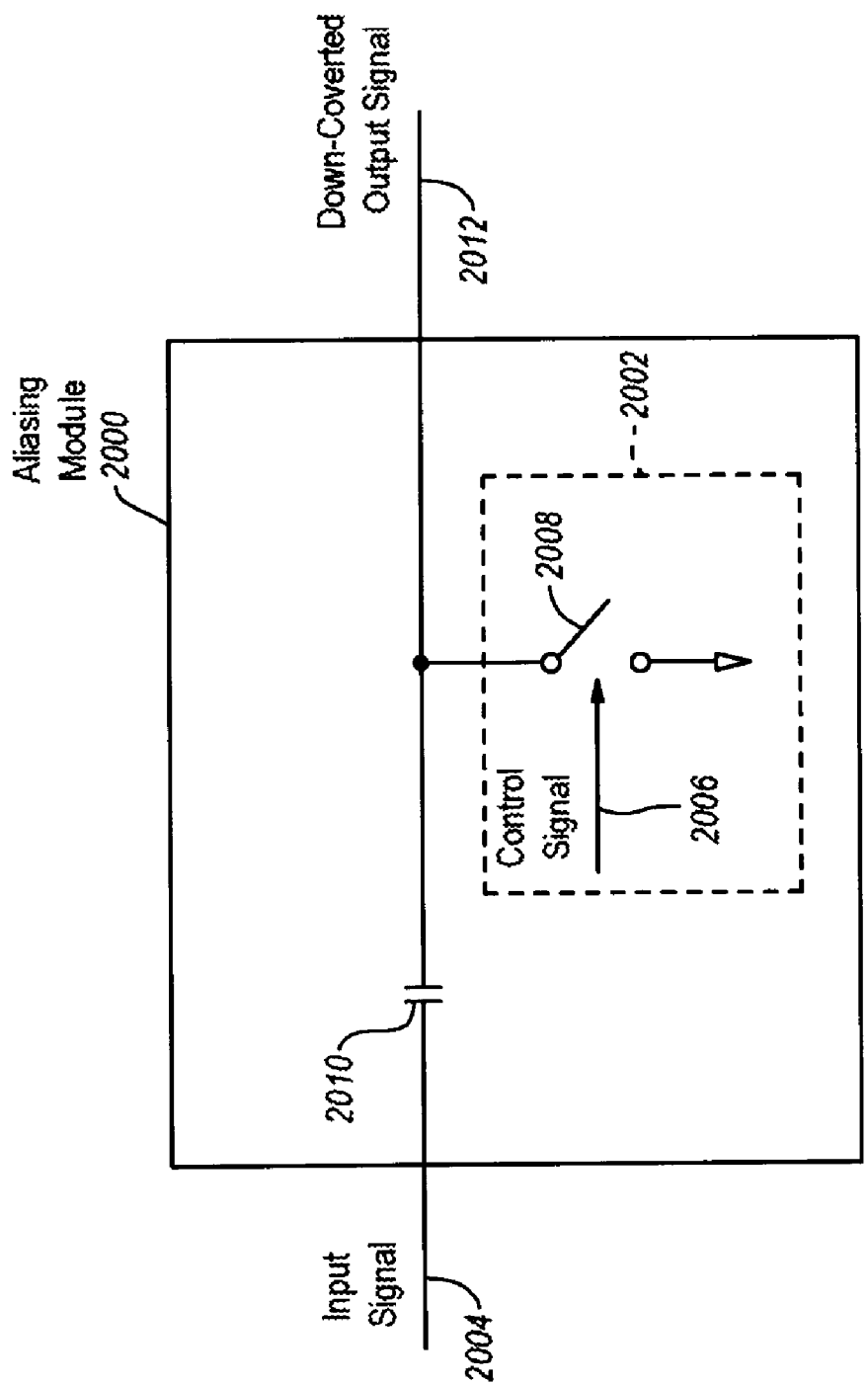

FIG. 20A illustrates an aliasing module 2000 for down-conversion using a universal frequency translation (UFT) module 2002 which down-converts an EM input signal 2004. In particular embodiments, aliasing module 2000 includes a switch 2008 and a capacitor 2010. The electronic alignment of the circuit components is flexible. That is, in one implementation, the switch 2008 is in series with input signal 2004 and capacitor 2010 is shunted to ground (although it may be other than ground in configurations such as differential mode). In a second implementation (see FIGS. 20A-1), the capacitor 2010 is in series with the input signal 2004 and the switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of the EM input signal 2004.

In one implementation, aliasing module 2000 down-converts the input signal 2004 to an intermediate frequency (IF) signal. In another implementation, the aliasing module 2000 down-converts the input signal 2004 to a demodulated baseband signal. In yet another implementation, the input signal 2004 is a frequency modulated (FM) signal, and the aliasing module 2000 down-converts it to a non-FM signal, such as a phase modulated (PM) signal or an amplitude modulated (AM) signal. Each of the above implementations is described below.

In an embodiment, the control signal 2006 includes a train of pulses that repeat at an aliasing rate that is equal to, or less than, twice the frequency of the input signal 2004. In this embodiment, the control signal 2006 is referred to herein as an aliasing signal because it is below the Nyquist rate for the frequency of the input signal 2004. Preferably, the frequency of control signal 2006 is much less than the input signal 2004.

Figure 20B:
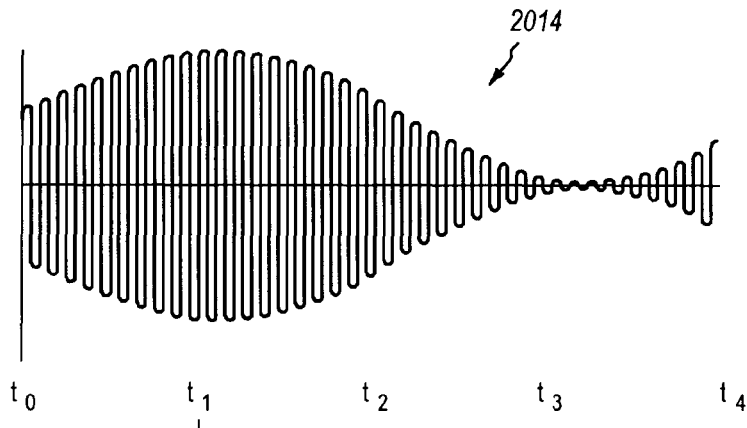
FIGS. 20B-20F are example waveforms used to describe the operation of the aliasing modules of FIGS. 20A and 20A-1.
Figure 20C:
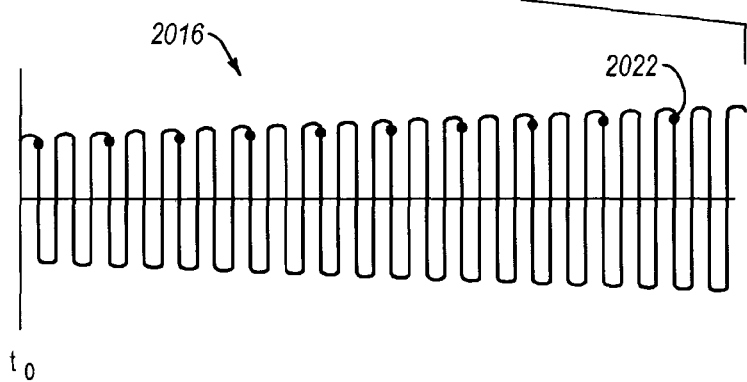
Figure 20D:
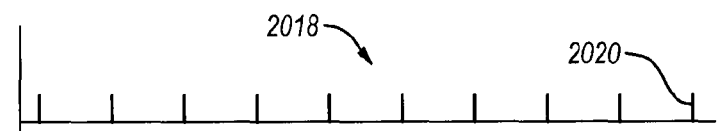
Figure 20E:
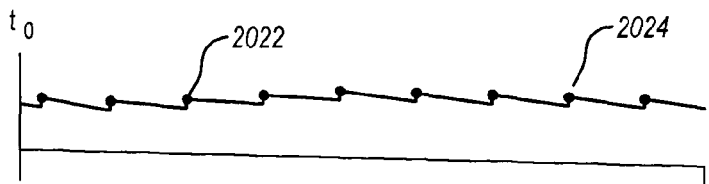

A train of pulses 2018 as shown in FIG. 20D controls the switch 2008 to alias the input signal 2004 with the control signal 2006 to generate a down-converted output signal 2012. More specifically, in an embodiment, switch 2008 closes on a first edge of each pulse 2020 of FIG. 20D and opens on a second edge of each pulse. When the switch 2008 is closed, the input signal 2004 is coupled to the capacitor 2010, and charge is transferred from the input signal to the capacitor 2010. The charge stored during successive pulses forms down-converted output signal 2012.

Exemplary waveforms are shown in FIGS. 20B-20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of the analog AM carrier signal 2014 on an expanded time scale. The analog AM carrier signal portion 2016 illustrates the analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as the analog AM carrier signal portion 2016. In the example shown in FIG. 20D, the aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). The pulses 2020 repeat at an aliasing rate, or pulse repetition rate of aliasing signal 2018. The aliasing rate is determined as described below, and further described in co-pending U.S. patent application entitled "Method and System for Down-converting Electromagnetic Signals," Ser. No. 09/176,022, issued as U.S. Pat. No. 6,061,551.

Figure 20F:
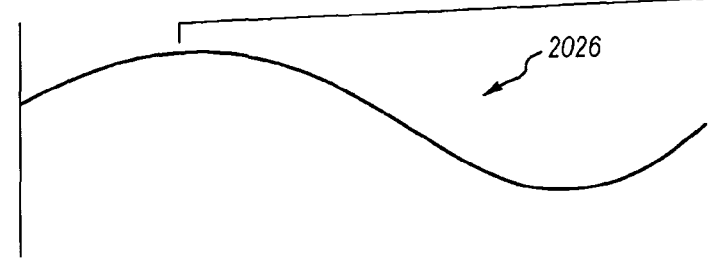

As noted above, the train of pulses 2020 (i.e., control signal 2006) control the switch 2008 to alias the analog AM carrier signal 2016 (i.e., input signal 2004) at the aliasing rate of the aliasing signal 2018. Specifically, in this embodiment, the switch 2008 closes on a first edge of each pulse and opens on a second edge of each pulse. When the switch 2008 is closed, input signal 2004 is coupled to the capacitor 2010, and charge is transferred from the input signal 2004 to the capacitor 2010. The charge transferred during a pulse is referred to herein as an under-sample. Exemplary under-samples 2022 form down-converted signal portion 2024 (FIG. 20E) that corresponds to the analog AM carrier signal portion 2016 (FIG. 20C) and the train of pulses 2020 (FIG. 20D). The charge stored during successive under-samples of AM carrier signal 2014 form the down-converted signal 2024 (FIG. 20E) that is an example of down-converted output signal 2012 (FIG. 20A). In FIG. 20F, a demodulated baseband signal 2026 represents the demodulated baseband signal 2024 after filtering on a compressed time scale. As illustrated, down-converted signal 2026 has substantially the same "amplitude envelope" as AM carrier signal 2014. Therefore, FIGS. 20B-20F illustrate down-conversion of AM carrier signal 2014.

The waveforms shown in FIGS. 20B-20F are discussed herein for illustrative purposes only, and are not limiting. Additional exemplary time domain and frequency domain drawings, and exemplary methods and systems of the invention relating thereto, are disclosed in co-pending U.S. patent application entitled "Method and System for Down-converting Electromagnetic Signals," Ser. No. 09/176,022, issued as U.S. Pat. No. 6,061,551.

The aliasing rate of control signal 2006 determines whether the input signal 2004 is down-converted to an IF signal, down-converted to a demodulated baseband signal, or down-converted from an FM signal to a PM or an AM signal. Generally, relationships between the input signal 2004, the aliasing rate of the control signal 2006, and the down-converted output signal 2012 are illustrated below:

(Freq. of input signal 2004)=$n$·(Freq. of control signal 2006)±(Freq. of down-converted output signal 2012)

For the examples contained herein, only the "+" condition will be discussed. The value of n represents a harmonic or sub-harmonic of input signal 2004 (e.g., n=0.5, 1, 2, 3, . . . ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If the input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 2006 would be calculated as follows:

(Freq$_{input}$−Freq$_{IF}$)/$n$=Freq$_{control}$(901 MHZ−1 MHZ)/
$n$=900/$n$

For n=0.5, 1, 2, 3, 4, etc., the frequency of the control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in co-pending U.S. patent application entitled "Method and System for Down-converting Electromagnetic Signals," Ser. No. 09/176,022, issued as U.S. Pat. No. 6,061,551.

Alternatively, when the aliasing rate of the control signal 2006 is substantially equal to the frequency of the input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of the input signal 2004. As a result, the under-samples form a constant output baseband signal. If the input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 2006 would be calculated as follows:

$$(\text{Freq}_{input} - \text{Freq}_{IF})/n = \text{Freq}_{control}(900 \text{ MHZ} - 0 \text{ MHZ})/n = 900 \text{ MHZ}/n$$

For n=0.5, 1, 2, 3, 4, etc., the frequency of the control signal 2006 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the co-pending U.S. patent application entitled "Method and System for Down-converting Electromagnetic Signals," Ser. No. 09/176,022, issued as U.S. Pat. No. 6,061,551.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2) \div 2]$) of the FSK signal is down-converted to zero IF. For example, to down-convert an FSK signal having $F_1$ equal to 899 MHZ and $F_2$ equal to 901 MHZ, to a FSK signal, the aliasing rate of the control signal 2006 would be calculated as follows:

$$\text{Frequency of the input} = (F_1 + F_2) \div 2$$
$$= (899 \text{ MHZ} + 901 \text{ MHZ}) \div 2$$
$$= 900 \text{ MHZ}$$

Frequency of the down-converted signal=0 (i.e., baseband)

$$(\text{Freq}_{input} - \text{Freq}_{IF})/n = \text{Freq}_{control}(900 \text{ MHZ} - 0 \text{ MHZ})/n = 900 \text{ MHZ}/n$$

For n=0.5, 1, 2, 3, etc., the frequency of the control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 2006 should be substantially equal to:

$$(900 \text{ MHZ} - 0 \text{ MHZ})/n = 900 \text{ MHZ}/n, \text{ or}$$

$$(901 \text{ MHZ} - 0 \text{ MHZ})/n = 901 \text{ MHZ}/n.$$

For the former case of 900 MHZ/n, and for n=0.5, 1, 2, 3, 4, etc., the frequency of the control signal 2006 should be substantially equal to 1.8 GHz, 900 MHZ, 450 MHZ, 300 MHZ, 225 MHZ, etc. For the latter case of 901 MHZ/n, and for n=0.5, 1, 2, 3, 4, etc., the frequency of the control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in the co-pending U.S. patent application entitled "Method and System for Down-converting Electromagnetic Signals," Ser. No. 09/176,022, issued as U.S. Pat. No. 6,061,551.

In an embodiment, the pulses of the control signal 2006 have negligible apertures that tend towards zero. This makes the UFT module 2002 a high input impedance device. This configuration is useful for situations where minimal disturbance of the input signal may be desired.

In another embodiment, the pulses of the control signal 2006 have non-negligible apertures that tend away from zero. This makes the UFT module 2002 a lower input impedance device. This allows the lower input impedance of the UFT module 2002 to be substantially matched with a source impedance of the input signal 2004. This also improves the energy transfer from the input signal 2004 to the down-converted output signal 2012, and hence the efficiency and signal to noise (s/n) ratio of UFT module 2002.

Exemplary systems and methods for generating and optimizing the control signal 2006, and for otherwise improving energy transfer and s/n ratio, are disclosed in the co-pending U.S. patent application entitled "Method and System for Down-converting Electromagnetic Signals," Ser. No. 09/176, 022, issued as U.S. Pat. No. 6,061,551.

When the pulses of the control signal 2006 have non-negligible apertures, the aliasing module 2000 is referred to interchangeably herein as an energy transfer module or a gated transfer module, and the control signal 2006 is referred to as an energy transfer signal. Exemplary systems and methods for generating and optimizing the control signal 2006 and for otherwise improving energy transfer and/or signal to noise ratio in an energy transfer module are described below.

3.1. Optional Energy Transfer Signal Module

Figure 47:
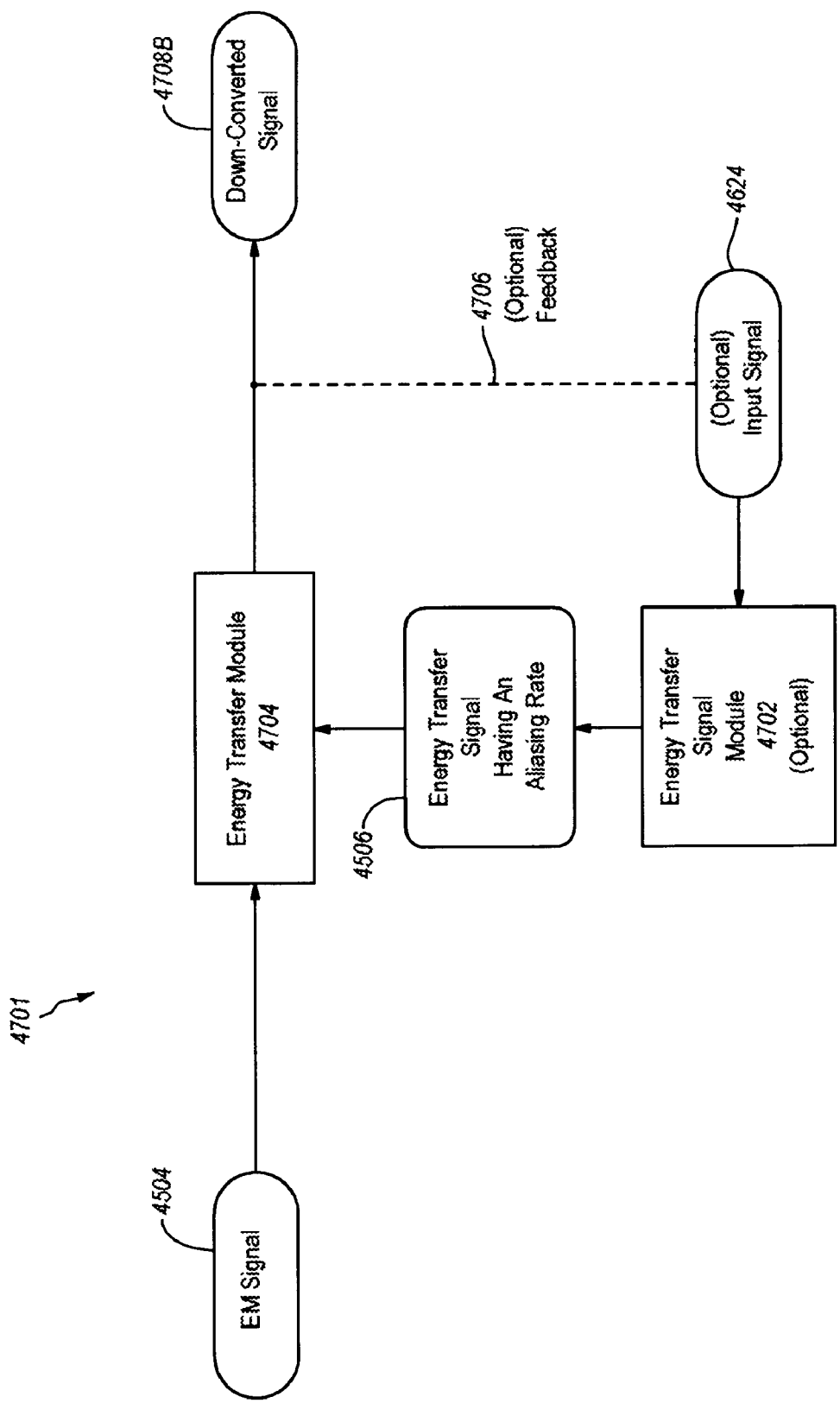
FIG. 47 illustrates an energy transfer system with an optional energy transfer signal module according to an embodiment of the invention.

FIG. 47 illustrates an energy transfer system 4701 that includes an optional energy transfer signal module 4702, which can perform any of a variety of functions or combinations of functions including, but not limited to, generating the energy transfer signal 4506.

Figure 46A:
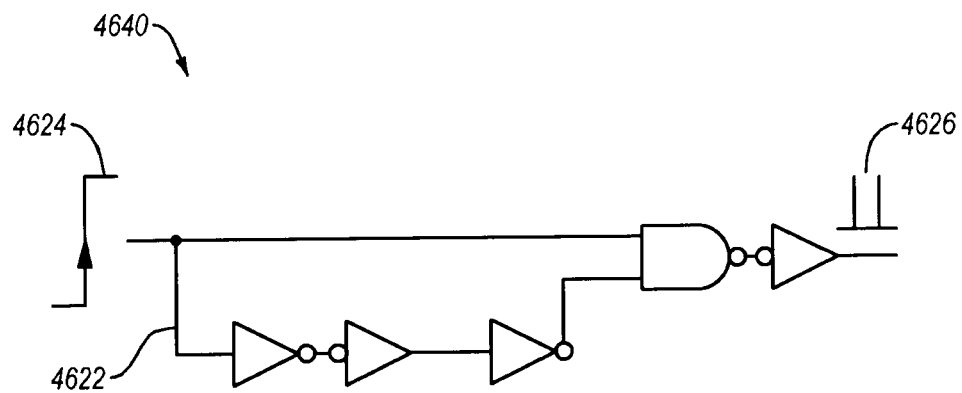
FIGS. 46A-D illustrate example aperture generators.
Figure 46B:
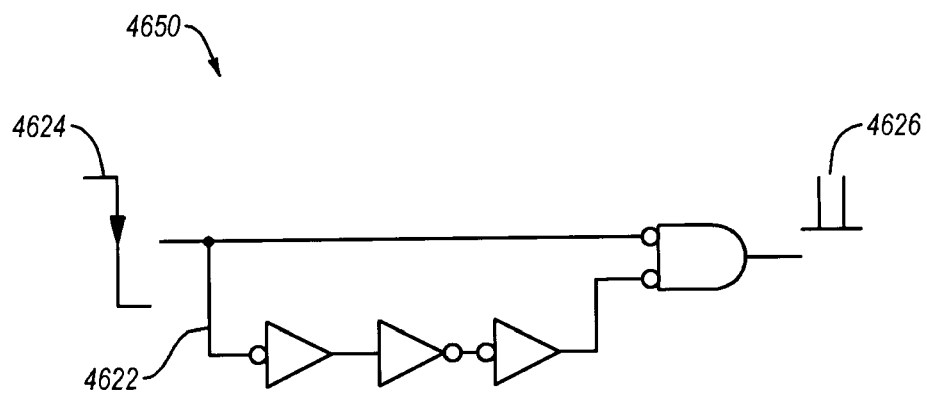
Figure 46C:
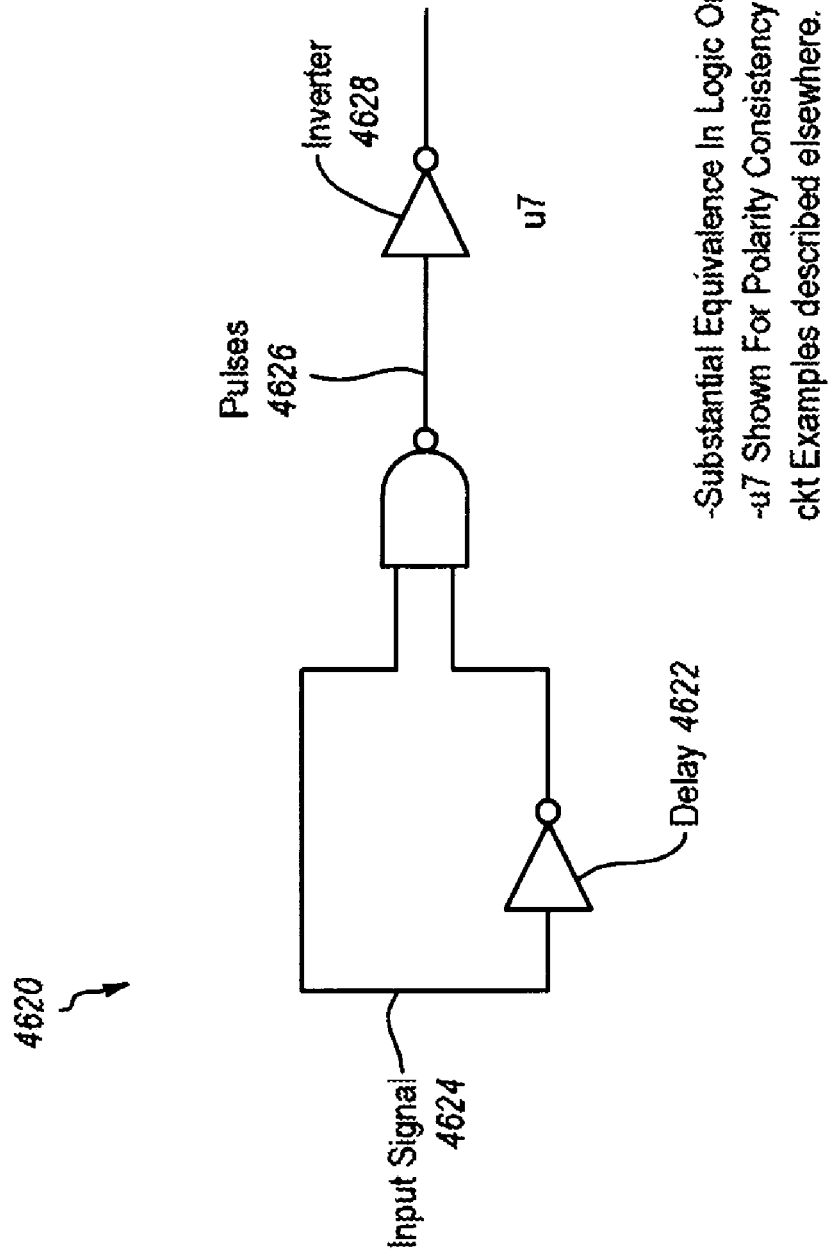

In an embodiment, the optional energy transfer signal module 4702 includes an aperture generator, an example of which is illustrated in FIG. 46C as an aperture generator 4620. The aperture generator 4620 generates non-negligible aperture pulses 4626 from an input signal 4624. The input signal 4624 can be any type of periodic signal, including, but not limited to, a sinusoid, a square wave, a saw-tooth wave, etc. Systems for generating the input signal 4624 are described below.

The width or aperture of the pulses 4626 is determined by delay through the branch 4622 of the aperture generator 4620. Generally, as the desired pulse width increases, the difficulty in meeting the requirements of the aperture generator 4620 decrease. In other words, to generate non-negligible aperture pulses for a given EM input frequency, the components utilized in the example aperture generator 4620 do not require as fast reaction times as those that are required in an under-sampling system operating with the same EM input frequency.

The example logic and implementation shown in the aperture generator 4620 are provided for illustrative purposes only, and are not limiting. The actual logic employed can take many forms. The example aperture generator 4620 includes an optional inverter 4628, which is shown for polarity consistency with other examples provided herein.

Figure 46E:
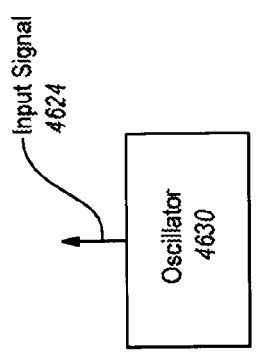
FIG. 46E illustrates an oscillator according to an embodiment of the present invention.
Figure 46D:
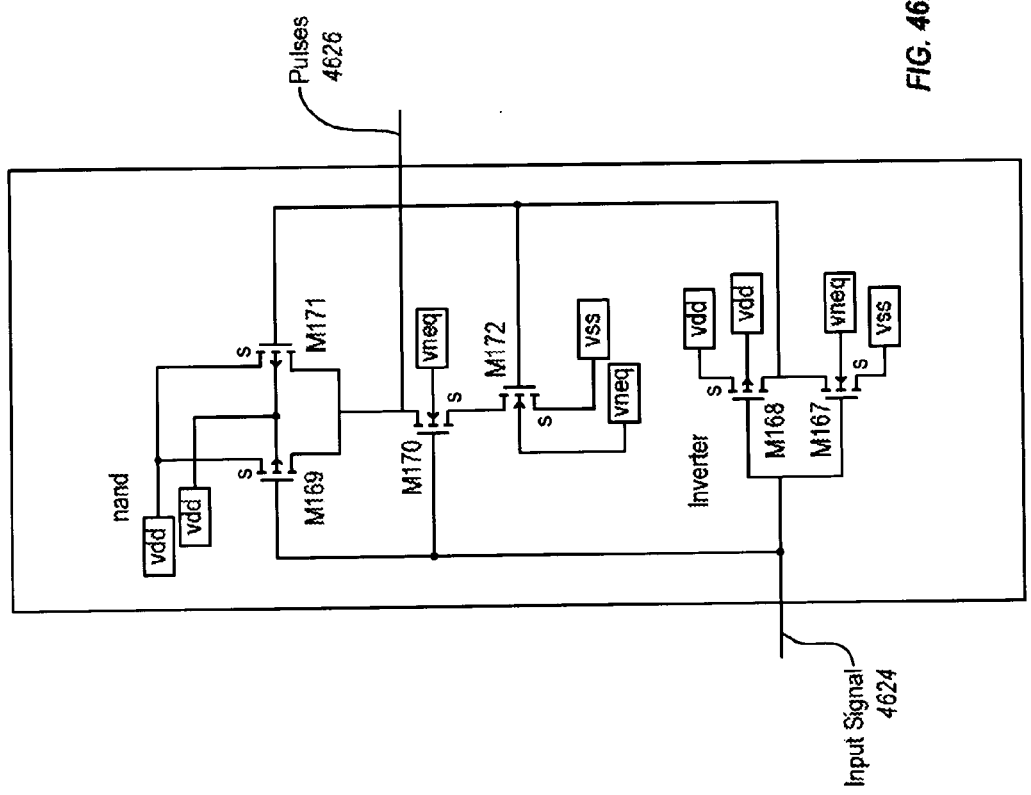

An example implementation of the aperture generator 4620 is illustrated in FIG. 46D. Additional examples of aperture generation logic are provided in FIGS. 46A and 46B. FIG. 46A illustrates a rising edge pulse generator 4640, which generates pulses 4626 on rising edges of the input signal 4624. FIG. 46B illustrates a falling edge pulse generator 4650, which generates pulses 4626 on falling edges of the input signal 4624.

In an embodiment, the input signal 4624 is generated externally of the energy transfer signal module 4702, as illustrated in FIG. 47. Alternatively, the input signal 4724 is generated internally by the energy transfer signal module 4702. The input signal 4624 can be generated by an oscillator, as illustrated in FIG. 46E by an oscillator 4630. The oscillator 4630 can be internal to the energy transfer signal module 4702 or external to the energy transfer signal module 4702. The oscillator 4630 can be external to the energy transfer system 4701. The output of the oscillator 4630 may be any periodic waveform.

The type of down-conversion performed by the energy transfer system 4701 depends upon the aliasing rate of the energy transfer signal 4506, which is determined by the frequency of the pulses 4626. The frequency of the pulses 4626 is determined by the frequency of the input signal 4624. For example, when the frequency of the input signal 4624 is substantially equal to a harmonic or a sub-harmonic of the EM signal 4504, the EM signal 4504 is directly down-converted to baseband (e.g. when the EM signal is an AM signal or a PM signal), or converted from FM to a non-FM signal. When the frequency of the input signal 4624 is substantially equal to a harmonic or a sub-harmonic of a difference frequency, the EM signal 4504 is down-converted to an intermediate signal.

The optional energy transfer signal module 4702 can be implemented in hardware, software, firmware, or any combination thereof.

3.2 Smoothing the Down-Converted Signal

Referring back to FIG. 20A, the down-converted output signal 2012 may be smoothed by filtering as desired.

3.3. Impedance Matching

The energy transfer module 2000 has input and output impedances generally defined by (1) the duty cycle of the switch module (i.e., UFT 2002), and (2) the impedance of the storage module (e.g., capacitor 2010), at the frequencies of interest (e.g. at the EM input, and intermediate/baseband frequencies).

Starting with an aperture width of approximately ½ the period of the EM signal being down-converted as a preferred embodiment, this aperture width (e.g. the "closed time") can be decreased. As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Figure 48:
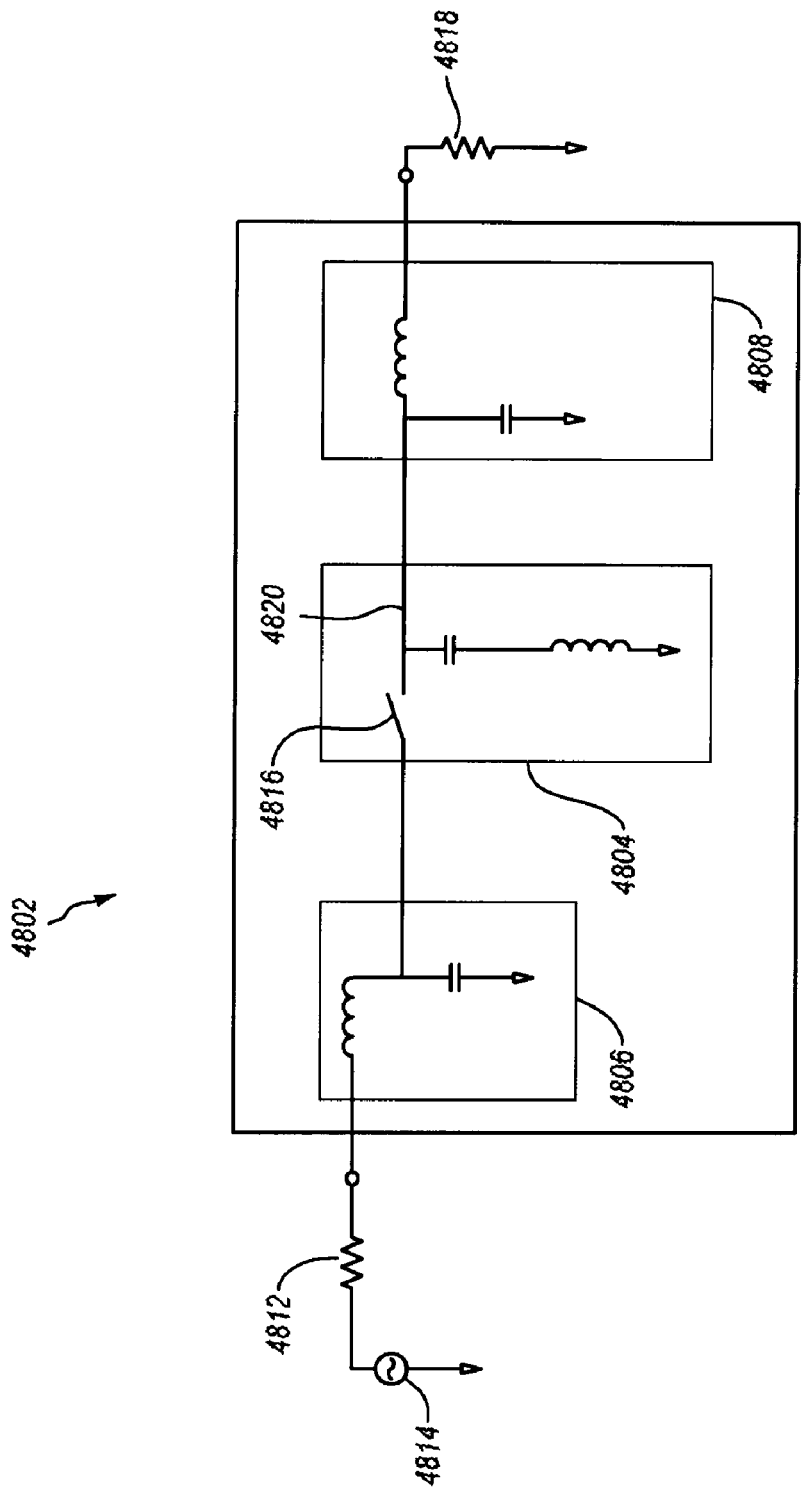
FIG. 48 illustrates an aliasing module with input and output impedance match according to an embodiment of the invention.
Figure 50:
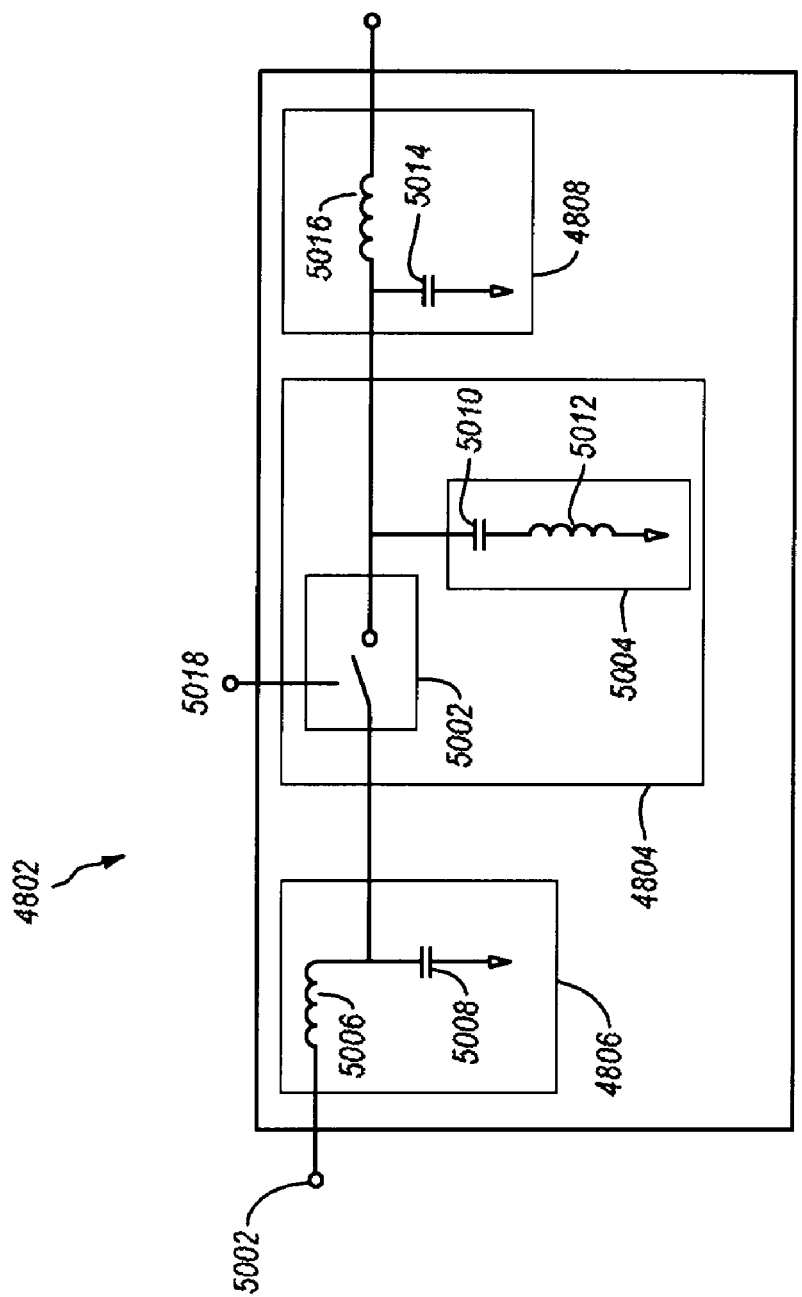
FIG. 50 illustrates an example energy transfer module with a switch module and a reactive storage module according to an embodiment of the invention.

Referring to FIG. 48, a specific embodiment using an RF signal as an input, assuming that the impedance 4812 is a relatively low impedance of approximately 50 Ohms, for example, and the input impedance 4816 is approximately 300 Ohms, an initial configuration for the input impedance match module 4806 can include an inductor 5006 and a capacitor 5008, configured as shown in FIG. 50. The configuration of the inductor 5006 and the capacitor 5008 is a possible configuration when going from a low impedance to a high impedance. Inductor 5006 and the capacitor 5008 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 5014 and an inductor 5016 can be configured as shown in FIG. 50. The capacitor 5014 and the inductor 5016 constitute an L match, the calculation of the component values being well known to those skilled in the relevant arts.

The configuration of the input impedance match module 4806 and the output impedance match module 4808 are considered to be initial starting points for impedance matching, in accordance with the present invention. In some situations, the initial designs may be suitable without further optimization. In other situations, the initial designs can be optimized in accordance with other various design criteria and considerations.

As other optional optimizing structures and/or components are utilized, their affect on the characteristic impedance of the energy transfer module should be taken into account in the match along with their own original criteria.

3.4 Tanks and Resonant Structures

Resonant tank and other resonant structures can be used to further optimize the energy transfer characteristics of the invention. For example, resonant structures, resonant about the input frequency, can be used to store energy from the input signal when the switch is open, a period during which one may conclude that the architecture would otherwise be limited in its maximum possible efficiency. Resonant tank and other resonant structures can include, but are not limited to, surface acoustic wave (SAW) filters, dielectric resonators, diplexers, capacitors, inductors, etc.

Figure 55:
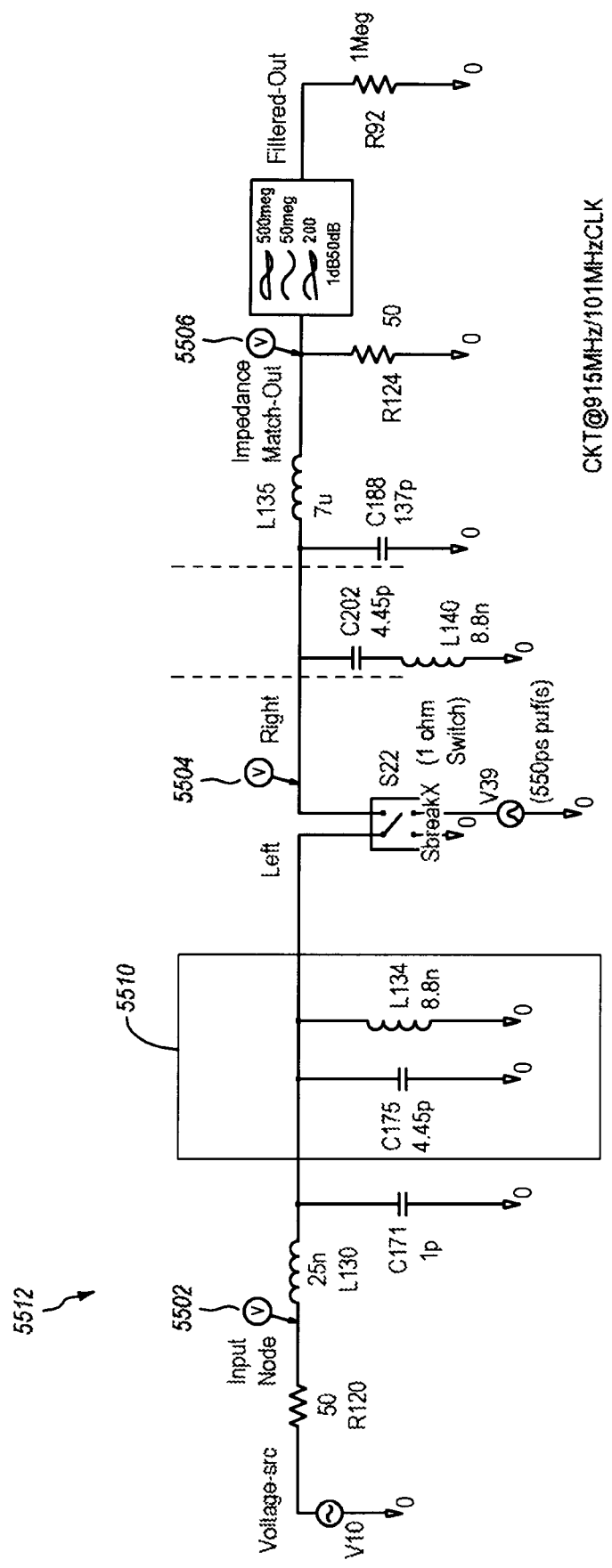
FIG. 55 is a schematic diagram of a circuit to down-convert a 915 MHZ signal to a 5 MHZ signal using a 101 MHZ clock according to an embodiment of the present invention.
Figure 60A:
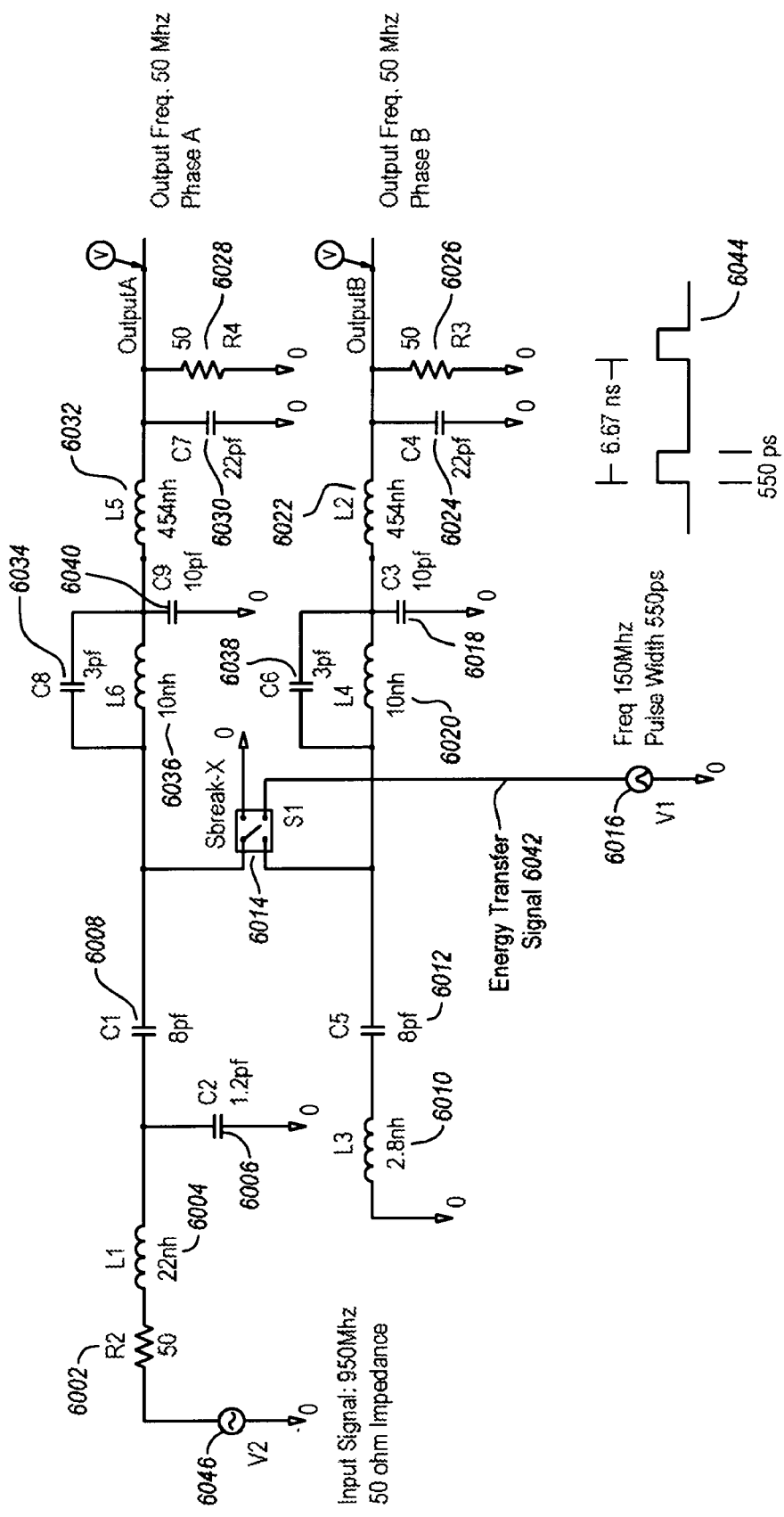
FIG. 60A illustrates an example energy transfer system according to an embodiment of the invention.
Figure 63:
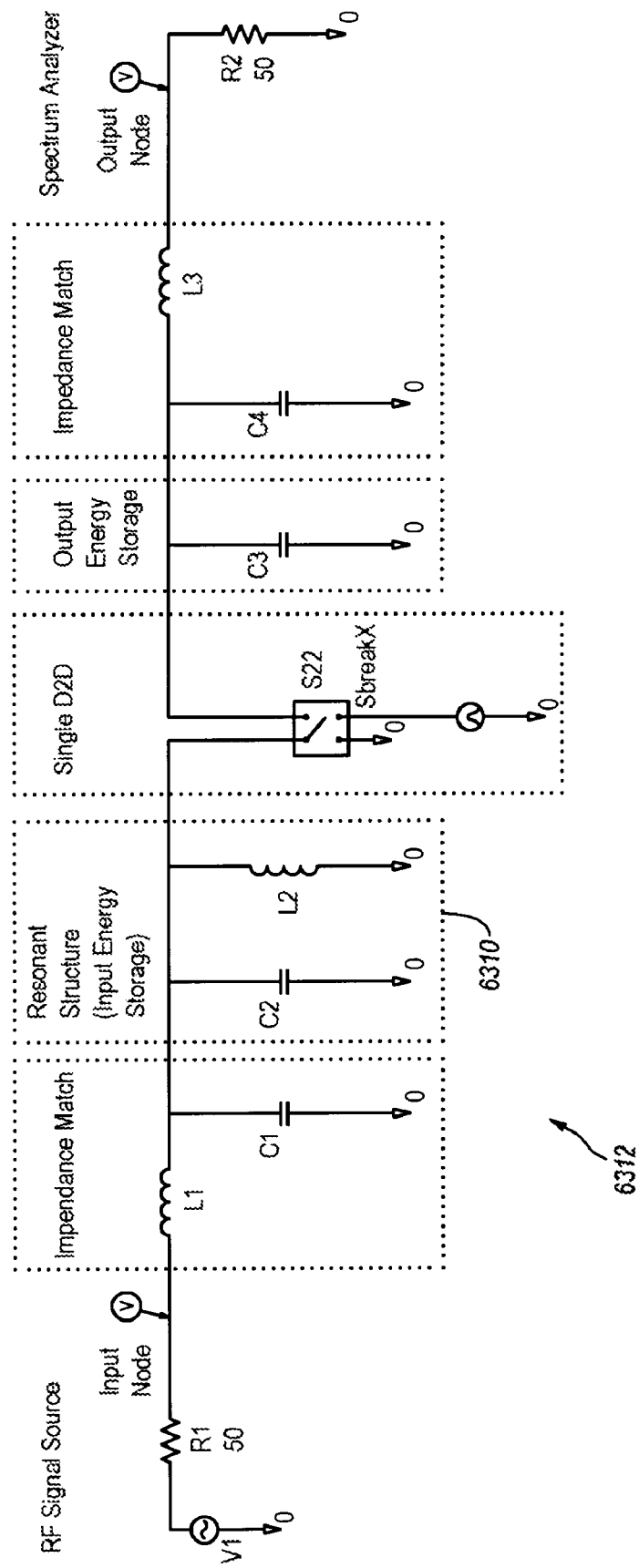
FIG. 63 illustrates an example embodiment of the invention.

An example embodiment is shown in FIG. 60A. Two additional embodiments are shown in FIG. 55 and FIG. 63. Alternate implementations will be apparent to persons skilled in the relevant art(s) based on the teachings contained herein. Alternate implementations fall within the scope and spirit of the present invention. These implementations take advantage of properties of series and parallel (tank) resonant circuits.

FIG. 60A illustrates parallel tank circuits in a differential implementation. A first parallel resonant or tank circuit consists of a capacitor 6038 and an inductor 6020 (tank1). A second tank circuit consists of a capacitor 6034 and an inductor 6036 (tank2).

As is apparent to one skilled in the relevant art(s), parallel tank circuits provide:

low impedance to frequencies below resonance;
low impedance to frequencies above resonance; and
high impedance to frequencies at and near resonance.

In the illustrated example of FIG. 60A, the first and second tank circuits resonate at approximately 920 MHz. At and near resonance, the impedance of these circuits is relatively high. Therefore, in the circuit configuration shown in FIG. 60A, both tank circuits appear as relatively high impedance to the input frequency of 950 MHz, while simultaneously appearing as relatively low impedance to frequencies in the desired output range of 50 MHz.

An energy transfer signal 6042 controls a switch 6014. When the energy transfer signal 6042 controls the switch 6014 to open and close, high frequency signal components are not allowed to pass through tank1 or tank2. However, the lower signal components (50 Mhz in this embodiment) generated by the system are allowed to pass through tank 1 and tank2 with little attenuation. The effect of tank1 and tank2 is to further separate the input and output signals from the same node thereby producing a more stable input and output impedance. Capacitors 6018 and 6040 act to store the 50 MHz output signal energy between energy transfer pulses.

Further energy transfer optimization is provided by placing an inductor 6010 in series with a storage capacitor 6012 as shown. In the illustrated example, the series resonant frequency of this circuit arrangement is approximately 1 GHz. This circuit increases the energy transfer characteristic of the system. The ratio of the impedance of inductor 6010 and the impedance of the storage capacitor 6012 is preferably kept relatively small so that the majority of the energy available will be transferred to storage capacitor 6012 during operation. Exemplary output signals A and B are illustrated in FIGS. 60B and 60C, respectively.

In FIG. 60A, circuit components 6004 and 6006 form an input impedance match. Circuit components 6032 and 6030 form an output impedance match into a 50 ohm resistor 6028. Circuit components 6022 and 6024 form a second output impedance match into a 50 ohm resistor 6026. Capacitors 6008 and 6012 act as storage capacitors for the embodiment. Voltage source 6046 and resistor 6002 generate a 950 MHz signal with a 50 ohm output impedance, which are used as the input to the circuit. Circuit element 6016 includes a 150 MHz oscillator and a pulse generator, which are used to generate the energy transfer signal 6042.

FIG. 55 illustrates a shunt tank circuit 5510 in a single-ended to-single-ended system 5512. Similarly, FIG. 63 illustrates a shunt tank circuit 6310 in a system 6312. The tank circuits 5510 and 6310 lower driving source impedance, which improves transient response. The tank circuits 5510 and 6310 are able store the energy from the input signal and provide a low driving source impedance to transfer that energy throughout the aperture of the closed switch. The transient nature of the switch aperture can be viewed as having a response that, in addition to including the input frequency, has large component frequencies above the input frequency, (i.e. higher frequencies than the input frequency are also able to effectively pass through the aperture). Resonant circuits or structures, for example resonant tanks 5510 or 6310, can take advantage of this by being able to transfer energy throughout the switch's transient frequency response (i.e. the capacitor in the resonant tank appears as a low driving source impedance during the transient period of the aperture).

The example tank and resonant structures described above are for illustrative purposes and are not limiting. Alternate configurations can be utilized. The various resonant tanks and structures discussed can be combined or utilized independently as is now apparent.

3.5 Charge and Power Transfer Concepts

Figure 71A:
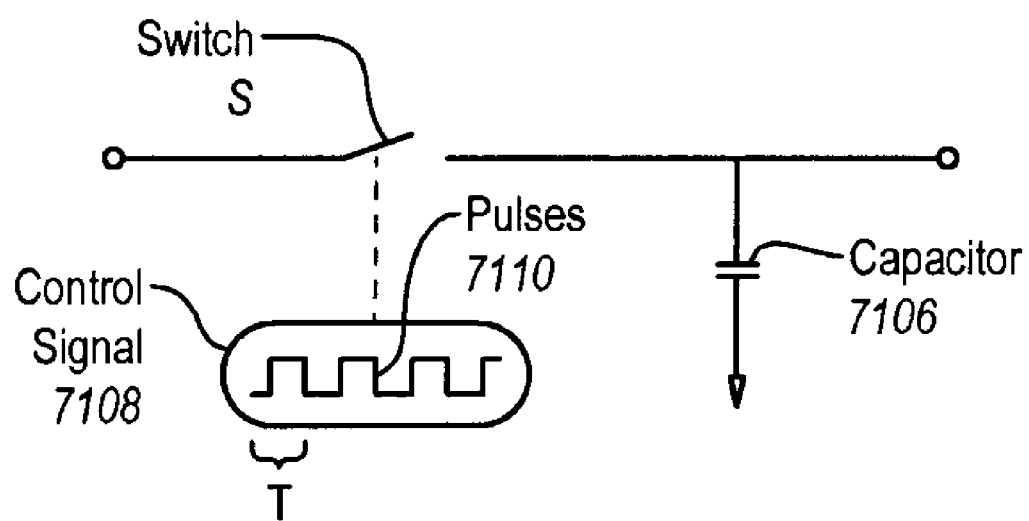
FIG. 71A illustrates and example embodiment of the invention.

Concepts of charge transfer are now described with reference to FIGS. 71A-F. FIG. 71A illustrates a circuit 7102, including a switch S and a capacitor 7106 having a capacitance C. The switch S is controlled by a control signal 7108, which includes pulses 19010 having apertures T.

In FIG. 71B, Equation 10 illustrates that the charge q on a capacitor having a capacitance C, such as the capacitor 7106, is proportional to the voltage V across the capacitor, where:

q=Charge in Coulombs
C=Capacitance in Farads
V=Voltage in Volts
A=Input Signal Amplitude Where the voltage V is represented by Equation 11, Equation 10 can be rewritten as Equation 12. The change in charge $\Delta q$ over time t is illustrated as in Equation 13 as $\Delta q(t)$, which can be rewritten as Equation 14. Using the sum-to-product trigonometric identity of Equation 15, Equation 14 can be rewritten as Equation 16, which can be rewritten as equation 17.

Note that the sin term in Equation 11 is a function of the aperture T only. Thus, $\Delta q(t)$ is at a maximum when T is equal to an odd multiple of $\pi$ (i.e., $\pi$, $3\pi$, $5\pi$, . . . ). Therefore, the capacitor 7106 experiences the greatest change in charge when the aperture T has a value of $\pi$ or a time interval representative of 180 degrees of the input sinusoid. Conversely, when T is equal to $2\pi$, $4\pi$, $6\pi$, . . . , minimal charge is transferred.

Figure 71C:
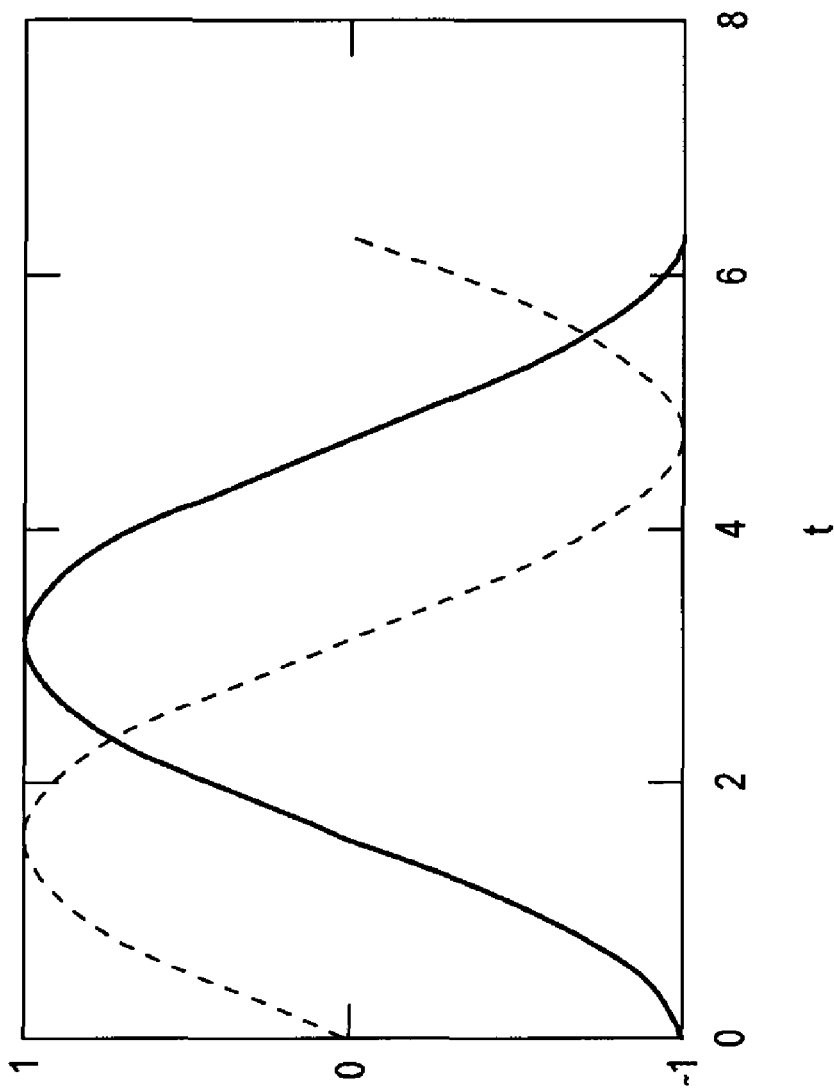
FIG. 71C illustrates relationships between capacitor charging and aperture, in accordance with an embodiment of the present invention.
Figure 71D:
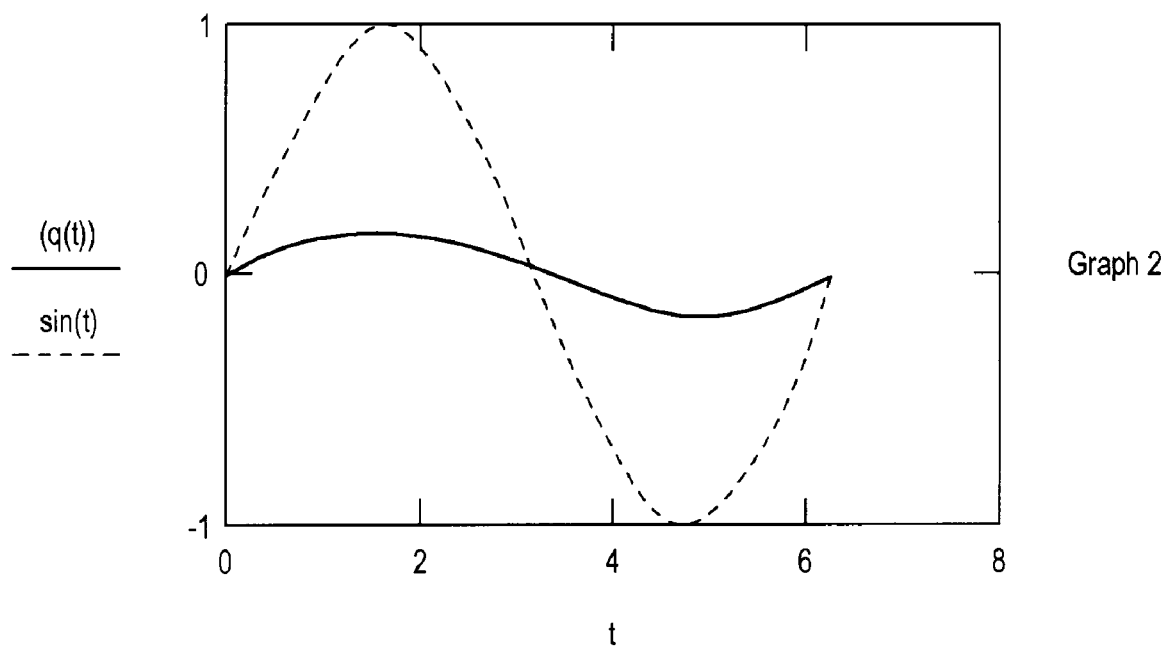
FIG. 71D illustrates relationships between capacitor charging and aperture, in accordance with an embodiment of the present invention.

Equations 18, 19, and 20 solve for q(t) by integrating Equation 10, allowing the charge on the capacitor 7106 with respect to time to be graphed on the same axis as the input sinusoid sin(t), as illustrated in the graph of FIG. 71C. As the aperture T decreases in value or tends toward an impulse, the phase between the charge on the capacitor C or q(t) and sin(t) tend toward zero. This is illustrated in the graph of FIG. 71D, which indicates that the maximum impulse charge transfer occurs near the input voltage maxima. As this graph indicates, considerably less charge is transferred as the value of T decreases.

Power/charge relationships are illustrated in Equations 21-26 of FIG. 71E, where it is shown that power is proportional to charge, and transferred charge is inversely proportional to insertion loss.

Concepts of insertion loss are illustrated in FIG. 71F. Generally, the noise figure of a lossy passive device is numerically equal to the device insertion loss. Alternatively, the noise figure for any device cannot be less that its insertion loss. Insertion loss can be expressed by Equation 27 or 28. From the above discussion, it is observed that as the aperture T increases, more charge is transferred from the input to the capacitor 7106, which increases power transfer from the input to the output. It has been observed that it is not necessary to accurately reproduce the input voltage at the output because relative modulated amplitude and phase information is retained in the transferred power.

3.6 Optimizing and Adjusting the Non-Negligible Aperture Width/Duration 3.6.1 Varying Input and Output Impedances In an embodiment of the invention, the energy transfer signal (i.e., control signal 2006 in FIG. 20A), is used to vary the input impedance seen by the EM Signal 2004 and to vary the output impedance driving a load. An example of this embodiment is described below using a gated transfer module 5101 shown in FIG. 51A. The method described below is not limited to the gated transfer module 5101.

Figure 51A:
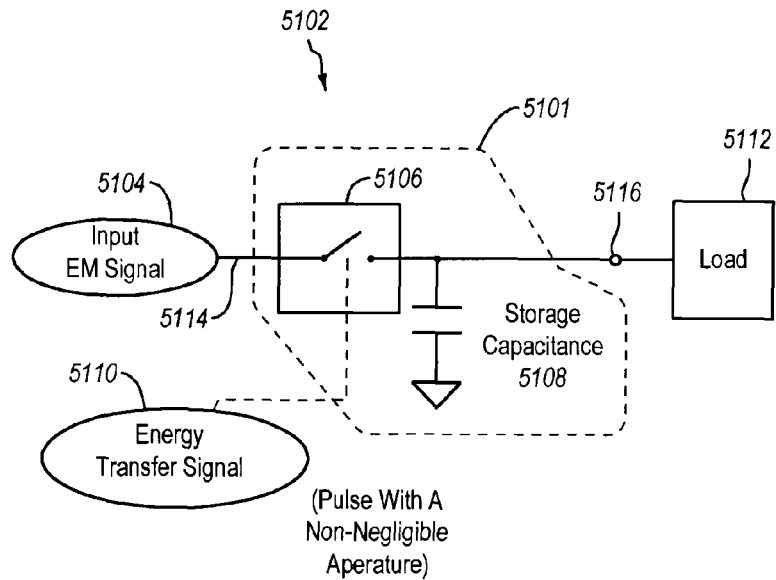
FIGS. 51A-B illustrate example energy transfer systems according to embodiments of the invention.
Figure 51B:
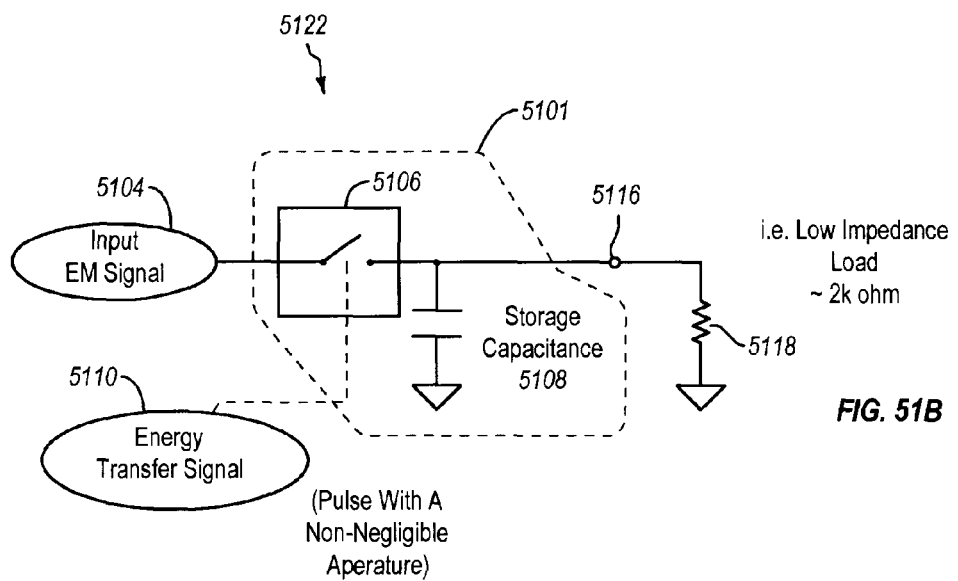

In FIG. 51A, when switch 5106 is closed, the impedance looking into circuit 5102 is substantially the impedance of a storage module, illustrated here as a storage capacitance 5108, in parallel with the impedance of a load 5112. When the switch 5106 is open, the impedance at point 5114 approaches infinity. It follows that the average impedance at point 5114 can be varied from the impedance of the storage module illustrated in parallel with the load 5112, to the highest obtainable impedance when switch 5106 is open, by varying the ratio of the time that switch 5106 is open to the time switch 5106 is closed. The switch 5106 is controlled by an energy transfer signal 5110. Thus the impedance at point 5114 can be varied by controlling the aperture width of the energy transfer signal in conjunction with the aliasing rate.

Figure 49A:
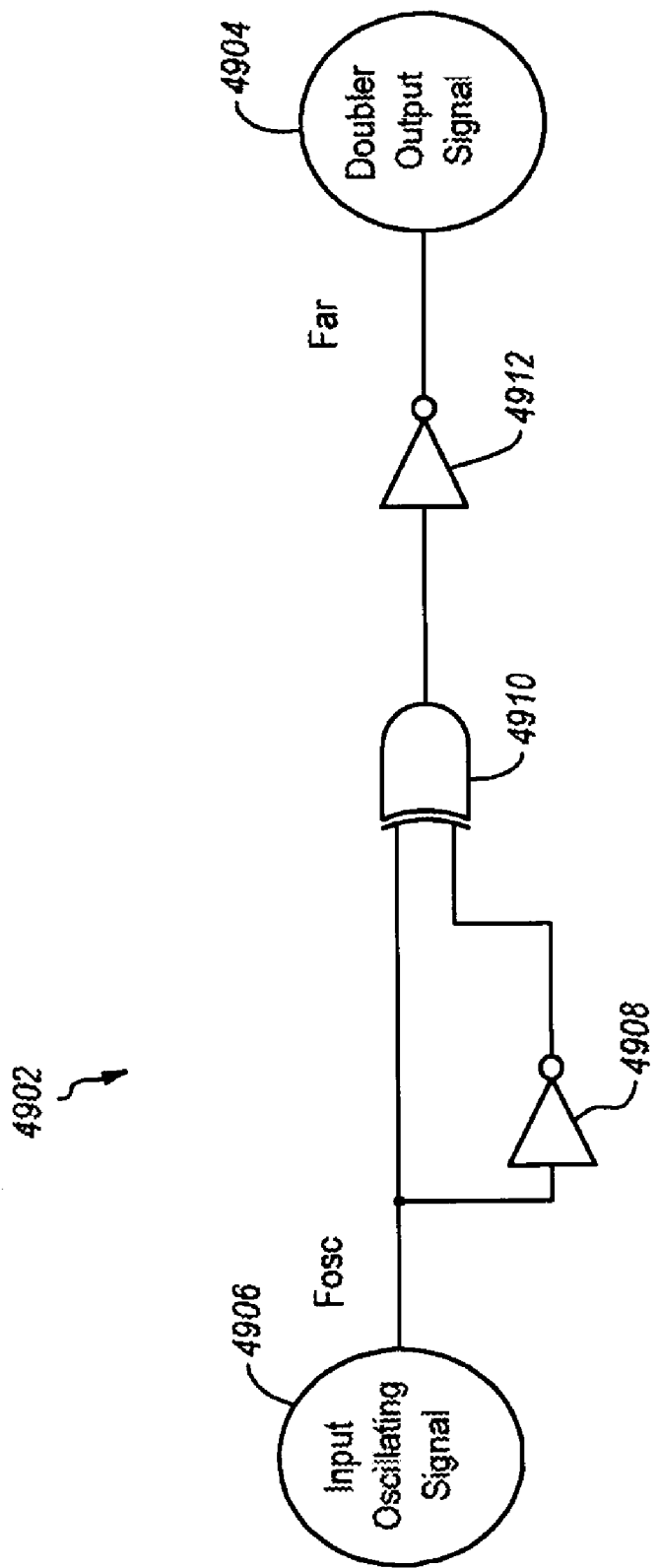
FIG. 49A illustrates an example pulse generator.

An example method of altering the energy transfer signal 5106 of FIG. 51A is now described with reference to FIG. 49A, where a circuit 4902 receives an input oscillating signal 4906 and outputs a pulse train shown as doubler output signal 4904. The circuit 4902 can be used to generate the energy transfer signal 5106. Example waveforms of 4904 are shown on FIG. 49C.

It can be shown that by varying the delay of the signal propagated by the inverter 4908, the width of the pulses in the doubler output signal 4904 can be varied. Increasing the delay of the signal propagated by inverter 4908, increases the width of the pulses. The signal propagated by inverter 4908 can be delayed by introducing a R/C low pass network in the output of inverter 4908. Other means of altering the delay of the signal propagated by inverter 4908 will be well known to those skilled in the art.

3.6.2 Real Time Aperture Control

In an embodiment, the aperture width/duration is adjusted in real time. For example, referring to the timing diagrams in FIGS. 64B-F, a clock signal 6414 (FIG. 64B) is utilized to generate an energy transfer signal 6416 (FIG. 64F), which includes energy transfer pluses 6418, having variable apertures 6420. In an embodiment, the clock signal 6414 is inverted as illustrated by inverted clock signal 6422 (FIG. 64D). The clock signal 6414 is also delayed, as illustrated by delayed clock signal 6424 (FIG. 64E). The inverted clock signal 6414 and the delayed clock signal 6424 are then ANDed together, generating an energy transfer signal 6416, which is active—energy transfer pulses 6418—when the delayed clock signal 6424 and the inverted clock signal 6422 are both active. The amount of delay imparted to the delayed clock signal 6424 substantially determines the width or duration of the apertures 6420. By varying the delay in real time, the apertures are adjusted in real time.

In an alternative implementation, the inverted clock signal 6422 is delayed relative to the original clock signal 6414, and then ANDed with the original clock signal 6414. Alternatively, the original clock signal 6414 is delayed then inverted, and the result ANDed with the original clock signal 6414.

Figure 64A:
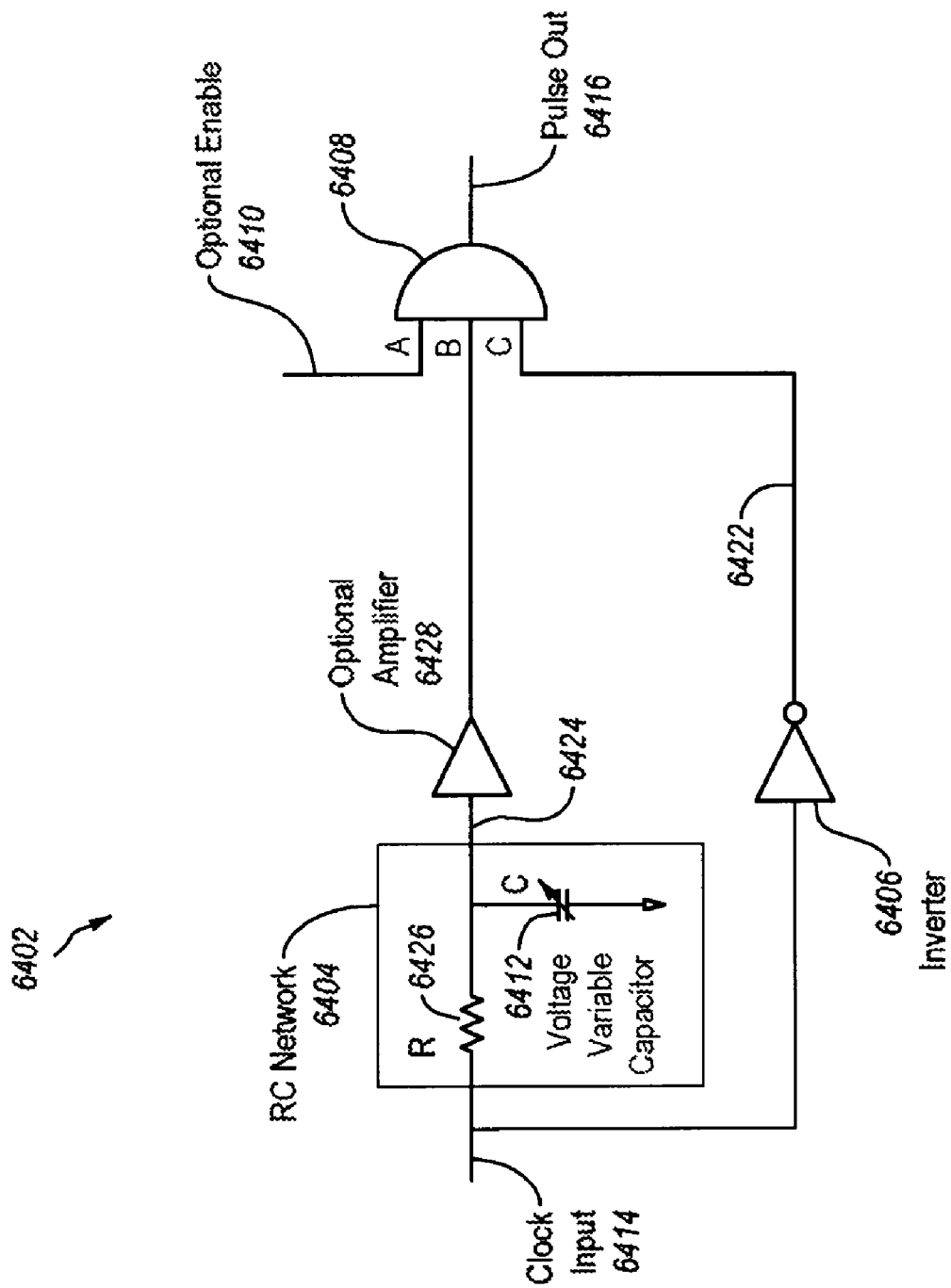
FIG. 64A illustrates an example real time aperture control circuit according to an embodiment of the invention.

FIG. 64A illustrates an exemplary real time aperture control system 6402 that can be utilized to adjust apertures in real time. The example real time aperture control system 6402 includes an RC circuit 6404, which includes a voltage variable capacitor 6412 and a resistor 6426. The real time aperture control system 6402 also includes an inverter 6406 and an AND gate 6408. The AND gate 6408 optionally includes an enable input 6410 for enabling/disabling the AND gate 6408. The RC circuit 6404. The real time aperture control system 6402 optionally includes an amplifier 6428.

Operation of the real time aperture control circuit is described with reference to the timing diagrams of FIGS. 64B-F. The real time control system 6402 receives the input clock signal 6414, which is provided to both the inverter 6406 and to the RC circuit 6404. The inverter 6406 outputs the inverted clock signal 6422 and presents it to the AND gate 6408. The RC circuit 6404 delays the clock signal 6414 and outputs the delayed clock signal 6424. The delay is determined primarily by the capacitance of the voltage variable capacitor 6412. Generally, as the capacitance decreases, the delay decreases.

The delayed clock signal 6424 is optionally amplified by the optional amplifier 6428, before being presented to the AND gate 6408. Amplification is desired, for example, where the RC constant of the RC circuit 6404 attenuates the signal below the threshold of the AND gate 6408.

The AND gate 6408 ANDs the delayed clock signal 6424, the inverted clock signal 6422, and the optional Enable signal 6410, to generate the energy transfer signal 6416. The apertures 6420 are adjusted in real time by varying the voltage to the voltage variable capacitor 6412.

In an embodiment, the apertures 6420 are controlled to optimize power transfer. For example, in an embodiment, the apertures 6420 are controlled to maximize power transfer. Alternatively, the apertures 6420 are controlled for variable gain control (e.g. automatic gain control—AGC). In this embodiment, power transfer is reduced by reducing the apertures 6420.

As can now be readily seen from this disclosure, many of the aperture circuits presented, and others, can be modified as in circuits illustrated in FIGS. 46 H-K. Modification or selection of the aperture can be done at the design level to remain a fixed value in the circuit, or in an alternative embodiment, may be dynamically adjusted to compensate for, or address, various design goals such as receiving RF signals with enhanced efficiency that are in distinctively different bands of operation, e.g. RF signals at 900 MHZ and 1.8 GHz.

3.7 Adding a Bypass Network

In an embodiment of the invention, a bypass network is added to improve the efficiency of the energy transfer module. Such a bypass network can be viewed as a means of synthetic aperture widening. Components for a bypass network are selected so that the bypass network appears substantially lower impedance to transients of the switch module (i.e., frequencies greater than the received EM signal) and appears as a moderate to high impedance to the input EM signal (e.g., greater that 100 Ohms at the RF frequency).

The time that the input signal is now connected to the opposite side of the switch module is lengthened due to the shaping caused by this network, which in simple realizations may be a capacitor or series resonant inductor-capacitor. A network that is series resonant above the input frequency would be a typical implementation. This shaping improves the conversion efficiency of an input signal that would otherwise, if one considered the aperture of the energy transfer signal only, be relatively low in frequency to be optimal.

Figure 57:
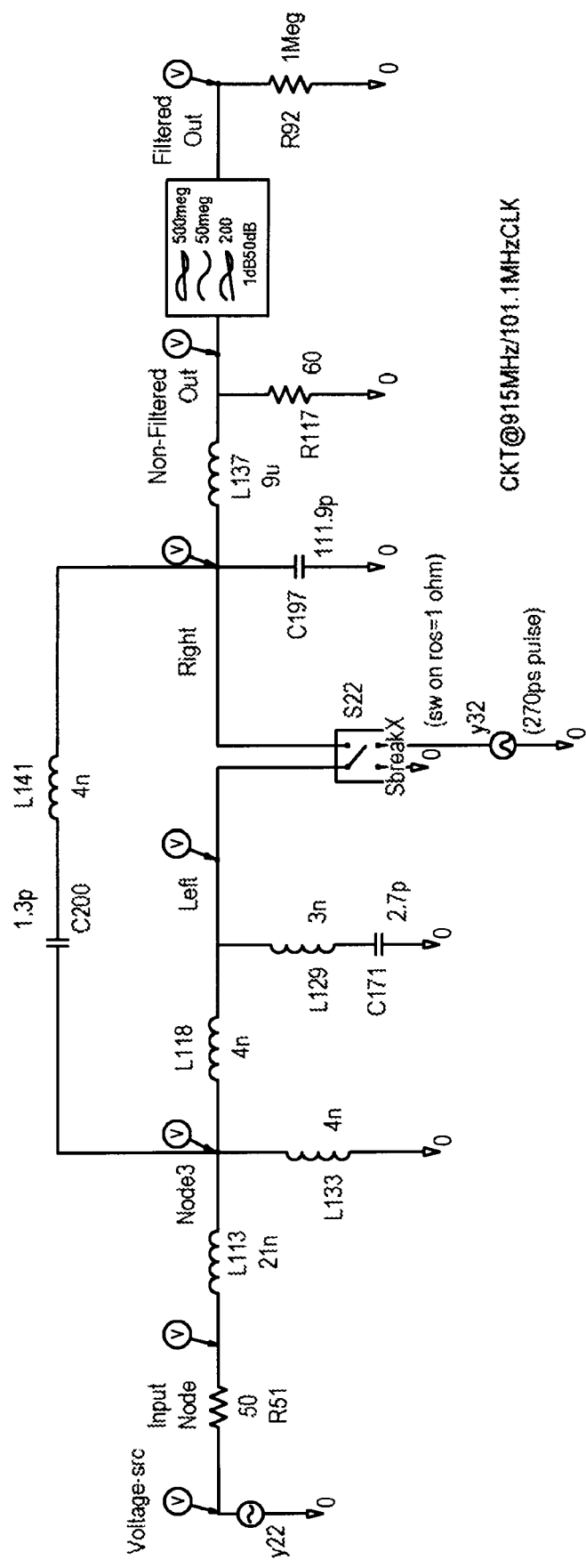
FIG. 57 is a schematic diagram of a circuit to down-convert a 915 MHZ signal to a 5 MHZ signal using a 101.1 MHZ clock according to an embodiment of the present invention.
Figure 61:
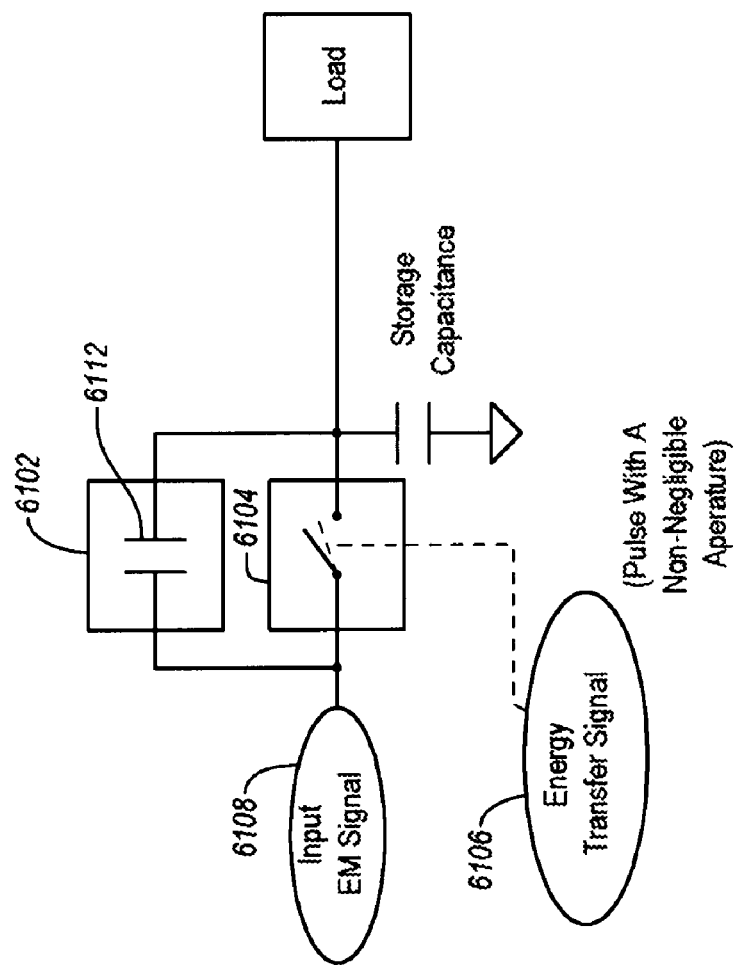
FIG. 61 illustrates an example bypass network according to an embodiment of the invention.
Figure 62:
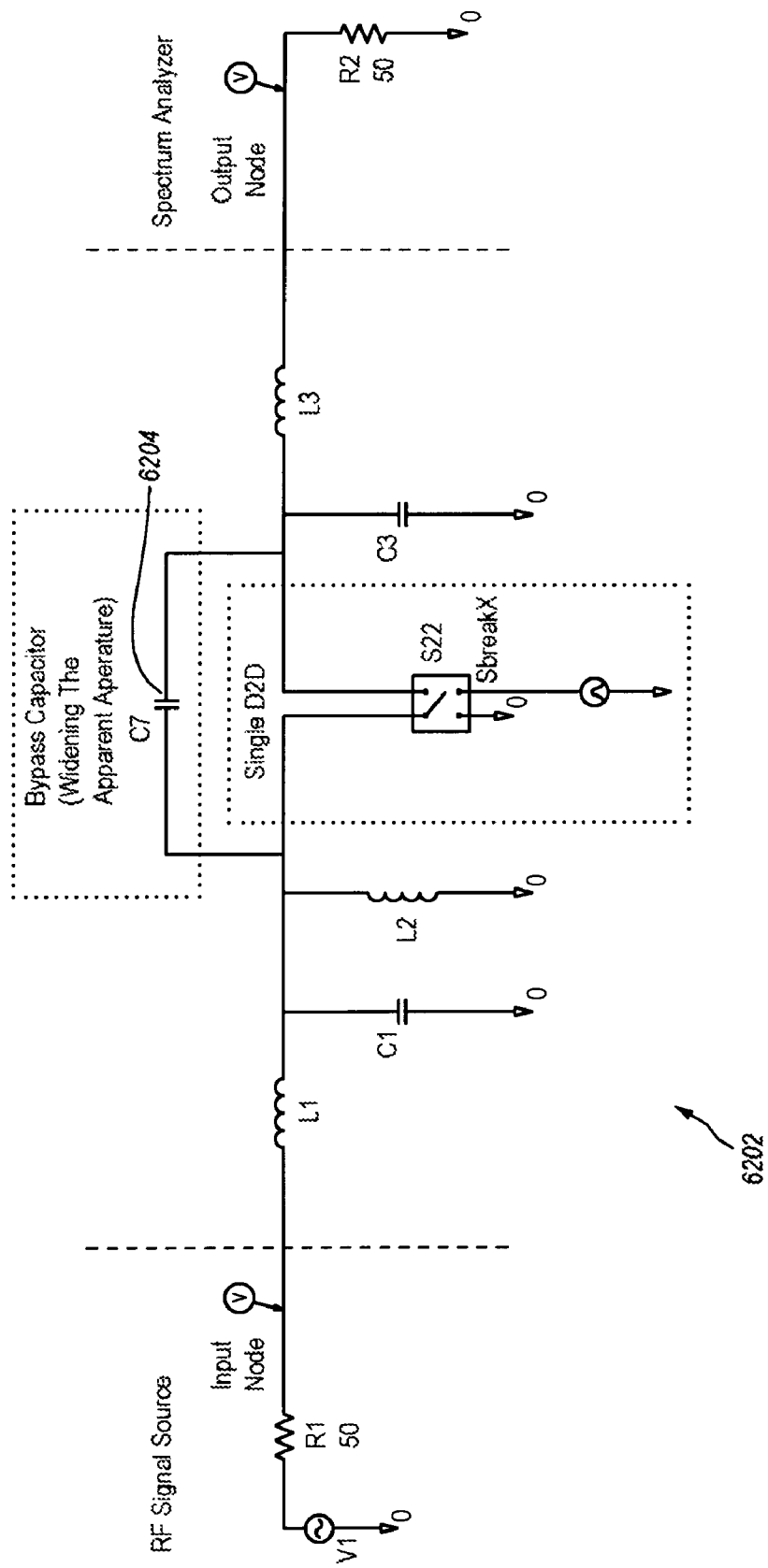
FIG. 62 illustrates an example bypass network according to an embodiment of the invention.

For example, referring to FIG. 61 a bypass network 6102 (shown in this instance as capacitor 6112), is shown bypassing switch module 6104. In this embodiment the bypass network increases the efficiency of the energy transfer module when, for example, less than optimal aperture widths were chosen for a given input frequency on the energy transfer signal 6106. The bypass network 6102 could be of different configurations than shown in FIG. 61. Such an alternate is illustrated in FIG. 57. Similarly, FIG. 62 illustrates another example bypass network 6202, including a capacitor 6204.

Figure 65:
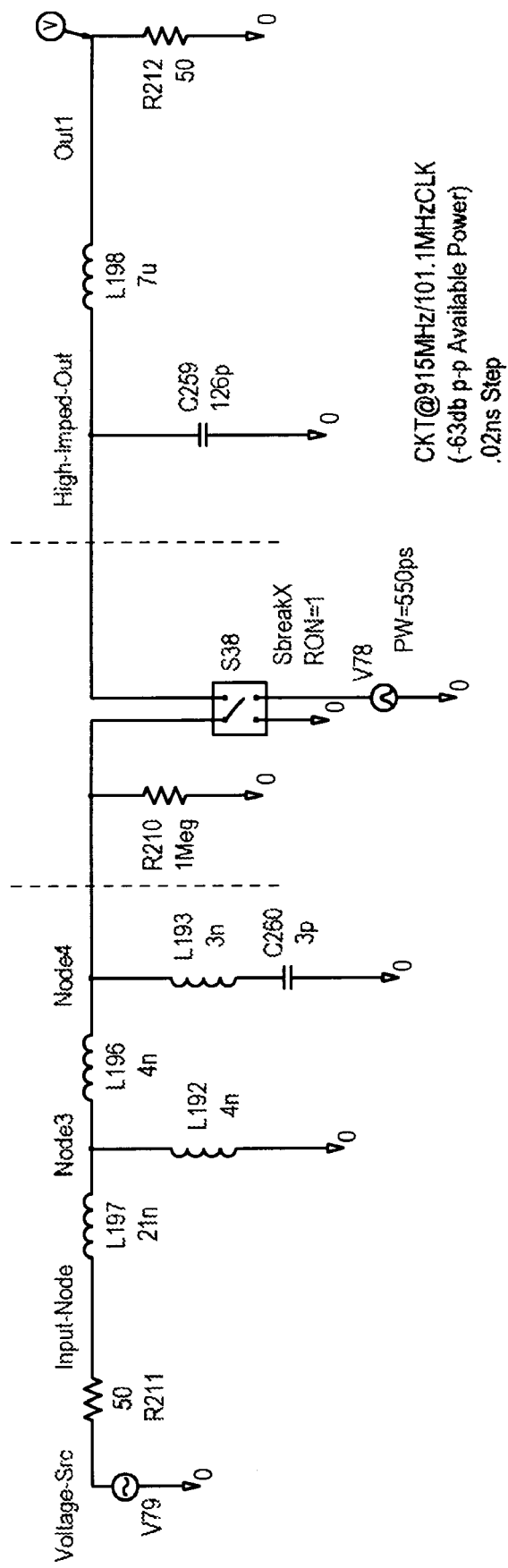
FIG. 65 illustrates an example embodiment of the invention.
Figure 66:
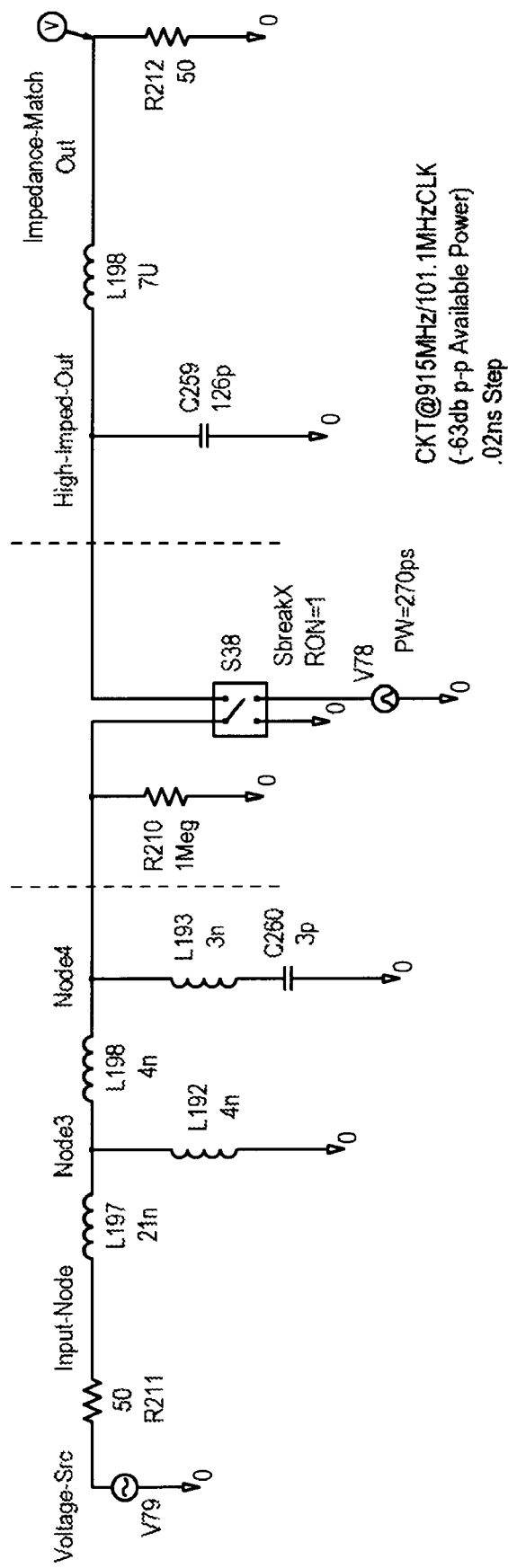
FIG. 66 illustrates an example embodiment of the invention.
Figure 67:
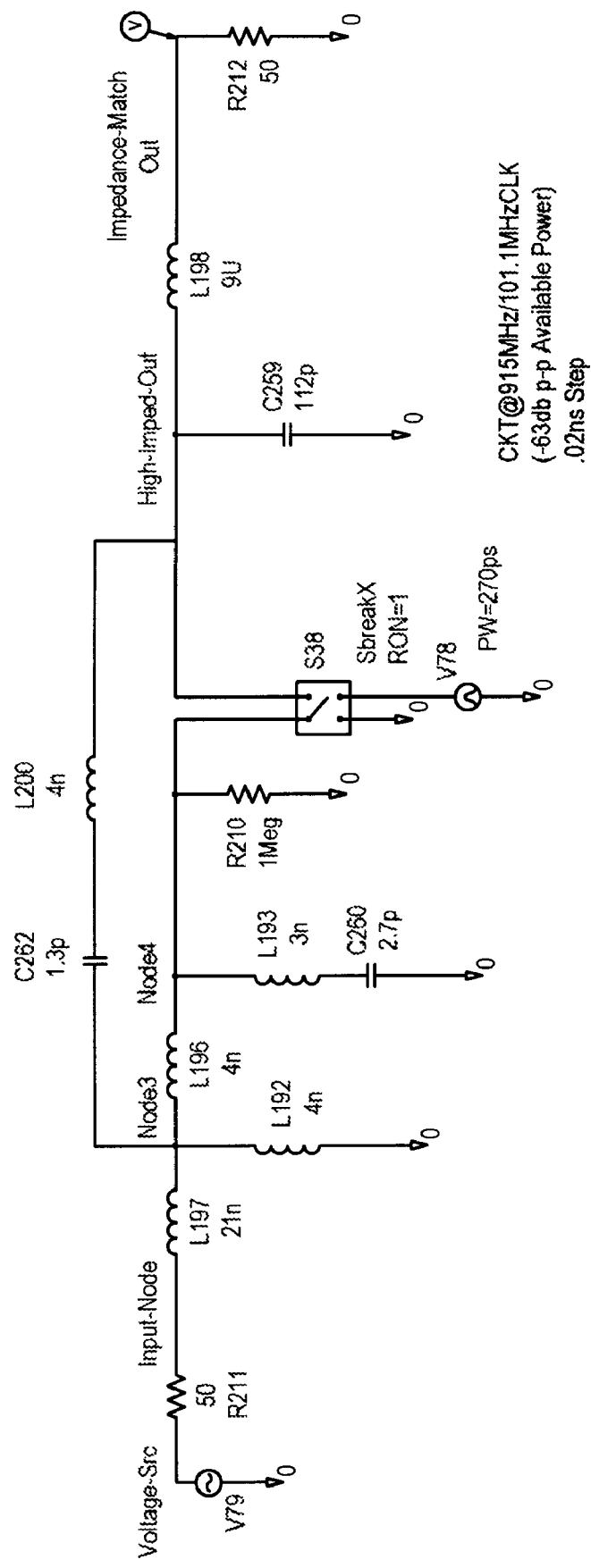
FIG. 67 illustrates an example embodiment of the invention.
Figure 68:
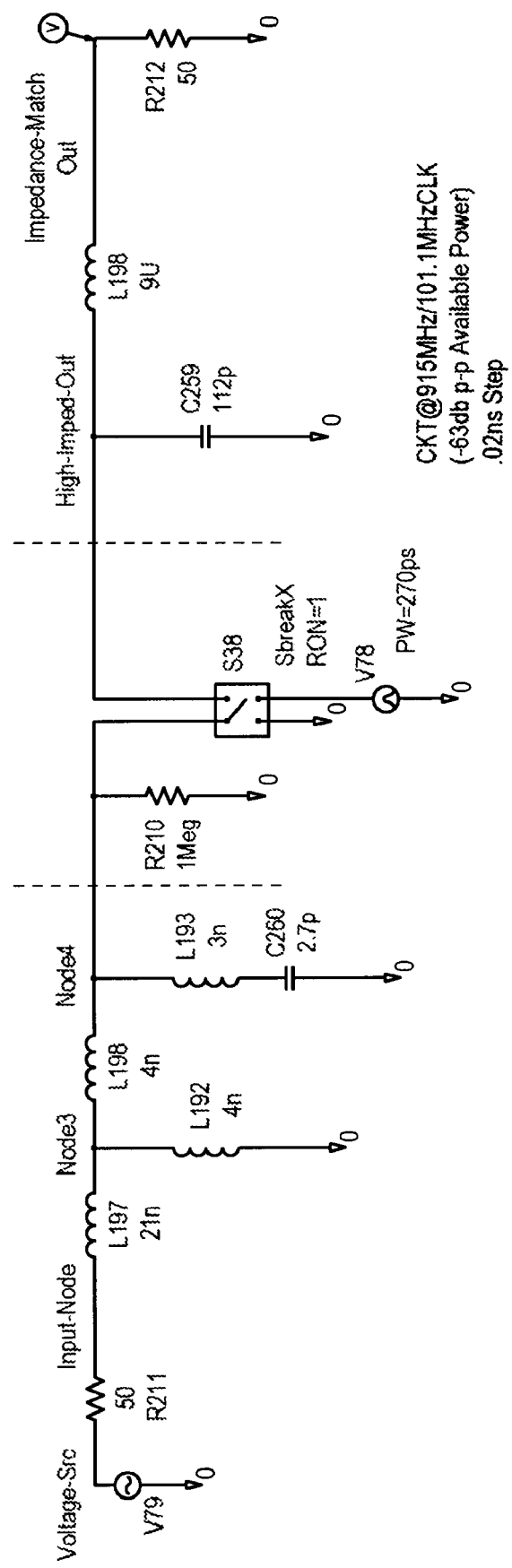
FIG. 68 illustrates an example embodiment of the invention.

The following discussion will demonstrate the effects of a minimized aperture and the benefit provided by a bypassing network. Beginning with an initial circuit having a 550 ps aperture in FIG. 65, its output is seen to be 2.8 mVpp applied to a 50 ohm load in FIG. 69A. Changing the aperture to 270 ps as shown in FIG. 66 results in a diminished output of 2.5 Vpp applied to a 50 ohm load as shown in FIG. 69B. To compensate for this loss, a bypass network may be added, a specific implementation is provided in FIG. 67. The result of this addition is that 3.2 Vpp can now be applied to the 50 ohm load as shown in FIG. 70A. The circuit with the bypass network in FIG. 67 also had three values adjusted in the surrounding circuit to compensate for the impedance changes introduced by the bypass network and narrowed aperture. FIG. 68 verifies that those changes added to the circuit, but without the bypass network, did not themselves bring about the increased efficiency demonstrated by the embodiment in FIG. 67 with the bypass network. FIG. 70B shows the result of using the circuit in FIG. 68 in which only 1.88 Vpp was able to be applied to a 50 ohm load.

3.8 Modifying the Energy Transfer Signal Utilizing Feedback

FIG. 47 shows an embodiment of a system 4701 which uses down-converted Signal 4708B as feedback 4706 to control various characteristics of the energy transfer module 4704 to modify the down-converted signal 4708B.

Generally, the amplitude of the down-converted signal 4708B varies as a function of the frequency and phase differences between the EM signal 4504 and the energy transfer signal 4506. In an embodiment, the down-converted signal 4708B is used as the feedback 4706 to control the frequency and phase relationship between the EM signal 4504 and the energy transfer signal 4506. This can be accomplished using the example logic in FIG. 52A. The example circuit in FIG. 52A can be included in the energy transfer signal module 4702. Alternate implementations will be apparent to persons skilled in the relevant art(s) based on the teachings contained herein. Alternate implementations fall within the scope and spirit of the present invention. In this embodiment a state-machine is used as an example.

Figure 52A:
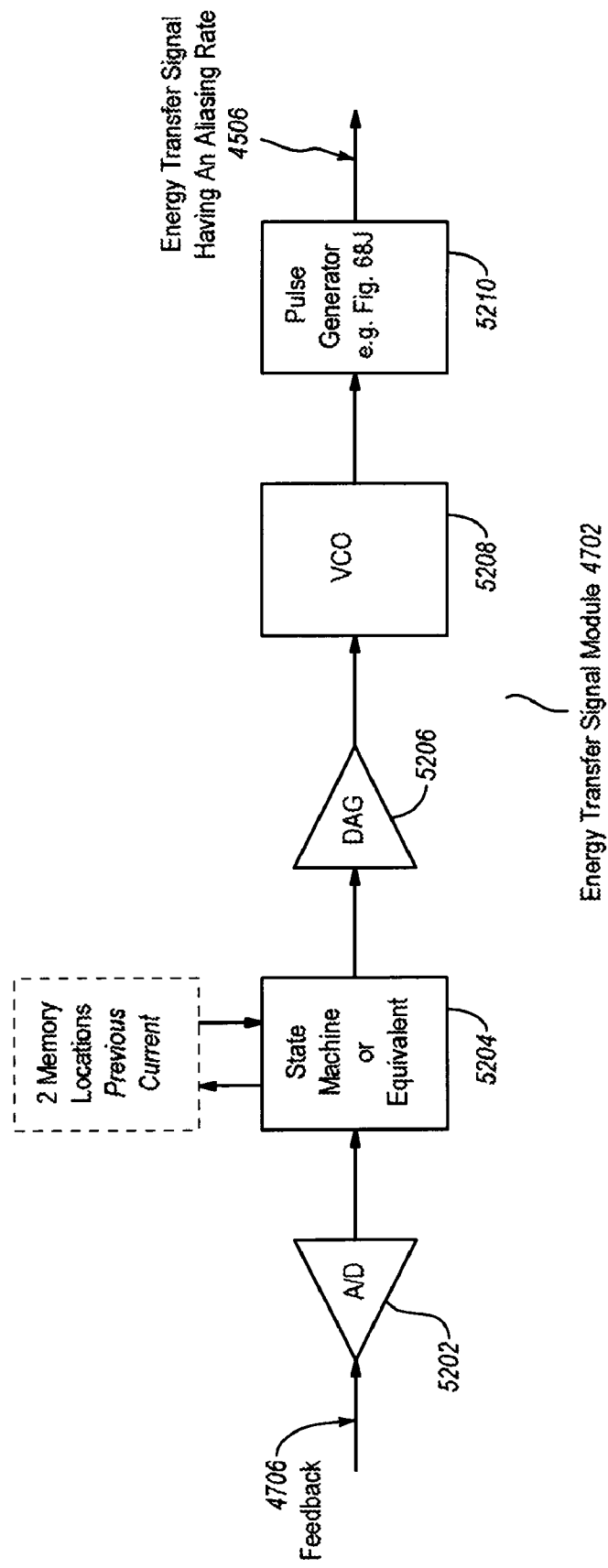
FIG. 52A illustrates an example energy transfer signal module according to an embodiment of the present invention.

In the example of FIG. 52A, a state machine 5204 reads an analog to digital converter, A/D 5202, and controls a digital to analog converter, DAC 5206. In an embodiment, the state machine 5204 includes 2 memory locations, Previous and Current, to store and recall the results of reading A/D 5202. In an embodiment, the state machine 5204 utilizes at least one memory flag.

The DAC 5206 controls an input to a voltage controlled oscillator, VCO 5208. VCO 5208 controls a frequency input of a pulse generator 5210, which, in an embodiment, is substantially similar to the pulse generator shown in FIG. 46C. The pulse generator 5210 generates energy transfer signal 4506.

Figure 52B:
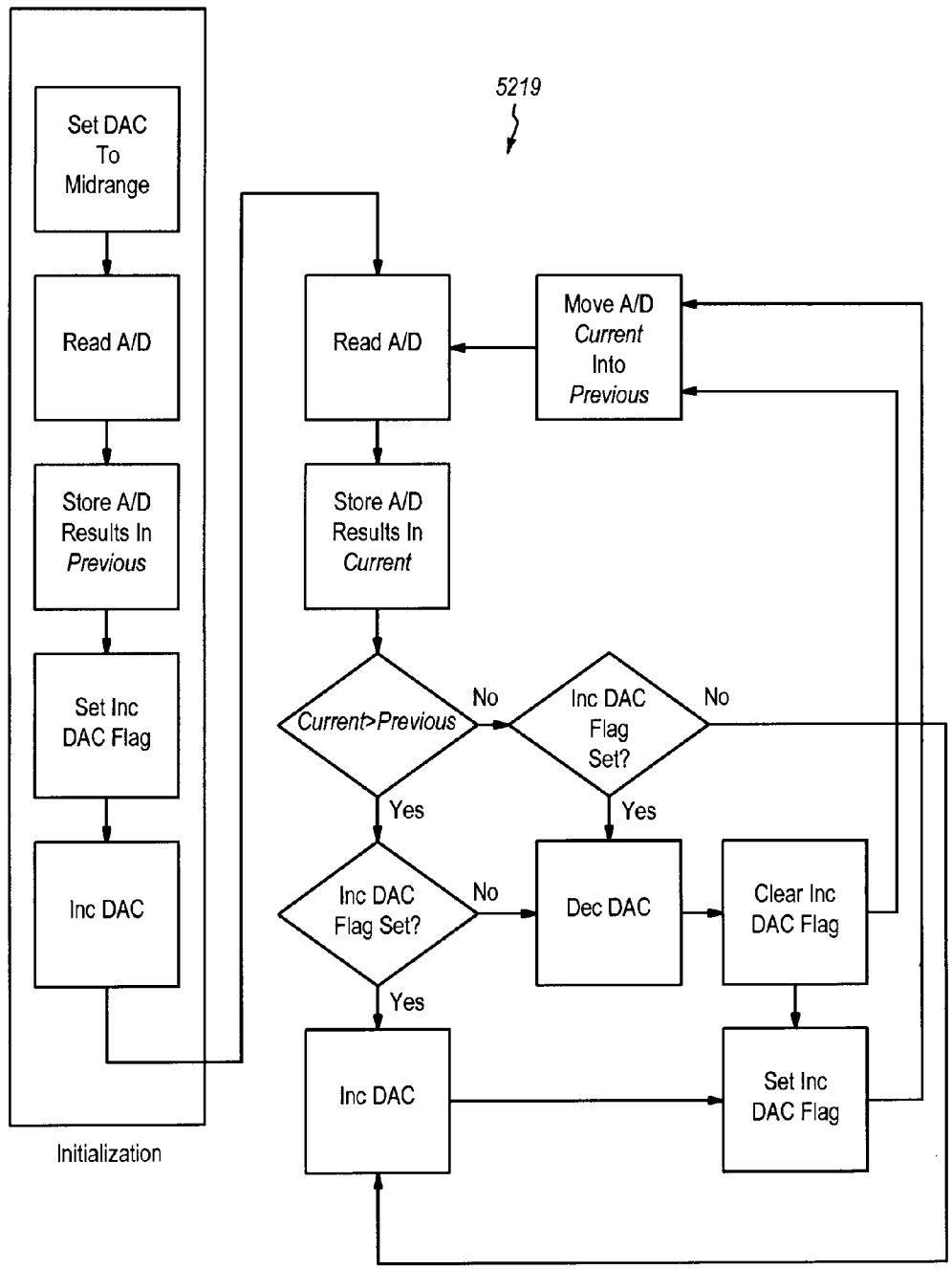
FIG. 52B illustrates a flowchart of state machine operation according to an embodiment of the present invention.

In an embodiment, the state machine 5204 operates in accordance with a state machine flowchart 5219 in FIG. 52B. The result of this operation is to modify the frequency and phase relationship between the energy transfer signal 4506 and the EM signal 4504, to substantially maintain the amplitude of the down-converted signal 4708B at an optimum level.

Figure 45A:
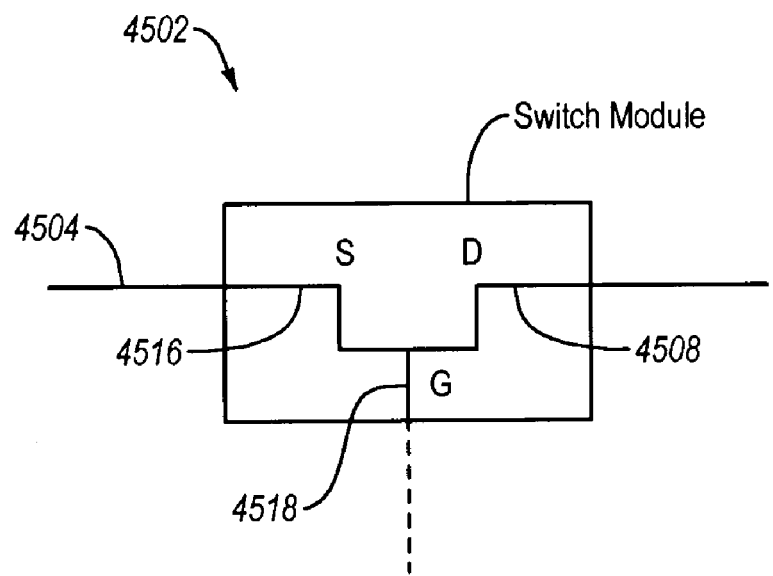
FIGS. 45A-D illustrate example implementations of a switch module according to embodiments of the invention.
Figure 45B:
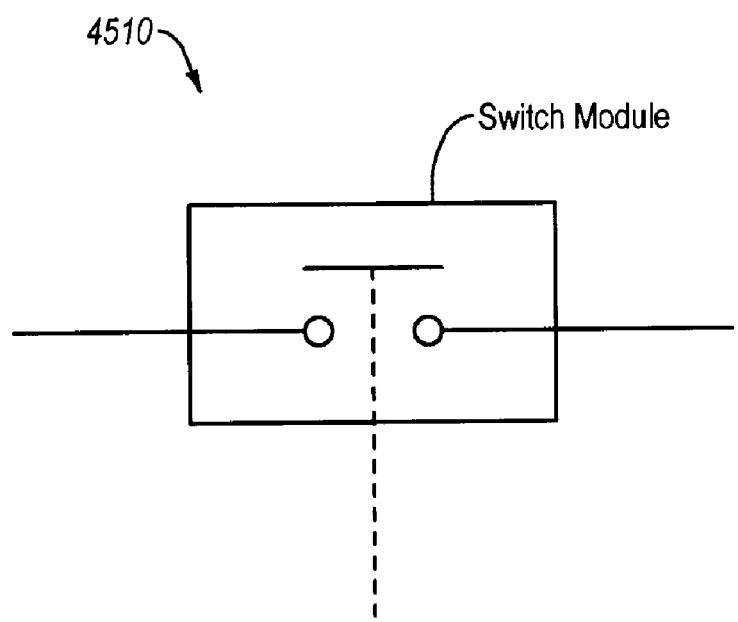
Figure 45C:
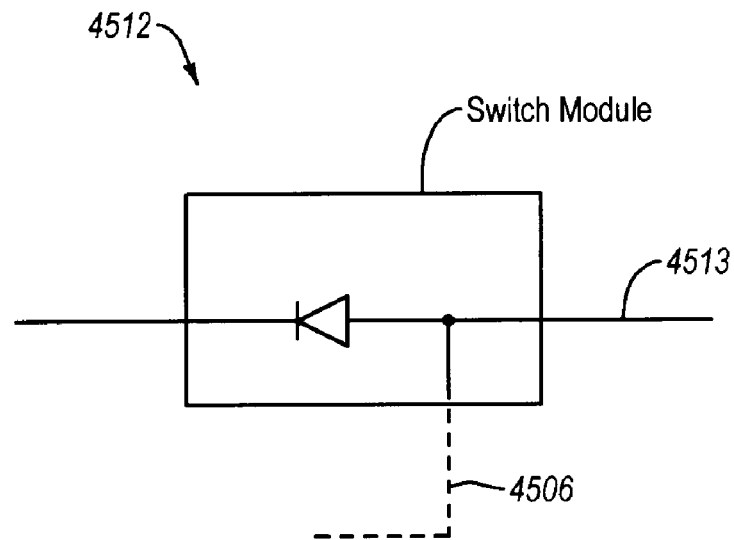
Figure 45D:
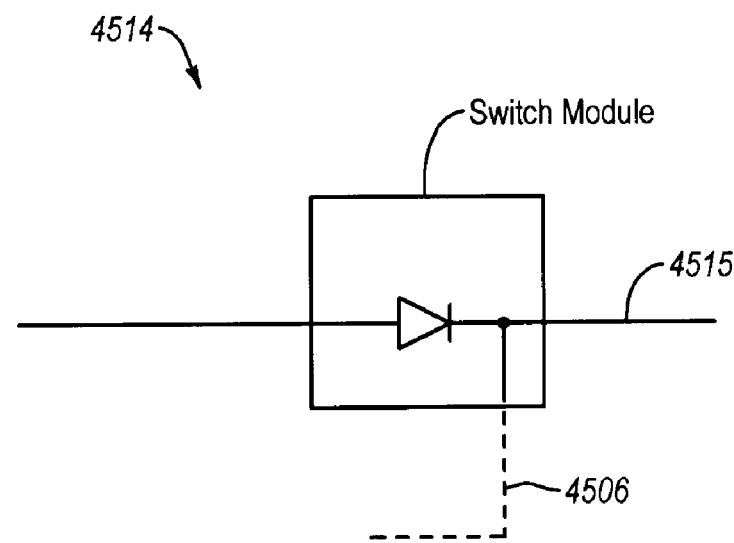
Figure 52C:
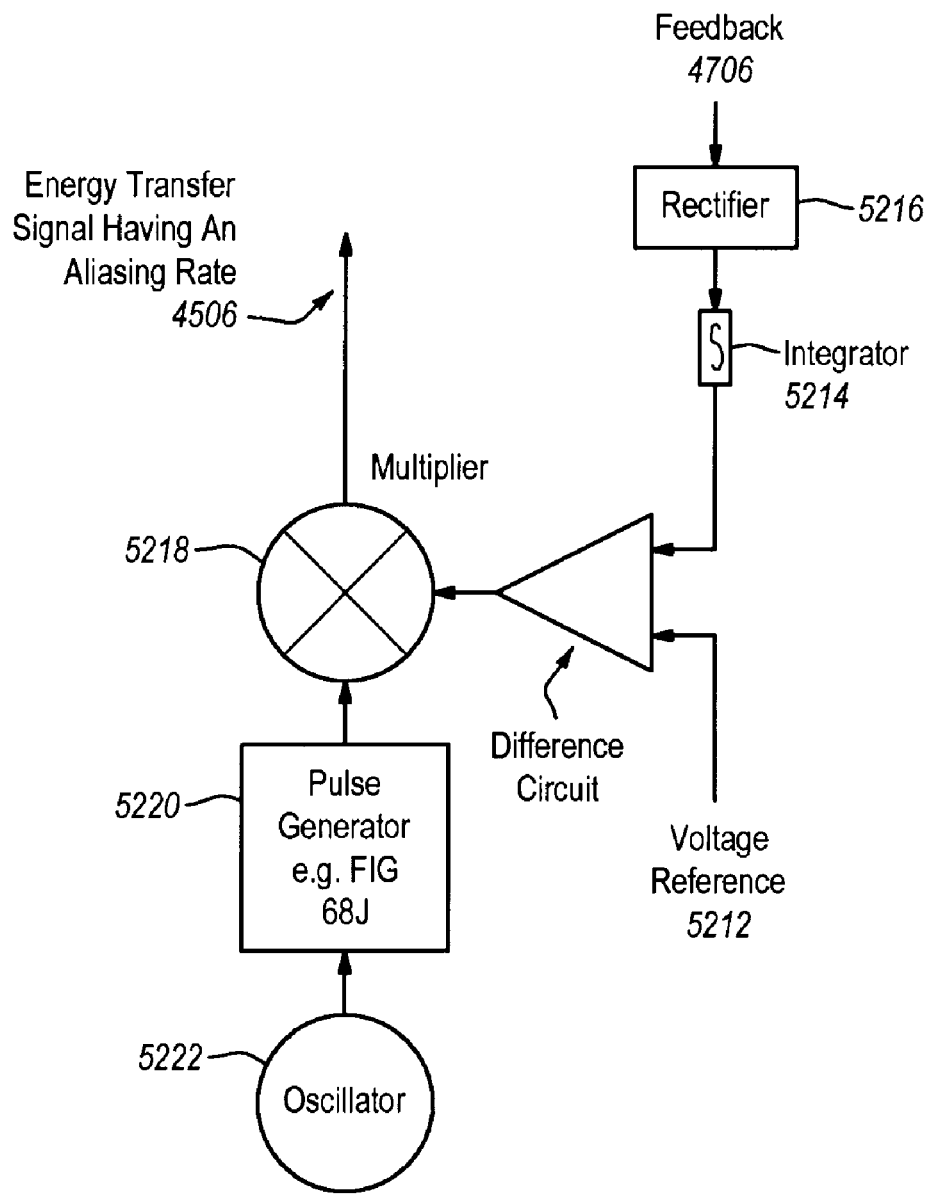
FIG. 52C is an example energy transfer signal module.

The amplitude of the down-converted signal 4708B can be made to vary with the amplitude of the energy transfer signal 4506. In an embodiment where the switch module 6502 is a FET as shown in FIG. 45A, wherein the gate 4518 receives the energy transfer signal 4506, the amplitude of the energy transfer signal 4506 can determine the "on" resistance of the FET, which affects the amplitude of the down-converted signal 4708B. The energy transfer signal module 4702, as shown in FIG. 52C, can be an analog circuit that enables an automatic gain control function. Alternate implementations will be apparent to persons skilled in the relevant art(s) based on the teachings contained herein. Alternate implementations fall within the scope and spirit of the present invention.

3.9 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

3.10 Example Energy Transfer Down-Converters

Example implementations are described below for illustrative purposes. The invention is not limited to these examples.

Figure 53:
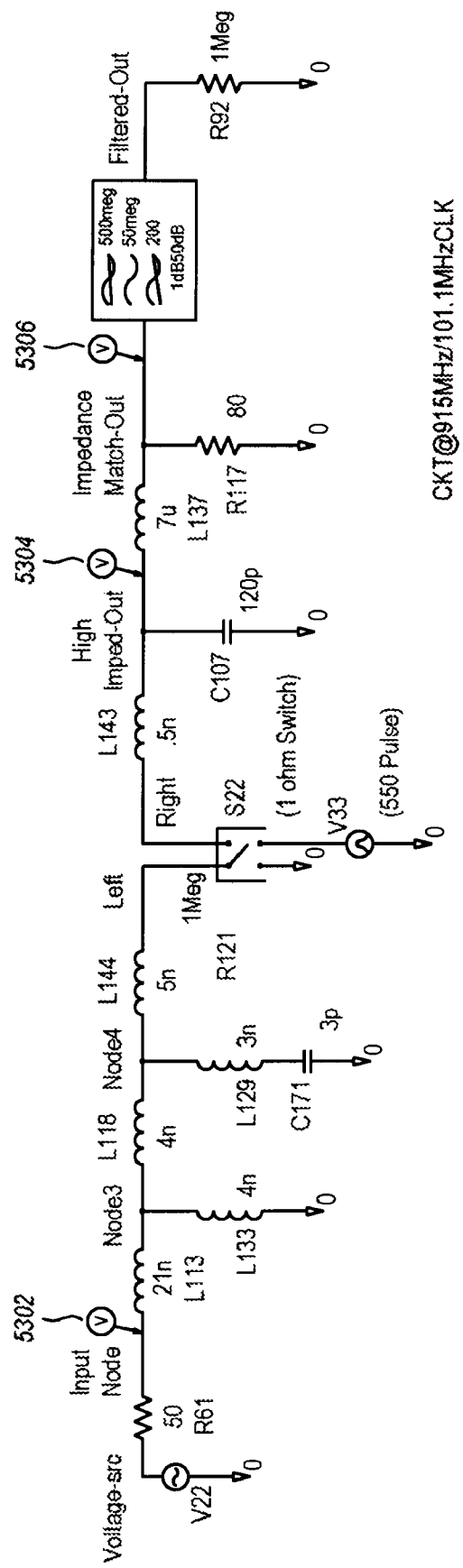
FIG. 53 is a schematic diagram of a circuit to down-convert a 915 MHZ signal to a 5 MHZ signal using a 101.1 MHZ clock according to an embodiment of the present invention.

FIG. 53 is a schematic diagram of an exemplary circuit to down convert a 915 MHZ signal to a 5 MHZ signal using a 101.1 MHZ clock.

Figure 54:
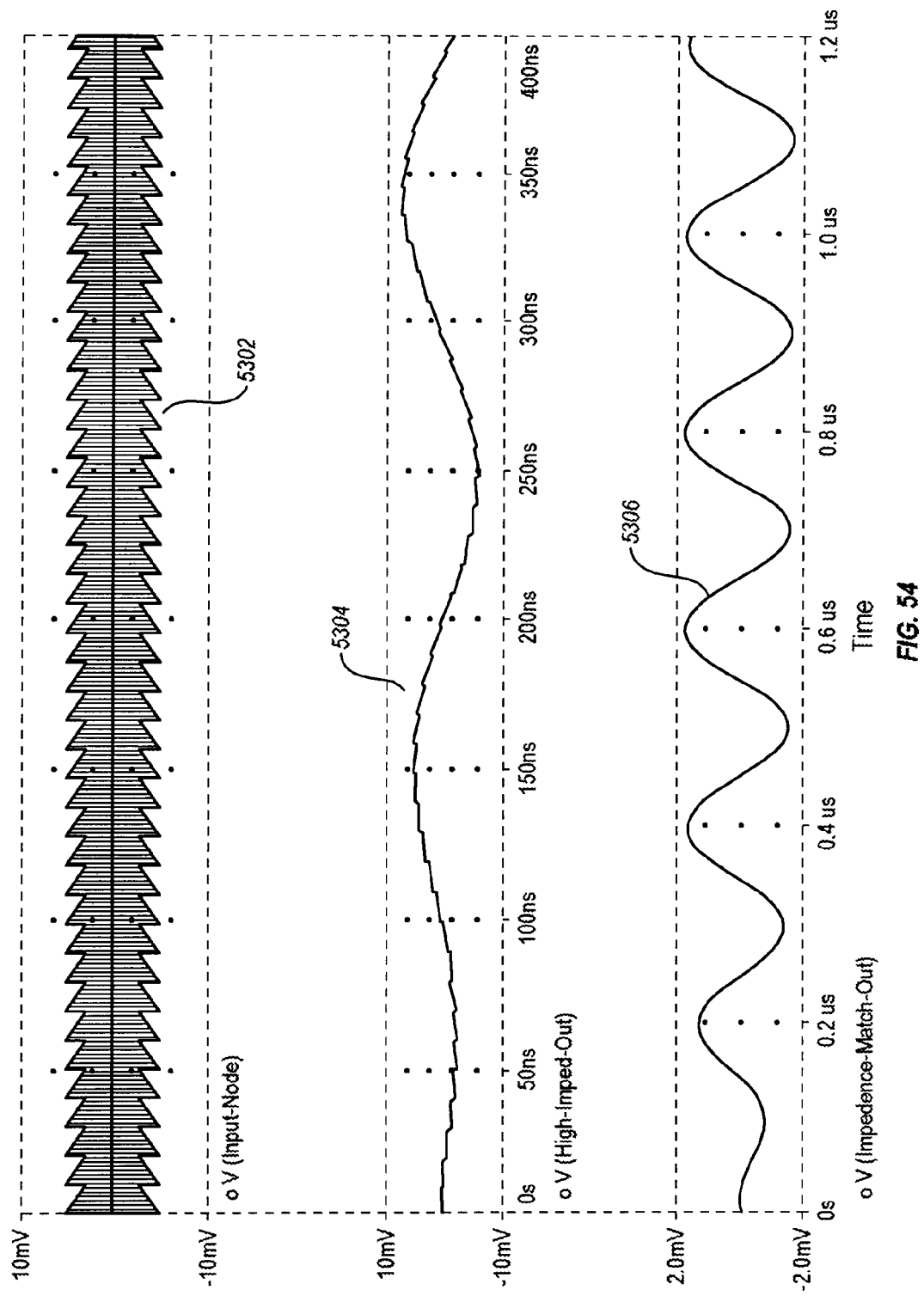
FIG. 54 shows example simulation waveforms for the circuit of FIG. 53 according to embodiments of the present invention.

FIG. 54 shows example simulation waveforms for the circuit of FIG. 53. Waveform 5302 is the input to the circuit showing the distortions caused by the switch closure. Waveform 5304 is the unfiltered output at the storage unit. Waveform 5306 is the impedance matched output of the down-converter on a different time scale.

FIG. 55 is a schematic diagram of an exemplary circuit to down-convert a 915 MHZ signal to a 5 MHZ signal using a 101.1 MHZ clock. The circuit has additional tank circuitry to improve conversion efficiency.

Figure 56:
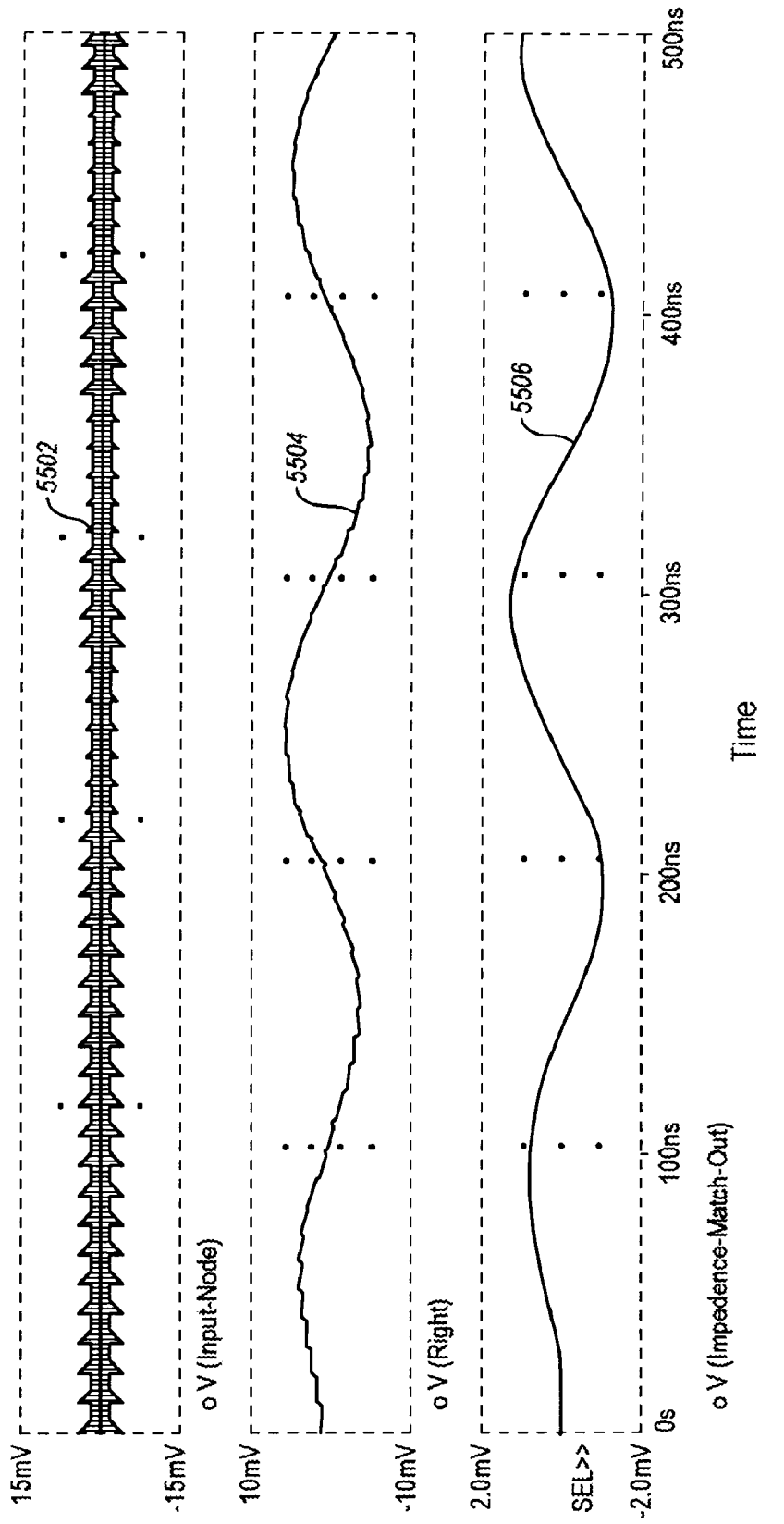
FIG. 56 shows example simulation waveforms for the circuit of FIG. 55 according to embodiments of the present invention.

FIG. 56 shows example simulation waveforms for the circuit of FIG. 55. Waveform 5502 is the input to the circuit showing the distortions caused by the switch closure. Waveform 5504 is the unfiltered output at the storage unit. Waveform 5506 is the output of the down-converter after the impedance match circuit.

FIG. 57 is a schematic diagram of an exemplary circuit to down-convert a 915 MHZ signal to a 5 MHZ signal using a 101.1 MHZ clock. The circuit has switch bypass circuitry to improve conversion efficiency.

Figure 58:
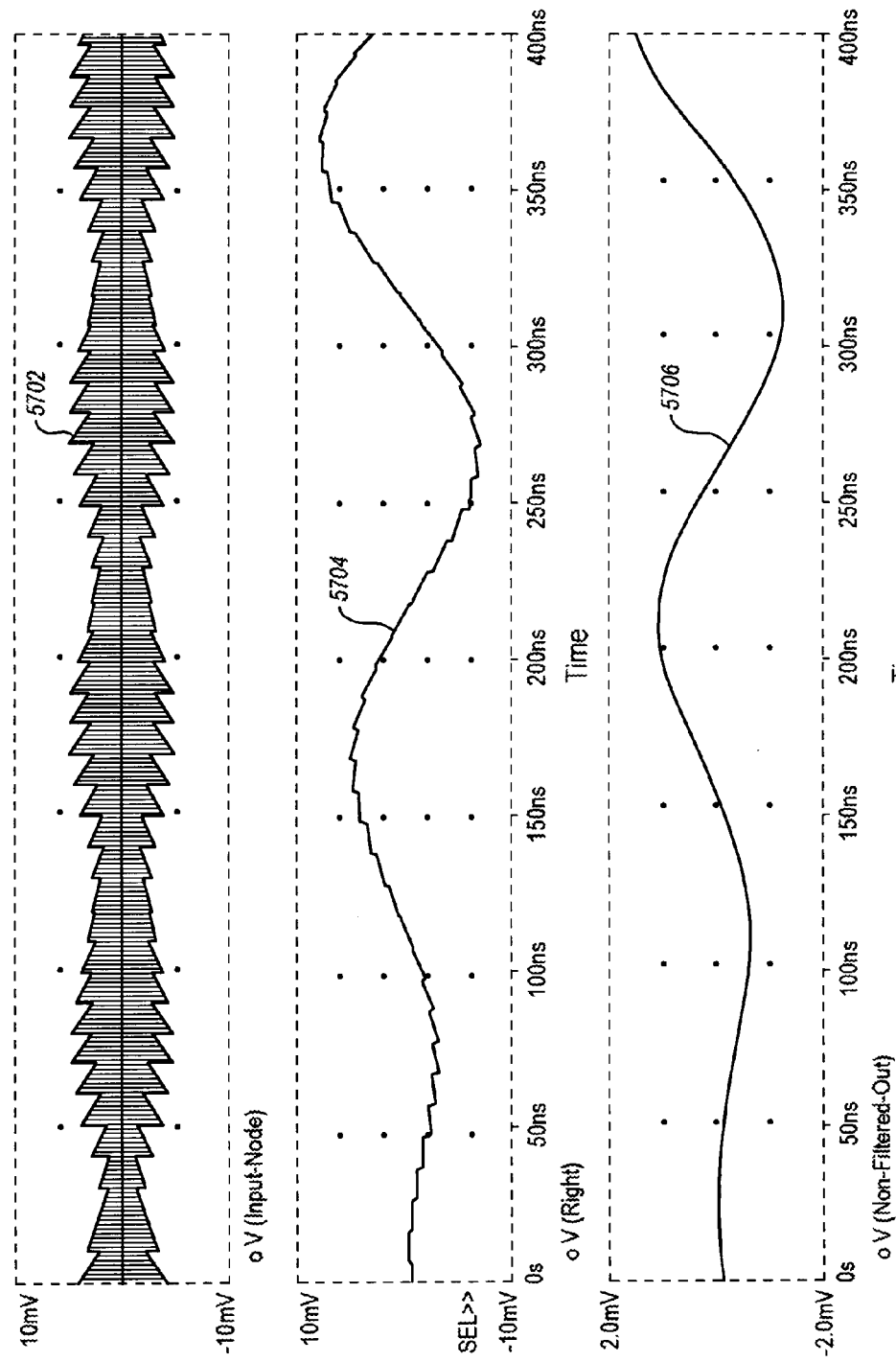
FIG. 58 shows example simulation waveforms for the circuit of FIG. 57 according to an embodiment of the present invention.

FIG. 58 shows example simulation waveforms for the circuit of FIG. 57. Waveform 5702 is the input to the circuit showing the distortions caused by the switch closure. Waveform 5704 is the unfiltered output at the storage unit. Waveform 5706 is the output of the down-converter after the impedance match circuit.

Figure 59:
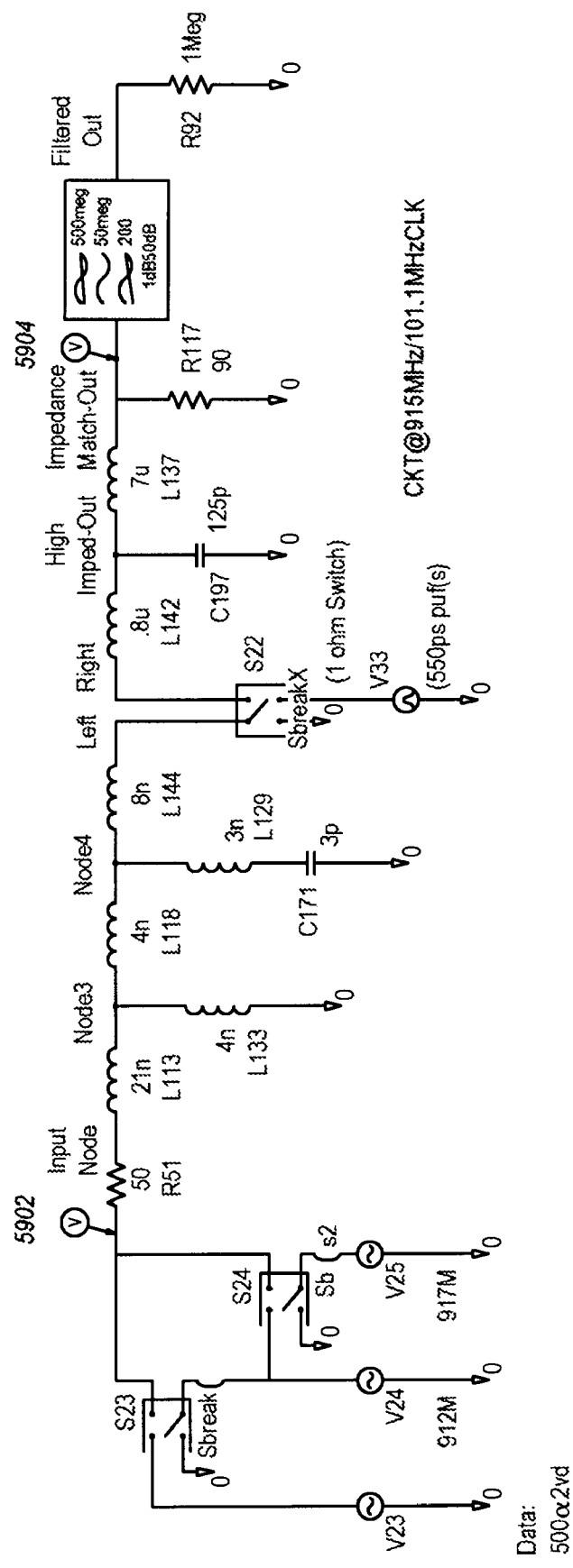
FIG. 59 shows a schematic of the circuit in FIG. 53 connected to an FSK source that alternates between 913 and 917 MHZ at a baud rate of 500 Kbaud according to an embodiment of the present invention.
Figure 72:
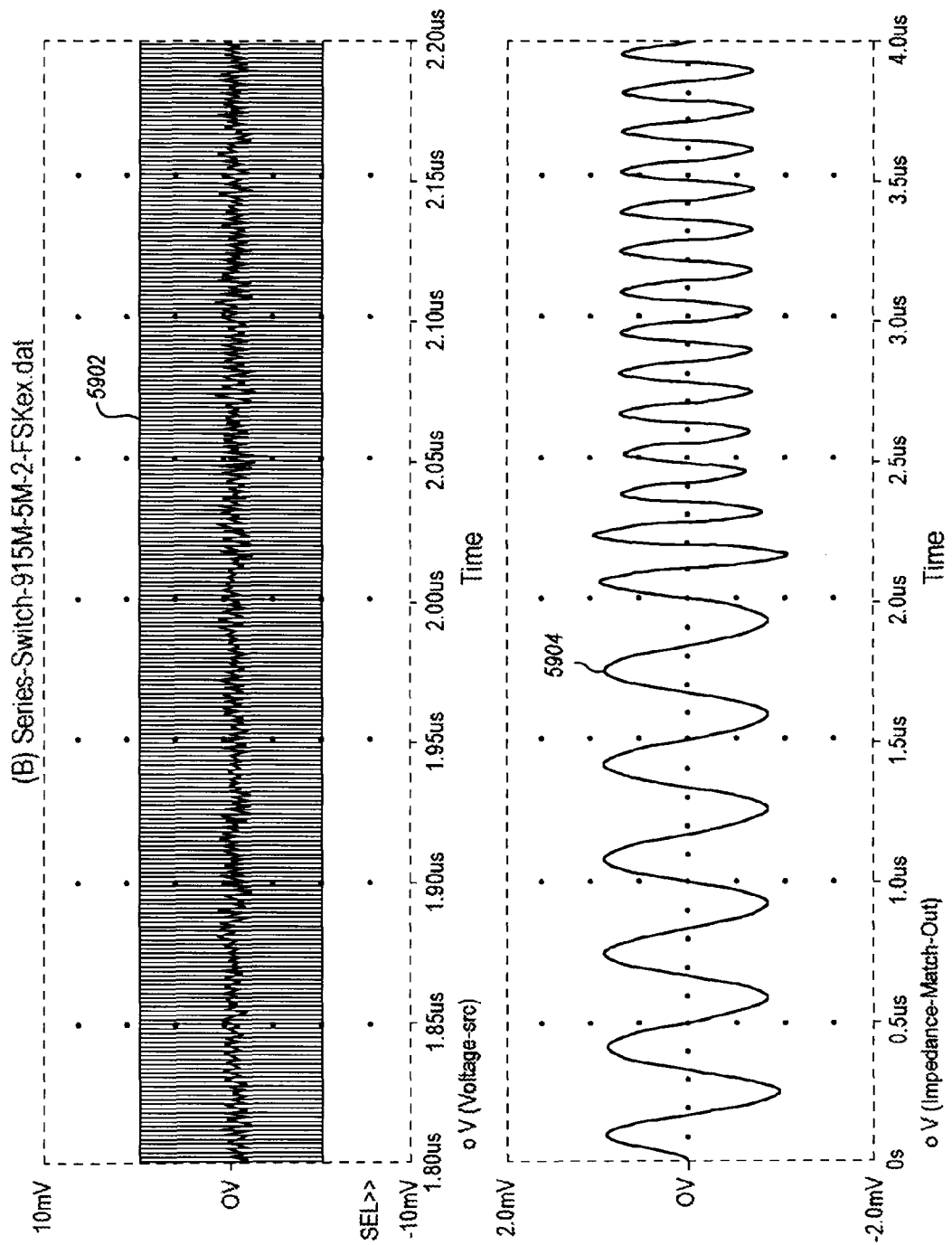
FIG. 72 shows the original FSK waveform 5902 and the down-converted waveform 5904.

FIG. 59 shows a schematic of the example circuit in FIG. 53 connected to an FSK source that alternates between 913 and 917 MHZ, at a baud rate of 500 Kbaud. FIG. 72 shows the original FSK waveform 5902 and the down-converted waveform 5904 at the output of the load impedance match circuit.

4. Frequency Up-Conversion

The present invention is directed to systems and methods of frequency up-conversion, and applications of same.

Figure 3:
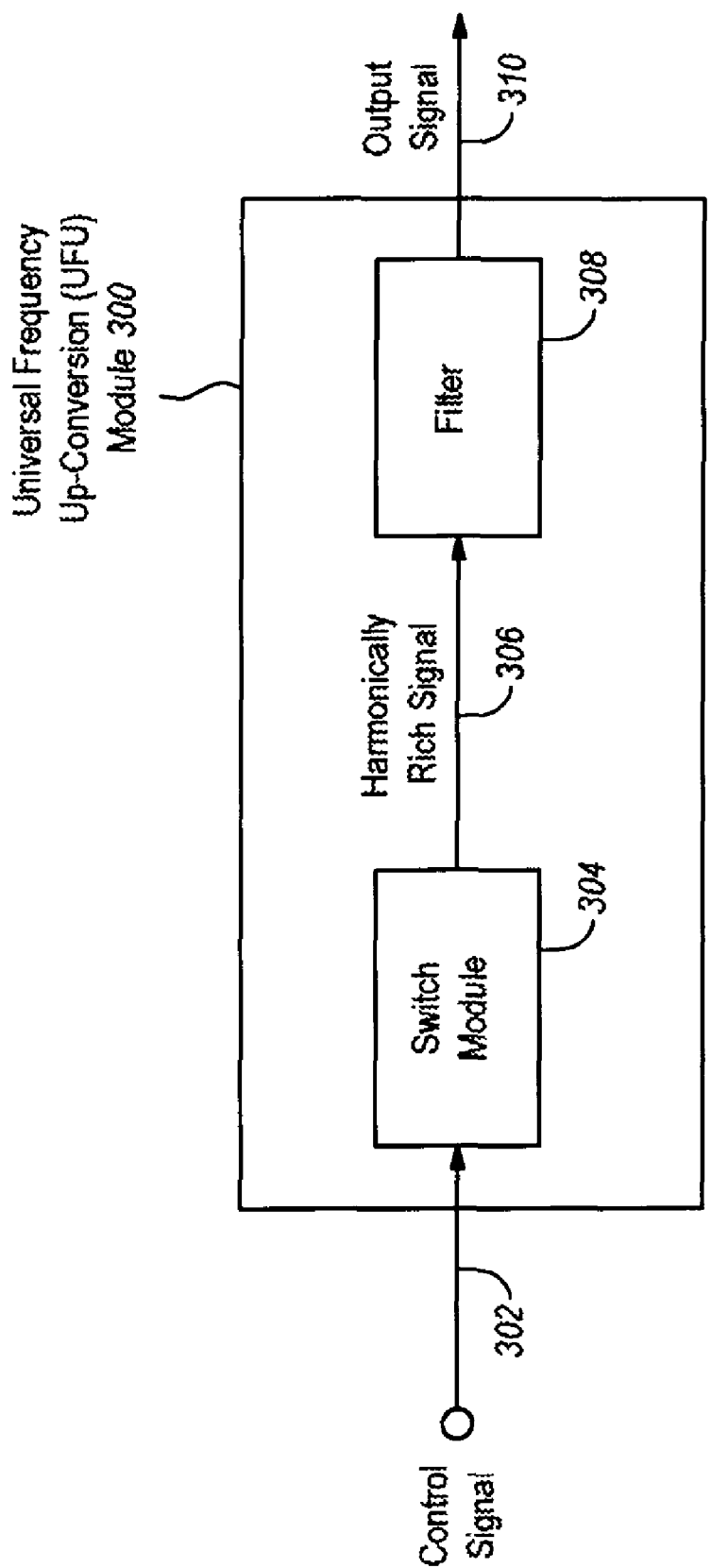
FIG. 3 is a block diagram of a universal frequency up-conversion (UFU) module according to an embodiment of the invention.

An example frequency up-conversion system 300 is illustrated in FIG. 3. The frequency up-conversion system 300 is now described.

An input signal 302 (designated as "Control Signal" in FIG. 3) is accepted by a switch module 304. For purposes of example only, assume that the input signal 302 is a FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. The information signal 602 can be analog, digital, or any combination thereof, and any modulation scheme can be used.

The output of switch module 304 is a harmonically rich signal 306, shown for example in FIG. 6D as a harmonically rich signal 608. The harmonically rich signal 608 has a continuous and periodic waveform.

FIG. 6E is an expanded view of two sections of harmonically rich signal 608, section 610 and section 612. The harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Harmonically rich signal 608 is comprised of a plurality of sinusoidal waves whose frequencies are integer multiples of the fundamental frequency of the waveform of the harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, the input signal 606 may be shaped to ensure that the amplitude of the desired harmonic is sufficient for its intended use (e.g., transmission).

A filter 308 filters out any undesired frequencies (harmonics), and outputs an electromagnetic (EM) signal at the desired harmonic frequency or frequencies as an output signal 310, shown for example as a filtered output signal 614 in FIG. 61.

Figure 4:
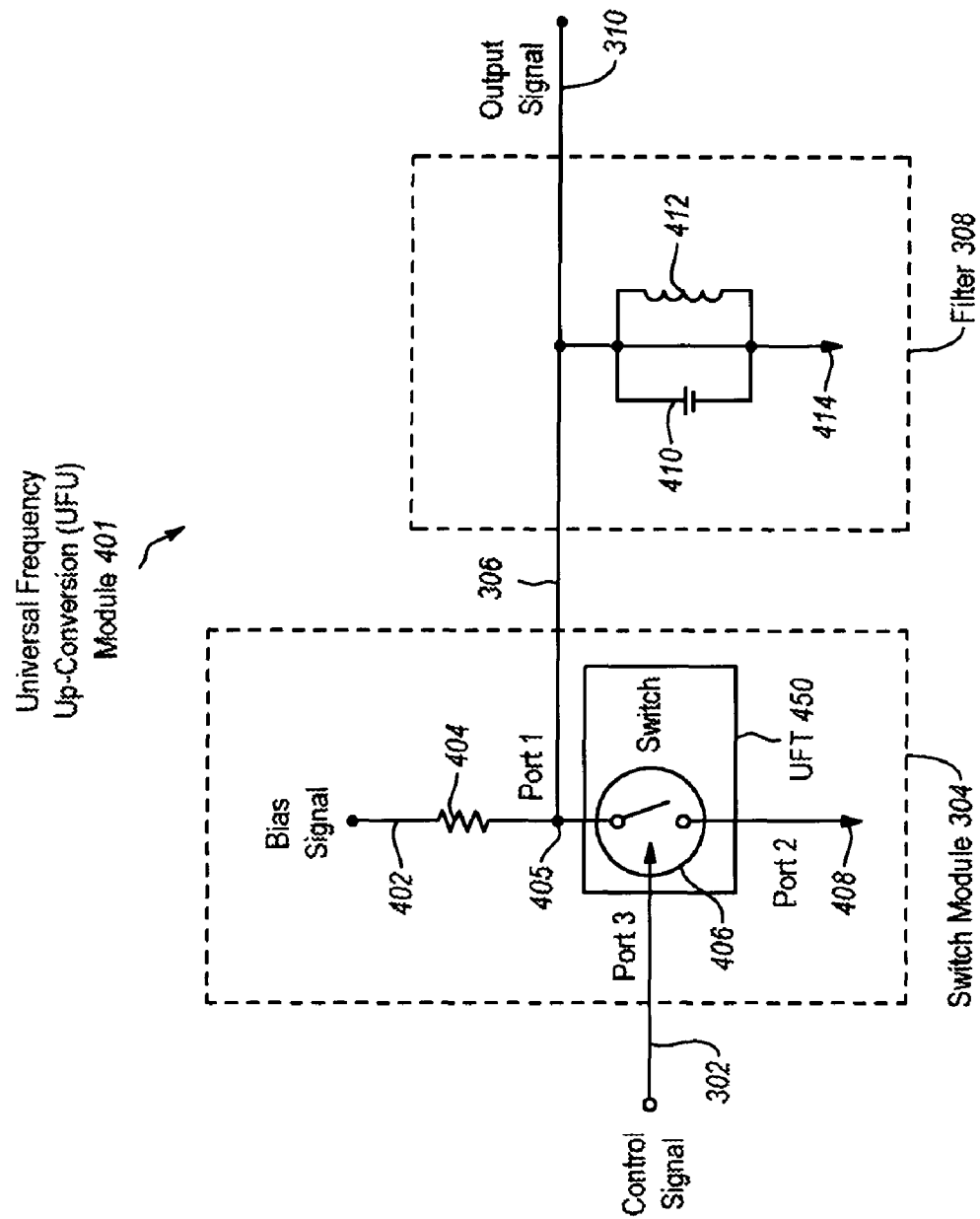
FIG. 4 is a more detailed diagram of a universal frequency up-conversion (UFU) module according to an embodiment of the invention.

FIG. 4 illustrates an example universal frequency up-conversion (UFU) module 401. The UFU module 401 includes an example switch module 304, which comprises a bias signal 402, a resistor or impedance 404, a universal frequency translator (UFT) 450, and a ground 408. The UFT 450 includes a switch 406. The input signal 302 (designated as "Control Signal" in FIG. 4) controls the switch 406 in the UFT 450, and causes it to close and open. Harmonically rich signal 306 is generated at a node 405 located between the resistor or impedance 404 and the switch 406.

Also in FIG. 4, it can be seen that an example filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
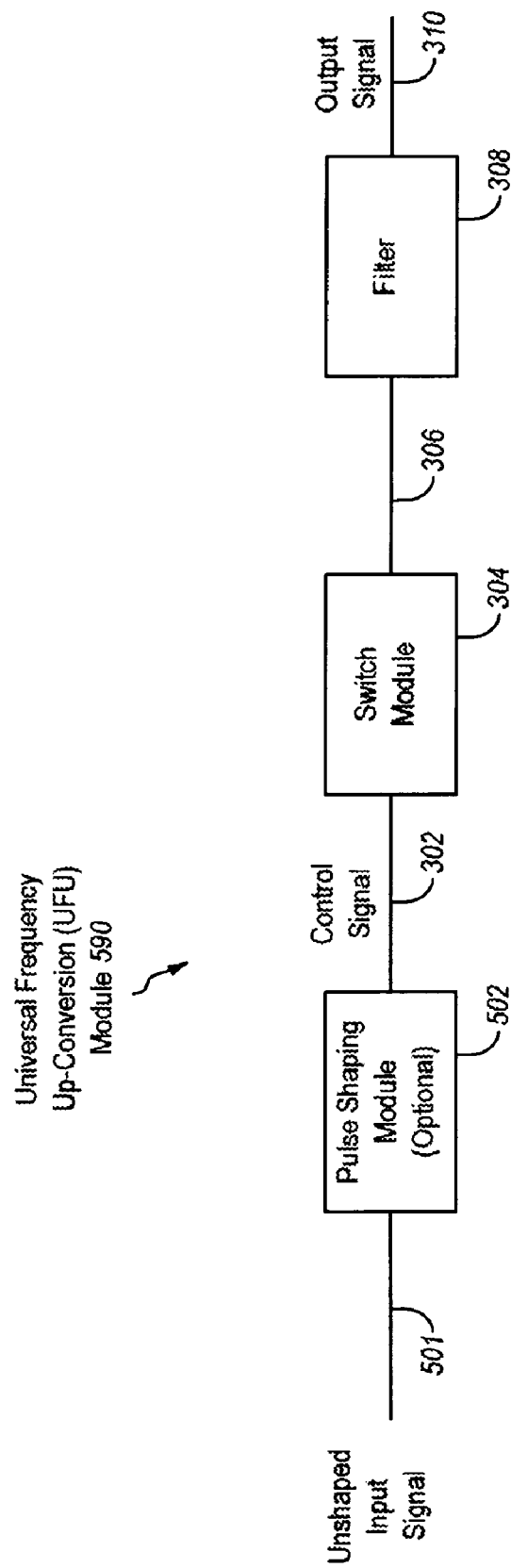
FIG. 5 is a block diagram of a universal frequency up-conversion (UFU) module according to an alternative embodiment of the invention.

For example, in an alternate embodiment shown in FIG. 5, an unshaped input signal 501 is routed to a pulse shaping module 502. The pulse shaping module 502 modifies the unshaped input signal 501 to generate a (modified) input signal 302 (designated as the "Control Signal" in FIG. 5). The input signal 302 is routed to the switch module 304, which operates in the manner described above. Also, the filter 308 of FIG. 5 operates in the manner described above.

The purpose of the pulse shaping module 502 is to define the pulse width of the input signal 302. Recall that the input signal 302 controls the opening and closing of the switch 406 in switch module 304. During such operation, the pulse width of the input signal 302 establishes the pulse width of the harmonically rich signal 306. As stated above, the relative amplitudes of the harmonics of the harmonically rich signal 306 are a function of at least the pulse width of the harmonically rich signal 306. As such, the pulse width of the input signal 302 contributes to setting the relative amplitudes of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

5. Enhanced Signal Reception

The present invention is directed to systems and methods of enhanced signal reception (ESR), and applications of same.

Figure 21:
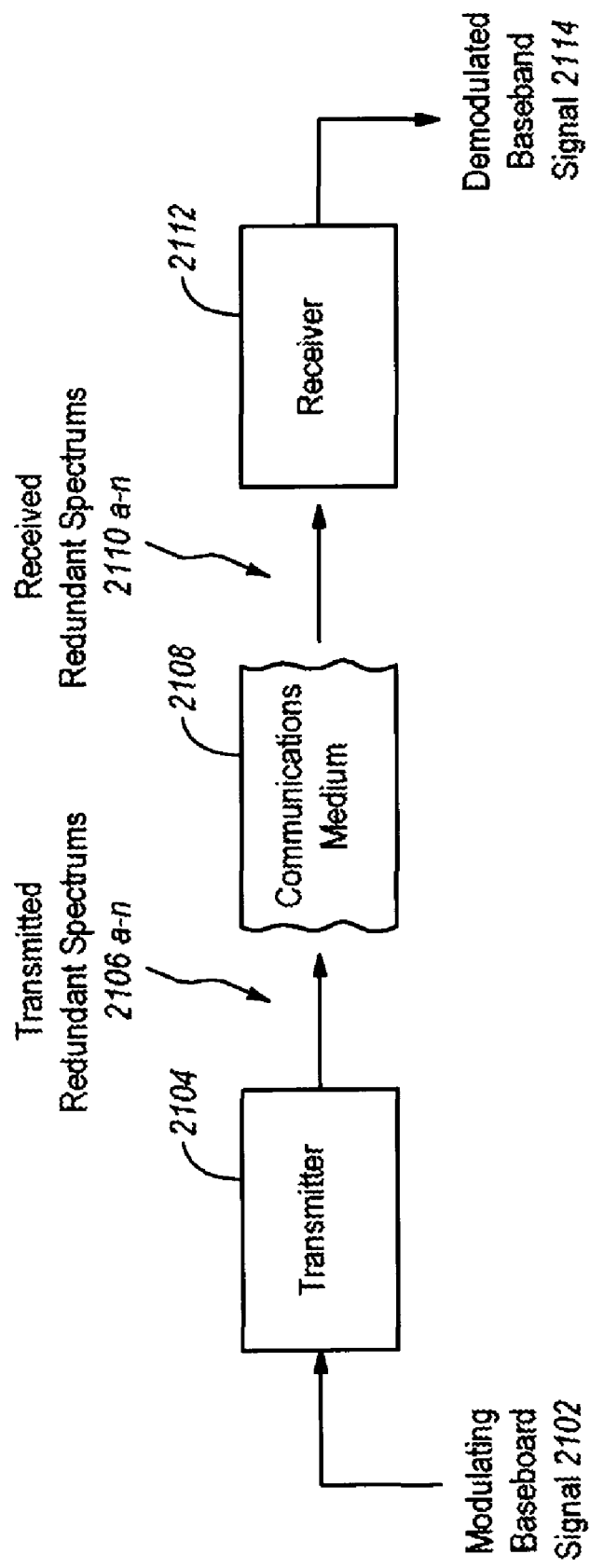
FIG. 21 illustrates an enhanced signal reception system according to an embodiment of the invention.

Referring to FIG. 21, transmitter 2104 accepts a modulating baseband signal 2102 and generates (transmitted) redundant spectrums 2106*a-n*, which are sent over communications medium 2108. Receiver 2112 recovers a demodulated baseband signal 2114 from (received) redundant spectrums 2110*a-n*. Demodulated baseband signal 2114 is representative of the modulating baseband signal 2102, where the level of similarity between the modulating baseband signal 2114 and the modulating baseband signal 2102 is application dependent.

Modulating baseband signal 2102 is preferably any information signal desired for transmission and/or reception. An example modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22*a*, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106a-n contains the necessary information to substantially reconstruct the modulating baseband signal 2102. In other words, each redundant spectrum 2106a-n contains the necessary amplitude, phase, and frequency information to reconstruct the modulating baseband signal 2102.

FIG. 22C illustrates example transmitted redundant spectrums 2206b-d. Transmitted redundant spectrums 2206b-d are illustrated to contain three redundant spectrums for illustration purposes only. Any number of redundant spectrums could be generated and transmitted as will be explained in following discussions.

Transmitted redundant spectrums 2206b-d are centered at $f_1$, with a frequency spacing $f_2$ between adjacent spectrums. Frequencies $f_1$ and $f_2$ are dynamically adjustable in real-time as will be shown below. FIG. 22D illustrates an alternate embodiment, where redundant spectrums 2208c,d are centered on unmodulated oscillating signal 2209 at $f_1$ (Hz). Oscillating signal 2209 may be suppressed if desired using, for example, phasing techniques or filtering techniques. Transmitted redundant spectrums are preferably above baseband frequencies as is represented by break 2205 in the frequency axis of FIGS. 22C and 22D.

Received redundant spectrums 2110a-n are substantially similar to transmitted redundant spectrums 2106a-n, except for the changes introduced by the communications medium 2108. Such changes can include but are not limited to signal attenuation, and signal interference. FIG. 22E illustrates example received redundant spectrums 2210b-d. Received redundant spectrums 2210b-d are substantially similar to transmitted redundant spectrums 2206b-d, except that redundant spectrum 2210c includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

As stated above, demodulated baseband signal 2114 is extracted from one or more of received redundant spectrums 2210b-d. FIG. 22F illustrates example demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

Figure 23A:
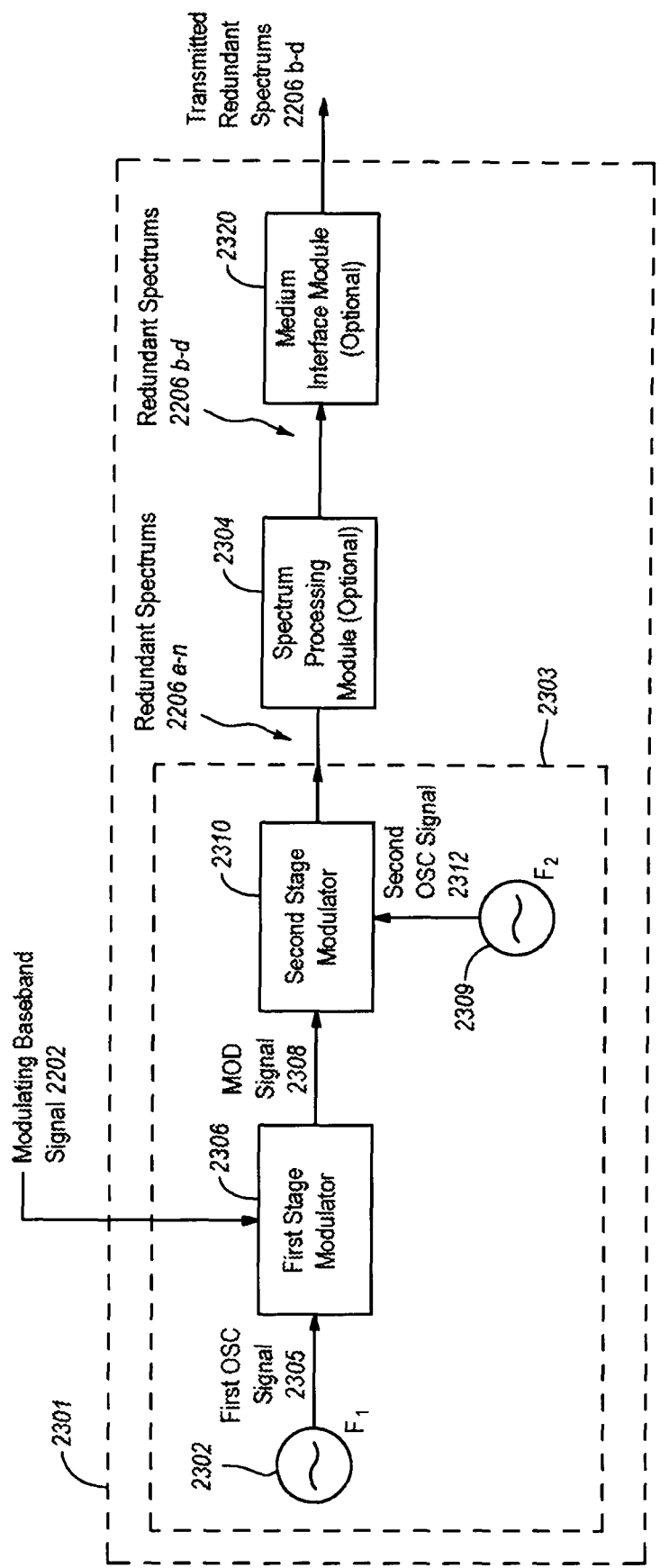
FIG. 23A illustrates an example transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectrums configured similar to redundant spectrums 2206b-d. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectrums 2206a-n shown in FIG. 23B. Second stage modulator 2310 is preferably a phase modulator, or a frequency modulator, although other types of modulation may be implemented including but not limited to amplitude modulation. Each redundant spectrum 2206a-n contains the necessary amplitude, phase, and frequency information to substantially reconstruct the modulating baseband signal 2202.

Redundant spectrums 2206a-n are substantially centered around $f_1$, which is the characteristic frequency of first oscillating signal 2305. Also, each redundant spectrum 2206a-n (except for 2206c) is offset from $f_1$ by approximately a multiple of $f_2$ (Hz), where $f_2$ is the frequency of the second oscillating signal 2312. Thus, each redundant spectrum 2206a-n is offset from an adjacent redundant spectrum by $f_2$ (Hz). This allows the spacing between adjacent redundant spectrums to be adjusted (or tuned) by changing $f_2$ that is associated with second oscillator 2309. Adjusting the spacing between adjacent redundant spectrums allows for dynamic real-time tuning of the bandwidth occupied by redundant spectrums 2206a-n.

In one embodiment, the number of redundant spectrums 2206a-n generated by transmitter 2301 is arbitrary and may be unlimited as indicated by the "a-n" designation for redundant spectrums 2206a-n. However, a typical communications medium will have a physical and/or administrative limitations (i.e. FCC regulations) that restrict the number of redundant spectrums that can be practically transmitted over the communications medium. Also, there may be other reasons to limit the number of redundant spectrums transmitted. Therefore, preferably, the transmitter 2301 will include an optional spectrum processing module 2304 to process the redundant spectrums 2206a-n prior to transmission over communications medium 2108.

In one embodiment, spectrum processing module 2304 includes a filter with a passband 2207 (FIG. 23C) to select redundant spectrums 2206b-d for transmission. This will substantially limit the frequency bandwidth occupied by the redundant spectrums to the passband 2207. In one embodiment, spectrum processing module 2304 also up converts redundant spectrums and/or amplifies redundant spectrums prior to transmission over the communications medium 2108. Finally, medium interface module 2320 transmits redundant spectrums over the communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
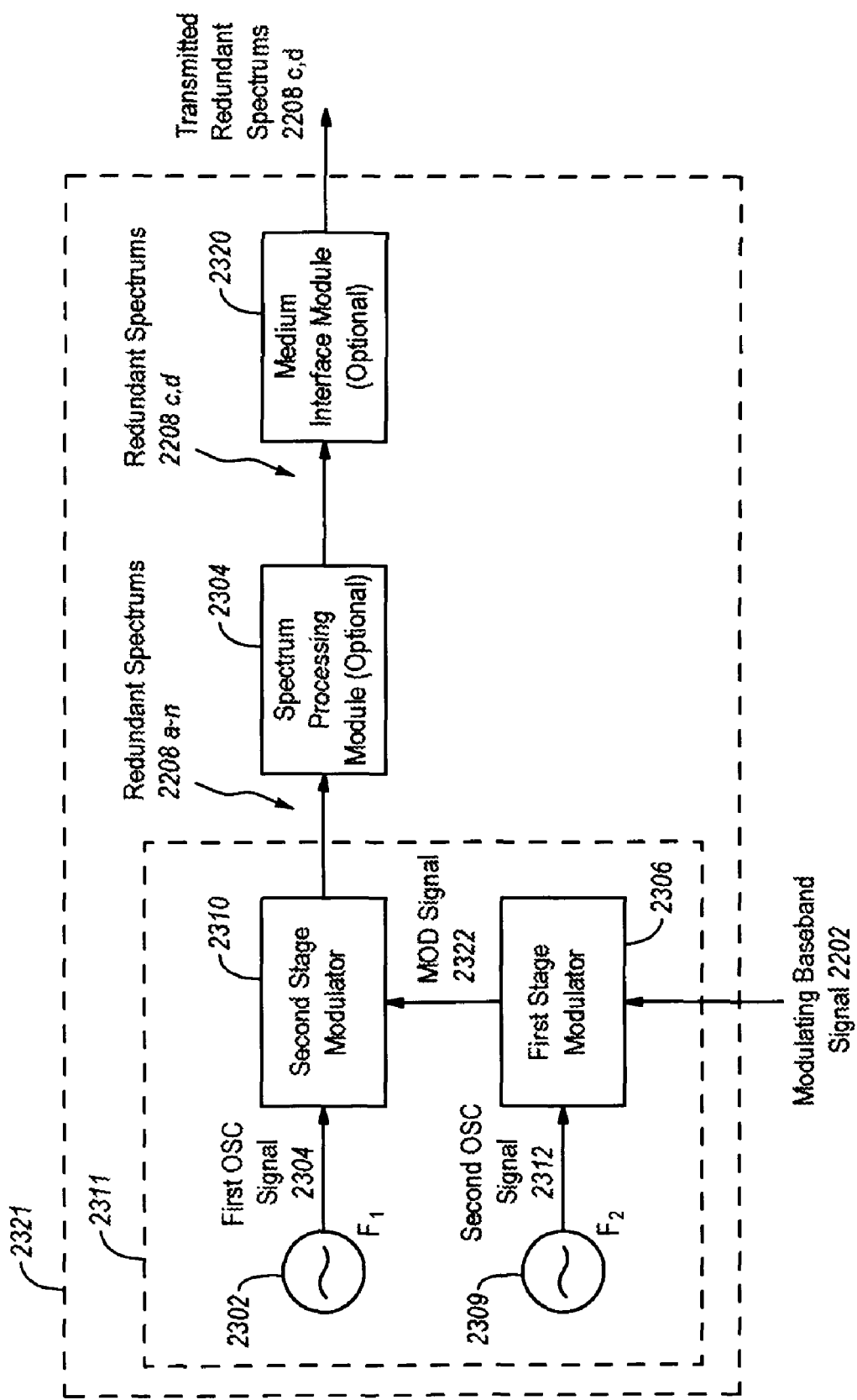
FIG. 23D illustrates another example transmitter in an enhanced signal reception system according to an embodiment of the invention.

FIG. 23D illustrates transmitter 2321, which is one embodiment of transmitter 2104 that generates redundant spectrums configured similar to redundant spectrums 2208c-d and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectrums 2208a-n, as shown in FIG. 23E. Second stage modulator 2310 is preferably a phase or frequency modulator, although other modulators could used including but not limited to an amplitude modulator.

Redundant spectrums 2208a-n are centered on unmodulated spectrum 2209 (at $f_1$ Hz), and adjacent spectrums are separated by $f_2$ Hz. The number of redundant spectrums 2208a-n generated by generator 2311 is arbitrary and unlimited, similar to spectrums 2206a-n discussed above. Therefore, optional spectrum processing module 2304 may also include a filter with passband 2325 to select, for example, spectrums 2208c,d for transmission over communications medium 2108. In addition, optional spectrum processing module 2304 may also include a filter (such as a bandstop filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectrums 2208c,d over communications medium 2108.

Figure 24A:
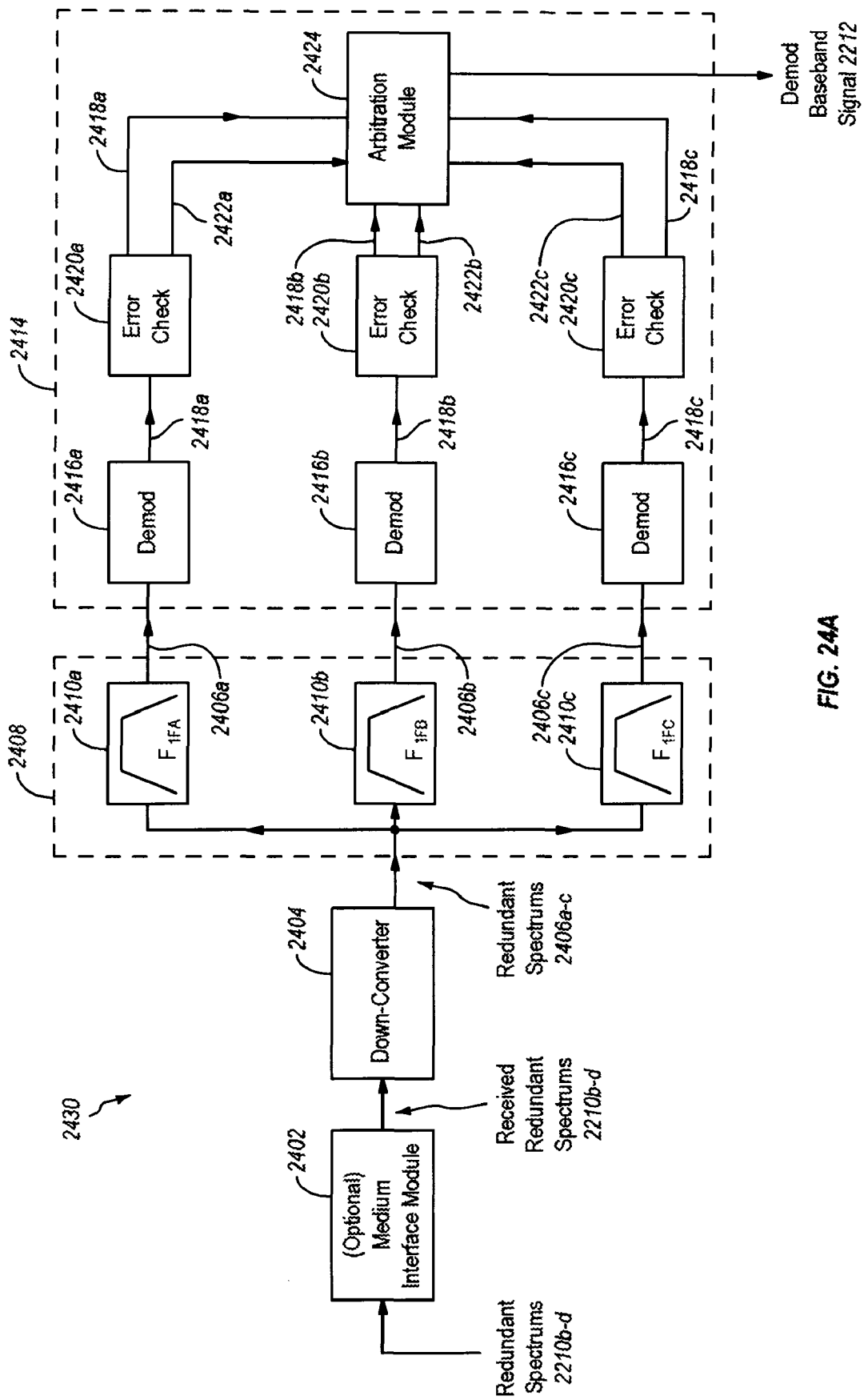
FIG. 24A illustrates an example receiver in an enhanced signal reception system according to an embodiment of the invention.

Receiver 2112 will now be explored in greater detail to illustrate recovery of a demodulated baseband signal from received redundant spectrums. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410a-c. Data extraction module 2414 includes demodulators 2416a-c, error check modules 2420a-c, and arbitration module 2424. Receiver 2430 will be discussed in relation to the signal diagrams in FIGS. 24B-24J.

In one embodiment, optional medium interface module 2402 receives redundant spectrums 2210b-d (FIG. 22E, and FIG. 24B). Each redundant spectrum 2210b-d includes the necessary amplitude, phase, and frequency information to substantially reconstruct the modulating baseband signal used to generated the redundant spectrums. However, in the present example, spectrum 2210c also contains jamming signal 2211, which may interfere with the recovery of a baseband signal from spectrum 2210c. Down-converter 2404 down-converts received redundant spectrums 2210b-d to lower intermediate frequencies, resulting in redundant spectrums 2406a-c (FIG. 24C). Jamming signal 2211 is also down-converted to jamming signal 2407, as it is contained within redundant spectrum 2406b. Spectrum isolation module 2408 includes filters 2410a-c that isolate redundant spectrums 2406a-c from each other (FIGS. 24D-24F, respectively). Demodulators 2416a-c independently demodulate spectrums 2406a-c, resulting in demodulated baseband signals 2418a-c, respectively (FIGS. 24G-24I). Error check modules 2420a-c analyze demodulate baseband signal 2418a-c to detect any errors. In one embodiment, each error check module 2420a-c sets an error flag 2422a-c whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectrums, where the degree of similarity is application dependent.

Referring to FIGS. 24G-I, arbitration module 2424 will select either demodulated baseband signal 2418a or 2418c, because error check module 2420b will set the error flag 2422b that is associated with demodulated baseband signal 2418b.

The error detection schemes implemented by the error detection modules include but are not limited to: cyclic redundancy check (CRC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, incorporated herein by reference in its entirety.

6. Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
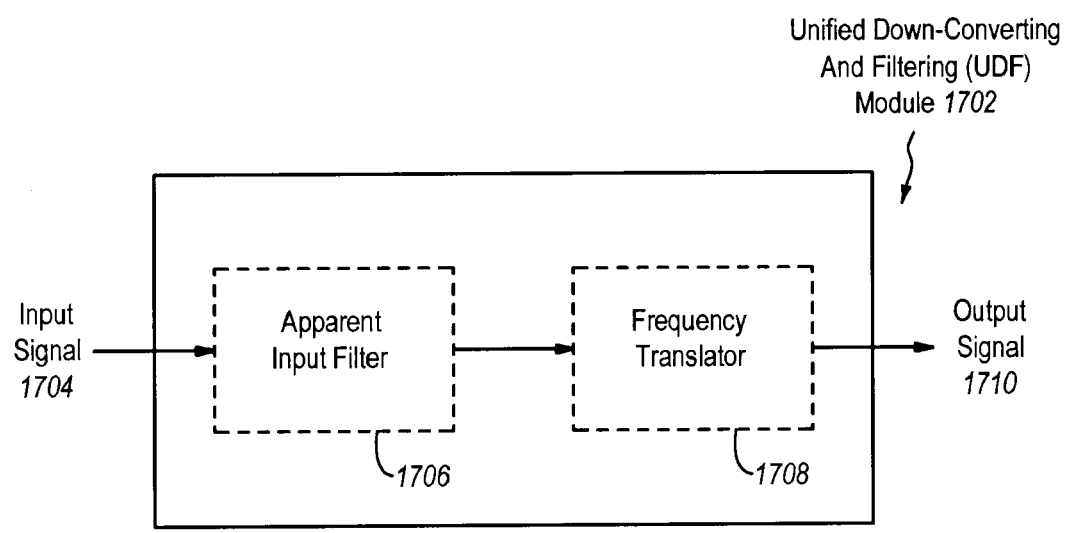
FIG. 17 illustrates a unified down-converting and filtering (UDF) module according to an embodiment of the invention.

FIG. 17 is a conceptual block diagram of a UDF module 1702 according to an embodiment of the present invention. The UDF module 1702 performs at least frequency translation and frequency selectivity.

The effect achieved by the UDF module 1702 is to perform the frequency selectivity operation prior to the performance of the frequency translation operation. Thus, the UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by the UDF module 1702 are at radio frequencies. The UDF module 1702 effectively operates to input filter these RF input signals 1704. Specifically, in these embodiments, the UDF module 1702 effectively performs input, channel select filtering of the RF input signal 1704. Accordingly, the invention achieves high selectivity at high frequencies.

The UDF module 1702 effectively performs various types of filtering, including but not limited to bandpass filtering, low pass filtering, high pass filtering, notch filtering, all pass filtering, band stop filtering, etc., and combinations thereof.

Conceptually, the UDF module 1702 includes a frequency translator 1708. The frequency translator 1708 conceptually represents that portion of the UDF module 1702 that performs frequency translation (down conversion).

The UDF module 1702 also conceptually includes an apparent input filter 1706 (also sometimes called an input filtering emulator). Conceptually, the apparent input filter 1706 represents that portion of the UDF module 1702 that performs input filtering.

In practice, the input filtering operation performed by the UDF module 1702 is integrated with the frequency translation operation. The input filtering operation can be viewed as being performed concurrently with the frequency translation operation. This is a reason why the input filter 1706 is herein referred to as an "apparent" input filter 1706.

The UDF module 1702 of the present invention includes a number of advantages. For example, high selectivity at high frequencies is realizable using the UDF module 1702. This feature of the invention is evident by the high Q factors that are attainable. For example, and without limitation, the UDF module 1702 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1702 can be electrically adjusted, either statically or dynamically.

Also, the UDF module 1702 can be designed to amplify input signals.

Further, the UDF module 1702 can be implemented without large resistors, capacitors, or inductors. Also, the UDF module 1702 does not require that tight tolerances be maintained on the values of its individual components, i.e., its resistors, capacitors, inductors, etc. As a result, the architecture of the UDF module 1702 is friendly to integrated circuit design techniques and processes.

The features and advantages exhibited by the UDF module 1702 are achieved at least in part by adopting a new technological paradigm with respect to frequency selectivity and translation. Specifically, according to the present invention, the UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
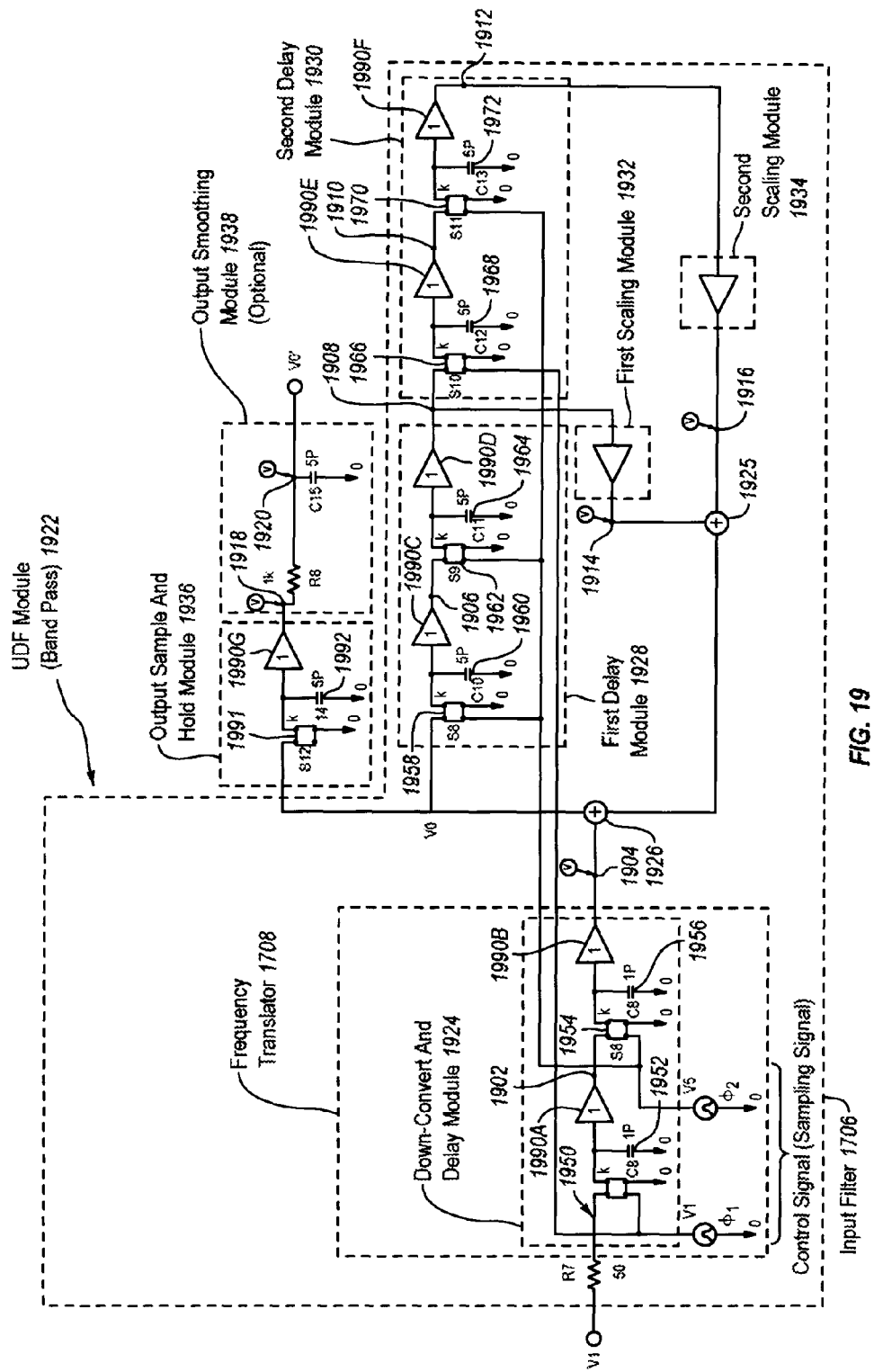
FIG. 19 is a detailed diagram of an example UDF module according to an embodiment of the invention.

FIG. 19 illustrates an example implementation of the unified down-converting and filtering (UDF) module 1922. The UDF module 1922 performs the frequency translation operation and the frequency selectivity operation in an integrated, unified manner as described above, and as further described below.

In the example of FIG. 19, the frequency selectivity operation performed by the UDF module 1922 comprises a band-pass filtering operation according to EQ. 1, below, which is an example representation of a band-pass filtering transfer function.

$$VO = \alpha_1 z^{-1} VI - \beta_1 z^{-1} VO - \beta_0 z^{-2} VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

The UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, the output smoothing module 1938 is optional.

As further described below, in the example of FIG. 19, the down-convert and delay module 1924 and the first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of the down-convert and delay module 1924 is not scaled. As evident from the embodiments described above, however, the invention is not limited to this example.

The example UDF module 1922 has a filter center frequency of 900.2 MHZ and a filter bandwidth of 570 KHz. The pass band of the UDF module 1922 is on the order of 899.915 MHZ to 900.485 MHZ. The Q factor of the UDF module 1922 is approximately 1879 (i.e., 900.2 MHZ divided by 570 KHz).

Figure 18:
FIG. 18 is a table of example values at nodes in the UDF module of FIG. 17.

The operation of the UDF module 1922 shall now be described with reference to a Table 1802 (FIG. 18) that indicates example values at nodes in the UDF module 1922 at a number of consecutive time increments. It is assumed in Table 1802 that the UDF module 1922 begins operating at time t−1. As indicated below, the UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in the down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of the switch 1950 and the capacitor 1952 in the down-convert and delay module 1924 operates to translate the frequency of the input signal VI to a desired lower frequency, such as IF or baseband. Thus, the value stored in the capacitor 1952 represents an instance of a down-converted image of the input signal VI.

The manner in which the down-convert and delay module 1924 performs frequency down-conversion is further described elsewhere in this application, and is additionally described in pending U.S. application "Method and System for Down-Converting Electromagnetic Signals," Ser. No. 09/176,022, filed Oct. 21, 1998, issued as U.S. Pat. No. 6,061, 551, which is herein incorporated by reference in its entirety.

Also at the rising edge of $\phi_1$ at time t−1, a switch 1958 in the first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$, is undefined at this point. However, for ease of understanding, $VO_{t-1}$, shall continue to be used for purposes of explanation.)

Also at the rising edge of $\phi_1$ at time t−1, a switch 1966 in the second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_2$ at time t−1, a switch 1954 in the down-convert and delay module 1924 closes, allowing a capacitor 1956 to charge to the level of the capacitor 1952. Accordingly, the capacitor 1956 charges to $VI_{t-1}$, such that node 1904 is at $VI_{t-1}$. This is indicated by cell 1810 in Table 1802.

The UDF module 1922 may optionally include a unity gain module 1990A between capacitors 1952 and 1956. The unity gain module 1990A operates as a current source to enable capacitor 1956 to charge without draining the charge from capacitor 1952. For a similar reason, the UDF module 1922 may include other unity gain modules 1990B-1990G. It should be understood that, for many embodiments and applications of the invention, these unity gain modules 1990A-1990G are optional. The structure and operation of the unity gain modules 1990 will be apparent to persons skilled in the relevant art(s).

Also at the rising edge of $\phi_2$ at time t−1, a switch 1962 in the first delay module 1928 closes, allowing a capacitor 1964 to charge to the level of the capacitor 1960. Accordingly, the capacitor 1964 charges to $VO_{t-1}$, such that node 1908 is at $VO_{t-1}$. This is indicated by cell 1814 in Table 1802.

Also at the rising edge of $\phi_2$ at time t−1, a switch 1970 in the second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, the switch 1950 in the down-convert and delay module 1924 closes. This allows the capacitor 1952 to charge to $VI_t$, such that node 1902 is at $VI_t$. This is indicated in cell 1816 of Table 1802.

Also at the rising edge of $\phi_1$ at time t, the switch 1958 in the first delay module 1928 closes, thereby allowing the capacitor 1960 to charge to $VO_t$. Accordingly, node 1906 is at $VO_t$. This is indicated in cell 1820 in Table 1802.

Further at the rising edge of $\phi_1$ at time t, the switch 1966 in the second delay module 1930 closes, allowing a capacitor 1968 to charge to the level of the capacitor 1964. Therefore, the capacitor 1968 charges to $VO_{t-1}$, such that node 1910 is at $VO_{t-1}$. This is indicated by cell 1824 in Table 1802.

At the rising edge of $\phi_2$ at time t, the switch 1954 in the down-convert and delay module 1924 closes, allowing the capacitor 1956 to charge to the level of the capacitor 1952. Accordingly, the capacitor 1956 charges to $VI_t$, such that node 1904 is at $VI_t$. This is indicated by cell 1828 in Table 1802.

Also at the rising edge of $\phi_2$ at time t, the switch 1962 in the first delay module 1928 closes, allowing the capacitor 1964 to charge to the level in the capacitor 1960. Therefore, the capacitor 1964 charges to $VO_t$, such that node 1908 is at $VO_t$. This is indicated by cell 1832 in Table 1802.

Further at the rising edge of $\phi_2$ at time t, the switch 1970 in the second delay module 1930 closes, allowing the capacitor 1972 in the second delay module 1930 to charge to the level of the capacitor 1968 in the second delay module 1930. Therefore, the capacitor 1972 charges to $VO_{t-1}$, such that node 1912 is at $VO_{t-1}$. This is indicated in cell 1836 of FIG. 18.

At time t+1, at the rising edge of $\phi_1$, the switch 1950 in the down-convert and delay module 1924 closes, allowing the capacitor 1952 to charge to $VI_{t+1}$. Therefore, node 1902 is at $VI_{t+1}$, as indicated by cell 1838 of Table 1802.

Also at the rising edge of $\phi_1$ at time t+1, the switch 1958 in the first delay module 1928 closes, allowing the capacitor 1960 to charge to $VO_{t+1}$. Accordingly, node 1906 is at $VO_{t+1}$, as indicated by cell 1842 in Table 1802.

Further at the rising edge of $\phi_1$ at time t+1, the switch 1966 in the second delay module 1930 closes, allowing the capacitor 1968 to charge to the level of the capacitor 1964. Accordingly, the capacitor 1968 charges to $VO_t$, as indicated by cell 1846 of Table 1802.

In the example of FIG. 19, the first scaling module 1932 scales the value at node 1908 (i.e., the output of the first delay module 1928) by a scaling factor of −0.1. Accordingly, the value present at node 1914 at time t+1 is $-0.1*VO_t$. Similarly, the second scaling module 1934 scales the value present at node 1912 (i.e., the output of the second scaling module 1930) by a scaling factor of −0.8. Accordingly, the value present at node 1916 is $-0.8*VO_{t-1}$ at time t+1.

At time t+1, the values at the inputs of the summer 1926 are: $VI_t$ at node 1904, $-0.1*VO_t$ at node 1914, and $-0.8*VO_{t-1}$ at node 1916 (in the example of FIG. 19, the values at nodes 1914 and 1916 are summed by a second summer 1925, and this sum is presented to the summer 1926). Accordingly, at time t+1, the summer generates a signal equal to $VI_t - 0.1*VO_t - 0.8*VO_{t-1}$.

At the rising edge of $\phi_1$ at time t+1, a switch 1991 in the output sample and hold module 1936 closes, thereby allowing a capacitor 1992 to charge to $VO_{t+1}$. Accordingly, the capacitor 1992 charges to $VO_{t+1}$, which is equal to the sum generated by the adder 1926. As just noted, this value is equal to: $VI_t - 0.1*VO_t - 0.8*VO_{t-1}$. This is indicated in cell 1850 of Table 1802. This value is presented to the optional output smoothing module 1938, which smoothes the signal to thereby generate the instance of the output signal $VO_{t+1}$. It is apparent from inspection that this value of $VO_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, incorporated herein by reference in its entirety.

7. Example Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Example applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these example applications. Additional applications of the UFT module will be apparent to persons skilled in the relevant art(s), based on the teachings contained herein.

Figure 7:
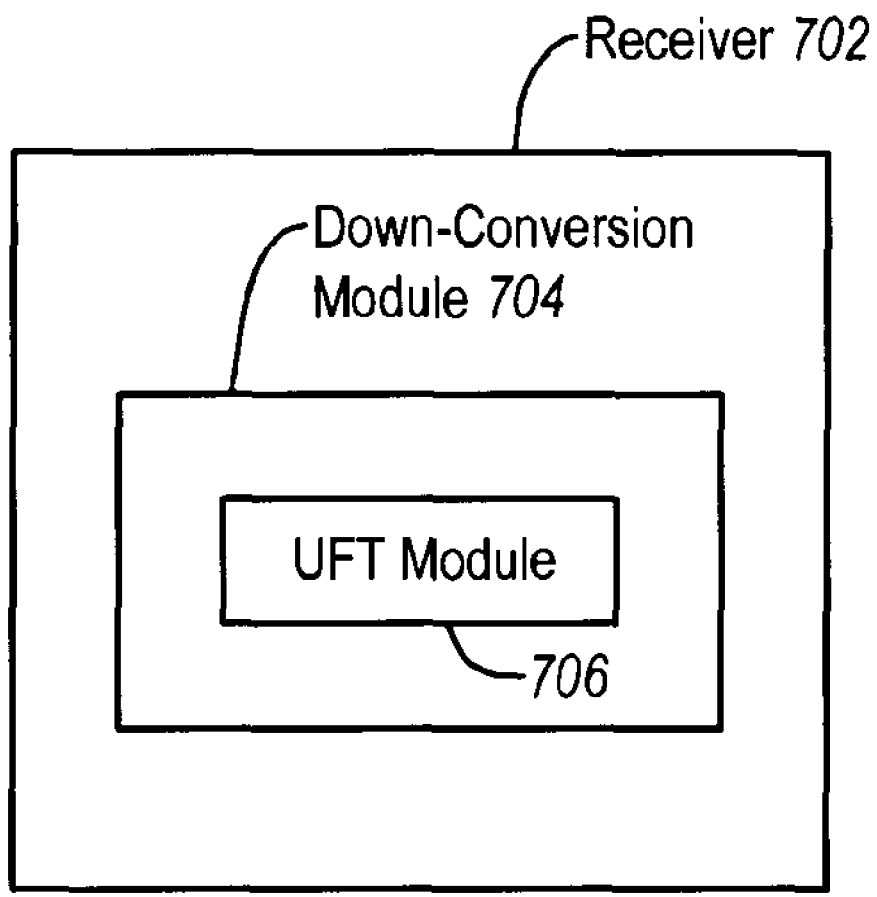
FIG. 7 illustrates a UFT module used in a receiver according to an embodiment of the invention.

For example, the present invention can be used in applications that involve frequency down-conversion. This is shown in FIG. 1C, for example, where an example UFT module 115 is used in a down-conversion module 114. In this capacity, the UFT module 115 frequency down-converts an input signal to an output signal. This is also shown in FIG. 7, for example, where an example UFT module 706 is part of a down-conversion module 704, which is part of a receiver 702.

Figure 8:
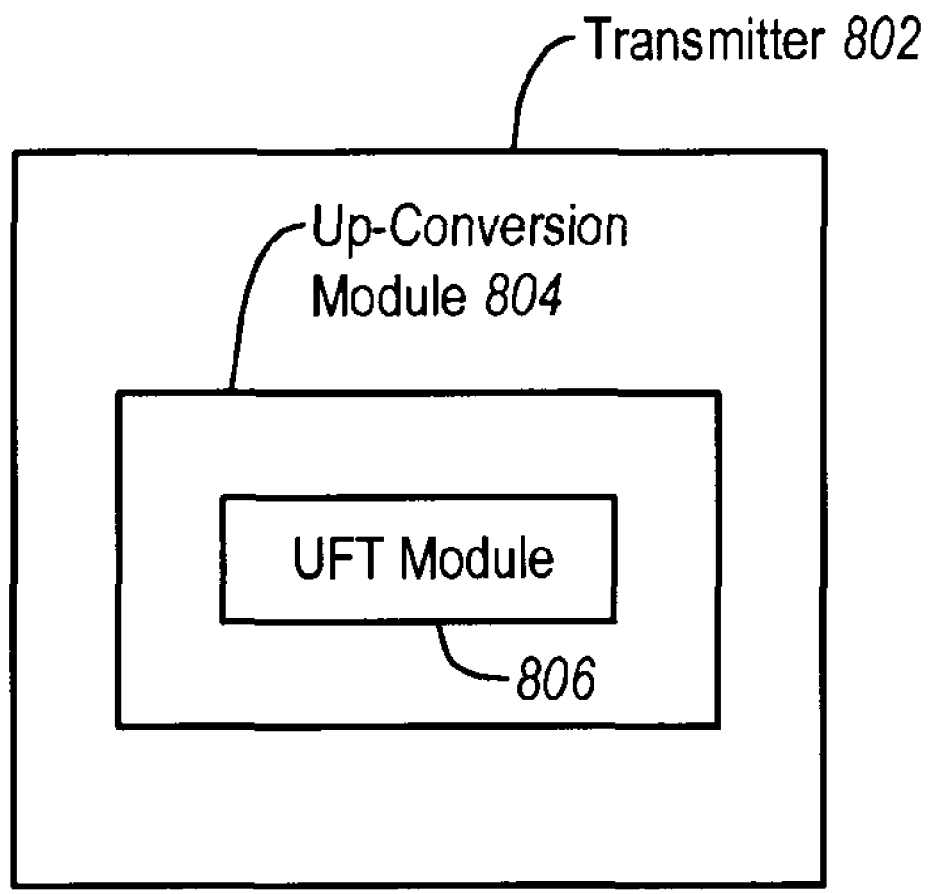
FIG. 8 illustrates a UFT module used in a transmitter according to an embodiment of the invention.

The present invention can be used in applications that involve frequency up-conversion. This is shown in FIG. 1D, for example, where an example UFT module 117 is used in a frequency up-conversion module 116. In this capacity, the UFT module 117 frequency up-converts an input signal to an output signal. This is also shown in FIG. 8, for example, where an example UFT module 806 is part of up-conversion module 804, which is part of a transmitter 802.

Figure 9:
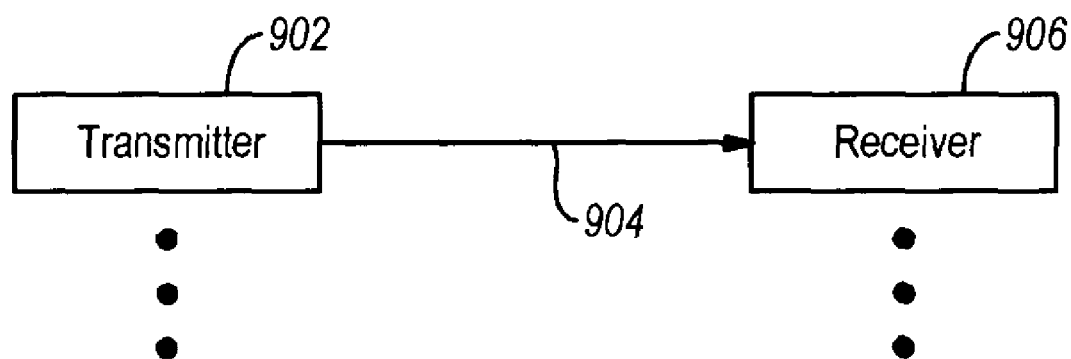
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more of the transmitters 902 may be implemented using a UFT module, as shown for example in FIG. 8. Also, one or more of the receivers 906 may be implemented using a UFT module, as shown for example in FIG. 7.

Figure 10:
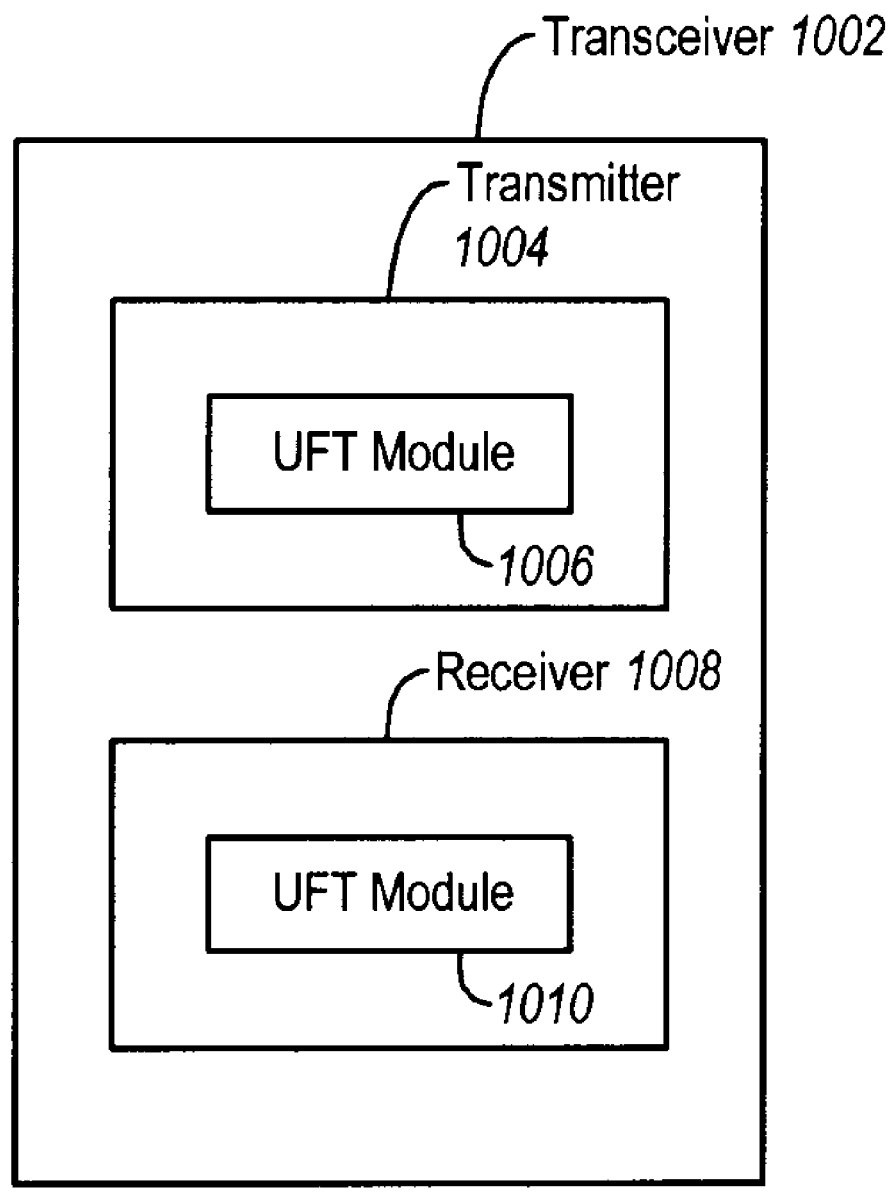
FIG. 10 illustrates a transceiver according to an embodiment of the invention.

The invention can be used to implement a transceiver. An example transceiver 1002 is illustrated in FIG. 10. The transceiver 1002 includes a transmitter 1004 and a receiver 1008. Either the transmitter 1004 or the receiver 1008 can be implemented using a UFT module. Alternatively, the transmitter 1004 can be implemented using a UFT module 1006, and the receiver 1008 can be implemented using a UFT module 1010. This embodiment is shown in FIG. 10.

Figure 11:
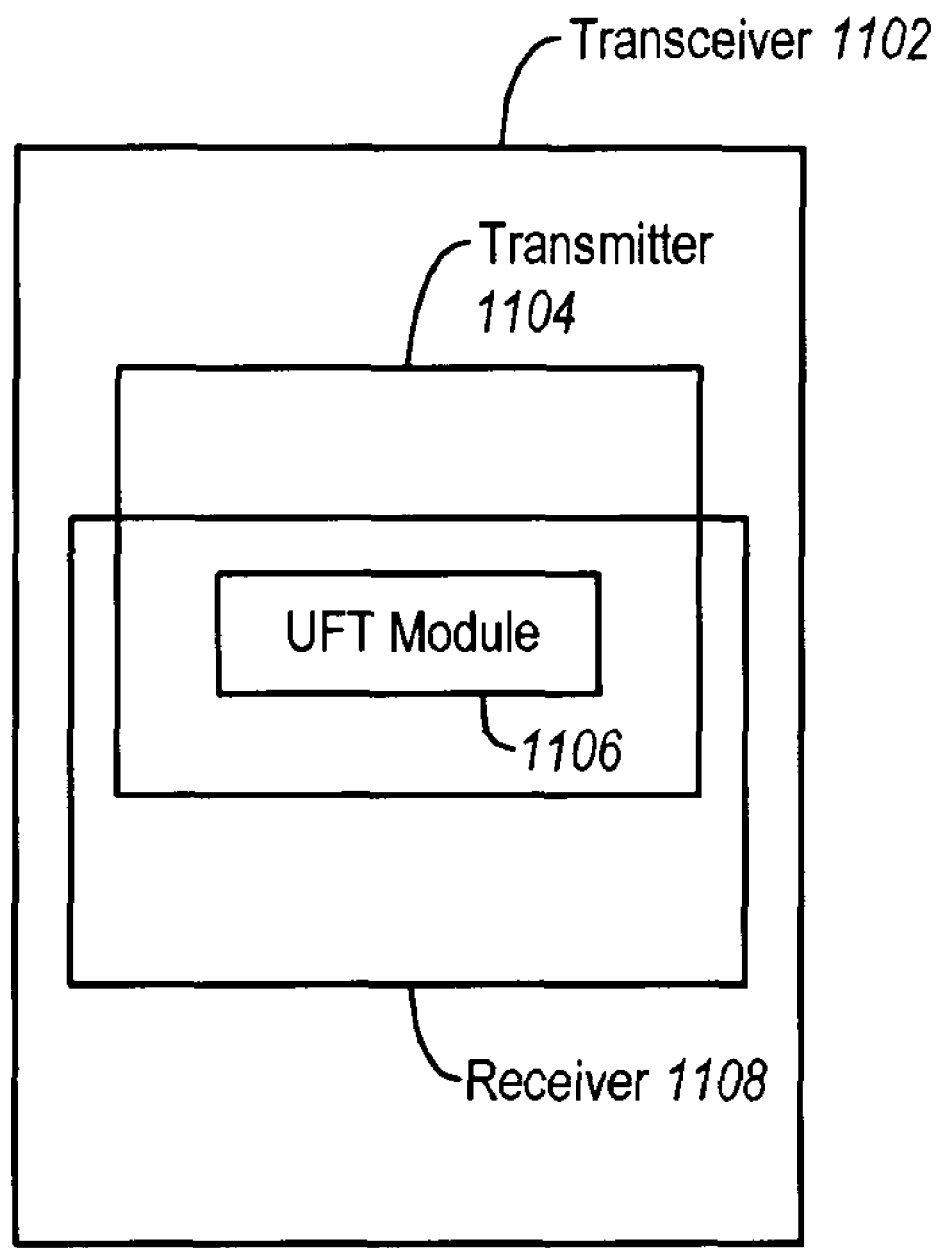
FIG. 11 illustrates a transceiver according to an alternative embodiment of the invention.

Another transceiver embodiment according to the invention is shown in FIG. 11. In this transceiver 1102, the transmitter 1104 and the receiver 1108 are implemented using a single UFT module 1106. In other words, the transmitter 1104 and the receiver 1108 share a UFT module 1106.

Figure 12:
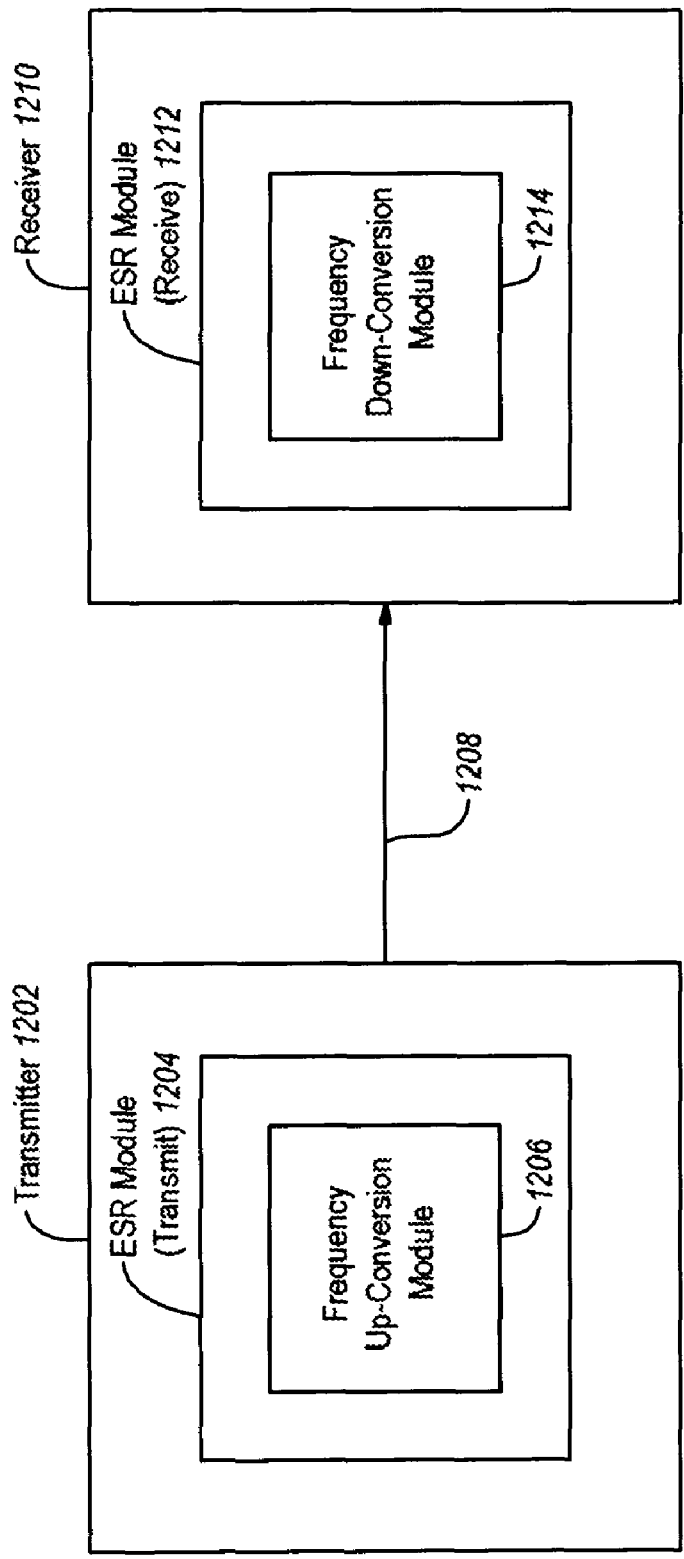
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) in a transmitter 1202, and an ESR module (receive) in a receiver 1210. An example ESR embodiment configured in this manner is illustrated in FIG. 12.

The ESR module (transmit) 1204 includes a frequency up-conversion module 1206. Some embodiments of this frequency up-conversion module 1206 may be implemented using a UFT module, such as that shown in FIG. 1D.

The ESR module (receive) 1212 includes a frequency down-conversion module 1214. Some embodiments of this frequency down-conversion module 1214 may be implemented using a UFT module, such as that shown in FIG. 1C.

Figure 13:
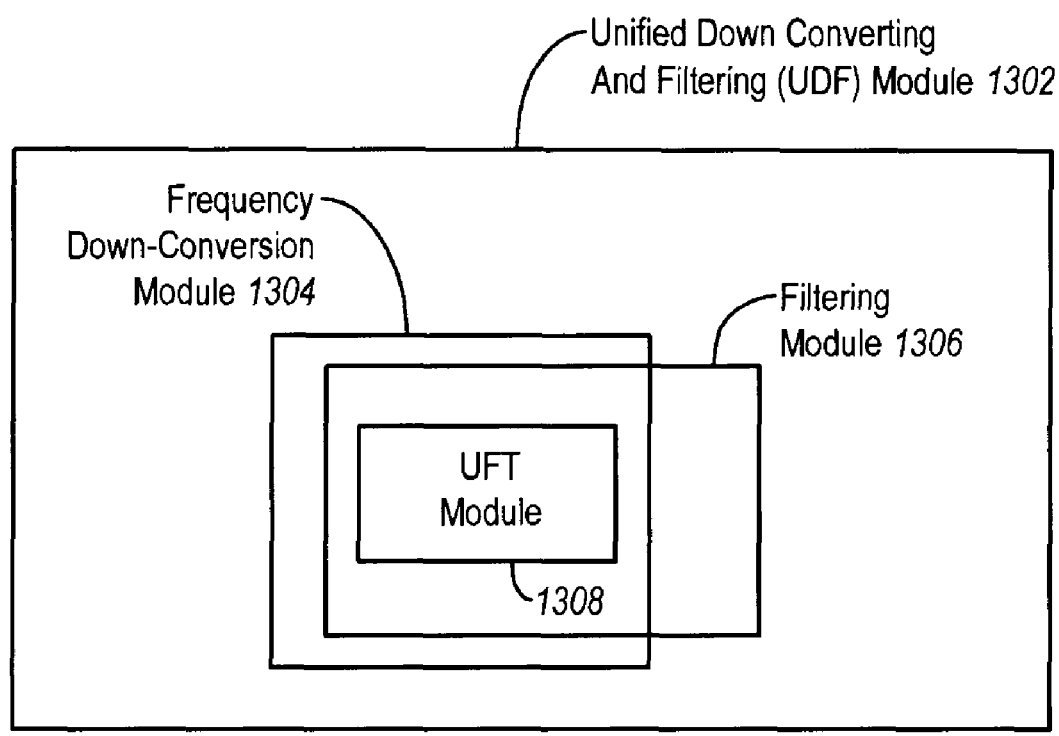
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An example unified down-conversion and filtering module 1302 is illustrated in FIG. 13. The unified down-conversion and filtering module 1302 includes a frequency down-conversion module 1304 and a filtering module 1306. According to the invention, the frequency down-conversion module 1304 and the filtering module 1306 are implemented using a UFT module 1308, as indicated in FIG. 13.

Figure 15A:
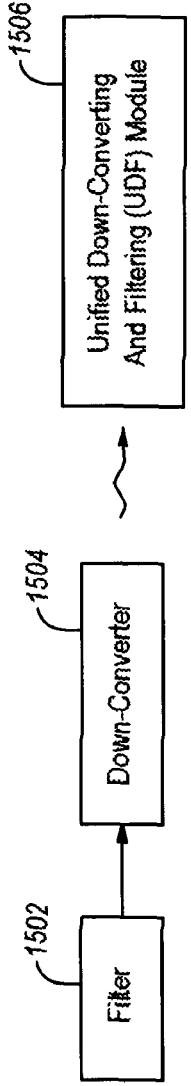
FIGS. 15A-15F illustrate example applications of the UDF module according to embodiments of the invention.
Figure 15B:
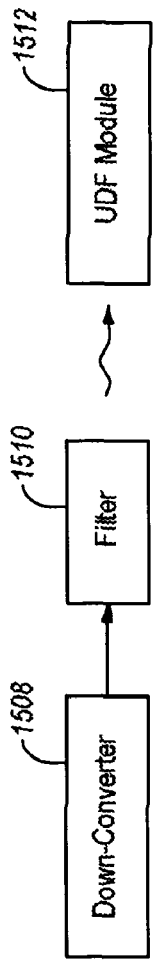
Figure 15C:
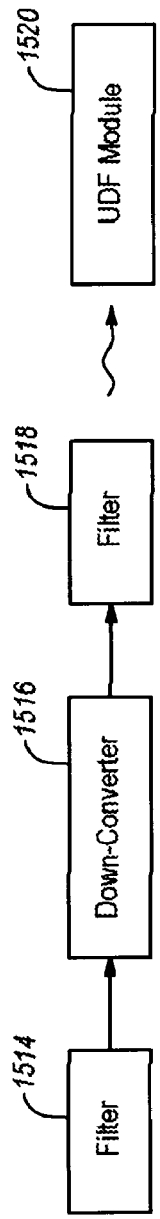
Figure 15D:
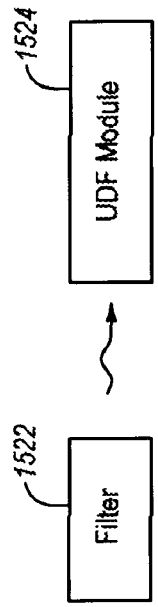
Figure 15E:
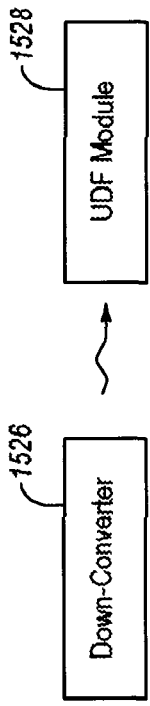
Figure 15F:
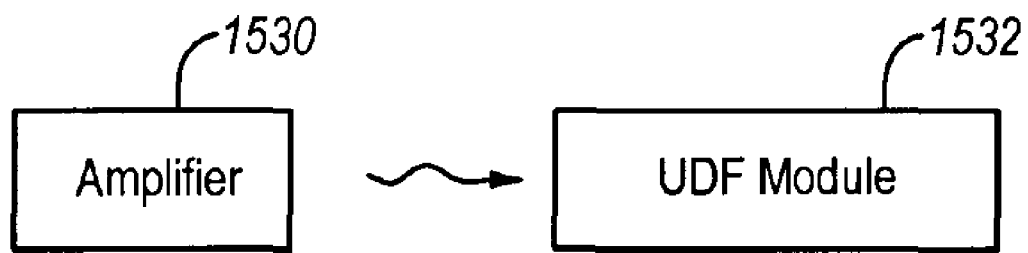

Unified down-conversion and filtering according to the invention is useful in applications involving filtering and/or frequency down-conversion. This is depicted, for example, in FIGS. 15A-15F. FIGS. 15A-15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be utilized as a filter 1522 (i.e., where the extent of frequency down-conversion by the down-converter in the unified down-conversion and filtering module 1524 is minimized). FIG. 15E indicates that a unified down-conversion and filtering module 1528 according to the invention can be utilized as a down-converter 1526 (i.e., where the filter in the unified down-conversion and filtering module 1528 passes substantially all frequencies). FIG. 15F illustrates that the unified down-conversion and filtering module 1532 can be used as an amplifier. It is noted that one or more UDF modules can be used in applications that involve at least one or more of filtering, frequency translation, and amplification.

Figure 14:
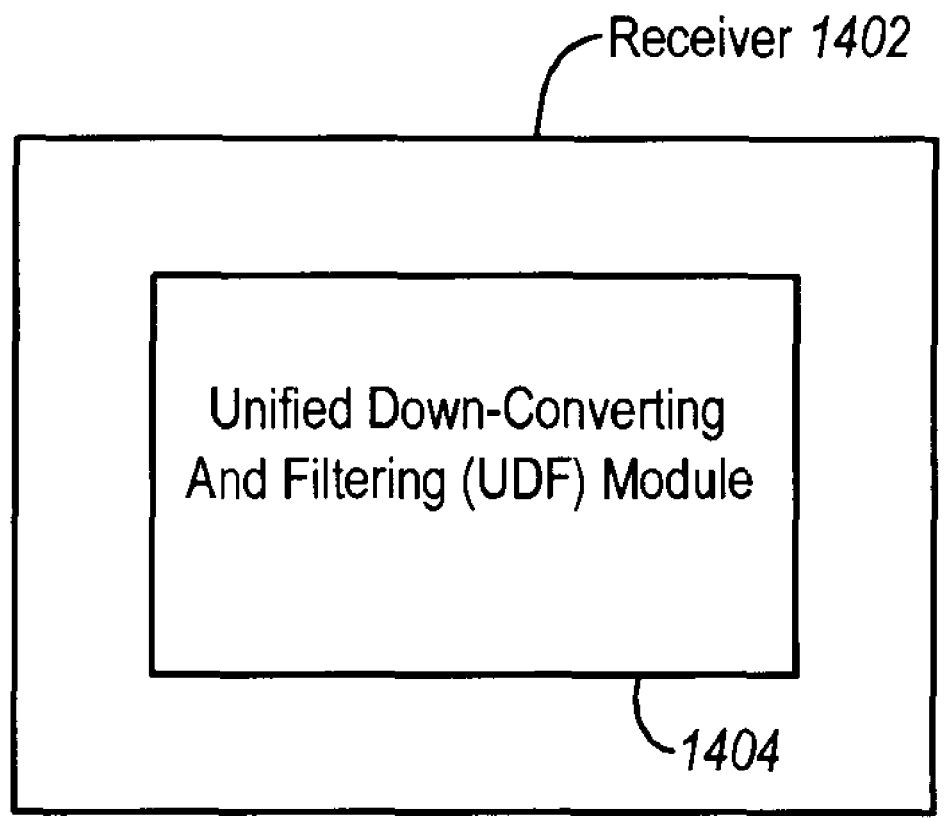
FIG. 14 illustrates an example receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
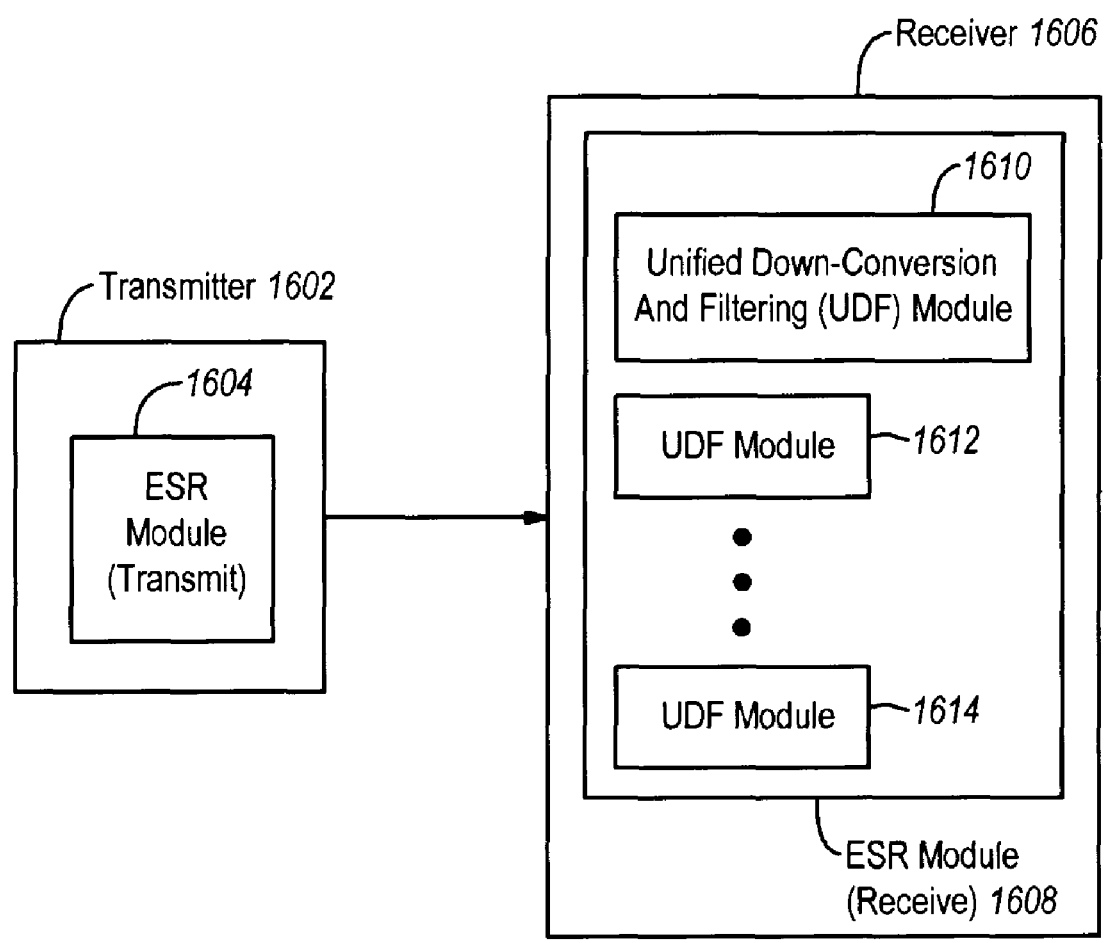
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectrums. The ESR module (receive) also operates to isolate the spectrums in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of the UDF modules

1610, 1612, 1614 operates to down-convert a received signal. The UDF modules 1610, 1612, 1614 also operate to filter the down-converted signal so as to isolate the spectrum(s) contained therein. As noted above, the UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the example applications of the UFT module discussed herein. Also, the invention is not limited to the example combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional examples are set forth below describing applications of the UFT module in the area of universal platform modules.

8. Universal Platform Module (UPM)

The invention is directed to devices which, generally, provide some information technology and communicate on a network or over any other communication medium (such as wireless and wired communication mediums). In order to communicate, the devices receive a signal, optionally modify the signal or otherwise process the signal in an application specific manner, display the information, allow modification of the information, and then transmit a modified signal at the same or different frequency or frequencies. As will be appreciated, at least some of these operations are optional. A device is often used in an off-line manner where it is disconnected from the network or networks (or, more generally, when the device is not in communication with other devices/external entities).

Figure 32:
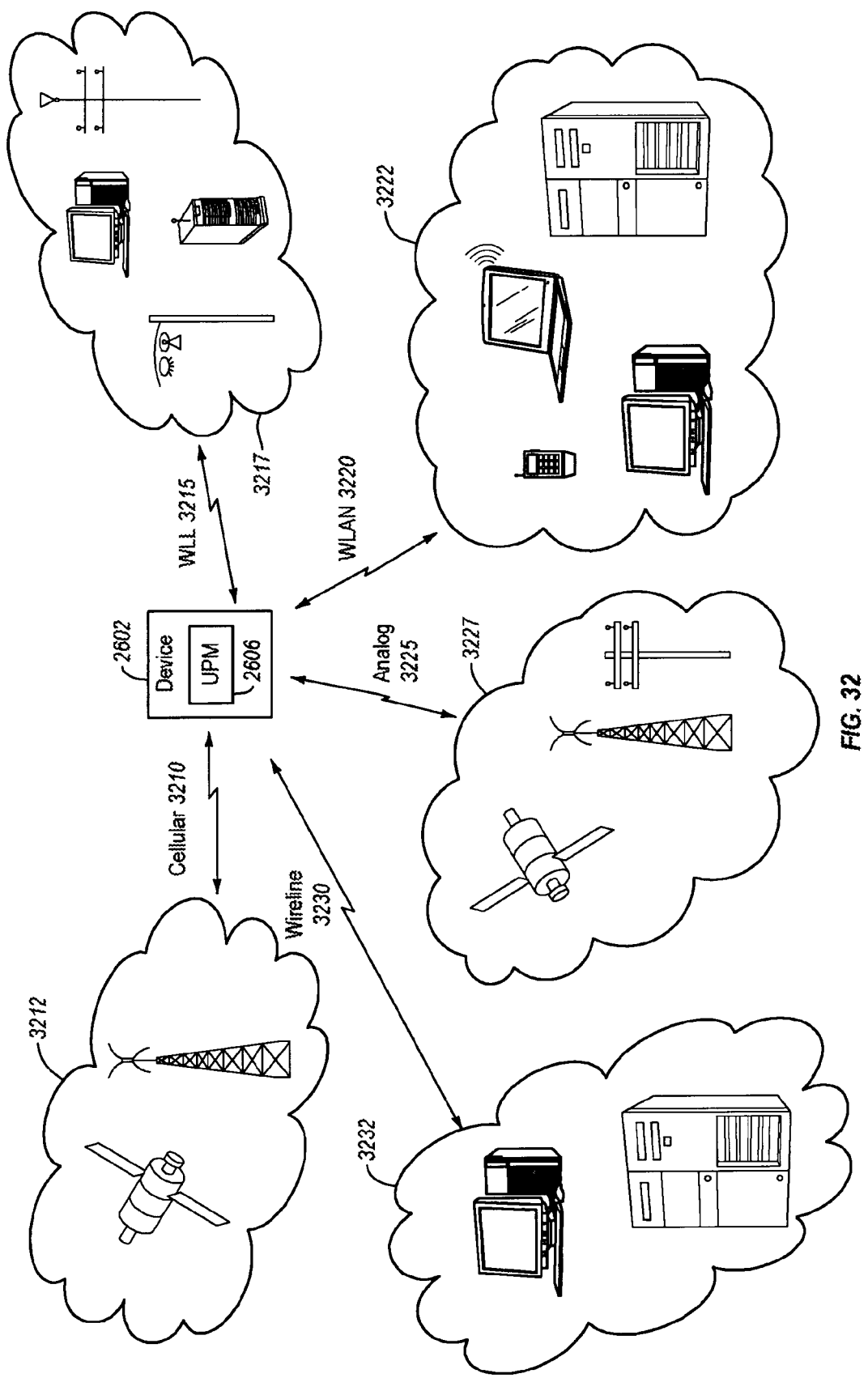
FIG. 32 illustrates an universal platform module according to an embodiment of the invention.

A device 2602 is illustrated, for example, in FIG. 32, where an example UPM 2606 enables communication with networks using cellular 3210, wireless local loop (WLL) 3215, wireless local area network (WLAN) 3220, wireline (LAN, WAN, etc.) 3230, and analog 3225 network links. These network links and/or topologies are described herein for example purposes only, although it should be understood that the invention is applicable to any communication medium. Device 2602 communicates using these links to any of the components (PCs, servers, other devices) which are available on the respective networks 3212, 3217, 3222, 3227, and 3232. Such communication may be simultaneous, either actual or apparent.

The UPM 2606 may include a receiver, transmitter, and/or transceiver. Such components employ one or more UFT modules for performing frequency translation operations. See, for example, FIGS. 10 and 11 in the case of transceivers. See, for example, FIGS. 7 and 8 for receivers and transmitters.

8.1 Conventional Multi-Mode Usage Model

Figure 25A:
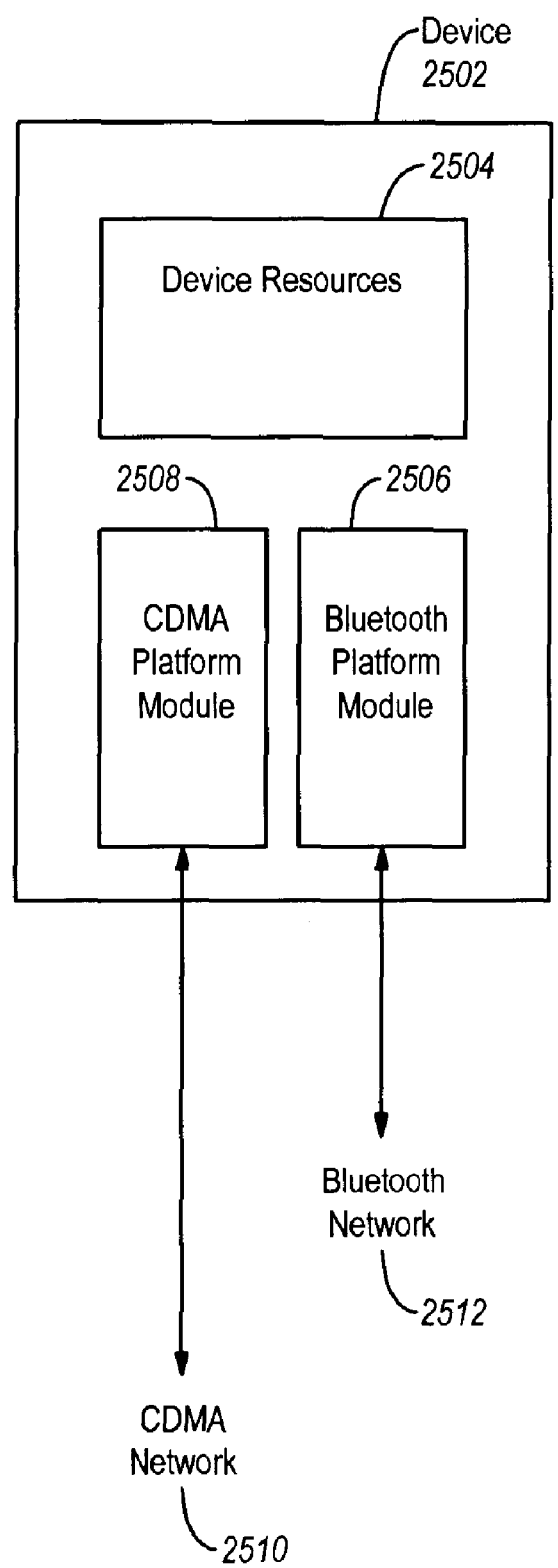
FIG. 25A illustrates a high level block diagram of an example conventional multi-mode device.

FIG. 25A illustrates a high level block diagram of an example conventional multi-mode device 2502. Multi-mode device 2502 includes device resources 2504, a CDMA platform module 2508, and a Bluetooth platform module 2506. CDMA platform module 2508 is constructed to perform cellular telephone operations with the cellular CDMA network 2510. Bluetooth platform module 2506 is constructed to perform WLAN operations with other Bluetooth devices on the Bluetooth Network 2512.

Figure 25B:
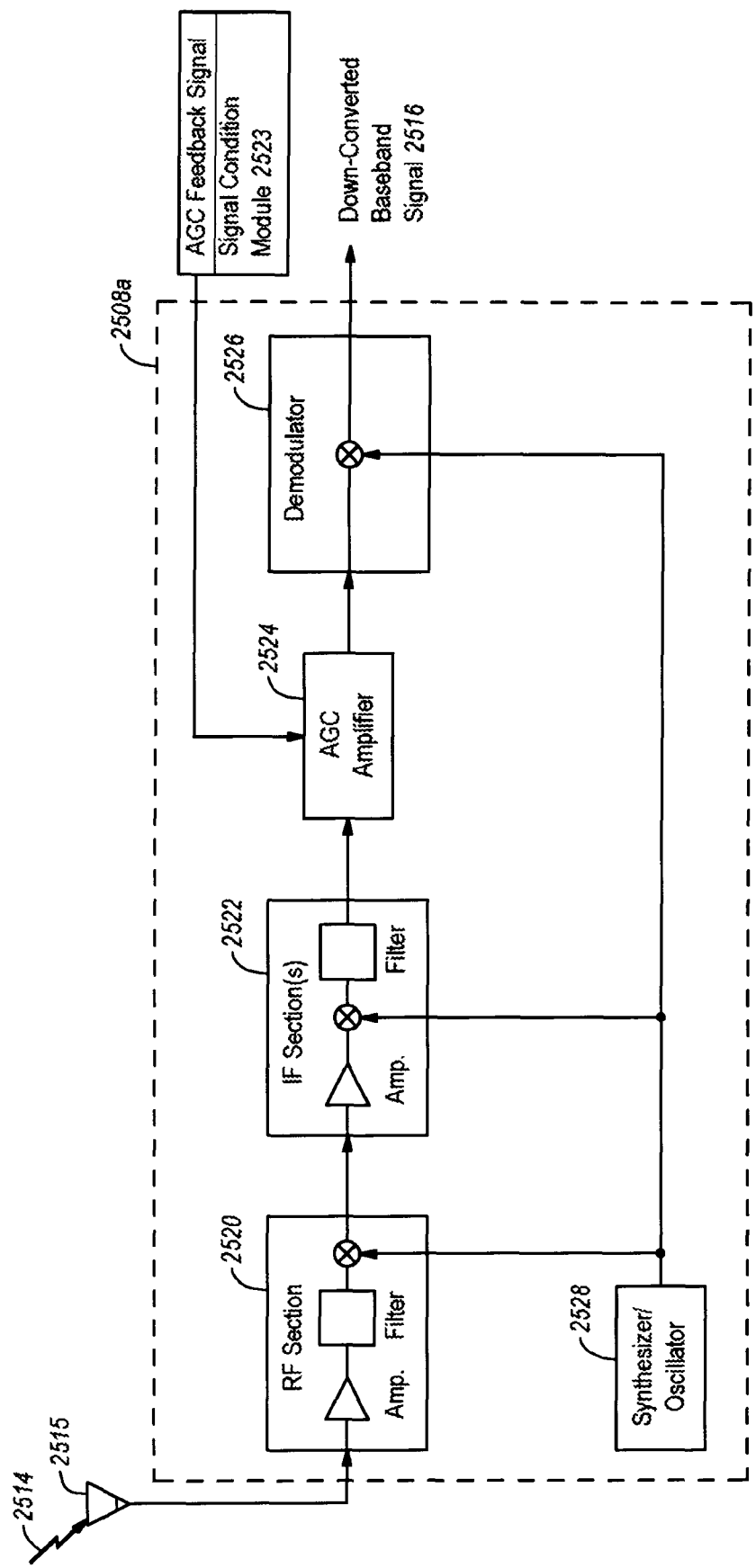
FIG. 25B illustrates a detailed block diagram of a conventional receiver.

FIG. 25B illustrates a more detailed block diagram of a platform module 2508a employing a conventional receiver implemented with heterodyne components. Platform module 2508a frequency down-converts and demodulates a first EM signal 2514 received by first antenna 2515. First EM signal 2514 generally comprises a electromagnetic (EM) signal broadcast at a carrier frequency modulated by a baseband information signal.

Figure 25C:
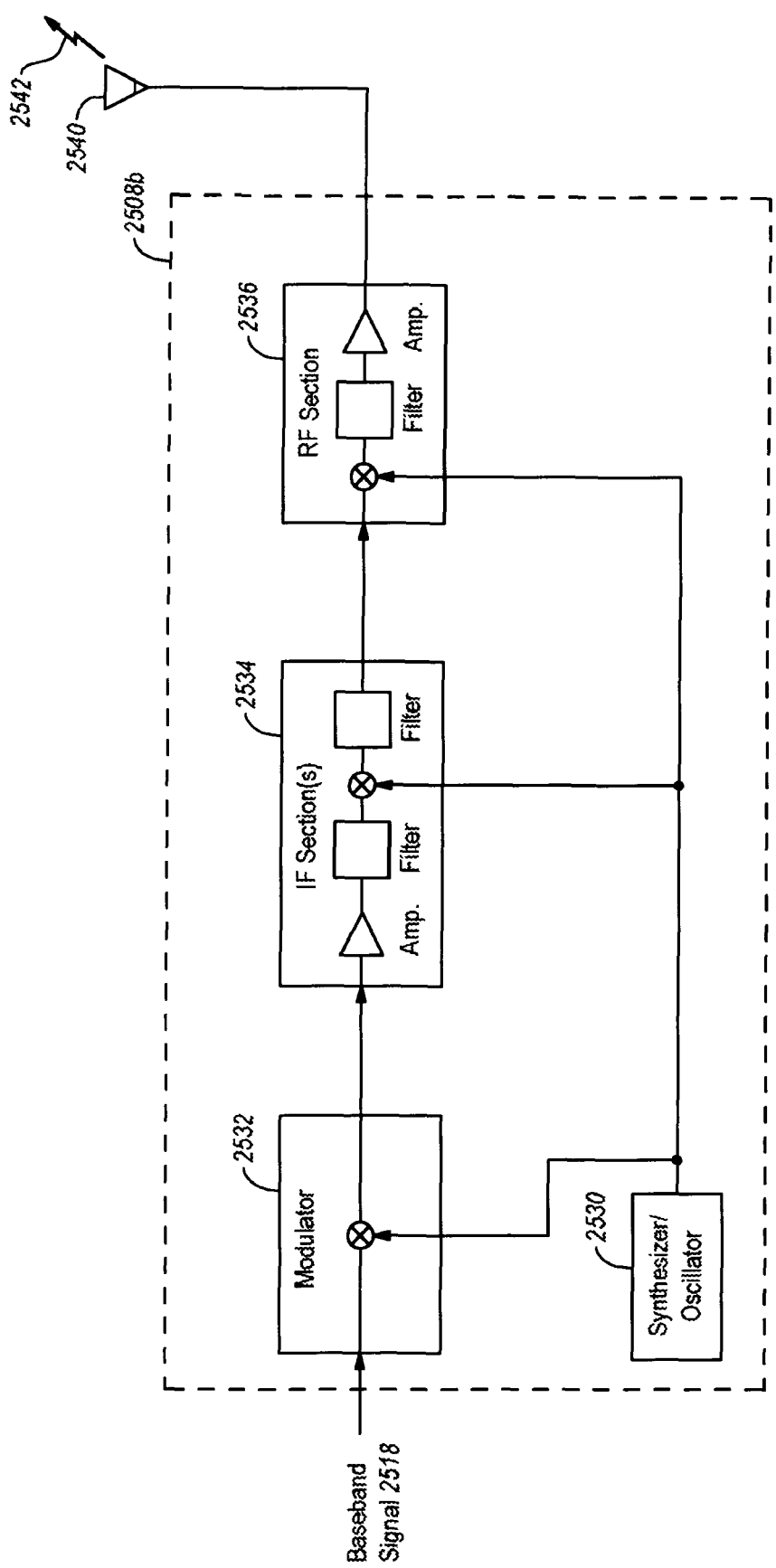
FIG. 25C illustrates a detailed block diagram of a conventional transmitter.

FIG. 25C illustrates a more detailed block diagram of a platform module 2508b employing a conventional transmitter implemented with heterodyne components. Platform module 2508b operates similarly to platform module 2508a. Platform module 2508b modulates and frequency up-converts baseband signal 2518, and outputs an EM signal 2542 that is transmitted by an antenna 2540.

Conventional platform module 2508, whether implemented as a receiver or transmitter (and/or transceiver (not shown)), suffers from the disadvantages of conventional wireless communication methods and systems. For instance, receivers and transmitters are conventionally implemented with heterodyne components. As previously described, heterodyne implementations are complex, are expensive to design, manufacture, and tune, and suffer from additional deficiencies well known in the art.

8.2 Universal Platform Module of the Present Invention

Figure 26A:
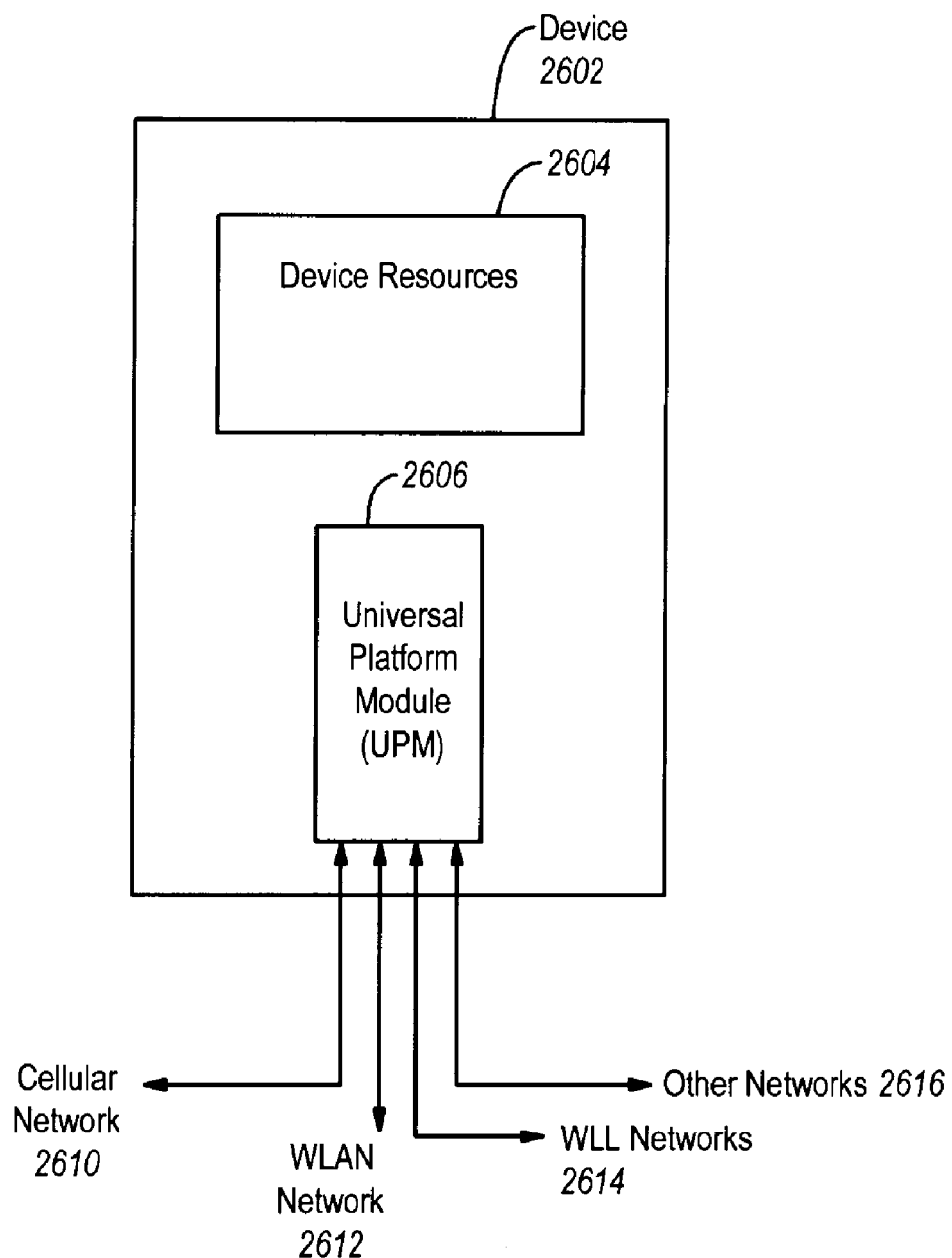
FIGS. 26A-26C illustrate example universal platform modules according to embodiments of the invention.

FIG. 26 illustrates a high level block diagram embodiment of an exemplary universal platform enabled device 2602 according to an embodiment of the present invention.

Figure 26B:
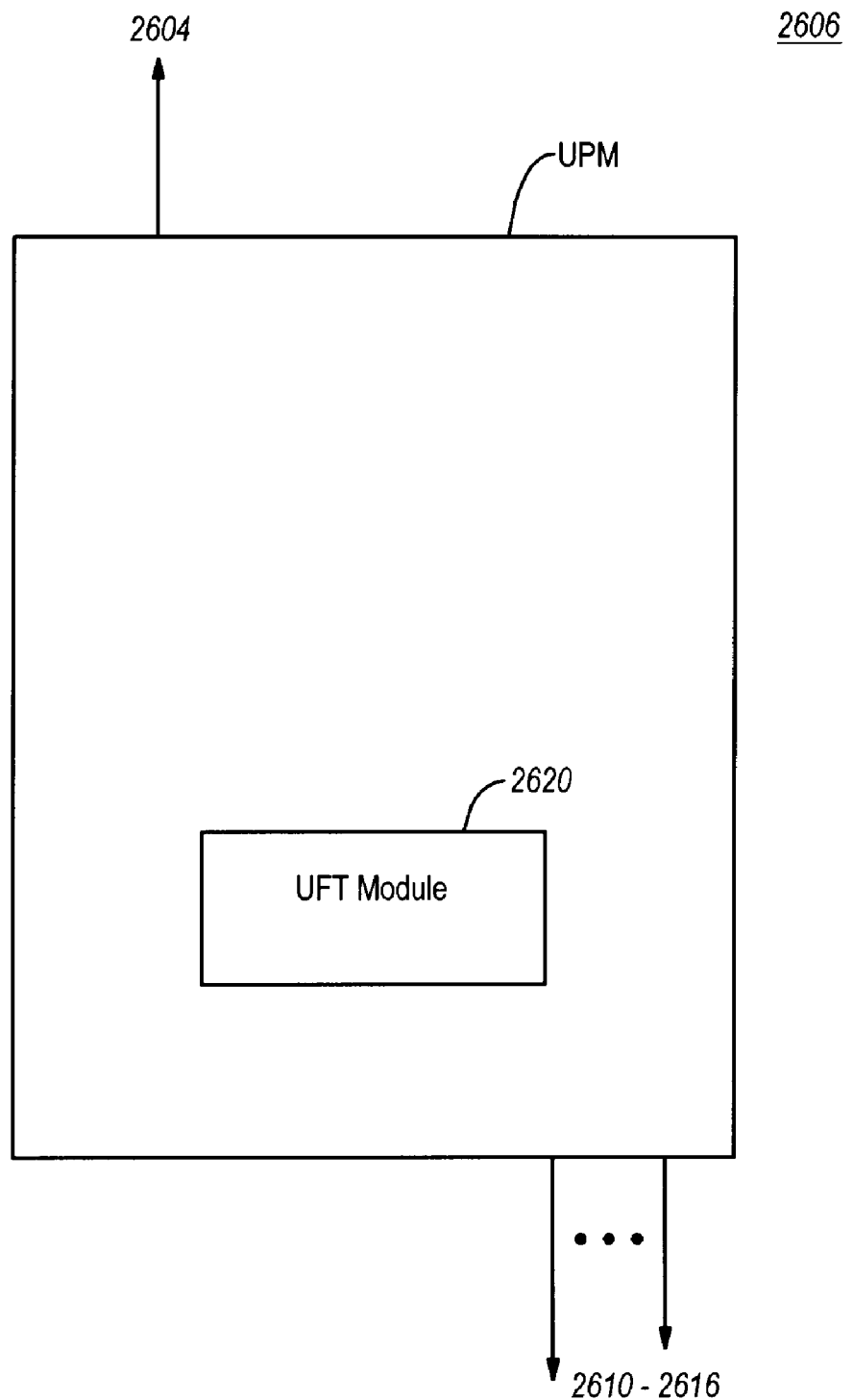

Universal platform enabled device 2602 includes device resources 2604 and a UPM 2606. UPM 2606 comprises at least one UFT module 2620 (as shown in FIG. 26B). UPM 2606 is shown linking to various network types: cellular network 2610, WLAN network 2612, WLL network 2614, and other networks 2616. Other networks 2616 include personal area networks (PANs), other non-IP networks, and any network resulting without limitation from the connection of devices through any communication medium, wired or wireless.

UPM 2606 receives signals and transmits signals using the UFT module 2620 as described herein.

Figure 26C:
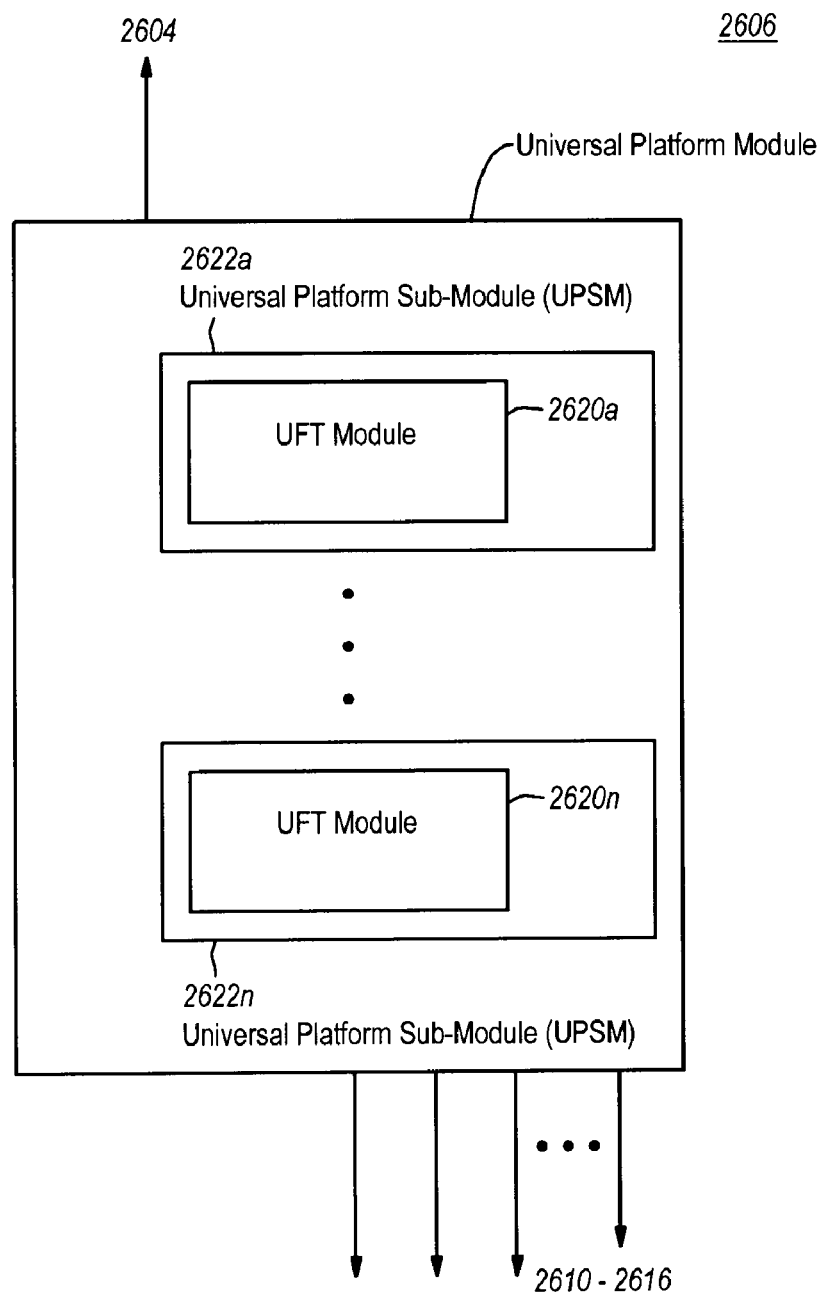

In another embodiment, additional UFT modules 2620 may be employed, as shown in FIG. 26C. Persons skilled in the relevant art(s) will recognize after reading this disclosure that in particular applications, additional UFT modules may be used.

Furthermore, FIG. 26C illustrates another embodiment where universal platform sub-modules (UPSM) 2622, each containing a UFT module 2620, are employed. Each UPSM 2622 would be capable of maintaining one or more links to the various networks/communication mediums disclosed herein.

The UPM 2606 of the present invention is also directed to digital signal applications. In a further embodiment, optional signal conditioning module 2523 comprises an analog-to-digital converter (A/D), a digital signal processor (DSP), a digital-to-analog (D/A) converter, and storage. Optional signal conditioning module 2523 inputs down-converted baseband signal 2518 to A/D. A/D converts down-converted baseband signal 2518 to a digital signal on interconnection. DSP can perform any digital signal processing function on the digital signal for signal amplification, filtering, error correction, etc. DSP may comprise a digital signal processing chip, a computer, hardware, software, firmware, or any combination thereof, or any other applicable technology known to persons skilled in the relevant art(s). Storage provides for storing digital signals at any stage prior to digital-to-analog conversion by D/A. These digital signals include the digital signal received from A/D, the digital signal to be output to D/A, or any intermediate signal provided by DSP. The interconnection may be configured between the components of optional signal conditioning module 2523 in a variety of ways as required by the present application, as would be understood by persons skilled in the relevant art(s).

D/A inputs the digital signal to be transmitted from interconnection, and converts it to analog, outputting baseband signal 2518. Optional signal conditioning module 2523 provides for digital signal processing and conditioning of a received signal prior to its re-transmission. Persons skilled in the relevant art(s) will recognize that a variety of digital signal conditioning configurations exist for optional signal conditioning module 2523. Any other digital signal conditioning function may be performed by optional signal conditioning module 2523, as would be known to persons skilled in the relevant art(s).

Furthermore, persons skilled in the relevant art(s) will recognize that optional signal conditioning module 2523 can be configured to handle a combination of analog and digital signal conditioning functions.

Exemplary embodiments of the UPM 2606 and UPSM 2622 of the present invention are described below. However, it should be understood that these examples are provided for illustrative purposes only. The invention is not limited to these embodiments. Alternate embodiments. (including equivalents, extensions, variations, deviations, etc., of the embodiments described herein) will be apparent to persons skilled in the relevant art(s) based on the teachings contained herein. The invention is intended and adapted to include such alternate embodiments.

8.2.1 Universal Platform Module Embodiments

The universal platform module of the present invention is directed to applications of universal platform modules and sub-modules. The universal platform module of the present invention may be implemented in devices which are land-based, and air- and space-based, or based anywhere else applicable. For example, the universal platform module of the present invention may be implemented in devices employed in ground stations, satellites, spacecraft, watercraft, and aircraft. The universal platform module of the present invention is applicable to any number of common household consumer appliances and goods, including phones and wireless modems. The universal platform module of the present invention may be implemented in any applicable manner known to persons skilled in the relevant art(s).

Figure 37:
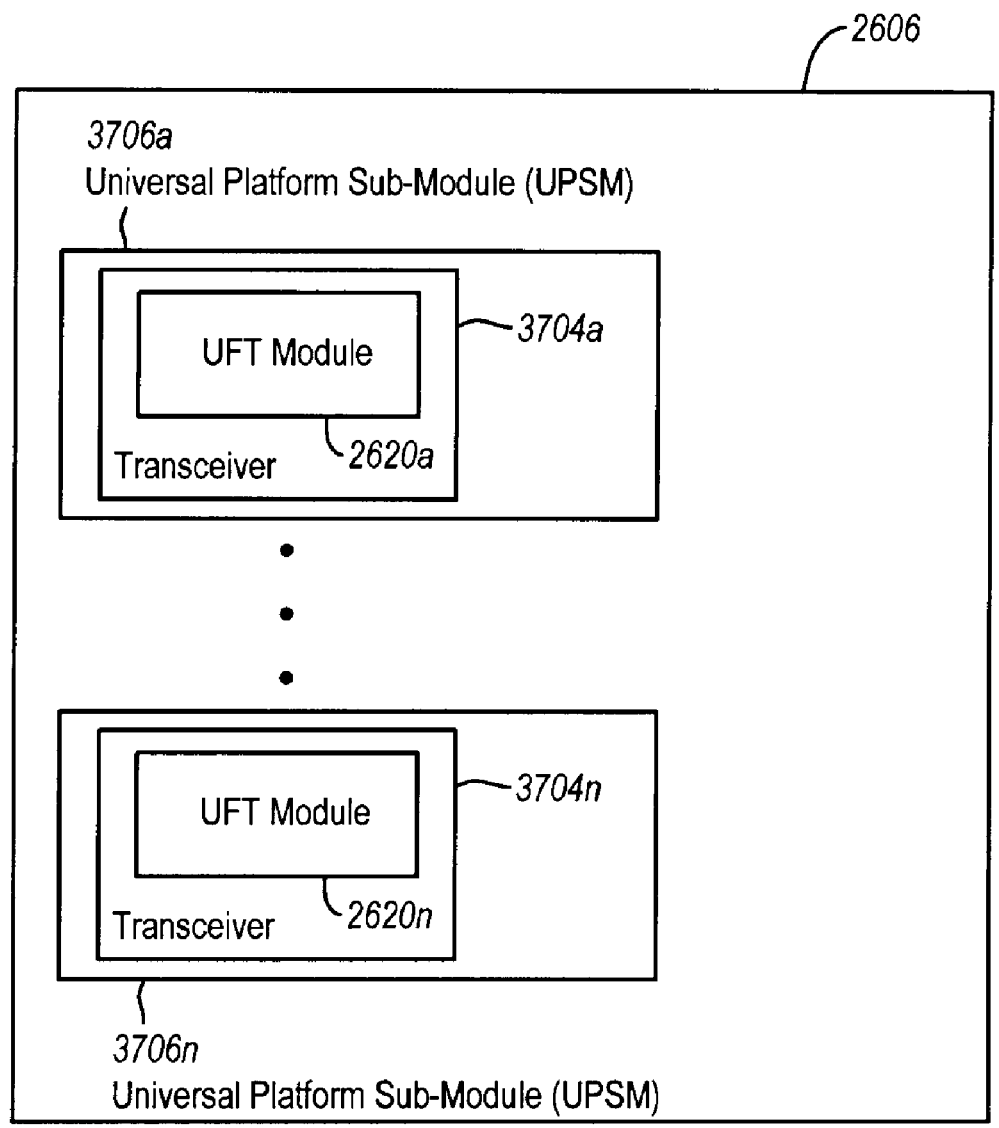
FIG. 37 illustrates a high level block diagram of an universal platform sub-module transceiver implementation according to an embodiment of the invention.
Figure 38:
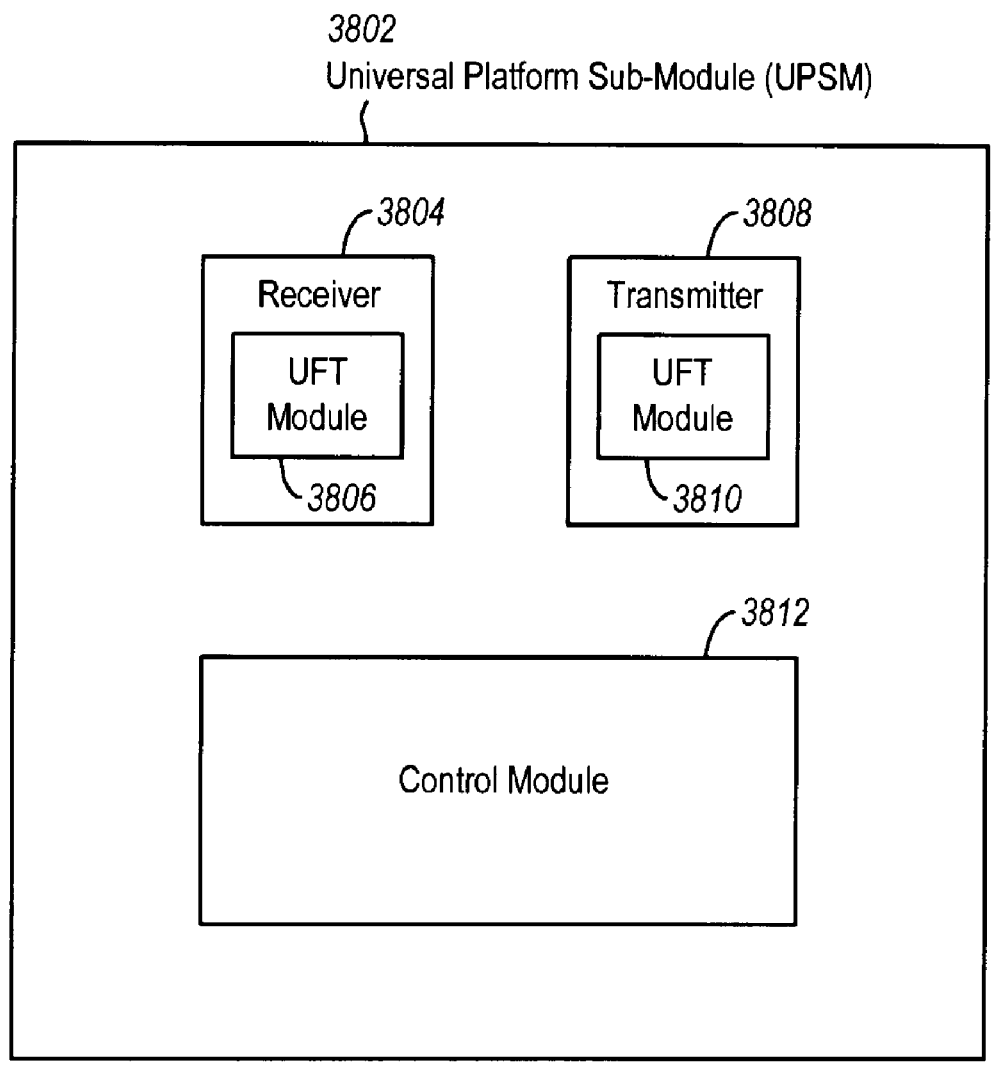
FIG. 38 illustrates a high level block diagram of universal platform sub-module receiver and transmitter implementations according to an embodiment of the invention.

The universal platform module of the present invention is preferably directed to analog signal applications, although the invention is also applicable to digital applications. UPSM 3802 in the example embodiment shown in FIG. 38 is specific to a particular protocol and a particular bearer combination. The UPSM 3802 includes a receiver 3804 and a transmitter 3808 each including one or more UFT modules (as indicated by 3806 and 3810) as described herein and in the cited patent applications. Alternatively, the UPSM 3802 includes a transceiver having one or more UFT modules as described herein (as shown in FIG. 37 and discussed below).

The UPSM 3802 also includes a control module 3812 that enables the UPSM 3802 to operate in conformance with the particular protocol/bearer service combination. In particular, the control module 3812 includes hardware, software, or combinations thereof to cause the UPSM 3802 to receive, transmit, process, and otherwise interact with signals according to the particular protocol/bearer service combination. Implementation of the control module 3812 will be apparent to persons skilled in the relevant art(s) based on at least the teachings contained herein.

Examples of the UPSM 3802 include ones that operate according to the example protocol/bearer service combinations shown in FIG. 39. It should be understood that the examples shown in FIG. 39 are provided for illustrative purposes only, and are not limiting. The invention is intended and adapted to operate with other protocol/bearer service combinations, and these will be apparent to persons skilled in the relevant art(s) based on at least the teachings contained herein.

Also, FIG. 40 is a representation of groups of communication links or types. The control module 3812 of the UPSM 3802 enables the UPSM 3802 to operate in conformance with any such communication link/type. In particular, the control module 3812 includes hardware, software, or combinations thereof to cause the UPSM 3802 to receive, transmit, process, and otherwise interact with signals according to the communication link/type. Implementation of the control module 3812 will be apparent to persons skilled in the relevant art(s) based on at least the teachings contained herein. It should be understood that the examples shown in FIG. 40 are provided for illustrative purposes only, and are not limiting. The invention is intended and adapted to operate with other communication links/types, and these will be apparent to persons skilled in the relevant art(s) based on at least the teachings contained herein.

An example embodiment of a USPM 3802 that operates according to the WLAN communication type/link is described in greater detail in U.S. provisional application Ser. No. 60/147,129 filed Aug. 4, 1999, which is herein incorporated by reference in its entirety. It should be understood that this description is provided for illustrative purposes only are is not limiting. In particular, the invention is not limited to this combination.

An example embodiment of a USPM 3802 that operates according to the CDMA communication type/link is described in greater detail in U.S. patent application Ser. No. 09/525,185 filed Mar. 14, 2000 and 09/525,615 filed Mar. 14, 2000, which are herein incorporated by reference in its entirety. Another example embodiment of a USPM 3802 that operates according to the CDMA communication type/link is described in greater detail in U.S. patent application "Wireless Telephone Using Universal Frequency Translation," filed Apr. 10, 2000, Ser. No. 60/195,328, incorporated herein by reference in its entirety. It should be understood that this description is provided for illustrative purposes only and is not limiting. In particular, the invention is not limited to this combination.

The UPSM 3802; and in particular the control module 3812, for the WAP/Bluetooth combination, shall now be described in greater detail. It should be understood that this description is provided for illustrative purposes only are is not limiting. In particular, the invention is not limited to this combination.

Figure 43:
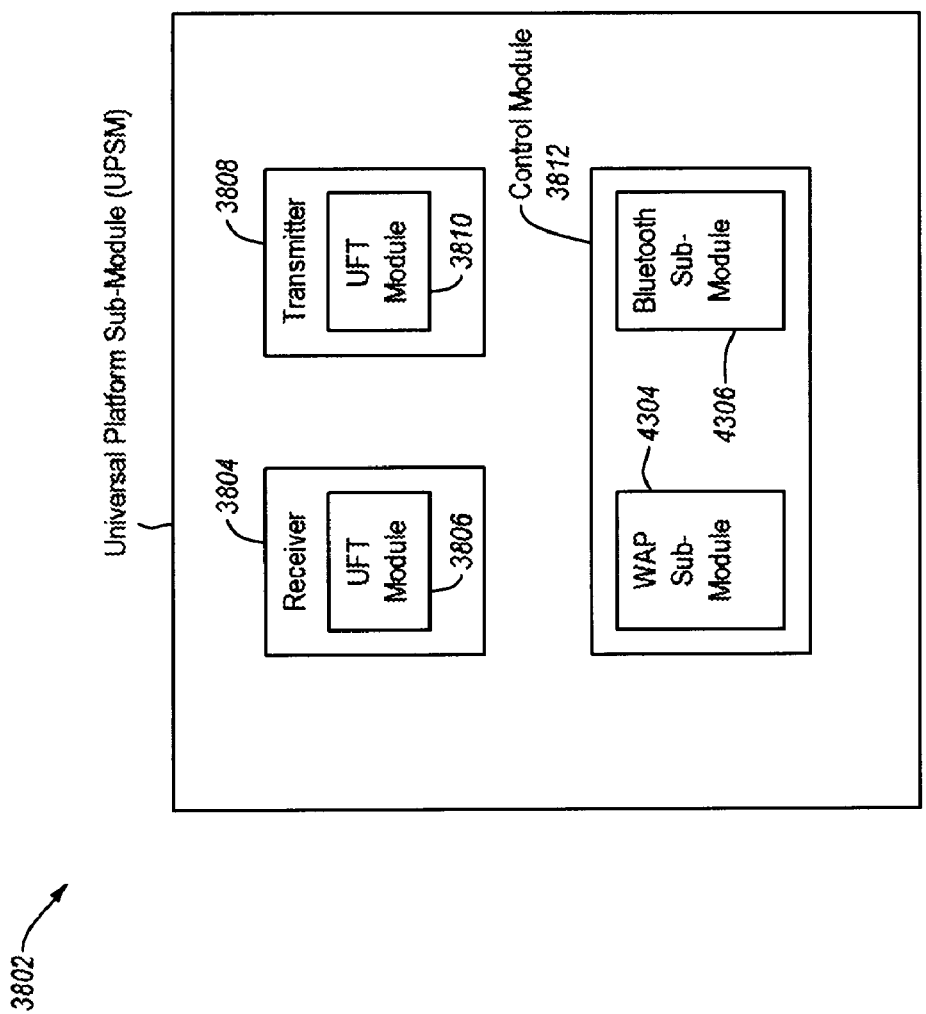
FIG. 43 illustrates a high level block diagram of a specific implementation of device employing a universal platform module.

FIG. 43 illustrates an embodiment of the invention for the UPSM 3802 and control module 3812. Control module 3812 includes sub-modules which contain implementation and operational instructions for UPSM 3802. In one embodiment, WAP sub-module 4304 and Bluetooth sub-module 4306 are employed such that the UPSM may operate using either Bluetooth or one of the number of bearer services available to WAP.

In an embodiment, WAP sub-module 4304 contains the WAP protocol stack and specification information about the WAP architecture. For instance, the wireless application environment (WAE) or application layer, session layer (WSP), transaction layer (WTP), security layer (WTLS), and transport layer (WDP). This information would enable control module 3812 to operate the components of UPSM 3802 in a manner that conforms to both the requirements of the protocol, but also to the requirements of the operating environment. The operating environment includes, but is not limited to, the available bearer services, content encoders and decoders employed, available protocol gateways, etc.

In an embodiment, Bluetooth sub-module 4306 contains the Bluetooth protocol stack and specification information about the Bluetooth architecture. For instance, Bluetooth sub-module 4306 includes: 1) the link manager protocol (LMP), which is responsible for link setup between Bluetooth-enabled devices, including authentication and encryption; 2) the logical link control and adaptation protocol (L2CAP), which serves as an adapter between the upper layer protocols and the Bluetooth baseband protocol and permits the higher level protocols to transmit and receive L2CAP data packets; 3) the service discovery protocol (SDP), which discovers information about the devices and services available in the local Bluetooth network, and then enables a connection between two or more Bluetooth-enabled devices; 4) the cable replacement protocol (RFCOMM); 5) the telephony control protocol (TCS BIN); and 6) the telephony control-AT commands.

The Bluetooth sub-module 4306 is not limited to these protocols. Additional protocol and specification information can be included to enhance the functionality of the UPSM 3802. Implementation of the sub-modules of control module 3812 will be apparent to persons skilled in the relevant art(s) based on at least the teachings contained herein. It should be understood that the examples shown in FIGS. 39 and 40 are provided for illustrative purposes only, and are not limiting. The invention is intended and adapted to operate with other communication links/types, and these will be apparent to persons skilled in the relevant art(s) based on at least the teachings contained herein.

A device containing at least one UPM, which contains at least one UPSM 3802 of FIG. 43, is capable of linking to wireless networks using any of the bearer services available for the protocols for which it is programmed and/or encoded. In one example, the device is communicating point-of-sale information by operating the receiver 3804 and transmitter 3808 components of UPSM 3802 for Bluetooth. In a nearly simultaneous fashion, the same device is switching the same receiver 3804 and transmitter 3808 components of UPSM 3802 using the wireless application protocol (WAP) to link the device to a cellular network using a CDMA standard bearer service.

In an additional embodiment, a device is able to employ WAP sub-module 4304 to maintain two or more nearly simultaneous links to the same or different bearer services using the same or different standards. For instance, a device is using AMPS to send and receive facsimiles, while a voice call is being maintained over GSM.

Figure 41:
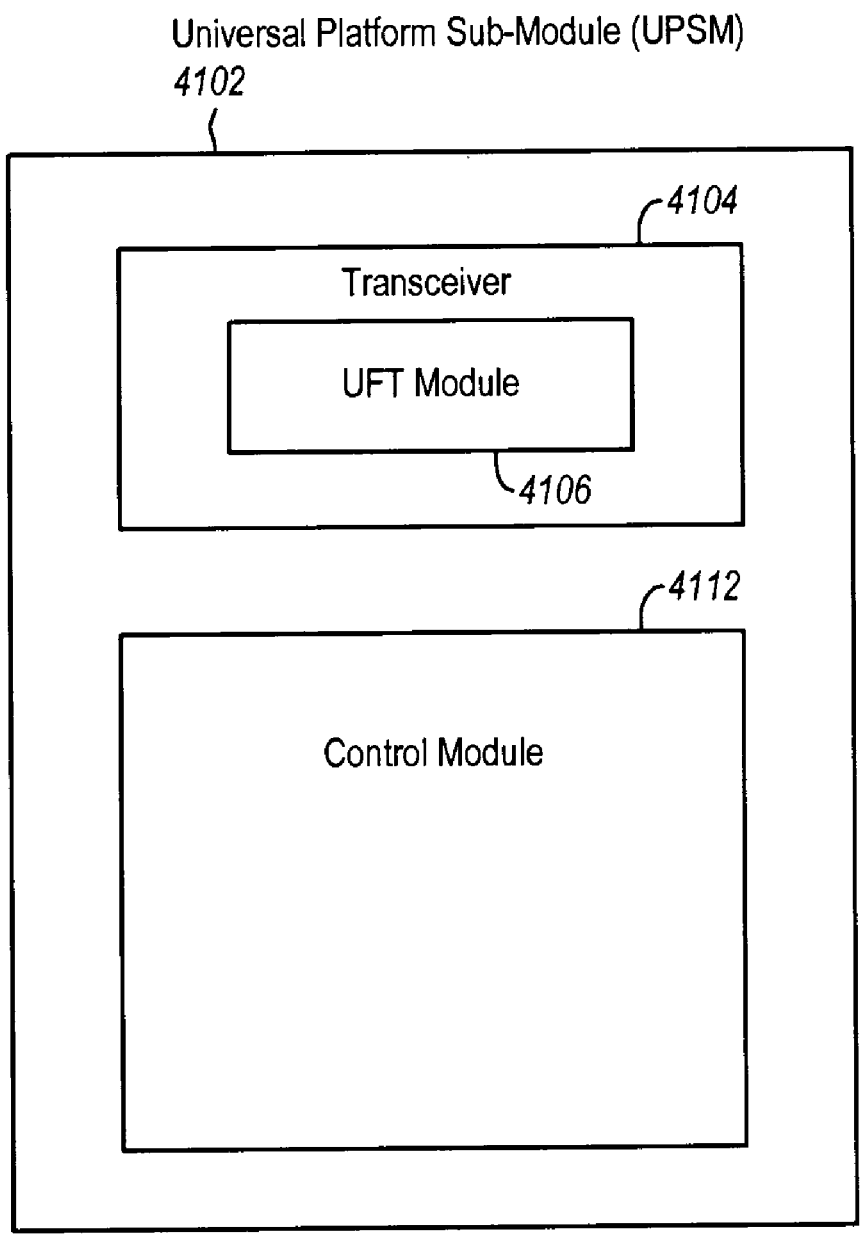
FIG. 41 illustrates a high level block diagram of an universal platform sub-module transceiver implementation according to an embodiment of the invention.

UPSM 4102 in the example embodiment shown in FIG. 41 contains a control module 4112 to enable the UPSM 4102 to operate according to multiple protocol/bearer service combinations (FIG. 39) and/or multiple communication link/types (FIG. 40).

In an embodiment, the UPSM 4102 operates according to one such protocol/bearer service combination or communication link/type at any given time. In this embodiment, the UPSM 4102 may operate in a multi-threaded manner so that it switches between protocol/bearer service combination or communication link/type over time. This enables the UPSM 4102 to effectively perform virtual or apparent simultaneous processing of multiple protocol/bearer service combinations and/or communication link/types.

Thus, the control module 4112 enables the UPSM 4102 to operate in conformance with any combination of protocol/bearer service combinations and communication link/types. In particular, the control module 4112 includes hardware, software, or combinations thereof to cause the UPSM 4102 to receive, transmit, process, and otherwise interact with signals according to any such protocol/bearer service combination or communication link/type. Implementation of the control module 4112 will be apparent to persons skilled in the relevant art(s) based on at least the teachings contained herein.

In the example shown in FIG. 41, the UPSM 4102 includes a transceiver 4104 having one or more UFT 4106 modules. Alternatively, the UPSM 4102 could have one or more receivers and one or more transmitters each having one or more UFT modules. In some of such embodiments, the UPSM 4102 operates according to one or more protocol/bearer service combinations and/or communication link/types simultaneously at any given time. This enables the UPSM 4102 to perform simultaneous processing of multiple protocol/bearer service combinations and/or communication link/types.

Examples of the UPSM include ones that operate according to the example protocol/bearer service combinations shown in FIG. 39. It should be understood that the examples shown in FIG. 39 are provided for illustrative purposes only, and are not limiting. The invention is intended and adapted to operate with other protocol/bearer service combinations, and these will be apparent to persons skilled in the relevant art(s) based on at least the teachings contained herein.

Also, FIG. 40 is a representation of groups of communication links or types. The control module 4112 of the UPSM 4102 enables the UPSM 4102 to operate in conformance with any such communication link/type. In particular, the control module 4112 includes hardware, software, or combinations thereof to cause the UPSM 4102 to receive, transmit, process, and otherwise interact with signals according to the communication link/type. Implementation of the control module 4112 will be apparent to persons skilled in the relevant art(s) based on at least the teachings contained herein. It should be understood that the examples shown in FIG. 40 are provided for illustrative purposes only, and are not limiting. The invention is intended and adapted to operate with other communication links/types, and these will be apparent to persons skilled in the relevant art(s) based on at least the teachings contained herein.

An example embodiment of a USPM 4102 that operates according to the WLAN communication type/link is described in greater detail in U.S. provisional application Ser.

No. 60/147,129 filed Aug. 4, 1999, which is herein incorporated by reference in its entirety. It should be understood that this description is provided for illustrative purposes only are is not limiting. In particular, the invention is not limited to this combination.

An example embodiment of a USPM 4102 that operates according to the CDMA communication type/link is described in greater detail in U.S. patent application Ser. No. 09/525,185 filed Mar. 14, 2000 and 09/525,615 filed Mar. 14, 2000, which are herein incorporated by reference in its entirety. Another example embodiment of a USPM 3802 that operates according to the CDMA communication type/link is described in greater detail in U.S. patent application 60/195, 328 Wireless Telephone Using Universal Frequency Translation," filed Apr. 10, 2000, incorporated herein by reference in its entirety. It should be understood that this description is provided for illustrative purposes only are is not limiting. In particular, the invention is not limited to this combination.

UPSM 4102, and in particular the control module 4112, for the CDMA/GSM combination, shall now be described in greater detail. It should be understood that this description is provided for illustrative purposes only are is not limiting. In particular, the invention is not limited to this combination.

Figure 44:
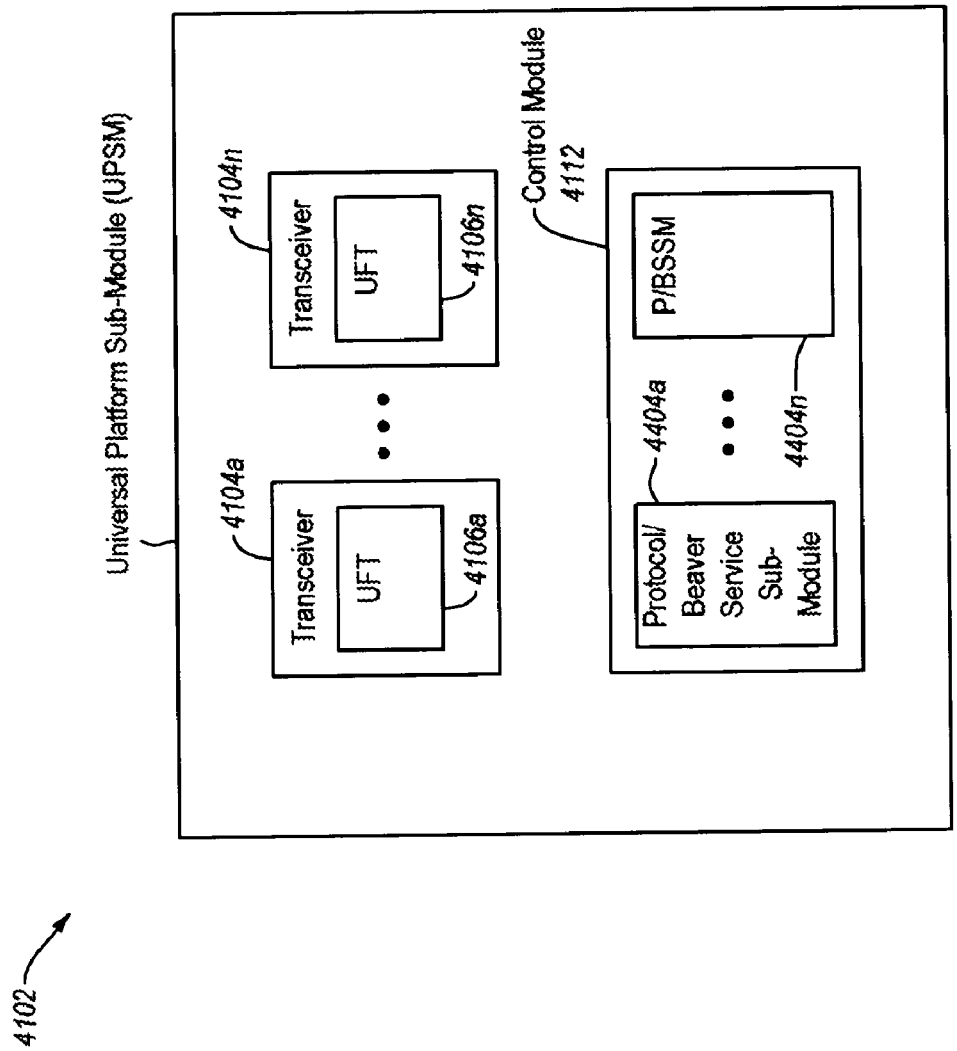
FIG. 44 illustrates a high level block diagram of a flexible implementation of a device employing a universal platform module.

FIG. 44 illustrates an embodiment of the invention for the UPSM 4102 and control module 4112. Control module 4112 includes protocol/bearer service sub-modules (P/BSSM) 4404 which contain implementation and operational instructions for UPSM 4102. In one embodiment, any number of P/BSSM 4404 are employed such that the UPSM may operate using any number of networks.

In an embodiment, P/BSSM 4404 contains the WAP protocol stack and specification information about the WAP architecture. For instance, the wireless application environment (WAE) or application layer, session layer (WSP), transaction layer (WTP), security layer (WTLS), and transport layer (WDP). This information would enable control module 4112 to operate the components of UPSM 4102 in a manner that conforms to both the requirements of the protocol, but also to the requirements of the operating environment. The operating environment includes, but is not limited to, the available bearer services, content encoders and decoders employed, available protocol gateways, etc.

In an embodiment, P/BSSM 4404 contains the Bluetooth protocol stack and specification information about the Bluetooth architecture. For instance, P/BSSM 4404 includes: 1) the link manager protocol (LMP), which is responsible for link setup between Bluetooth-enabled devices, including authentication and encryption; 2) the logical link control and adaptation protocol (L2CAP), which serves as an adapter between the upper layer protocols and the Bluetooth baseband protocol and permits the higher level protocols to transmit and receive L2CAP data packets; 3) the service discovery protocol (SDP), which discovers information about the devices and services available in the local Bluetooth network, and then enables a connection between two or more Bluetooth-enabled devices; 4) the cable replacement protocol (RFCOMM); 5) the telephony control protocol (TCS BIN); and 6) the telephony control-AT commands.

The P/BSSM 4404 is not limited to these protocols. Additional protocol and specification information can be included to enhance the functionality of the UPSM 4102. Implementation of the sub-modules of control module 4112 will be apparent to persons skilled in the relevant art(s) based on at least the teachings contained herein. It should be understood that the examples shown in FIGS. 39 and 40 are provided for illustrative purposes only, and are not limiting. The invention is intended and adapted to operate with other communication links/types, and these will be apparent to persons skilled in the relevant art(s) based on at least the teachings contained herein.

A device containing at least one UPM, which contains at least one UPSM 4102 of FIG. 44, is capable of linking to networks using any of the bearer services available for the protocols for which it is programmed and/or encoded. In one example, the device is communicating point-of-sale information by operating the transceiver 4104 component of UPSM 4102. Simultaneously, the same device is switching another of the transceiver 4104 components of UPSM 4102 using the wireless application protocol (WAP) to link the device to a cellular network using a CDMA standard bearer service.

In an additional embodiment, a device is able to employ P/BSSM 4404 to maintain two or more simultaneous links to the same or different bearer services using the same or different standards. For instance, a device is using AMPS to send and receive facsimiles, while a voice call is being maintained over GSM.

It is noted that in the embodiments of FIGS. 43 and 44 the instructions programmed and/or encoded into the sub-modules of the control modules may be update, upgraded, replaced, and/or modified in order to provide additional and/or new functionality. The functionality may take the form of new network availability, altered performance characteristics, changes in information exchange formats, etc.

These example embodiments and other alternate embodiments (including equivalents, extensions, variations, deviations, etc., of the example embodiments described herein) will be apparent to persons skilled in the relevant art(s) based on the referenced teachings and the teachings contained herein, and are within the scope and spirit of the present invention. The invention is intended and adapted to include such alternate embodiments.

8.2.2 Universal Platform Module Receiver

The following discussion describes down-converting signals using a Universal Frequency Down-conversion (UFD) Module. The down-conversion of an EM signal by aliasing the EM signal at an aliasing rate is described above, and is more fully described in co-pending U.S. patent application entitled "Method and System for Down-converting an Electromagnetic Signal," Ser. No. 09/176,022, issued as U.S. Pat. No. 6,061,551, which is incorporated herein by reference in its entirety.

Exemplary embodiments of the UPM receiver are described below. However, it should be understood that these examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

8.2.2.1 Universal Platform Module Receiver Embodiments

Figure 27A:
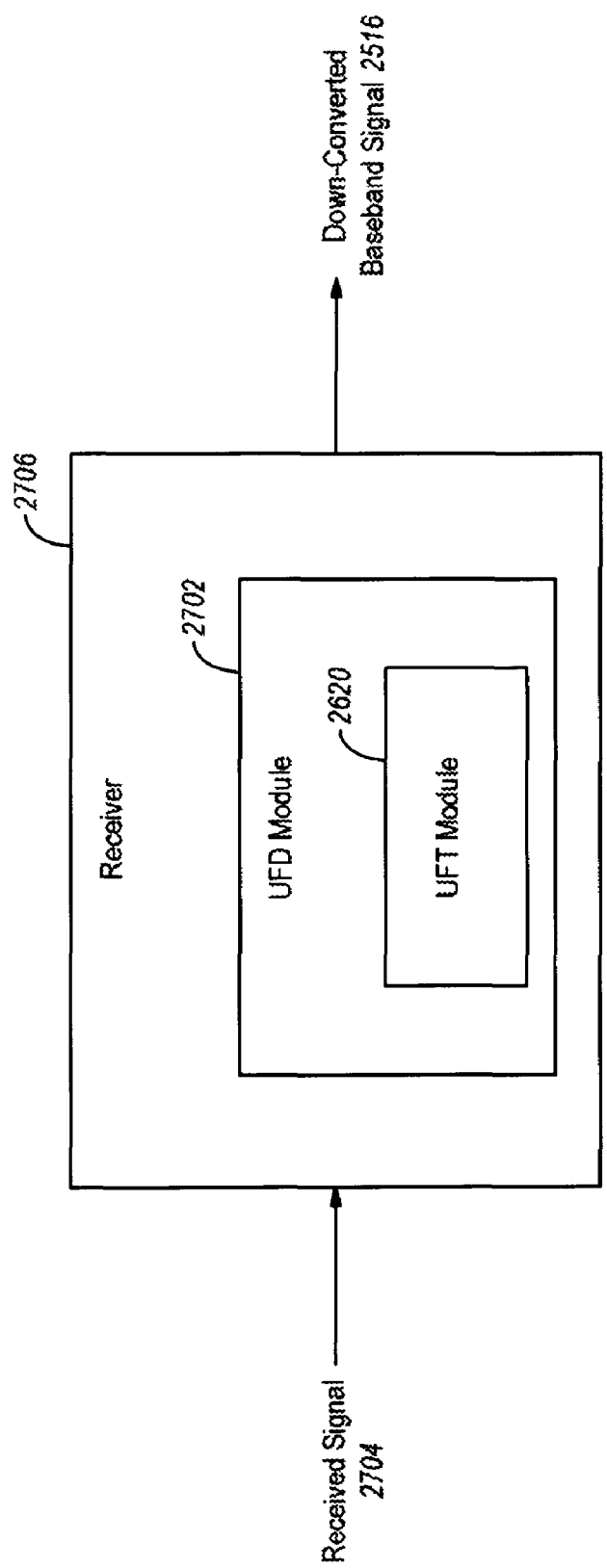
FIGS. 27A-27C illustrate example universal platform sub-module receivers according to embodiments of the invention.

FIG. 27A illustrates an embodiment of the receiving UPSM 2706. Receiving UPSM 2706 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

Receiving UPSM 2706 of FIG. 27A comprises at least one UFD module 2702. UFD module 2702 comprises at least one UFT module 2620. Numerous embodiments for receiving UPSM 2706 will be recognized by persons skilled in the relevant art(s) from the teachings herein, and are within the scope of the invention.

Figure 27B:
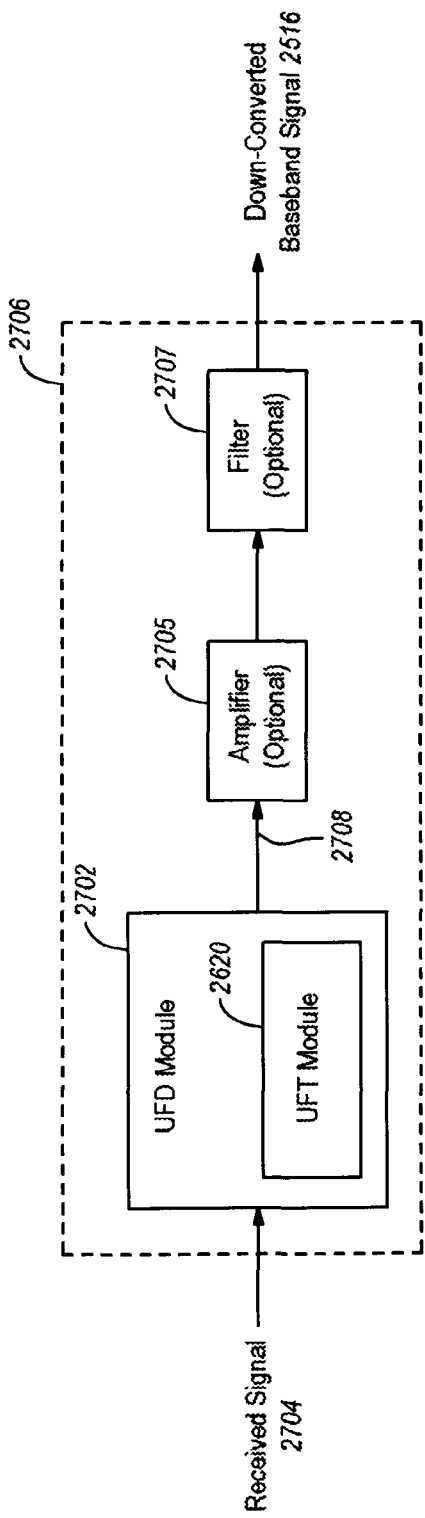

FIG. 27B illustrates an embodiment of the receiving UPSM 2706, in greater detail. Receiving UPSM 2706 comprises a UFD module 2702, an optional amplifier 2705, and an optional filter 2707. UFD module 2702 comprises at least one UFT module 2620.

UFD module 2702 inputs received signal 2704. UFD module 2702 frequency down-converts received signal 2704 to UFD module output signal 2708.

UFD module output signal 2708 is optionally amplified by optional amplifier 2705 and optionally filtered by optional filter 2707, and a down-converted baseband signal 2516 results. The amplifying and filtering functions may instead be provided for in optional signal conditioning module 2523, when present.

Received signals of a variety of modulation types may be down-converted directly to a baseband signal by receiving UPSM 2706 of FIG. 27B. These modulation types include, but are not limited to phase modulation (PM), phase shift keying (PSK), amplitude modulation (AM), amplitude shift keying (ASK), and quadrature amplitude modulation (QAM), and combinations thereof.

In embodiments, UFD module 2702 frequency down-converts received signal 2704 to a baseband signal. In alternative embodiments, UFD module 2702 down-converts received signal 2704 to an intermediate frequency.

Figure 27C:
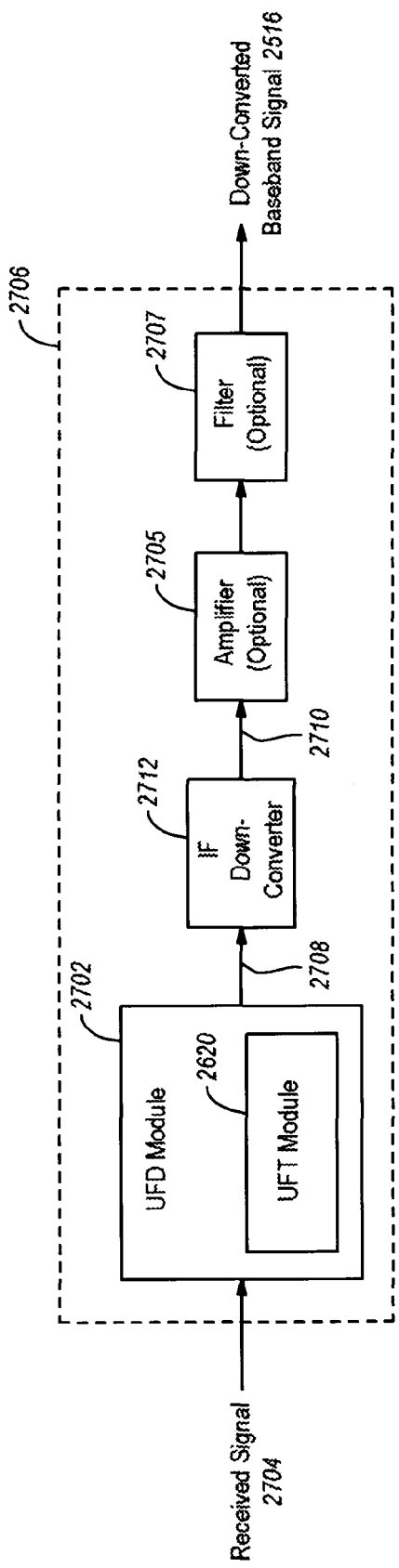

FIG. 27C illustrates an alternative embodiment of receiving UPSM 2706 comprising a UFD module 2702 that down-converts received signal 2704 to an intermediate frequency. Receiving UPSM 2706 of FIG. 27C comprises an intermediate frequency (IF) down-converter 2712. IF down-converter 2712 may comprise a UFD module and/or a UFT module, or may comprise a conventional down-converter. In this embodiment, UFD module output signal 2708 is output by UFD module 2702 at an intermediate frequency. This is an offset frequency, not at baseband. IF down-converter 2712 inputs UFD module output signal 2708, and frequency down-converts it to baseband signal 2710.

Baseband signal 2710 is optionally amplified by optional amplifier 2705 and optionally filtered by optional filter 2707, and a down-converted baseband signal 2516 results.

Receiving UPSM 2706 may further comprise a third stage IF down-converter, and subsequent IF down-converters, as would be required or preferred by some applications. It will be apparent to persons skilled in the relevant art(s) how to design and configure such further IF down-converters from the teachings contained herein. Such implementations are within the scope of the present invention.

8.2.2.1.1 Detailed UFD Module Block Diagram

Figure 28:
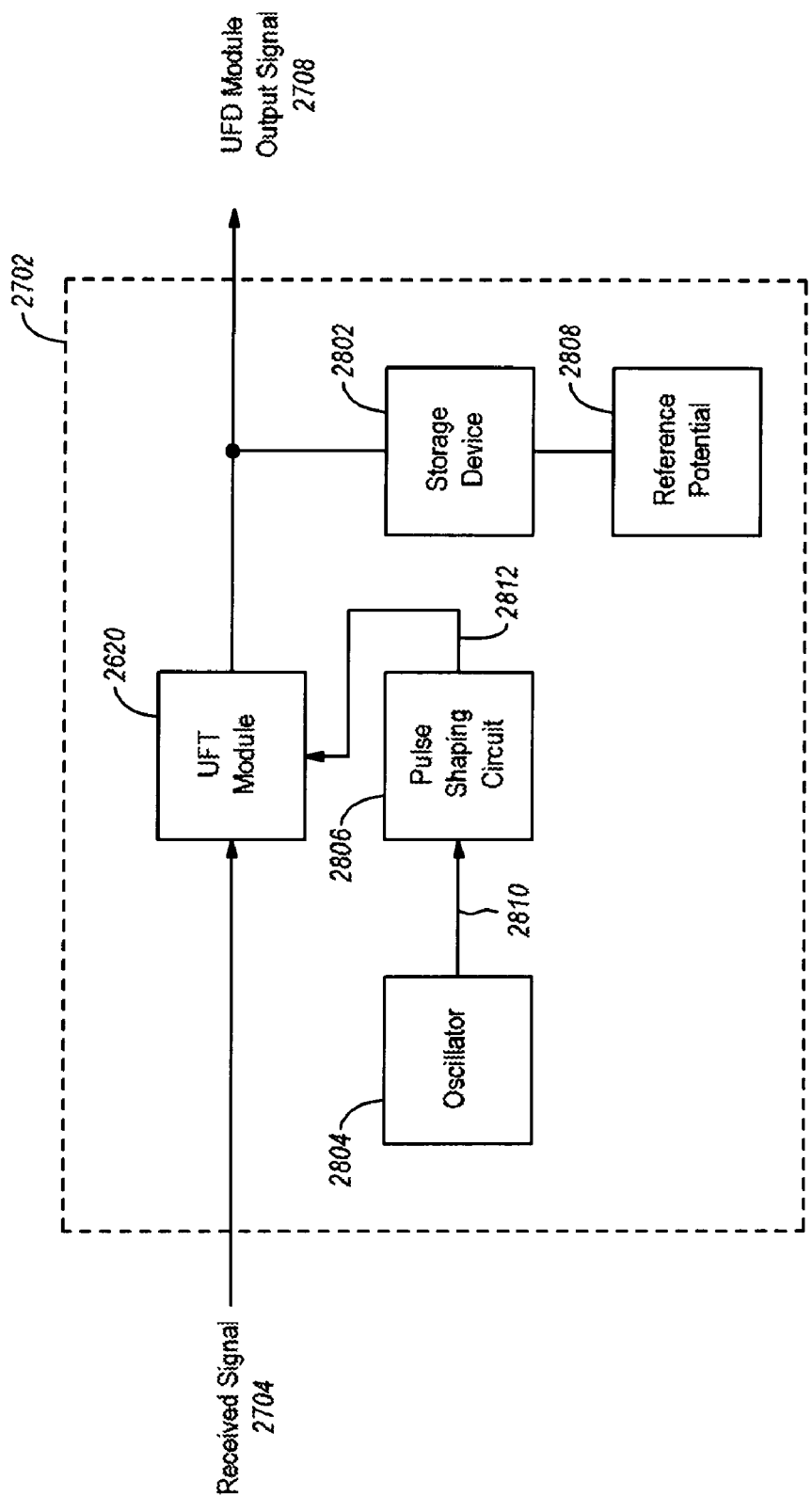
FIG. 28 illustrates an example LTD module in greater detail according to an embodiment of the invention.

FIG. 28 illustrates an embodiment of UFD module 2702 of FIG. 27 in greater detail. This embodiment is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

UFD module 2702 comprises a storage device 2802, an oscillator 2804, a pulse-shaping circuit 2806, a reference potential 2808, and a UFT module 2620. As described above, many embodiments exist for UFD module 2702. For instance, in embodiments, oscillator 2804, or both oscillator 2804 and pulse-shaping circuit 2806, may be external to UFD module 2702.

Oscillator 2804 outputs oscillating signal 2810, which is input by pulse-shaping circuit 2806. The output of pulse-shaping circuit 2806 is a control signal 2812, which preferably comprises a string of pulses. Pulse-shaping circuit 2806 controls the pulse width of control signal 2812.

In embodiments, UFT module 2620 comprises a switch. Other embodiments for UFT module 2620 are within the scope of the present invention, such as those described above. One terminal of UFT module 2620 is coupled to a received signal 2704, and a second terminal of UFT module 2620 is coupled to a first terminal of storage device 2802. A second terminal of storage device 2802 is coupled to a reference potential 2808 such as a ground, or some other potential. In a preferred embodiment, storage device 2802 is a capacitor. In an embodiment, the switch contained within UFT module 2620 opens and closes as a function of control signal 2812. As a result of the opening and closing of this switch, a down-converted signal, referred to as UFD module output signal 2708, results. Additional details pertaining to UFD module 2702 are contained in co-pending U.S. patent application entitled "Method and System for Down-Converting an Electromagnetic Signal," Ser. No. 09/176,022, issued as U.S. Pat. No. 6,061,551, which is incorporated herein by reference in its entirety.

8.2.2.2 In-Phase/Quadrature-Phase (I/Q) Modulation Mode Receiver Embodiments

Figure 29:
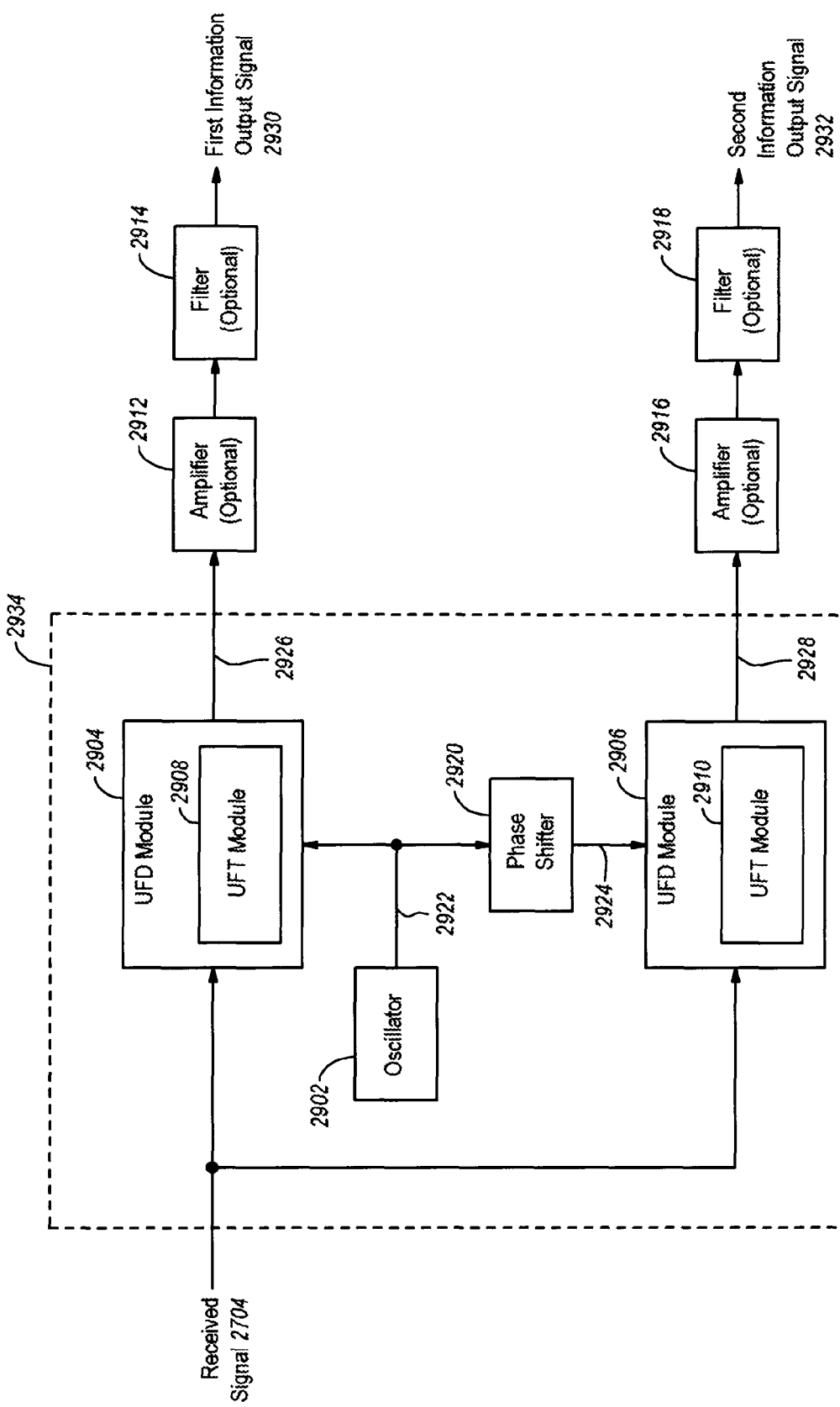
FIG. 29 illustrates an exemplary I/Q modulation embodiment of a receiver, according to the invention.

FIG. 29 illustrates an exemplary I/Q modulation mode embodiment of a receiving UPSM 2706, according to the present invention. This I/Q modulation mode embodiment is described herein for purposes of illustration, and not limitation. Alternate I/Q modulation mode embodiments (including equivalents, extensions, variations, deviations, etc., of the embodiments described herein), as well as embodiments of other modulation modes, will be apparent to persons skilled in the relevant art(s) based on the teachings contained herein. The invention is intended and adapted to include such alternate embodiments.

Receiving UPSM 2706 comprises an I/Q modulation mode receiver 2934, a first optional amplifier 2912, a first filter 2914, a second optional amplifier 2916, and a second filter 2918.

I/Q modulation mode receiver 2934 comprises an oscillator 2902, a first UFD module 2904, a second UFD module 2906, a first UFT module 2908, a second UFT module 2910, and a phase shifter 2920.

Oscillator 2902 provides an oscillating signal used by both first UFD module 2904 and second UFD module 2906 via the phase shifter 2920. Oscillator 2902 generates an "I" oscillating signal 2922.

"I" oscillating signal 2922 is input to first UFD module 2904. First UFD module 2904 comprises at least one UFT module 2908. In an embodiment, first UFD module 2904 is structured similarly to UFD module 2702 of FIG. 28, with oscillator 2902 substituting for oscillator 2804, and "I" oscillating signal 2922 substituting for oscillating signal 2810. First UFD module 2904 frequency down-converts and demodulates received signal 2514 to down-converted "I" signal 2926 according to "I" oscillating signal 2922.

Phase shifter 2920 receives "I" oscillating signal 2922, and outputs "Q" oscillating signal 2924, which is a replica of "I" oscillating signal 2922 shifted preferably by 90°.

Second UFD module 2906 inputs "Q" oscillating signal 2924. Second UFD module 2906 comprises at least one UFT module 2910. In an embodiment, second UFD module 2906 is structured similarly to UFD module 2702 of FIG. 28, with "Q" oscillating signal 2924 substituting for oscillating signal 2810. Second UFD module 2906 frequency down-converts and demodulates received signal 2514 to down-converted "Q" signal 2928 according to "Q" oscillating signal 2924.

Down-converted "I" signal 2926 is optionally amplified by first optional amplifier 2912 and optionally filtered by first optional filter 2914, and a first information output signal 2930 is output.

Down-converted "Q" signal 2928 is optionally amplified by second optional amplifier 2916 and optionally filtered by second optional filter 2918, and a second information output signal 2932 is output.

In the embodiment depicted in FIG. 29, first information output signal 2930 and second information output signal 2932 comprise down-converted baseband signal 2516 of FIGS. 27A-27C. In an embodiment, optional signal conditioning module 2523 receives first information output signal 2930 and second information output signal 2932. These signals may be separately amplified/conditioned by optional signal conditioning module 2523. Optionally amplified and conditioned first information output signal 2930 and second information output signal 2932 may then be individually modulated and up-converted, and subsequently individually transmitted by one or more transmitters. Alternatively, optionally amplified and conditioned first information output signal 2930 and second information output signal 2932 may be modulated, up-converted, recombined into a single signal, and transmitted by a single transmitting UPSM 3006 as shown in FIG. 30 and discussed herein. For example, optionally amplified and conditioned first information output signal 2930 and second information output signal 2932 may be recombined into an I/Q modulated signal for re-transmission, as further described below. In embodiments, optionally amplified and conditioned first information output signal 2930 and second information output signal 2932 may be modulated by the same or different modulation schemes before retransmission, or before recombination and retransmission.

Alternate configurations for I/Q modulation mode receiver 2934 will be apparent to persons skilled in the relevant art(s) from the teachings herein. For instance, an alternate embodiment exists wherein phase shifter 2920 is coupled between received signal 2704 and UFD module 2906, instead of the configuration described above. This and other such I/Q modulation mode receiver embodiments will be apparent to persons skilled in the relevant art(s) based upon the teachings herein, and are within the scope of the present invention.

Reference is made to pending U.S. application Ser. No. "Method, System, and Apparatus for Balanced Frequency Up-conversion of a Baseband Signal," Ser. No. 09/525,615, filed Mar. 14, 2000, for other teachings relating to this I/Q embodiment, which is herein incorporated by reference in its entirety.

8.2.2.3 Unified Down-Convert and Filter Receiver Embodiments

As described above, the invention is directed to unified down-conversion and filtering (UDF). UDF according to the invention can be used to perform filtering and/or down-conversion operations.

Many if not all of the applications described herein involve frequency translation operations. Accordingly, the applications described above can be enhanced by using any of the UDF embodiments described herein.

Many if not all of the applications described above involve filtering operations. Accordingly, any of the applications described above can be enhanced by using any of the UDF embodiments described herein.

Accordingly, the invention is directed to any of the applications described herein in combination with any of the UDF embodiments described herein.

Figure 36:
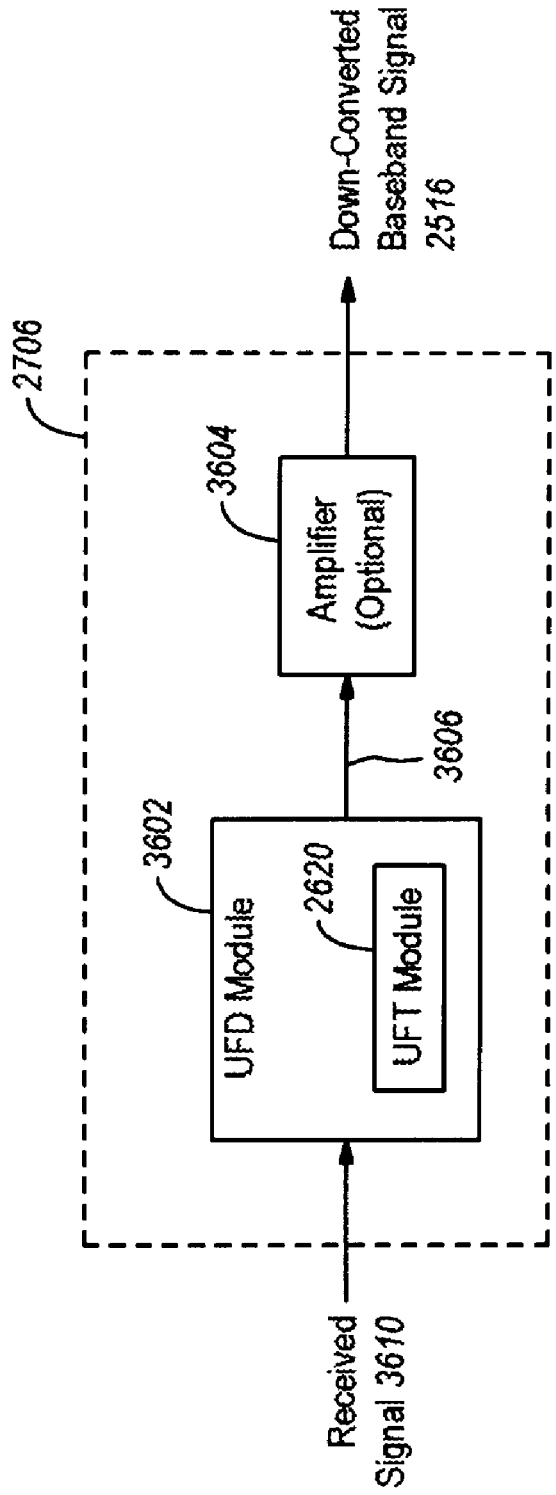
FIG. 36 illustrates a block diagram of a receiver incorporating unified down-convert and filtering according to an embodiment of the invention.

For example, a block diagram of a receiving UPSM 2706 incorporating unified down-convert in filtering according to an embodiment of the present invention is illustrated in FIG. 36. Receiving UPSM 2706 comprises a UDF module 3602 and an optional amplifier 3604. UDF Module 3602 both down-converts and filters received signal 3610 and outputs UDF module output signal 3606. UDF module output signal 3606 is optionally amplified by optional amplifier 3604, outputting down-converted baseband signal 2516.

The unified down-conversion and filtering of a signal is described above, and is more fully described in co-pending U.S. patent application entitled "Integrated Frequency Translation And Selectivity," Ser. No. 09/175,966, issued as U.S. Pat. No. 6,049,706, which is incorporated herein by reference in its entirety.

These example embodiments and other alternate embodiments (including equivalents, extensions, variations, deviations, etc., of the example embodiments described herein) will be apparent to persons skilled in the relevant art(s) based on the referenced teachings and the teachings contained herein, and are within the scope and spirit of the present invention. The invention is intended and adapted to include such alternate embodiments.

8.2.2.4 Other Receiver Embodiments

The UPSM receiver embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, down-converting different combinations of modulation techniques in an "I/Q" mode. Such alternate embodiments fall within the scope and spirit of the present invention.

For example, other UPSM receiver embodiments may down-convert signals that have been modulated with other modulation techniques. These would be apparent to one skilled in the relevant art(s) based on the teachings disclosed herein, and include, but are not limited to, amplitude modulation (AM), frequency modulation (FM), quadrature amplitude modulation (QAM), time division multiple access (TDMA), frequency division multiple access (FDMA), code division multiple access (CDMA), down-converting a signal with two forms of modulation embedding thereon, and combinations thereof.

8.2.3 Universal Platform Module Transmitter Embodiments

The following discussion describes frequency up-converting signals to be transmitted by an UPSM, using a Universal Frequency Up-conversion (UFU) Module. Frequency up-conversion of an EM signal is described above, and is more fully described in co-pending U.S. patent application entitled "Method and System for Frequency Up-Conversion," Ser. No. 09/176,154, the full disclosure of which is incorporated herein by reference in its entirety.

Exemplary embodiments of the UPSM transmitter are described below, including PM and I/Q modulation modes. However, it should be understood that these examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

8.2.3.1 Various Modulation Mode Transmitter Embodiments, Including Phase Modulation (PM)

Figure 30A:
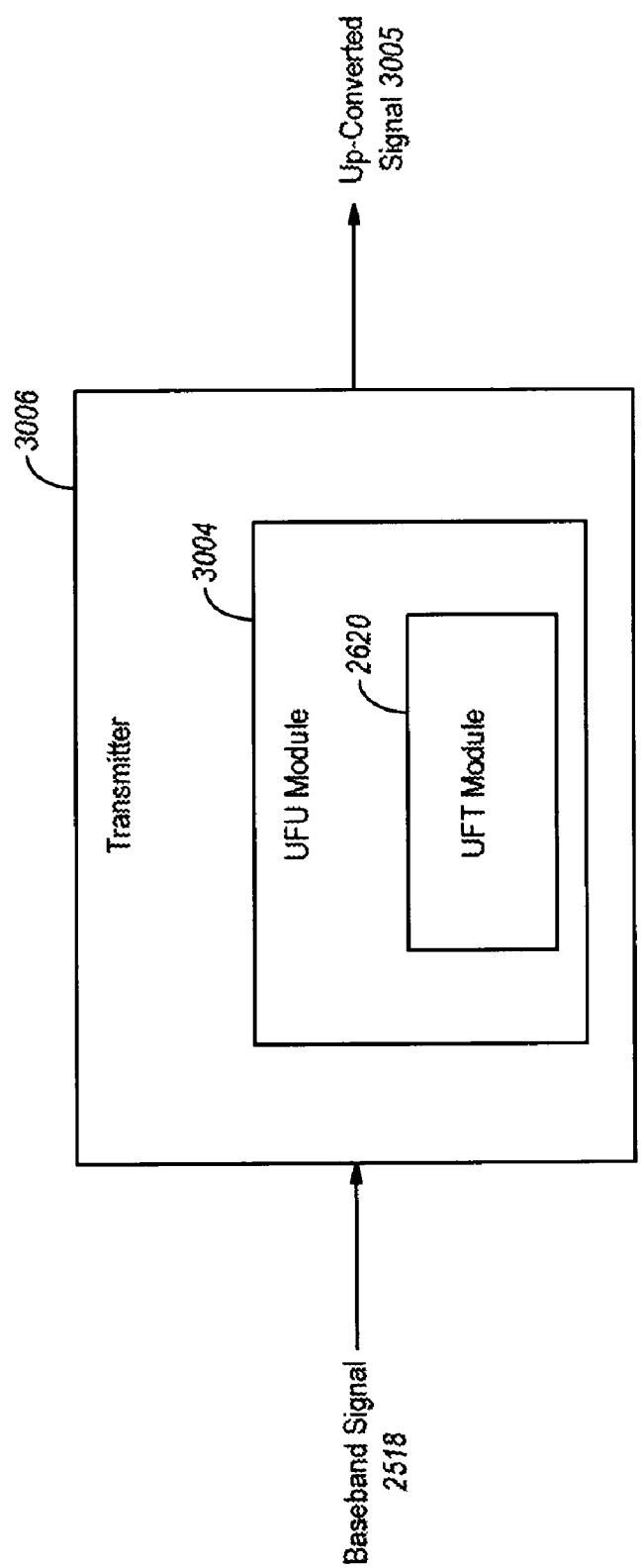
FIGS. 30A-30C illustrate example universal platform sub-module transmitters according to embodiments of the invention.

FIG. 30A illustrates an exemplary embodiment of the transmitting UPSM 3006. Transmitting UPSM 3006 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

Transmitting UPSM 3006 of FIG. 30A comprises at least one UFU module 3004. UFU module 3004 comprises at least one UFT module 2620. Numerous embodiments for transmitting UPSM 3006 will be known to persons skilled in the relevant art(s) from the teachings herein, and are within the scope of the invention.

Figure 30B:
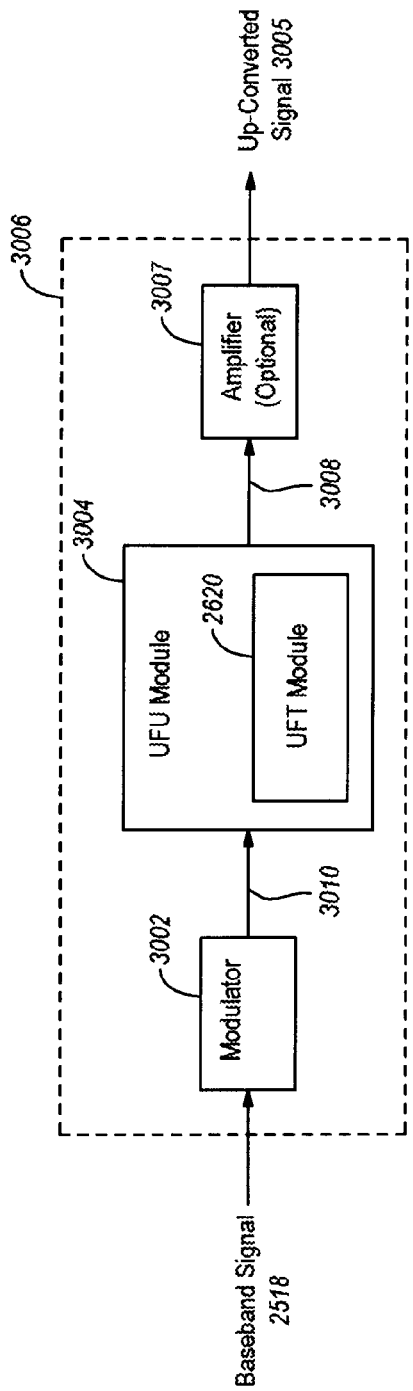

FIG. 30B illustrates in greater detail an exemplary embodiment of the transmitting UPSM 3006 of FIG. 30A. Transmitting UPSM 3006 comprises a modulator 3002, a UFU module 3004, and an optional amplifier 3007.

Figure 31:
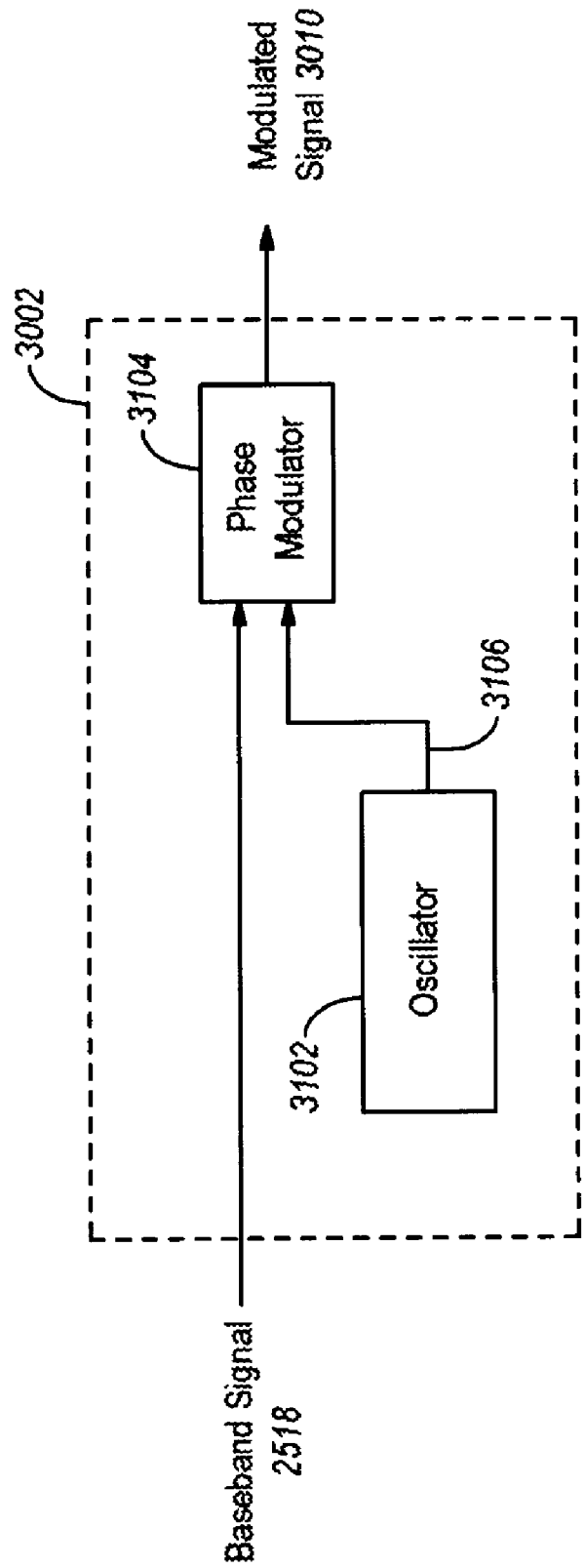
FIG. 31 illustrates further detail of an example modulator of FIG. 30B, operating in a pulse modulation (PM) mode, according to an embodiment of the invention.

Modulator 3002 of transmitting UPSM 3006 receives a baseband signal 2518. Modulator 3002 modulates baseband signal 2518, according to any modulation scheme, such as those described above. FIG. 31 illustrates an embodiment of modulator 3002. In this exemplary embodiment, the modulation scheme implemented may be phase modulation (PM) or phase shift keying (PSK) modulation. Modulator 3002 comprises an oscillator 3102 and a phase modulator 3104. Phase modulator 3104 receives baseband signal 2518 and an oscillating signal 3106 from oscillator 3102. Phase modulator 3104 phase modulates oscillating signal 3106 using baseband signal 2518. Phase modulators are well known to persons skilled in the relevant art(s). Phase modulator outputs modulated signal 3010, according to PM or PSK modulation.

In FIG. 30B, modulated signal 3010 is received by UFU module 3004. UFU module 3004 includes at least one UFT module 2620. UFU module 3004 frequency up-converts the modulated signal, outputting UFU module output signal 3008.

When present, optional amplifier 3006 amplifies UFU module output signal 3008, outputting up-converted signal 3005.

Figure 30C:
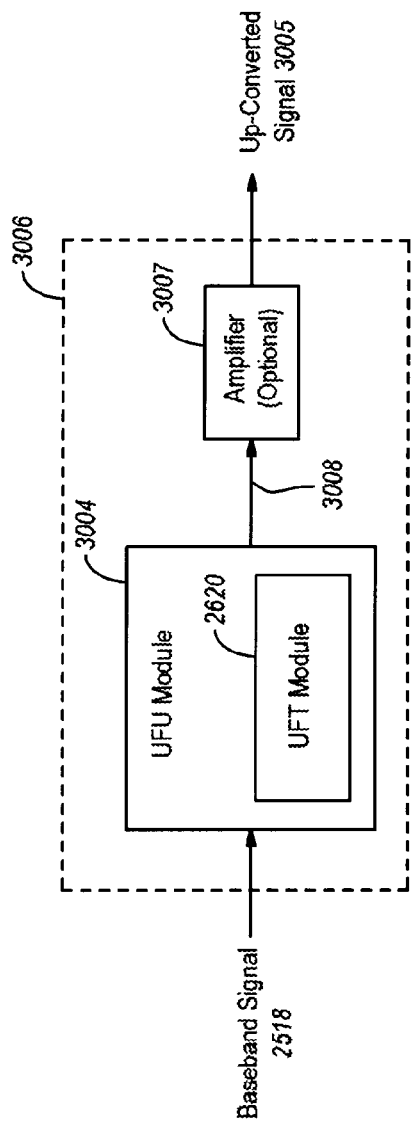

In alternate embodiments, transmitting UPSM 3006 does not require a modulator 3002 because UFU module 3004 performs the modulation function. FIG. 30C illustrates such an alternate embodiment of transmitting UPSM 3006 of FIG. 30A. Transmitting UPSM 3006 includes a UFU module 3004 and an optional amplifier 3007. UFU module 3004 includes at least one UFT module 2620. UFU module 3004 frequency modulates and up-converts baseband signal 2518 to UFU module output signal 3008. For instance, and without limitation, UFU module 3004 may provide for frequency up-conversion and modulation in an AM modulation mode. AM modulation techniques and other modulation techniques are more fully described in co-pending U.S. patent application entitled "Method and System for Frequency Up-Conversion," Ser. No. 09/176,154, the full disclosure of which is incorporated herein by reference in its entirety.

8.2.3.1.1 Detailed UFU Module Embodiments

Figure 33:
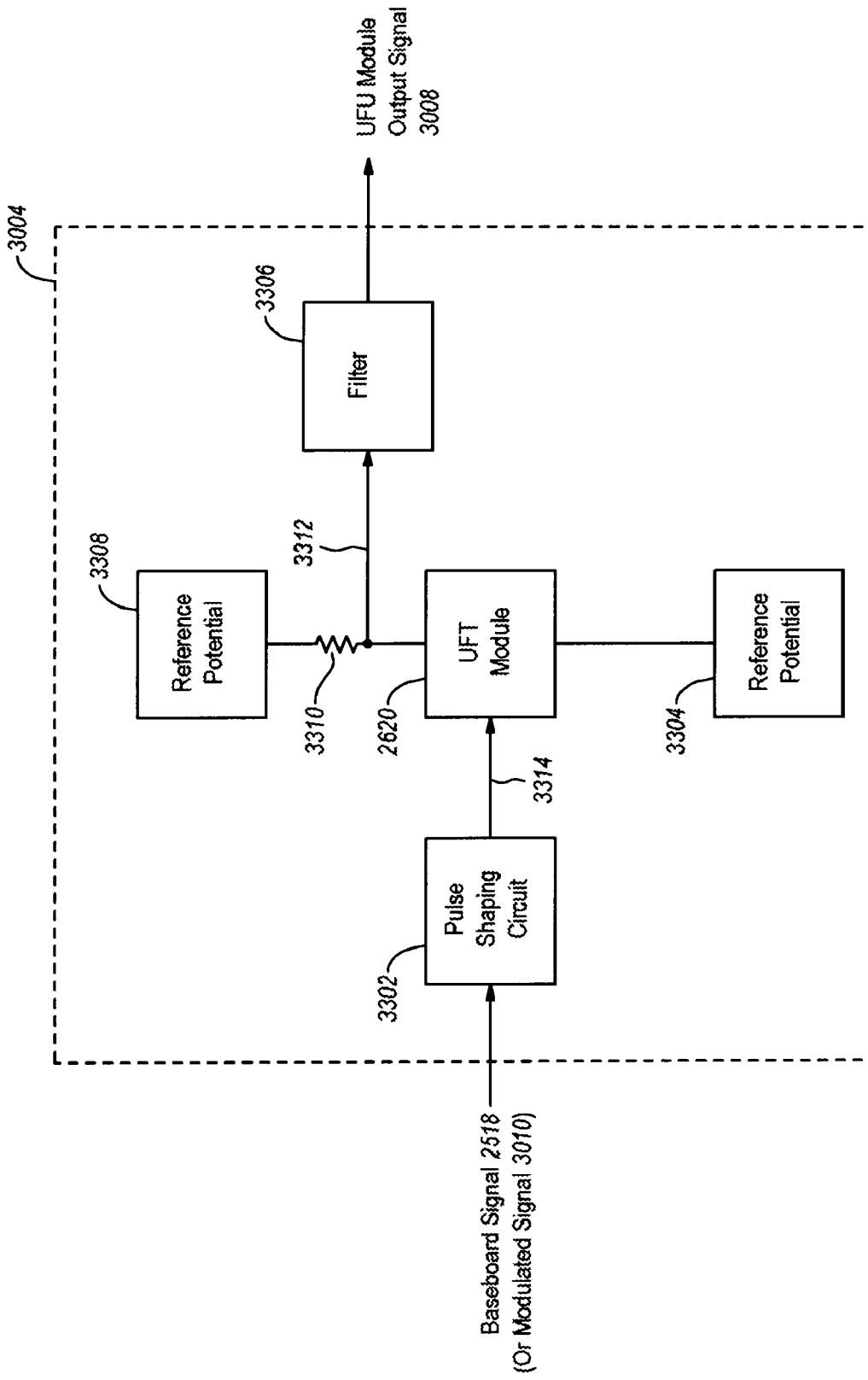
FIG. 33 illustrates an UFU module in greater detail according to an embodiment of the invention.

FIG. 33 illustrates a more detailed exemplary circuit diagram of an embodiment of UFU module 3004 of FIG. 30A. UFU module 3004 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

UFU module 3004 comprises a pulse-shaping circuit 3302, a first reference potential 3304, a filter 3306, a second reference potential 3308, a resistor 3310, and a UFT module 2620.

In FIG. 33, pulse shaping circuit 3302 receives baseband signal 2518. Pulse shaping circuit 3302 outputs control signal 3314, which is preferably comprised of a string of pulses. Control signal 3314 controls UFT module 2620, which preferably comprises a switch. Various embodiments for UFT module 2620 are described above. One terminal of UFT module 2620 is coupled to a first reference potential 3304. The second terminal of UFT module 2620 is coupled through resistor 3310 to a second reference potential 3308. In a PM or PSK modulation embodiment, second reference potential 3308 is preferably a constant voltage level. In other embodiments, such as in an amplitude modulation (AM) mode, second reference potential 3308 may be a voltage that varies with the amplitude of the information signal.

The output of UFT module 2620 is a harmonically rich signal 3312. Harmonically rich signal 3312 has a fundamental frequency and phase substantially proportional to control signal 3314, and an amplitude substantially proportional to the amplitude of second reference potential 3308. Each of the harmonics of harmonically rich signal 3312 also have phase proportional to control signal 3314, and in an PM or PSK embodiment are thus considered to be PM or PSK modulated.

Harmonically rich signal 3312 is received by filter 3306. Filter 3306 preferably has a high Q. Filter 3306 preferably selects the harmonic of harmonically rich signal 3312 that is at the approximate frequency desired for transmission. Filter 3306 removes the undesired frequencies that exist as harmonic components of harmonically rich signal 3312. Filter 3306 outputs UFU module output signal 3008.

Further details pertaining to UFU module 3004 are provided in co-pending U.S. patent application entitled "Method and System for Frequency Up-Conversion," Ser. No. 09/176, 154, which is incorporated herein by reference in its entirety.

Figure 34:
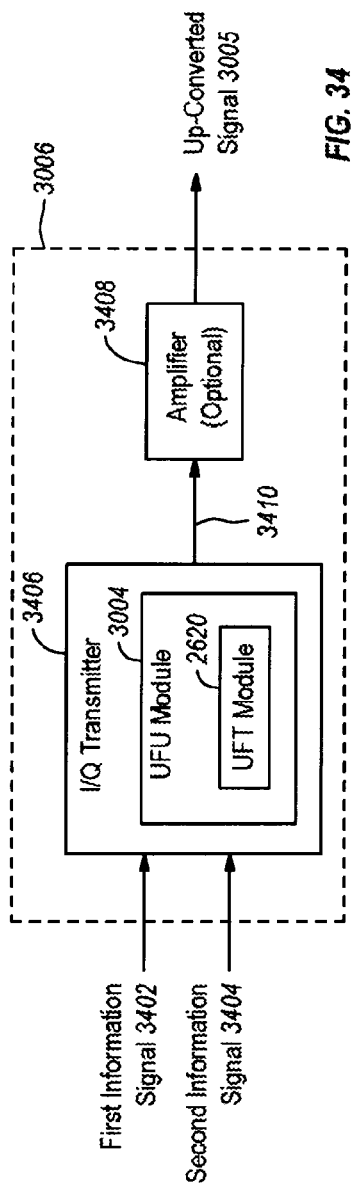
FIGS. 34 and 35 illustrate exemplary block diagrams of a transmitter operating in an I/Q modulation mode, according to embodiments of the invention.

8.2.3.2 In-Phase/Quadrature-Phase (I/Q) Modulation Mode Transmitter Embodiments In FIG. 34, an I/Q modulation mode embodiment is presented. In this embodiment, two information signals are accepted. An in-phase signal ("I") is modulated such that its phase varies as a function of one of the information signals, and a quadrature-phase signal ("Q") is modulated such that its phase varies as a function of the other information signal. The two modulated signals are combined to form an "I/Q" modulated signal and transmitted. In this manner, for instance, two separate information signals could be transmitted in a single signal simultaneously. Other uses for this type of modulation would be apparent to persons skilled in the relevant art(s).

FIG. 34 illustrates an exemplary block diagram of a transmitting UPSM 3006 operating in an I/Q modulation mode. In FIG. 34, baseband signal 2518 comprises two signals, first information signal 3402 and second information signal 3404. Transmitting UPSM 3006 comprises an I/Q transmitter 3406 and an optional amplifier 3408. I/Q transmitter 3406 comprises at least one UFT module 2620. I/Q transmitter 3406 provides I/Q modulation to first information signal 3402 and second information signal 3404, outputting I/Q output signal 3410. Optional amplifier 3408 optionally amplifies I/Q output signal 3410, outputting up-converted signal 3005.

Figure 35:
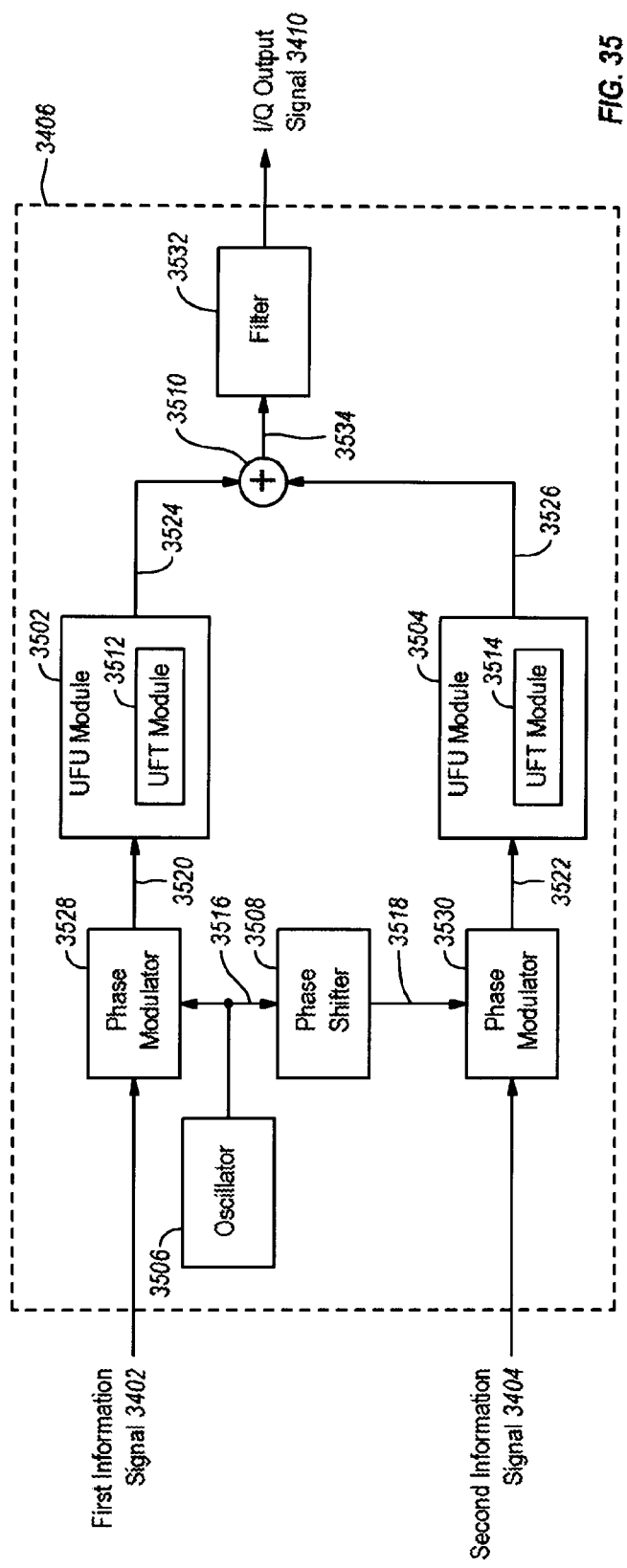

FIG. 35 illustrates a more detailed circuit block diagram for I/Q transmitter 3406. I/Q transmitter 3406 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

I/Q transmitter 3406 comprises a first UFU module 3502, a second UFU module 3504, an oscillator 3506, a phase shifter 3508, a summer 3510, a first UFT module 3512, a second UFT module 3514, a first phase modulator 3528, and a second phase modulator 3530.

Oscillator 3506 generates an "I"-oscillating signal 3516.

A first information signal 3402 is input to first phase modulator 3528. The "I"-oscillating signal 3516 is modulated by first information signal 3402 in the first phase modulator 3528, thereby producing an "I"-modulated signal 3520.

First UFU module 3502 inputs "I"-modulated signal 3520, and generates a harmonically rich "I" signal 3524 with a continuous and periodic wave form.

The phase of "I"-oscillating signal 3516 is shifted by phase shifter 3508 to create "Q"-oscillating signal 3518. Phase shifter 3508 preferably shifts the phase of "I"-oscillating signal 3516 by 90 degrees.

A second information signal 3404 is input to second phase modulator 3530. "Q"-oscillating signal 3518 is modulated by second information signal 3404 in second phase modulator 3530, thereby producing a "Q" modulated signal 3522.

Second UFU module 3504 inputs "Q" modulated signal 3522, and generates a harmonically rich "Q" signal 3526, with a continuous and periodic waveform.

Harmonically rich "I" signal 3524 and harmonically rich "Q" signal 3526 are preferably rectangular waves, such as square waves or pulses (although the invention is not limited to this embodiment), and are comprised of pluralities of sinusoidal waves whose frequencies are integer multiples of the fundamental frequency of the waveforms. These sinusoidal waves are referred to as the harmonics of the underlying waveforms, and a Fourier analysis will determine the amplitude of each harmonic.

Harmonically rich "I" signal 3524 and harmonically rich "Q" signal 3526 are combined by summer 3510 to create harmonically rich "I/Q" signal 3534. Summers are well known to persons skilled in the relevant art(s).

Filter 3532 filters out the undesired harmonic frequencies, and outputs an I/Q output signal 3410 at the desired harmonic frequency or frequencies.

It will be apparent to persons skilled in the relevant art(s) that an alternative embodiment exists wherein the harmonically rich "I" signal 3524 and the harmonically rich "Q" signal 3526 may be filtered before they are summed, and further, another alternative embodiment exists wherein "I"-modulated signal 3520 and "Q"-modulated signal 3522 may be summed to create an "I/Q"-modulated signal before being routed to a switch module. Other "I/Q"-modulation embodiments will be apparent to persons skilled in the relevant art(s) based upon the teachings herein, and are within the scope of the present invention. Further details pertaining to an I/Q modulation mode transmitter are provided in co-pending U.S. patent application entitled "Method and System for Frequency Up-Conversion," Ser. No. 09/176,154, which is incorporated herein by reference in its entirety.

Reference is made to pending U.S. application Ser. No. "Method, System, and Apparatus for Balanced Frequency Up-conversion of a Baseband Signal," Ser. No. 09/525,615, filed Mar. 14, 2000, for other teachings relating to this I/Q embodiment, which is herein incorporated by reference in its entirety.

8.2.3.3 Other Transmitter Embodiments

The UPSM transmitter embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, combinations of modulation techniques in an "I/Q" mode. Such alternate embodiments fall within the scope and spirit of the present invention.

For example, other UPSM transmitter embodiments may utilize other modulation techniques. These would be apparent to one skilled in the relevant art(s) based on the teachings disclosed herein, and include, but are not limited to, amplitude modulation (AM), frequency modulation (FM), quadrature amplitude modulation (QAM), time division multiple access (TDMA), frequency division multiple access (FDMA), code division multiple access (CDMA), embedding two forms of modulation onto a signal for up-conversion, etc., and combinations thereof.

8.2.4 Enhanced Signal Reception Universal Platform Embodiments

In additional embodiments of the present invention, enhanced signal reception (ESR) according to the present invention may be used. As discussed above, the invention is directed to methods and systems for ESR. Any of the example applications discussed above can be modified by incorporating ESR therein to enhance communication between transmitters and receivers. Accordingly, the invention is also directed to any of the applications described above, in combination with any of the ESR embodiments described above. Enhanced signal reception using redundant spectrums is described above, and is fully described in co-pending U.S. patent application entitled "Method and System for Ensuring Reception of a Communications Signal," Ser. No. 09/176, 415, which is incorporated herein by reference in its entirety.

For example, in an embodiment, transmitting UPSM 3006 may comprise a transmitter configured to transmit redundant spectrums, and receiving UPSM 2706 may be configured to receive and process such redundant spectrums, similarly to the system shown in FIG. 21. In an alternative embodiment, UPM 2606 may include transceivers configured to transmit, and to receive and process redundant spectrums. Accordingly, the invention is directed to any of the applications described herein in combination with any of the ESR embodiments described herein.

These example embodiments and other alternate embodiments (including equivalents, extensions, variations, deviations, etc., of the example embodiments described herein) will be apparent to persons skilled in the relevant art(s) based on the referenced teachings and the teachings contained herein, and are within the scope and spirit of the present invention. The invention is intended and adapted to include such alternate embodiments.

8.2.5 Universal Platform Transceiver Embodiments

As discussed above, in other embodiments of the present invention, UPM 2606 may include a transceiver unit, rather than a separate receiver and transmitter. Furthermore, the invention is directed to any of the applications described herein in combination with any of the transceiver embodiments described herein.

An exemplary embodiment of a transceiving UPSM 3706 of the present invention is illustrated in FIG. 37. Transceiving UPSM 3706 includes a UFT module 2620. In one embodiment, UPM 2606 includes more than one transceiver UPSM 3706.

Transceiving UPSM 3706 frequency down-converts first EM signal 2514, and outputs down-converted baseband signal 2516. In an embodiment (not shown), each transceiving UPSM 3706 comprises one or more UFT modules 2620 at least for frequency down-conversion.

Transceiving UPSM 3706 frequency up-converts down-converted baseband signal 2518. UFT module 2620 provides at least for frequency up-conversion. In alternate embodiments, UFT module 2620 only supports frequency down-conversion, and at least one additional UFT module 2620 provides for frequency up-conversion. The up-converted signal is output by transceiving UPSM 3706.

Further example embodiments of receiver/transmitter systems applicable to the present invention may be found in co-pending U.S. patent application entitled "Method and System for Frequency Up-Conversion," Ser. No. 09/176,154, incorporated by reference in its entirety.

These example embodiments and other alternate embodiments (including equivalents, extensions, variations, deviations, etc., of the example embodiments described herein) will be apparent to persons skilled in the relevant art(s) based on the referenced teachings and the teachings contained herein, and are within the scope and spirit of the present invention. The invention is intended and adapted to include such alternate embodiments.

Reference is made to pending U.S. application Ser. No. "Method, System, and Apparatus for Balanced Frequency Up-conversion of a Baseband Signal," Ser. No. 09/525,615, filed Mar. 14, 2000, for other teachings relating to this embodiment, which is herein incorporated by reference in its entirety.

8.2.6 Other Universal Platform Module Embodiments

The UPM and UPSM embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, receiving a signal of a first modulation type and re-transmitting the signal in a different modulation mode. Another such alternate embodiment includes receiving a signal of a first frequency and re-transmitting the signal at a different frequency. Such alternate embodiments fall within the scope and spirit of the present invention.

8.3 Multi-Mode Infrastructure

The invention is also directed to multi-mode infrastructure embodiments for interacting with the devices discussed above. Such infrastructure embodiments include, but are not limited to, servers, routers, access points, and any other components for enabling multi-mode operation as described herein.

For example, consider a scenario of a commercial airplane. The passengers traveling in the airplane may have devices where they (1) receive flight information, (2) receive telephone calls, and/or (3) receive email. There may be a number of mediums by which such information can be received. For example, such information might be received via a wireless telephone network, or via a WLAN internal to the airplane, or via a short range wireless communication medium. The airplane may have infrastructure components to receive and route such information to the passengers' devices. The infrastructure components include control modules for enabling such operation.

In an embodiment, such infrastructure embodiments include one or more receivers, transmitters, and/or transceivers that include UFTs as described herein. In embodiments, such infrastructure embodiments include UPMs and UPSMs as described herein.

8.4 Additional Multi-mode Teachings

Additional teachings relating to multi-mode methods, apparatuses, and systems according to embodiments of the invention are described in the following applications (as well as others cited above), which are all herein incorporated by reference in their entireties:

"Family Radio System with Multi-Mode and Multi-Band Functionality," Ser. No. 09/476,093, filed Jan. 3, 2000.

"Multi-Mode, Multi-Band Communications System," Ser. No. 09/476,330, filed Jan. 3, 2000.

9. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for communicating according to a plurality of protocols, comprising the steps of:
   (1) frequency down-converting a first signal to a lower frequency second signal;
   (2) controlling a control signal used to achieve said frequency down-converting, wherein an amplitude of the lower frequency second signal is determined by a frequency and phase relationship between the first signal and the control signal;
   (3) controlling step (1) so that said frequency down-conversion operates according to at least one of a first protocol and a second protocol; and
   (4) controlling step (1) so that said frequency down-conversion switches operation between said first protocol and said second protocol.

2. The method of claim 1, further comprising the step of:
   (5) up-converting a third signal to a higher frequency fourth signal.

3. The method of claim 2, further comprising the steps of:
   (6) controlling step (5) so that said frequency up-conversion operates according to said first protocol; and
   (7) controlling step (5) so that said frequency up-conversion switches operation to said second protocol.

4. The method of claim 1, further comprising the step of:
   (5) controlling step (1) so that said frequency down-conversion alternates operation according to at least said first and second protocols.

5. The method of claim 1, wherein said protocols comprise one or more of Wireless Application Protocol (WAP), Jini, Java Virtual Machine (JVM), a short range wireless protocol, Wireless Local Area Network (WLAN), TCP/IP, UDP, HAVi, Salutation, Infrared (IR, IRDA), Service Location Protocol (SLP), Universal Plug-n-Play (UPnP), and Simple Service Discovery Protocol (SSDP).

6. The method of claim 1, wherein said protocols comprise one or more of CDMA, US-TDMA, W-CDMA, EDGE, IS-95C, SMS, GSM, DataTAC, iDEN (ESMR), CDPD, dDECT, Project Angel, LMDS, MMDS, ARDIS, Mobitex, and AMPS.

7. The method of claim 1, further comprising the step of:
(5) controlling step (1) to enable communication via at least one of wireless local loop (WLL) links, wireless local area network (WLAN) links, cellular links, personal area network links, short range links, wireline links, and analog network links.

8. The method of claim 7, wherein said wireline links comprise at least one of local area network links and wide area network links.

9. The method of claim 7, wherein said short range links include a short range wireless protocol.

10. The method of claim 1, wherein step (1) operates over a wireless link.

11. An apparatus that communicates according to a plurality of protocols, comprising:
frequency down-converting means for frequency down-converting a first signal to a lower frequency second signal, wherein said first signal is at a radio frequency and said lower frequency second signal is at a baseband frequency other than an intermediate frequency;
means for controlling a control signal used to achieve said frequency down-converting, wherein an amplitude of the lower frequency second signal is determined by a frequency and phase relationship between the first signal and the control signal;
means for controlling said frequency down-converting means so that said frequency down-conversion operates according to at least one of a first protocol and a second protocol; and
means for controlling said frequency down-converting means so that said frequency down-conversion switches operation between said first protocol and said second protocol.

12. The apparatus of claim 11, further comprising: frequency up-converting means for up-converting a third signal to a higher frequency fourth signal.

13. The apparatus of claim 12, further comprising: means for controlling said frequency up-converting means so that said frequency up-conversion operates according to said first protocol; and
means for controlling said frequency up-converting means so that said frequency up-conversion switches operation to said second protocol.

14. The apparatus of claim 11, further comprising: means for controlling said frequency down-converting means so that said frequency down-conversion alternates operation according to at least said first and second protocols.

15. The apparatus of claim 11, wherein said protocols comprise one or more of Wireless Application Protocol (WAP), Jini, Java Virtual Machine (JVM), a short range wireless protocol, Wireless Local Area Network (WLAN), TCP/IP, UDP, HAVi, Salutation, Infrared (IR, IRDA), Service Location Protocol (SLP), Universal Plug-n-Play (UPnP), and Simple Service Discovery Protocol (SSDP).

16. The apparatus of claim 11, wherein said protocols comprise one or more of CDMA, US-TDMA, W-CDMA, EDGE, IS-95C, SMS, GSM, DataTAC, iDEN (ESMR), CDPD, dDECT, Project Angel, LMDS, MMDS, ARDIS, Mobitex, and AMPS.

17. The apparatus of claim 11, further comprising:
means for controlling said frequency down-converting means to enable communication via at least one of wireless local loop (WLL) links, wireless local area network (WLAN) links, cellular links, personal area network links, short range links, wireline links, and analog network links.

18. The apparatus of claim 17, wherein said wireline links comprise at least one of local area network links and wide area network links.

19. The apparatus of claim 17, wherein said short range links include a short range wireless protocol.

20. The apparatus of claim 11, wherein said frequency down-converting means operates over a wireless link.

21. An apparatus that communicates according to a plurality of protocols, comprising:
frequency down-converting means for frequency down-converting a first signal to a lower frequency second signal, wherein said frequency down-converting means is other than at least one of a frequency synthesizer and a phase shifter;
means for controlling a control signal used to achieve said frequency down-converting, wherein an amplitude of the lower frequency second signal is determined by a frequency and phase relationship between the first signal and the control signal;
means for controlling said frequency down-converting means so that said frequency down-conversion operates according to at least one of a first protocol and a second protocol; and
means for controlling said frequency down-converting means so that said frequency down-conversion switches operation between said first protocol and said second protocol.

22. An apparatus that communicates according to a plurality of protocols, comprising:
a frequency down-converting module configured to down-convert a first signal to a lower frequency second signal;
a first control module configured to control a control signal used to achieve said frequency down-converting, wherein an amplitude of the lower frequency second signal is determined by a frequency and phase relationship between the first signal and the control signal;
a second control module configured to control said frequency down-converting module so that said frequency down-conversion operates according to at least one of a first protocol and a second protocol; and
a third control module configured to control said frequency down-converting module so that said frequency down-conversion switches operation between said first protocol and said second protocol.

23. The method of claim 1, wherein step (2) comprises comparing a current measurement of the amplitude of the lower frequency second signal to a previous measurement of the amplitude of the lower frequency second signal to generate a comparison value.

24. The method of claim 23, wherein step (2) comprises controlling the frequency of the control signal based on the comparison value.

* * * * *